US009718901B2

(12) United States Patent
Tsuruta et al.

(10) Patent No.: US 9,718,901 B2

(45) **Date of Patent: *Aug. 1, 2017**

(54) RESIN COMPOSITION AND PATTERN FORMING METHOD USING THE SAME

(71) Applicant: FUJIFILM Corporation, Minato-Ku, Tokyo (JP)

(72) Inventors: Takuya Tsuruta, Haibara-gun (JP); Tomotaka Tsuchimura, Haibara-gun (JP); Kaoru Iwato, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/586,129

(22) Filed: Dec. 30, 2014

(65) Prior Publication Data

US 2015/0118623 A1 Apr. 30, 2015

Related U.S. Application Data

(63) Continuation of application No. PCT/JP2013/068303, filed on Jun. 26, 2013.

(30) Foreign Application Priority Data

Jul. 27, 2012 (JP) ................................ 2012-167509

(51) Int. Cl.

| | |
|---|---|
| ***G03F 7/039*** | (2006.01) |
| ***G03F 7/038*** | (2006.01) |
| ***G03F 7/20*** | (2006.01) |
| ***C08F 12/24*** | (2006.01) |
| ***C08F 12/32*** | (2006.01) |
| ***C08F 16/12*** | (2006.01) |
| ***C08F 16/26*** | (2006.01) |
| ***C08F 212/14*** | (2006.01) |
| ***G03F 7/004*** | (2006.01) |
| ***C08F 8/02*** | (2006.01) |

(52) U.S. Cl.

CPC ................ *C08F 12/24* (2013.01); *C08F 8/02* (2013.01); *C08F 12/32* (2013.01); *C08F 212/14* (2013.01); *G03F 7/004* (2013.01); *G03F 7/0045* (2013.01); *G03F 7/0382* (2013.01); *G03F 7/0392* (2013.01); *G03F 7/20* (2013.01); *G03F 7/0388* (2013.01)

(58) Field of Classification Search

None

See application file for complete search history.

(56) References Cited

U.S. PATENT DOCUMENTS 5,585,218 A 12/1996 Nakano et al.
6,083,658 A * 7/2000 Kunita .................. G03F 7/0045 430/270.1
6,153,349 A 11/2000 Ichikawa et al.
6,214,518 B1 * 4/2001 Kunita .................. B41C 1/1008 430/270.1
6,258,507 B1 7/2001 Ochiai et al.
7,501,223 B2 3/2009 Takeda et al.
7,977,027 B2 * 7/2011 Takeda .................. G03F 7/0045 430/270.1
8,470,512 B2 6/2013 Masunaga et al.
8,501,942 B2 8/2013 Domon et al.
8,735,048 B2 5/2014 Inasaki et al.
8,828,645 B2 9/2014 Tanaka et al.
2003/0232940 A1 * 12/2003 Komoriya ............... C07C 33/46 526/242

(Continued)

FOREIGN PATENT DOCUMENTS

JP 1-293338 A 11/1989
JP 02-229804 * 9/1990

(Continued)

OTHER PUBLICATIONS

Machine translation ofjp 2009-086353 (2009).*

(Continued)

*Primary Examiner* — Martin Angebranndt

(74) *Attorney, Agent, or Firm* — Sughrue Mion, PLLC

(57) ABSTRACT

A resin composition of the present invention includes a polymer compound (A) containing a repeating unit (Q) represented by the following general formula (1):

[Chem. 1]

(1)

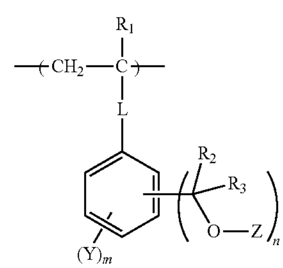

wherein $R_1$ represents a hydrogen atom, a methyl group, or a halogen atom;

$R_2$ and $R_3$ represent a hydrogen atom, an alkyl group, or a cycloalkyl group;

L represents a divalent linking group or a single bond;

Y represents a substituent excluding a methylol group;

Z represents a hydrogen atom or a substituent;

m represents an integer of 0 to 4;

n represents an integer of 1 to 5; and m+n is 5 or less.

28 Claims, 9 Drawing Sheets

(56) References Cited

U.S. PATENT DOCUMENTS

| | | | | |
|---|---|---|---|---|
| 2009/0053657 | A1* | 2/2009 | Hatakeyama | C09D 133/066 430/324 |
| 2009/0087784 | A1 | 4/2009 | Hirano et al. | |
| 2010/0266951 | A1* | 10/2010 | Hiroi | C08G 59/226 430/270.1 |
| 2010/0304300 | A1* | 12/2010 | Kodama | G03F 7/0045 430/270.1 |
| 2012/0148953 | A1 | 6/2012 | Arai et al. | |
| 2012/0149916 | A1 | 6/2012 | Utsumi et al. | |
| 2013/0040096 | A1 | 2/2013 | Iwato et al. | |
| 2013/0095429 | A1 | 4/2013 | Iizuka et al. | |
| 2013/0115557 | A1 | 5/2013 | Yamaguchi et al. | |
| 2013/0266777 | A1 | 10/2013 | Kato et al. | |
| 2014/0242502 | A1* | 8/2014 | Tsuchimura | C08F 12/22 430/5 |
| 2015/0072274 | A1* | 3/2015 | Tsuchimura | C08F 212/14 430/5 |
| 2016/0147155 | A1* | 5/2016 | Takizawa | G03F 7/004 428/195.1 |
| 2016/0202608 | A1* | 7/2016 | Namai | G03F 7/0045 430/270.1 |
| 2016/0209747 | A1* | 7/2016 | Yamaguchi | G03F 7/0045 |
| 2016/0280675 | A1* | 9/2016 | Yamaguchi | G03F 7/004 |
| 2016/0282720 | A1* | 9/2016 | Takahashi | G03F 7/0382 |

FOREIGN PATENT DOCUMENTS

| | | | |
|---|---|---|---|
| JP | 7-295220 | A | 11/1995 |
| JP | 07-333851 | * | 12/1995 |
| JP | 11-102071 | * | 4/1999 |
| JP | 2000-29220 | A | 1/2000 |
| JP | 2001-109143 | * | 4/2001 |
| JP | 2002-0311891 | * | 1/2002 |
| JP | 200486020 | A | 3/2004 |
| JP | 3546687 | B2 | 7/2004 |
| JP | 2005-99558 | A | 4/2005 |
| JP | 2007-248515 | * | 9/2007 |
| JP | 2007-254751 | A | 10/2007 |
| JP | 2008-95009 | A | 4/2008 |
| JP | 2008-162101 | A | 7/2008 |
| JP | 2009-86353 | A | 4/2009 |
| JP | 2009-86354 | A | 4/2009 |
| JP | 2011-035173 | * | 2/2011 |
| JP | 2011-53365 | A | 3/2011 |
| JP | 2011-123225 | A | 6/2011 |
| JP | 2011-227463 | A | 11/2011 |
| JP | 2011-248019 | A | 12/2011 |
| JP | 2012-22100 | A | 2/2012 |
| JP | 2012-31233 | A | 2/2012 |
| JP | 2012-46731 | A | 3/2012 |
| JP | 2012-063728 | * | 3/2012 |
| JP | 2012-73508 | A | 4/2012 |
| JP | 2012-113003 | A | 6/2012 |
| JP | 2012-121838 | A | 6/2012 |
| JP | 2012-128383 | A | 7/2012 |
| JP | 2012-132949 | A | 7/2012 |
| JP | 2012-133329 | A | 7/2012 |
| JP | 2012-137735 | A | 7/2012 |
| JP | 2013-254081 | * | 12/2013 |

OTHER PUBLICATIONS

International Search Report for PCT/JP2013/068303 dated Sep. 17, 2013 [PCT/ISA/210].
Written Opinion for PCT/JP2013/068303 dated Sep. 17, 2013 [PCT/ISA/237].
Notice of Final Rejection, dated Oct. 6, 2015, issued in corresponding JP Application No. 2012-167509, 7 pages in English and Japanese.
Office Action dated Jan. 5, 2016 from the Japanese Patent Office in counterpart Japanese Application No. 2012-167509.
Notice of Reasons for Rejection, mailed Jun. 30, 2015, issued in corresponding JP Application No. 2012-167509, 39 pages in English and Japanese.
Office Action dated Jun. 9, 2016 from the Korean Intellectual Property Office in counterpart Korean Application No. 10-2014-7035470.
Office Action dated Oct. 12, 2016 from the Taiwanese Intellectual Property Office in counterpart Taiwanese Application No. 102124826.
Office Action dated Dec. 22, 2016, issued by the Korean Intellectual Property Office in corresponding Korean Application No. 10-2014-7035470.
Office Action dated Apr. 14, 2017, issued by the Korean Intellectual Property Office in corresponding Korean Application No. 10-2014-7035470.

* cited by examiner

RESIN COMPOSITION AND PATTERN FORMING METHOD USING THE SAME

CROSS-REFERENCE TO RELATED APPLICATIONS

This application is a Continuation of PCT International Application No. PCT/JP2013/068303 filed on Jun. 26, 2013, which claims priority under 35 U.S.C. §119(a) to Japanese Patent Application No. 2012-167509 filed on Jul. 27, 2012. Each of the above application(s) is hereby expressly incorporated by reference, in its entirety, into the present application.

BACKGROUND OF THE INVENTION

1. Field of the Invention

The present invention relates to a resin composition capable of forming a high-precision pattern using an electron beam or extreme ultraviolet rays, which is suitably used in an ultramicrolithography process such as a process for manufacturing a super-LSI or a high-capacity microchip, and other photofabrication processes, and a pattern forming method using the same. Specifically, the present invention relates to a resin composition which can be suitably used in a process using a substrate having a specific undercoating film, and an actinic ray-sensitive or radiation-sensitive film, mask blanks, and a pattern forming method, each using the same. In addition, the present invention relates to a method for manufacturing an electronic device including the pattern forming method, and an electronic device manufactured by the method.

2. Description of the Related Art

In microfabrication using a resist composition, along with the increase in the degree of integration of integrated circuits, there is a demand for formation of ultrafine patterns. Therefore, the exposure wavelength also tends to become shorter, as in the case of the transition from g-line to i-line, or further to excimer laser light, and for example, the development of lithographic technologies using electron beams is currently underway. Further, as a resin used for the exposure to excimer laser light such as that of a KrF excimer laser, a resin having a structure where a hydrogen atom of a phenolic hydroxyl group is substituted with a group having an aliphatic hydrocarbon residue, a resin having a structure where the hydrogen atom is substituted with a group having an aryl group, a resin having a structure where the hydrogen atom is substituted with an alkyl group, and a resin having a structure where the hydrogen atom is substituted with a linear alkyl group, to which an oxirane group is introduced, are described, respectively, in JP2000-29220A, JP3546687B, JP1995-295220A (JP-H07-295220A), and JP1989-293338A (JP-H01-293338A).

In order to form ultrafine patterns, thickness reduction of the resist is required; however, if a thinner resist is formed, dry etching resistance is decreased. To cope with the thickness reduction of the resist, there has been proposed, for example, a resin formed by immersing methylol urea in a methacrylic resin (JP2012-31233A and JP2012-46731A), but sufficient dry etching resistance has not been obtained.

Furthermore, in the field of electron beam lithography, the influence of electron scattering in the resist film (forward scattering) has been reduced in recent years, by increasing the acceleration voltage of the electron beam (EB). However, in this case, the resist film has a reduced electron energy trapping ratio which decreases the sensitivity, and the effect of scattering (backward scattering) of electrons reflected in the resist substrate increases. In particular, when forming an isolated pattern having a large exposure area, the effect of backward scattering is large and the resolution properties of the isolated pattern are impaired.

Particularly, in the case of patterning on photomask blanks used for semiconductor exposure, a light-shielding film containing heavy atoms is present as the layer below the resist, and the effect of backward scattering attributable to the heavy atoms is serious. Therefore, in the case of forming an isolated pattern on photomask blanks, among others, the resolution properties are highly likely to decrease.

As one of the methods to solve these problems, use of a resin having an aromatic skeleton such as naphthalene (for example, JP2008-95009A and JP2009-86354A) and use of a resin containing an oxirane group (for example, JP2011-123225A) are being studied, but the problem regarding the resolution properties of an isolated pattern is unsolved. Further, it is found that for the technology disclosed in JP2011-123225A, dry etching resistance is not sufficient. In JP2005-99558A, as one of the methods to enhance the resolution properties of an isolated pattern, a resin containing a group for adjusting the solubility is used, but it has not approached a satisfactory level in the resolution properties of an isolated pattern.

Also, the microfabrication using a resist composition is not only used directly to produce an integrated circuit but has also been applied, in recent years, to the fabrication or the like of a so-called imprint mold structure (see, for example, JP2008-162101A and Basic and Technology Expansion Application Development of Nanoimprint—Fundamental Technology of Nanoimprint and Latest Technology Expansion, edited by Yoshihiko HIRAI, Frontier Publishing (issued June, 2006)). Therefore, it has become an important task to satisfy high sensitivity, high resolution properties (for example, a high resolution, an excellent pattern shape, and a small line edge roughness (LER)), and good dry etching resistance all at the same time, and this needs to be solved.

SUMMARY OF THE INVENTION

It is an object of the present invention to provide a resin composition capable of forming a pattern satisfying high sensitivity, high resolution properties (for example, a high resolution, an excellent pattern shape, and a small line edge roughness (LER)) and good dry etching resistance, and an actinic ray-sensitive or radiation-sensitive film including the same, mask blanks forming the film, and a pattern forming method.

The present invention is, for example, as follows:

[1] A resin composition including a polymer compound (A) containing a repeating unit (Q) represented by the following general formula (1):

[Chem. 1]

(1)

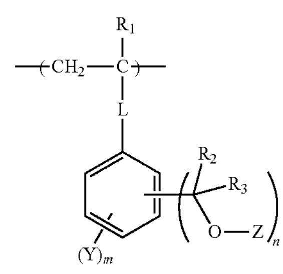

wherein $R_1$ represents a hydrogen atom, a methyl group, or a halogen atom;

$R_2$ and $R_3$ represent a hydrogen atom, an alkyl group, or a cycloalkyl group;

L represents a divalent linking group or a single bond;

Y represents a substituent excluding a methylol group;

Z represents a hydrogen atom or a substituent;

m represents an integer of 0 to 4;

n represents an integer of 1 to 5;

m+n is 5 or less;

in the case where m is 2 or more, plural Y's may be the same as or different from each other;

in the case where n is 2 or more, plural $R_2$'s, $R_3$'s, and Z's may be the same as or different from each other; and any two or more of Y, $R_2$, $R_3$ and Z may be bonded to each other to form a ring structure.

[2] The resin composition as described in [1], in which the repeating unit (Q) represented by the general formula (1) is represented by the following general formula (2) or (3):

[Chem. 2]

(2)

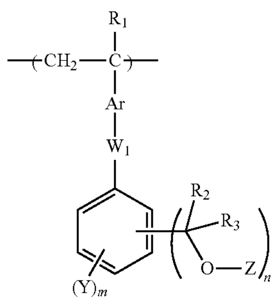

(3)

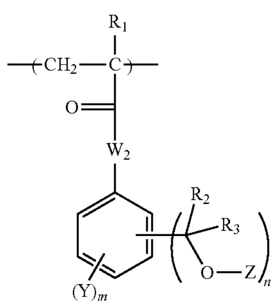

wherein $R_1$, $R_2$, $R_3$, Y, Z, m, and n are as defined in the general formula (1);

Ar represents an aromatic ring; and $W_1$ and $W_2$ represent a divalent linking group or a single bond.

[3] The resin composition as described in [1] or [2], in which n described in the general formula (1) to (3) is an integer of 2 to 4.

[4] The resin composition as described in any one of [1] to [3], in which the polymer compound (A) further contains a repeating unit (P) represented by the following general formula (4) (provided that a repeating unit corresponding to the repeating unit (Q) is excluded):

[Chem. 3]

(4)

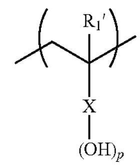

wherein $R_1'$ represents a hydrogen atom, a methyl group, or a halogen atom;

X represents a (p+1)-valent linking group or a single bond; and p represents an integer of 1 or more.

[5] The resin composition as described in [4], in which the repeating unit (P) represented by the general formula (4) is represented by the following general formula (5) or (6):

[Chem. 3]

(5)

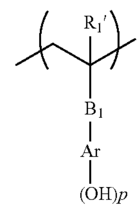

(6)

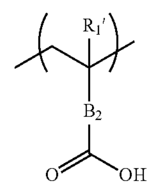

wherein $R_1'$ and p are as defined in the general formula (4);

$B_1$ and $B_2$ represent a divalent linking group or a single bond; and

Ar represents an aromatic ring.

[6] The resin composition as described in any one of [1] to [5], further including a compound (B) capable of generating an acid by irradiation with actinic rays or radiation.

[7] The resin composition as described in [6], in which the compound (B) is an onium compound, and the acid that the compound (B) generates by the irradiation with actinic rays or radiation has a volume of 130 Å$^3$ or more.

[8] The resin composition as described in any one of [1] to [7], in which the dispersity of the polymer compound (A) is from 1.0 to 1.20.

[9] The resin composition as described in any one of [1] to [8], further including a compound (C) as a cross-linking agent.

[10] The resin composition as described in any one of [1] to [9], which is a chemical amplification type resist composition.

[11] An actinic ray-sensitive or radiation-sensitive film including the resin composition as described in any one of [1] to [10].

[12] A pattern forming method including irradiating the actinic ray-sensitive or radiation-sensitive film as described in [11] with actinic rays or radiation, and developing the film irradiated with the actinic rays or radiation.

[13] Mask blanks having the actinic ray-sensitive or radiation-sensitive film as described in [11] on a surface thereof.

[14] A pattern forming method including: irradiating the mask blanks having an actinic ray-sensitive or radiation-sensitive film formed on a surface thereof with actinic rays or radiation, and developing the mask blanks irradiated with actinic rays or radiation.

[15] The pattern forming method as described in [12] or [14], in which the irradiation with the actinic rays or radiation is carried out using an electron beam or extreme ultraviolet rays.

[16] A method for manufacturing an electronic device, including the pattern forming method as described in any one of [12], [14], and [15].

[17] An electronic device manufactured by the method for manufacturing an electronic device as described in [16].

[18] A polymer compound containing two kinds of repeating units represented by the following general formula (I) or two kinds of repeating units represented by the following general formula (II):

[Chem. 5]

(I)

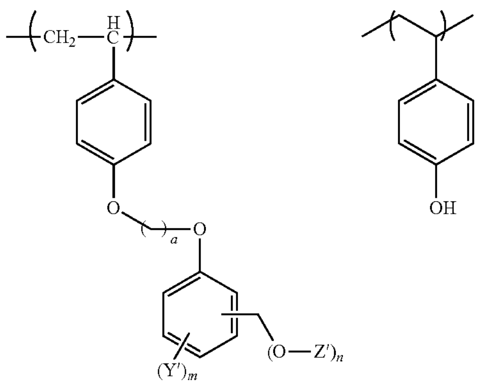

(II)

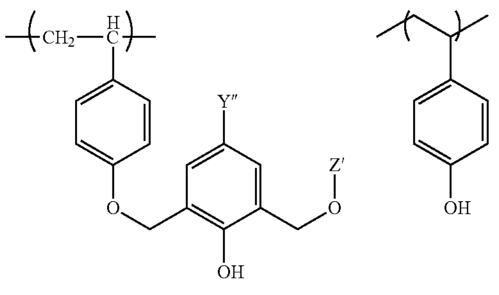

wherein

Y' represents an alkyl group, a cycloalkyl group, or an aryl group;

Y" represents a hydrogen atom, an alkyl group, a cycloalkyl group, or an aryl group;

Z' represents a hydrogen atom, an alkyl group, or a cycloalkyl group;

m is 0 or 1;

n represents an integer of 1 to 3; and a represents an integer of 2 to 6.

According to the present invention, it is possible to provide a resin composition capable of forming a pattern satisfying high sensitivity, high resolution properties (for example, a high resolution, an excellent pattern shape, and a small line edge roughness (LER)) and good dry etching resistance, and an actinic ray-sensitive or radiation-sensitive film, mask blanks having the film, and a pattern forming method, each using the same can be provided.

DESCRIPTION OF THE PREFERRED EMBODIMENTS

Figure 1:
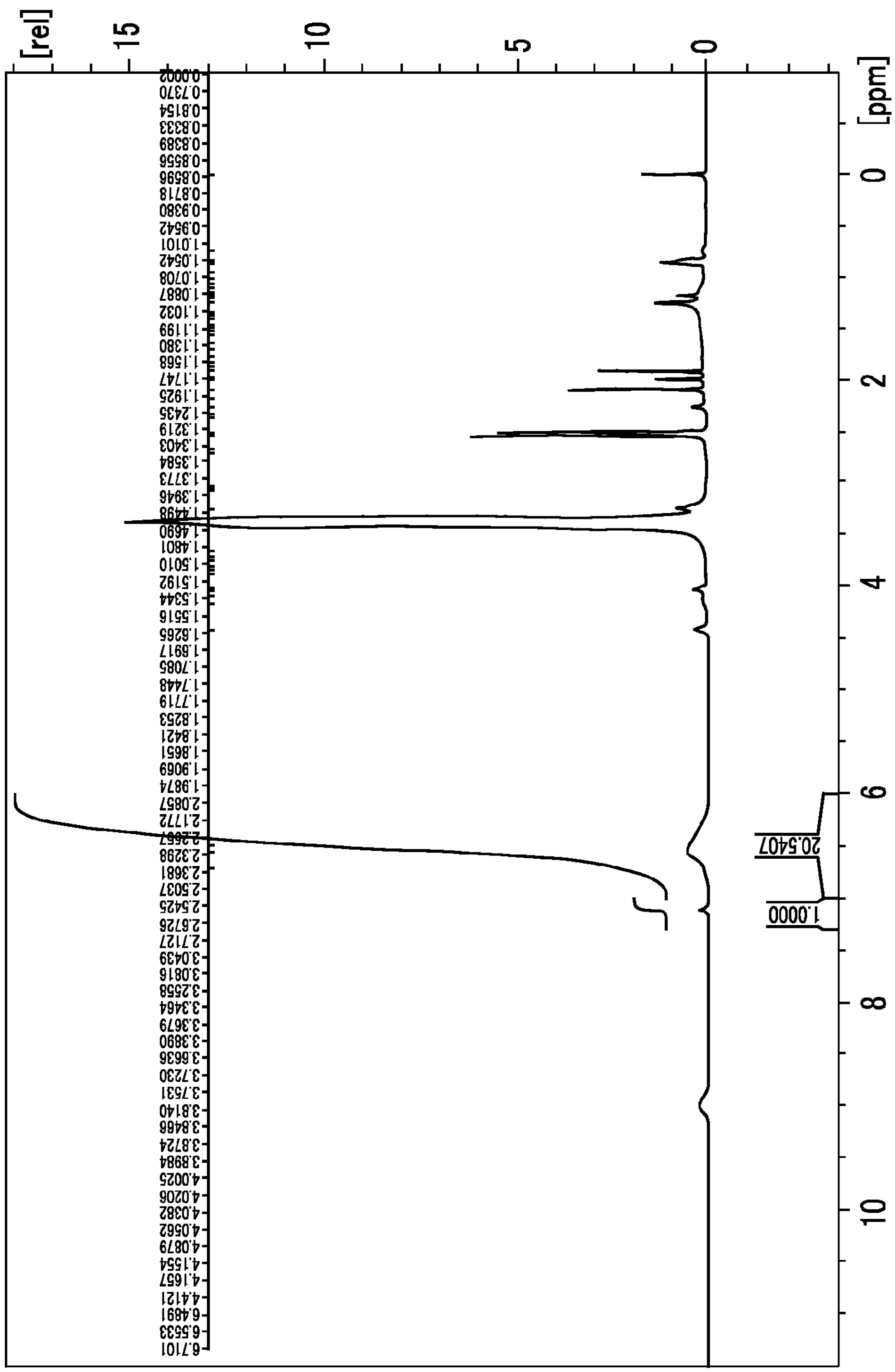
FIG. 1 is a view showing a $^{1}$H-NMR spectrum of the polymer compound (A1) obtained in Synthesis Example 1.

Hereinbelow, the present invention will be described in detail.

In the expressions of a group and an atom group in the present specification, when the group and the atomic group are described without specifying whether substituted or unsubstituted, a group includes both a group and an atomic group, each having no substituent, and a group and an atomic group, each having a substituent. For example, the "alkyl group" which is described without specifying whether substituted or unsubstituted includes not only an alkyl group having no substituent (unsubstituted alkyl group) but also an alkyl group having a substituent (substituted alkyl group).

The "actinic rays" or "radiation" in the present invention refers to, for example, a bright line spectrum of a mercury lamp or the like, far ultraviolet rays typified by an excimer laser, extreme-ultraviolet (EUV) rays, X rays, and particle beams such as an electron beam and an ion beam. Further, the "light" in the present invention means actinic rays or radiation.

Furthermore, unless otherwise specifically indicated, the "exposure" as used in the present invention includes not only exposure to a mercury lamp, far ultraviolet rays typified by an excimer laser, X rays, extreme-ultraviolet (EUV) rays, or the like, but also lithography with a particle beam such as an electron beam and an ion beam.

<Resin Composition>

The resin composition of the present invention (which will be hereinafter also referred to as the "composition of the present invention") includes a [1] a polymer compound (A) containing the repeating unit (Q) represented by the general formula (1) as described later (which will be hereinafter also referred to as the "compound (A)").

In one embodiment, the composition of the present invention is a chemical amplification type resist composition. The composition of the present invention may be used for forming a so-called negative tone pattern, and may also be used for forming a positive tone pattern. In one embodiment, the composition of the present invention is a composition which is suitably used for exposure with an electron beam or extreme ultraviolet rays.

Since the repeating unit (Q) has a cross-linking group in the molecule unit, the cross-linking reactivity is high, as compared with a common system in which a resin and a cross-linking agent are used in combination. Therefore, when the resin composition of the present invention is used for forming a pattern, a hard film can be formed, and thus, acid diffusion and dry etching resistance can be controlled. As a result, since the diffusibility of acid at the areas exposed to actinic rays or radiation such as an electron beam or extreme ultraviolet rays is significantly suppressed, the resolution, pattern shape and LER in fine patterns are excellent. Further, in the repeating unit (Q) represented by the general formula (1), the reaction point of the resin is close to the reaction point of the cross-linking group. Therefore, the composition of the present invention becomes a composition having improved sensitivity in forming a pattern by incorporating a polymer compound containing the repeating unit (Q).

The effect of increasing the glass transition temperature (Tg) by the polymer compound (A) is larger when the polymer compound (A) is used in a negative tone resist composition for forming a negative tone pattern rather than when the polymer compound (A) is used in a positive tone resist composition for forming a positive tone pattern. Therefore, the resin composition according to the present invention is preferably a negative tone composition.

Examples of the component included in the composition according to the present invention include [2] a compound (X) containing a phenolic hydroxyl group, [3] a compound (B) capable of generating an acid by irradiation with actinic rays or radiation, [4] a compound (C) as a cross-linking agent, [5] a basic compound, [6] a surfactant, [7] an organic carboxylic acid, [8] a carboxylic acid onium salt, and [9] a solvent. The composition of the present invention can be used for forming a pattern according to, for example, the method described later as a "pattern forming method".

Hereinafter, the respective components described above will be sequentially described in detail.

[1] Polymer Compound (A)

(a) Repeating Unit (Q)

The polymer compound (A) contains a repeating unit (Q) represented by the following general formula (1). The repeating unit (Q) is a structure containing at least one methylol group which may have a substituent.

Herein, the "methylol group" is a group represented by the following general formula (M), and in one embodiment of the present invention, it is preferably a hydroxymethyl group or an alkoxymethyl group:

[Chem. 6]

(M)

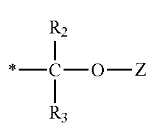

wherein $R_2$, $R_3$ and Z have the same definitions as in the general formula (1) as described later.

First, the general formula (1) will be described.

[Chem. 7]

(1)

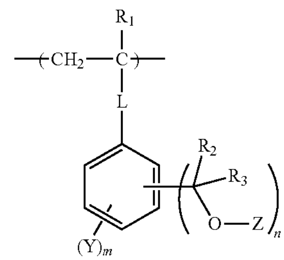

In the general formula (1), $R_1$ represents a hydrogen atom, a methyl group, or a halogen atom.

$R_2$ and $R_3$ represent a hydrogen atom, an alkyl group, or a cycloalkyl group.

L represents a divalent linking group or a single bond.

Y represents a substituent excluding a methylol group.

Z represents a hydrogen atom or substituent.

m represents an integer of 0 to 4.

n represents an integer of 1 to 5.

m+n is 5 or less.

In the case where m is 2 or more, plural Y's may be the same as or different from each other.

In the case where n is 2 or more, plural $R_2$'s, $R_3$'s, and Z's may be the same as or different from each other.

Furthermore, any two or more of Y, $R_2$, $R_3$ and Z may be bonded to each other to form a ring structure. Herein, the expression "any two or more of Y, $R_2$, $R_3$ and Z may be bonded to each other to form a ring structure" means that in the case where there are plural groups represented by the same symbols, the groups represented by the same symbols may be bonded to each other to form a ring structure, or the groups represented by different symbols may be bonded to each other to form a ring.

The methyl group represented by $R_1$ may have a substituent, and examples of the substituent include halogen atoms such as a fluorine atom, a chlorine atom, a bromine atom, and an iodine atom, a hydroxyl group, and an isopropyl group. Examples of the methyl group which may have a substituent include a methyl group, a trifluoromethyl group, and a hydroxymethyl group. Examples of the halogen atom of $R_1$ include fluorine, chlorine, bromine, and iodine.

$R_1$ is preferably a hydrogen atom or methyl group.

Examples of the alkyl group represented by $R_2$ and $R_3$ include a linear or branched alkyl group having 1 to 10 carbon atoms, and examples of the cycloalkyl group include a cycloalkyl group having 3 to 10 carbon atoms, and specifically a hydrogen atom, a methyl group, a cyclohexyl group, and a t-butyl group. The alkyl group and cycloalkyl group herein may have a substituent. Examples of the substituent include the same ones described later as the substituent contained in the monovalent substituent of Y.

Examples of the divalent linking group represented by L include a monocyclic or polycyclic aromatic ring having 6 to 18 carbon atoms, —C(═O)—, —O—C(═O)—, $—CH_2—O—C(═O)—$, a thiocarbonyl group, a linear or branched alkylene group (preferably having 1 to 10 carbon atoms, and more preferably having 1 to 6 carbon atoms), a linear or branched alkenylene group (preferably having 2 to 10 carbon atoms, and more preferably having 2 to 6 carbon atoms), a cycloalkylene group (preferably having 3 to 10 carbon atoms, and more preferably 3 to 6 carbon atoms), a sulfonyl group, —O—, —NH—, —S—, a cyclic lactone structure, or a divalent linking group formed by a combination thereof (preferably having 1 to 50 carbon atoms in total, more preferably having 1 to 30 carbon atoms in total, and even more preferably having 1 to 20 carbon atoms in total).

Preferable examples of the aromatic ring in L of the general formula (1) include aromatic hydrocarbon rings having a substituent which may include 6 to 18 carbon atoms, such as a benzene ring, a naphthalene ring, an anthracene ring, a fluorene ring, and a phenanthrene ring; and aromatic heterocyclic rings containing heterocyclic rings such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among them, a benzene ring and a naphthalene ring are preferred from the viewpoint of resolution properties, and a benzene ring is most preferred.

The divalent linking group represented by L may have a substituent, and examples of the substituent include the same ones described later as the substituent contained in the monovalent substituent represented by Y.

Preferable examples of the monovalent substituent represented by Y include an alkyl group (which may be either linear or branched, and preferably has 1 to 12 carbon atoms), an alkenyl group (preferably having 2 to 12 carbon atoms), an alkynyl group (preferably having 2 to 12 carbon atoms), a cycloalkyl group (which may be either monocyclic or polycyclic and preferably has 3 to 12 carbon atoms), an aryl group (preferably having 6 to 18 carbon atoms), a hydroxy group, an alkoxy group, an ester group, an amido group, a urethane group, an ureido group, a thioether group, a sulfonamide group, a halogen atom, a haloalkyl group, and a sulfonic acid ester group. More preferable examples thereof include an alkyl group, a cycloalkyl group, a halogen atom, a haloalkyl group, a hydroxy group, an alkoxy group, an aryloxy group, an ester group, and an aryl group, and more preferable examples thereof include an alkyl group, a halogen atom, a hydroxy group, and an alkoxy group.

The monovalent substituent of Y may further have a substituent, and examples of the substituent include a hydroxyl group, a halogen atom (for example, a fluorine atom), an alkyl group, a cycloalkyl group, an alkoxy group, a carboxylic group, an alkoxycarbonyl group, an aryl group, and an alkoxyalkyl group, and a group formed by a combination thereof, preferably having 8 or less carbon atoms.

In addition, when m is 2 or more, plural Y's may be bonded to each other via a single bond or a linking group to form a ring structure. Examples of the linking group in this case include an ether bond, a thioether bond, an ester bond, an amide bond, a carbonyl group, and an alkylene group.

Examples of the halogen atom include the same those as mentioned for $R_1$.

Examples of the haloalkyl group include alkyl groups having 1 to 12 carbon atoms, and cycloalkyl groups, with at least 1 or more hydrogen atoms substituted with a fluorine atom, a chlorine atom, a bromine atom, and an iodine atom. Specific examples thereof include a fluoromethyl group, a trifluoromethyl group, a pentafluoroethyl group, a heptafluoropropyl group, and an undecafluorocyclohexyl group.

Examples of the monovalent substituent represented by Z include an alkyl group (which may be either linear or branched, and preferably has 1 to 12 carbon atoms), an alkenyl group (preferably having 2 to 12 carbon atoms), an alkynyl group (preferably having 2 to 12 carbon atoms), a cycloalkyl group (preferably having 3 to 8 carbon atoms), an aryl group (which may be either linear or branched, and preferably has 6 to 18 carbon atoms), a haloalkyl group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthio group, an arylthio group, an alkoxyalkyl group and a heterocyclic group. Preferable examples thereof include a hydrogen atom, an alkyl group, a cycloalkyl group, an alkanoyl group, an alkenyl group, a haloalkyl group, and an alkoxyalkyl group.

Preferable examples of the haloalkyl group include the same as mentioned for Y in the general formula (1).

The alkanoyl group is preferably an alkanoyl group having 2 to 20 carbon atoms, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having 2 to 20 carbon atoms, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Examples of the aryloxycarbonyl group include aryloxycarbonyl groups having 7 to 30 carbon atoms, for example, a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The alkylsulfonyloxy group is preferably an alkylsulfonyloxy group having 1 to 20 carbon atoms, and examples thereof include a methylsulfonyloxy group, an ethylsulfonyloxy group, a propylsulfonyloxy group, an isopropylsulfonyloxy group, a butylsulfonyloxy group, a hexylsulfonyloxy group, a cyclohexylsulfonyloxy group, an octylsulfonyloxy group, a 2-ethylhexylsulfonyloxy group, a decanylsulfonyloxy group, a dodecanylsulfonyloxy group, an octadecanylsulfonyloxy group, a cyanomethylsulfonyloxy group, a methoxymethylsulfonyloxy group, and a perfluoroalkylsulfonyloxy group.

The arylsulfonyloxy group is preferably an arylsulfonyloxy group having 6 to 30 carbon atoms, and examples thereof include a phenylsulfonyloxy group, a 1-naphthylsulfonyloxy group, a 2-naphthylsulfonyloxy group, a 2-chlorophenylsulfonyloxy group, a 2-methylphenylsulfonyloxy group, a 2-methoxyphenylsulfonyloxy group, a 2-butoxyphenylsulfonyloxy group, a 3-chlorophenylsulfonyloxy group, a 3-trifluoromethylphenylsulfonyloxy group, a 3-cyanophenylsulfonyloxy group, a 3-nitrophenylsulfonyloxy group, a 4-fluorophenylsulfonyloxy group, a 4-cyanophenylsulfonyloxy group, a 4-methoxyphenylsulfonyloxy group, a 4-methylsulfanylphenylsulfonyloxy group, a 4-phenylsulfanylphenylsulfonyloxy group, and a 4-dimethylaminophenylsulfonyloxy group.

The alkylsulfonyl group is preferably an alkylsulfonyl group having 1 to 20 carbon atoms, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanylsulfonyl group, a dodecanylsulfonyl group, an octadecanylsulfonyl group, a cyanomethylsulfonyl group, a methoxymethylsulfonyl group, and a perfluoroalkylsulfonyl group.

The arylsulfonyl group is preferably an arylsulfonyl group having 6 to 30 carbon atoms, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

Examples of the alkylthio group include alkylthio groups having 1 to 30 carbon atoms, for example, a methylthio group, an ethylthio group, a propylthio group, an n-butylthio group, a trifluoromethylthio group, a hexylthio group, a t-butylthio group, a 2-ethylhexylthio group, a cyclohexylthio group, a decylthio group, and a dodecylthio group.

Examples of the arylthio group include arylthio groups having 6 to 30 carbon atoms, for example, a phenylthio group, a 1-naphthylthio group, a 2-naphthylthio group, a tolylthio group, a methoxyphenylthio group, a naphthylthio group, a chlorophenylthio group, a trifluoromethylphenylthio group, a cyanophenylthio group, and a nitrophenylthio group.

Preferable examples of the heterocyclic group include aromatic or aliphatic heterocyclic groups containing a nitrogen atom, an oxygen atom, a sulfur atom, or a phosphorous atom, for example, a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolidinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a tetrahydropyriminidyl group, a tetrahydro-2-pyrimidinonyl group, a triazinyl group, a morpholinyl group, and a thioxanthryl group.

n preferably represents an integer of 1 to 4, more preferably an integer of 2 to 4, and particularly preferably 2 or 3. m is preferably 0 or 1.

Moreover, the repeating unit (Q) represented by the general formula (1) is preferably represented by the following general formula (2) or (3).

[Chem. 8]

(2)

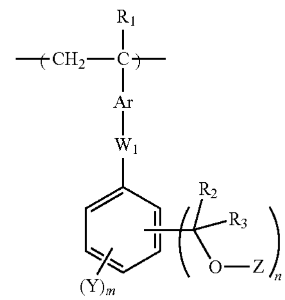

(3)

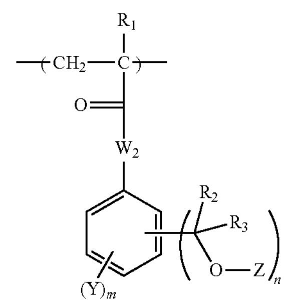

In the general formulae (2) and (3), $R_1$, $R_2$, $R_3$, Y, Z, m, and n are as defined in the general formula (1).

Ar represents an aromatic ring.

$W_1$ and $W_2$ represent a divalent linking group or a single bond.

Specific examples of $R_1$, $R_2$, $R_3$, Y, Z, m, and n include the same as mentioned in the general formula (1), respectively, and the preferred ranges thereof are also the same.

Specific examples of the aromatic ring represented by Ar include the same as the specific examples in the case where L in the general formula (1) is an aromatic ring, and the preferred ranges thereof are also the same.

Examples of the divalent linking group represented by $W_1$ and $W_2$ include a monocyclic or polycyclic aromatic hydrocarbon ring which may have a substituent having 6 to 18 carbon atoms, —C(═O)—, —O—C(═O)—, —$CH_2$—O—C(═O)—, a thiocarbonyl group, a linear or branched alkylene group (preferably having 1 to 10 carbon atoms, and more preferably having 1 to 6 carbon atoms), a linear or branched alkenylene group (preferably having 2 to 10 carbon atoms, and more preferably having 2 to 6 carbon atoms), a cycloalkylene group (preferably having 3 to 10 carbon atoms, and more preferably having 5 to 10 carbon atoms), a sulfonyl group, —O—, —NH—, —S—, a cyclic lactone structure, or a divalent linking group formed by a combination thereof.

Furthermore, the repeating unit (Q) represented by the general formula (1) is more preferably represented by the following general formulae (2') or (3').

[Chem. 9]

(2')

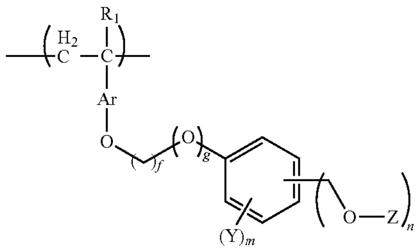

(3')

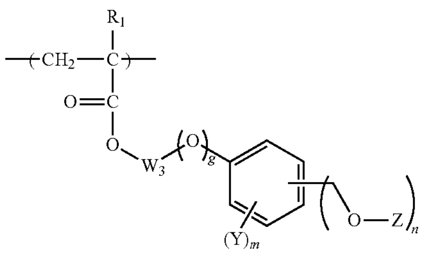

In the general formulae (2') and (3'), $R_1$, Y, Z, m, and n have the same definitions as the groups in the general formula (1), respectively, and specific examples and the preferred ranges thereof are also the same. Ar in the general formula (2') has the same definition as Ar in the general formula (2), and the preferred ranges thereof are also the same.

$W_3$ in the general formula (3') is a divalent linking group. Examples of the divalent linking group represented by $W_3$ include a monocyclic or polycyclic aromatic hydrocarbon ring which may have a substituent having 6 to 18 carbon atoms, —C(═O)—, a linear or branched alkylene group (preferably having 1 to 10 carbon atoms, and more preferably having 1 to 6 carbon atoms), a cycloalkylene group (preferably having 3 to 10 carbon atoms, and more preferably having 5 to 10 carbon atoms), —O—, a cyclic lactone structure, or a divalent linking group formed by a combination thereof.

In the general formulae (2') and (3'), f is an integer of 0 to 6, preferably an integer of 0 to 3, and more preferably an integer of 1 to 3.

In the general formulae (2') and (3'), g is 0 or 1.

Furthermore, the general formula (2') is particularly preferably represented by any one of the following general formulae (1-a) to (1-c). The repeating unit (Q) is particularly preferably a repeating unit represented by any one of the following general formulae (1-a) to (1-c), or a repeating unit represented by the general formula (3').

[Chem. 10]

(1-a)

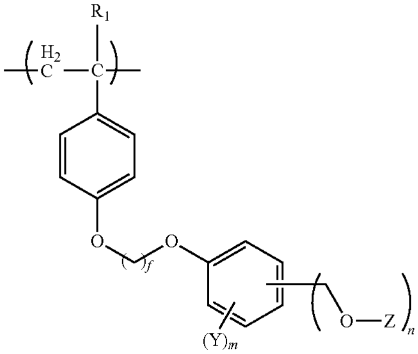

-continued (1-b)

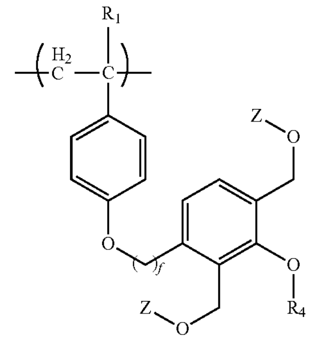

(1-c)

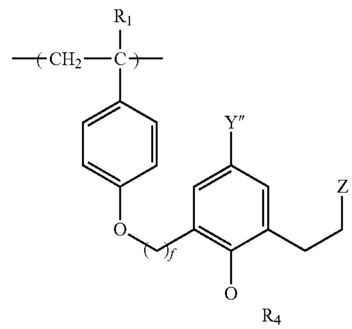

$R_1$, Y, and Z in the general formulae (1-a) to (1-c) have the same definitions as the groups in the general formula (1), respectively, and the specific examples and the preferred ranges thereof are also the same.

In the general formulae (1-b) to (1-c),

Y" represents a hydrogen atom or a monovalent substituent. Examples of the monovalent substituent include the same as the monovalent substituent represented by Y as described above. However, Y" may be a methylol group.

$R_4$ represents a hydrogen atom or a monovalent substituent. Specific examples of the monovalent substituent include the same as those in the case where Z in the general formula (1) is a monovalent substituent.

f is an integer of 1 to 6. The preferred range thereof is as mentioned in the general formulae (2') and (3').

m is 0 or 1 and n is an integer of 1 to 3.

In the general formulae (1-b) and (1-c), examples of $R_4$ include a hydrogen atom, an alkyl group (which may be either linear or branched and preferably has 1 to 12 carbon atoms), an alkenyl group (preferably having 2 to 12 carbon atoms), an alkynyl group (preferably having 2 to 12 carbon atoms), a cycloalkyl group (preferably having 3 to 8 carbon atoms), an aryl group (which may be either monocyclic or polycyclic and preferably has 6 to 18 carbon atoms), a haloalkyl group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthio group, an arylthio group, and a heterocyclic group. Preferable examples thereof include a hydrogen atom, an alkyl group, a cycloalkyl group, and an alkanoyl group.

Specific examples of the haloalkyl group, the alkanoyl group, the alkoxycarbonyl group, the aryloxycarbonyl group, the alkylsulfonyloxy group, the arylsulfonyloxy group, the alkylsulfonyl group, the arylsulfonyl group, the cyano group, the alkylthio group, the arylthio group, and the heterocyclic group are the same as in the general formula (1), and the preferred ranges thereof are also the same.

The content of the repeating units (Q) is preferably from 5% by mole to 50% by mole, and more preferably from 10% by mole to 40% by mole, based on the entire repeating units included in the polymer compound (A) from the viewpoints of cross-linking efficiency and developability.

Specific examples of the repeating unit (Q) include the following structures.

[Chem. 11-1]

(Q-1)

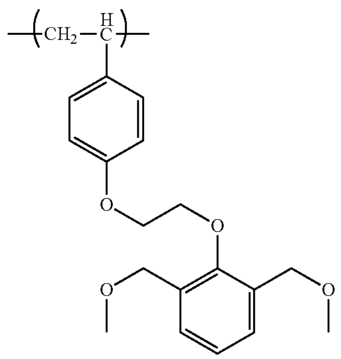

(Q-2)

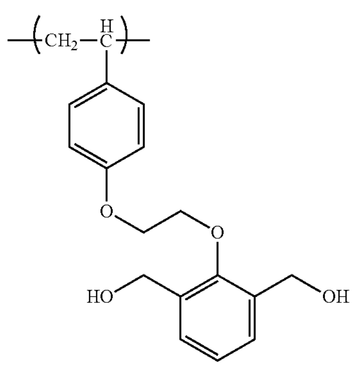

(Q-3)

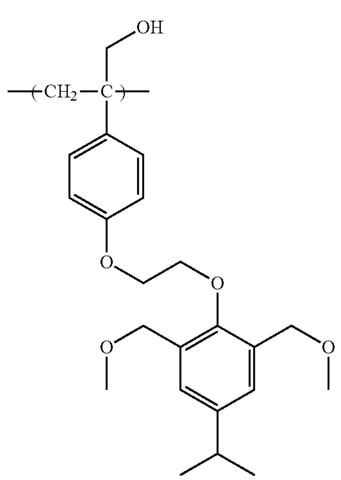

-continued (Q-4)

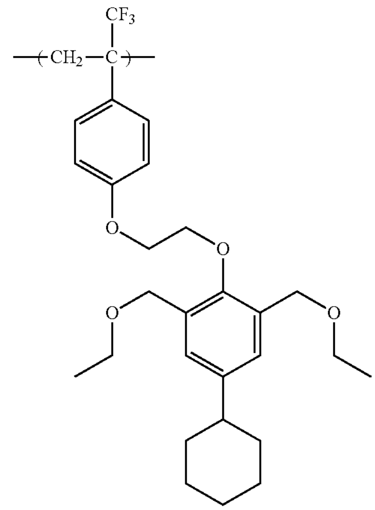

(Q-5)

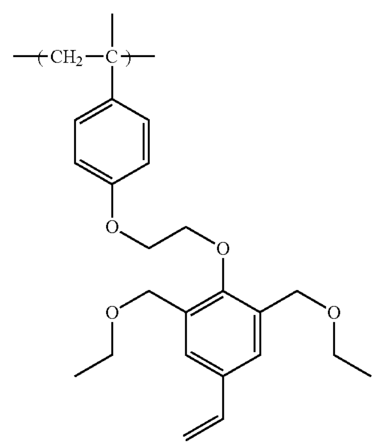

(Q-6)

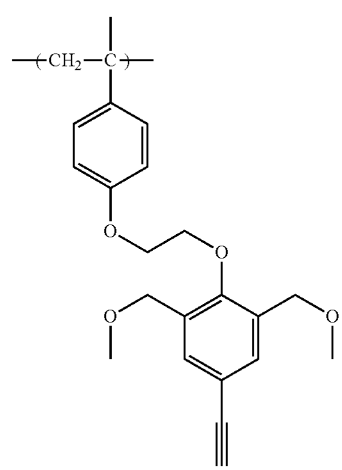

-continued
(Q-7)
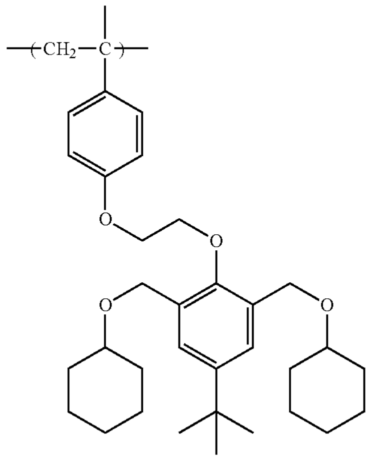
(Q-8)\
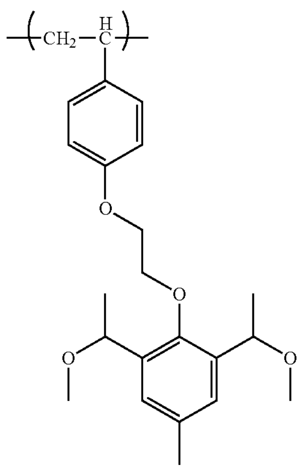
(Q-9)
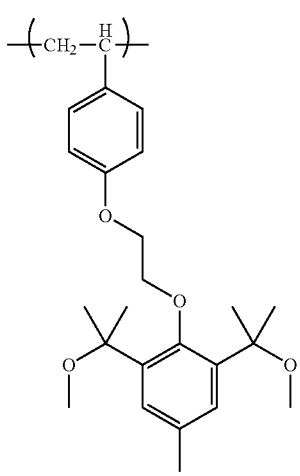
-continued
(Q-10)
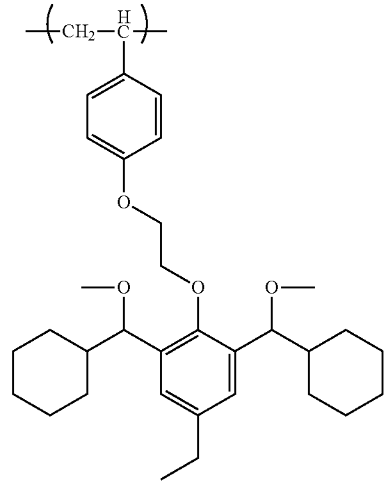
(Q-11)
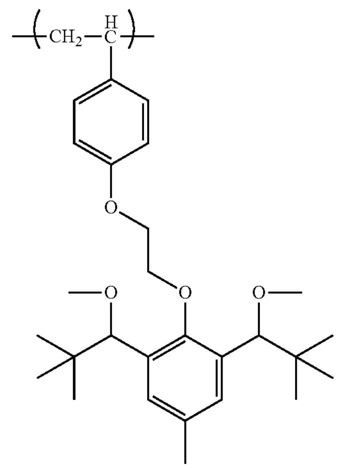
(Q-12)
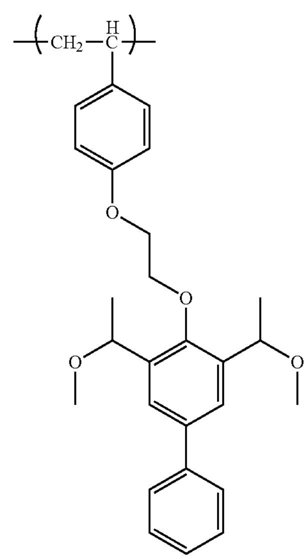

(Q-13)
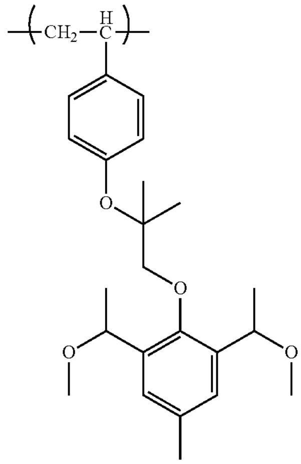
(Q-14)
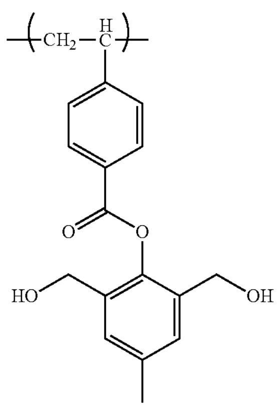
(Q-15)
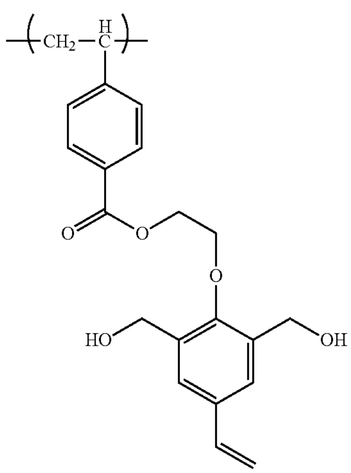
[Chem. 11-2]
(Q-16)
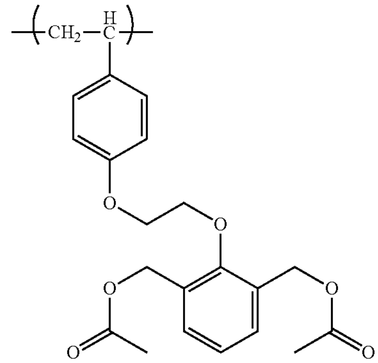
(Q-17)
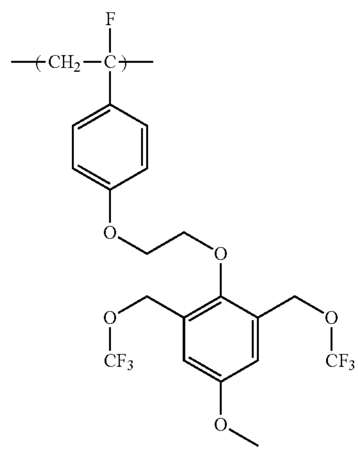
(Q-18)
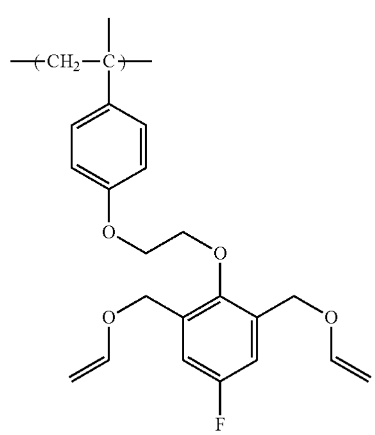

-continued
(Q-19)
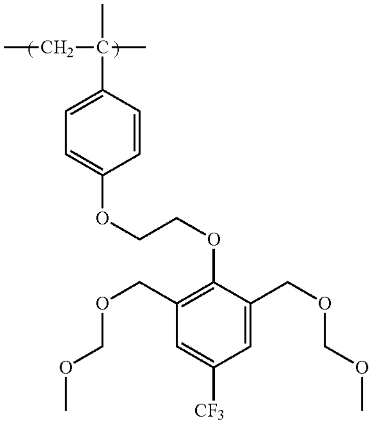
(Q-20)
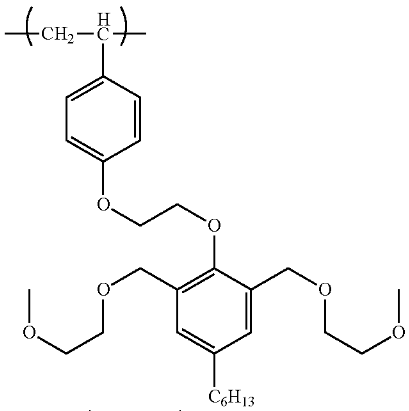
(Q-21)
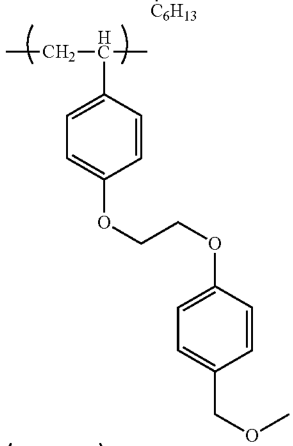
(Q-22)
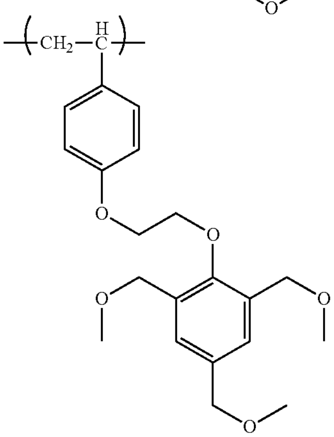
-continued
(Q-23)
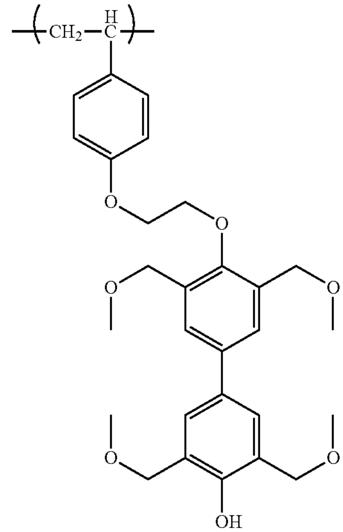
(Q-24)
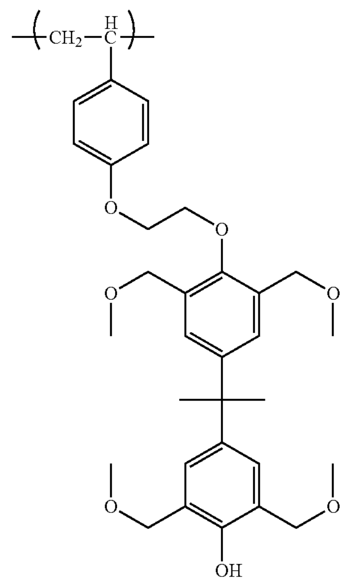
(Q-25)
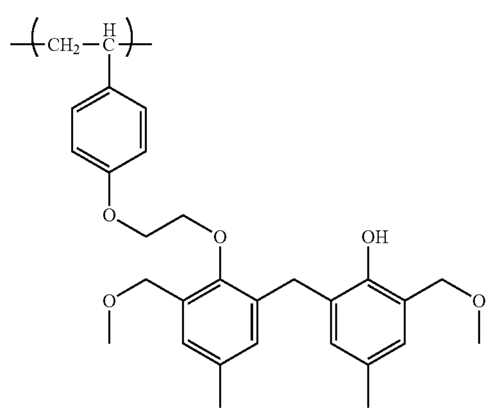

-continued
(Q-26)
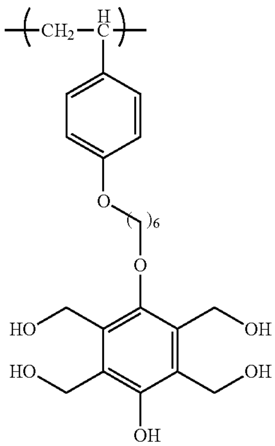
(Q-27)
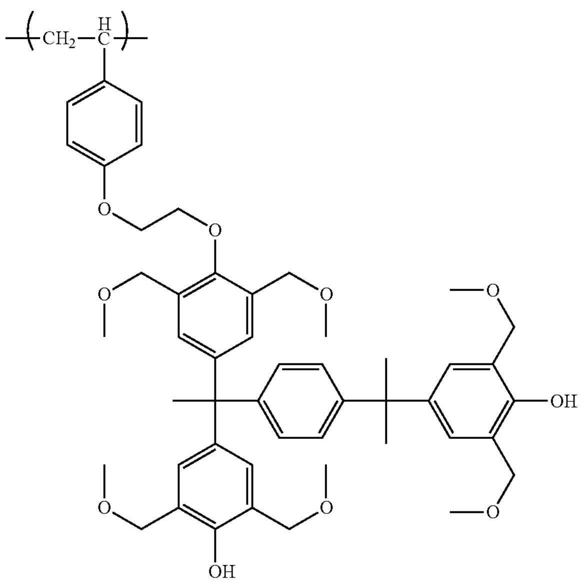
(Q-28)
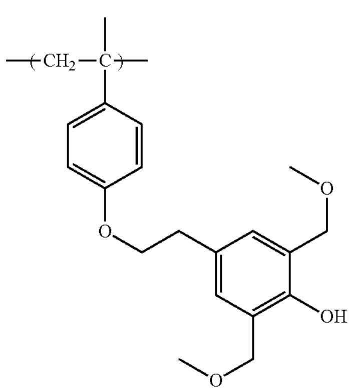
-continued
(Q-29)
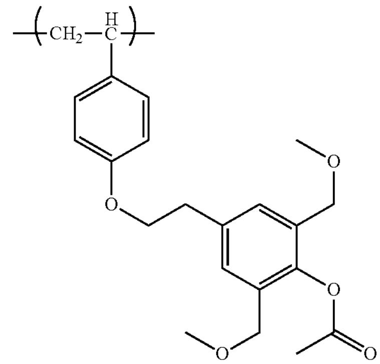
[Chem. 11-3]
(Q-30)
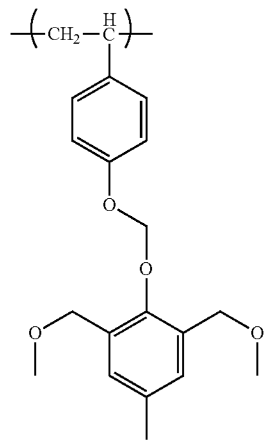
(Q-31)
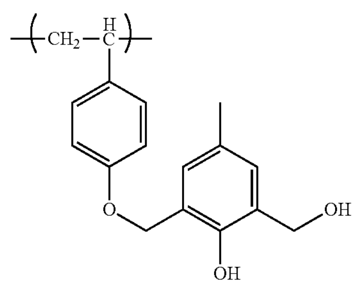
(Q-32)
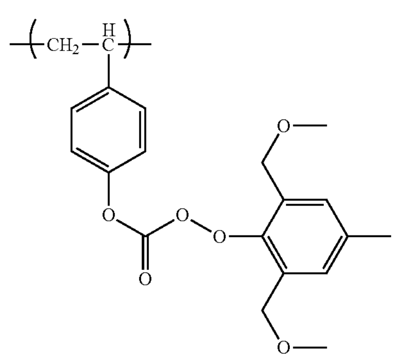

-continued
(Q-33)
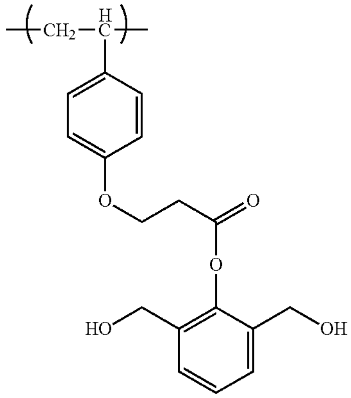
(Q-34)
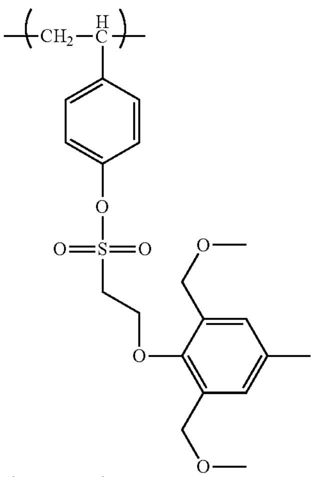
(Q-35)
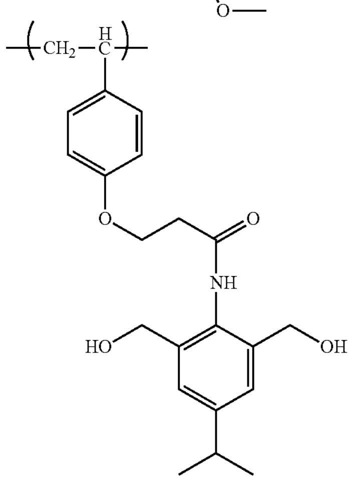
(Q-36)
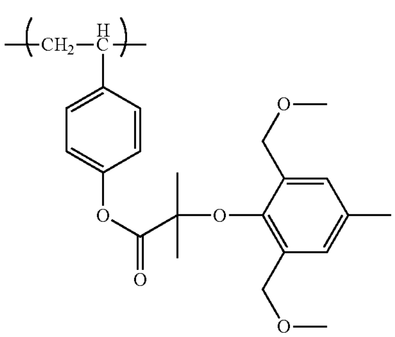
-continued
(Q-37)
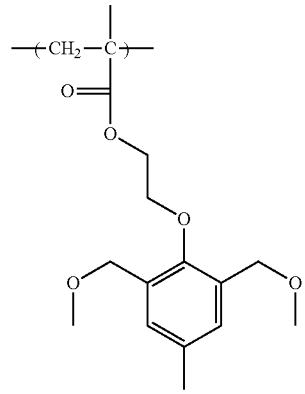
(Q-38)
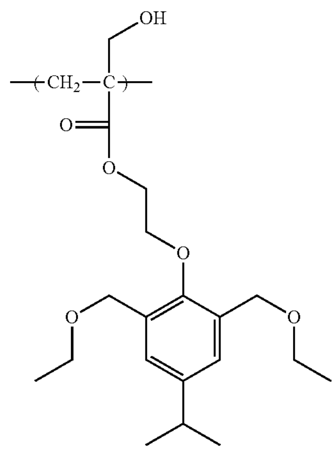
(Q-39)
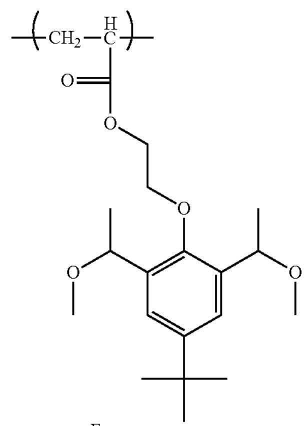
(Q-40)
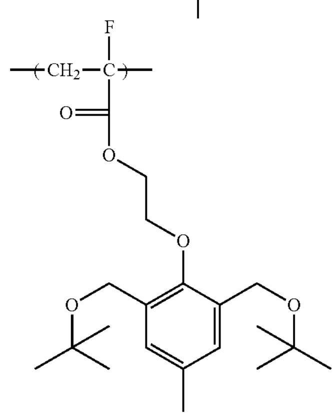

-continued
(Q-41)
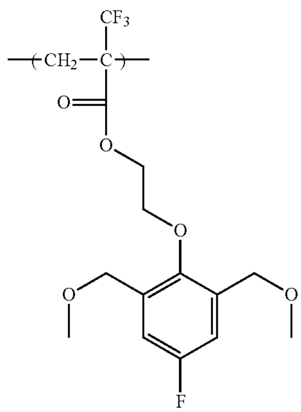
(Q-42)
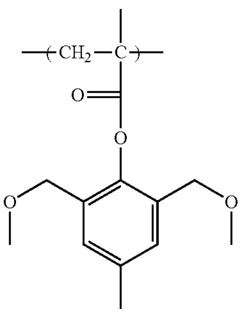
(Q-43)
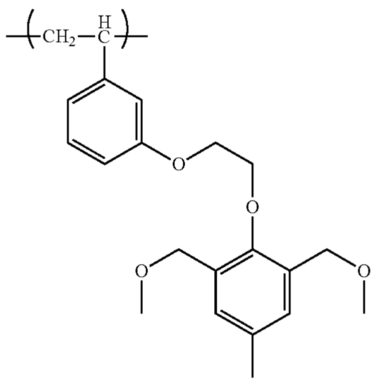
(Q-44)
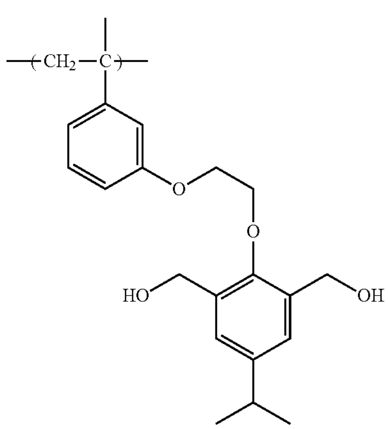
-continued
[Chem. 11-4]
(Q-45)
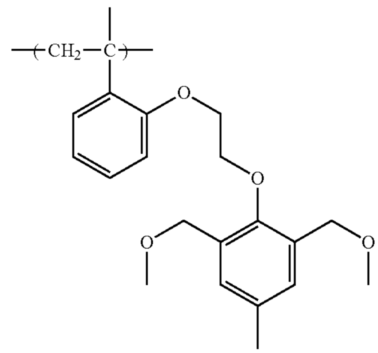
(Q-46)
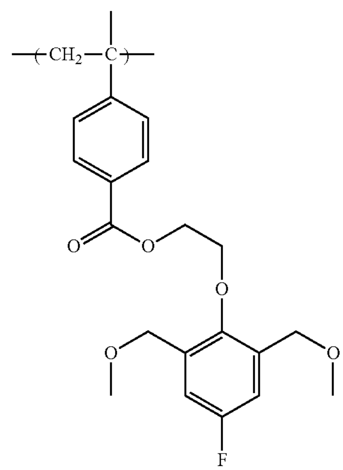
(Q-47)
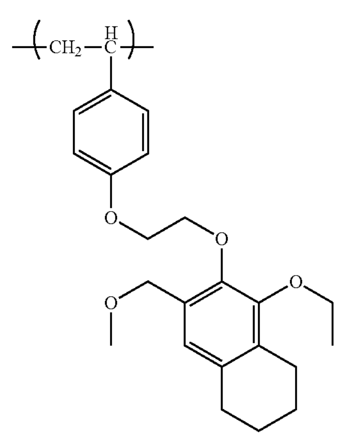

(Q-48)
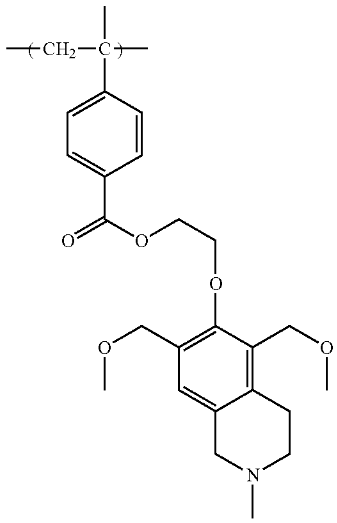
(Q-49)
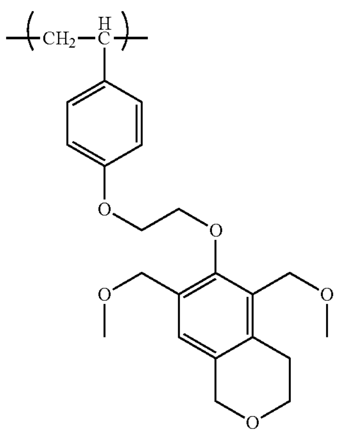
(Q-50)
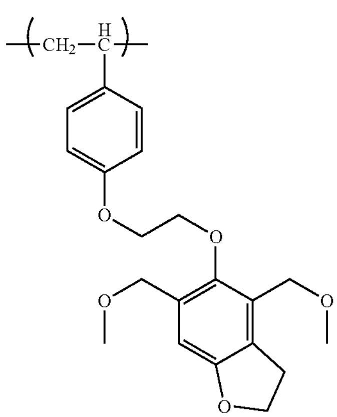
(Q-51)
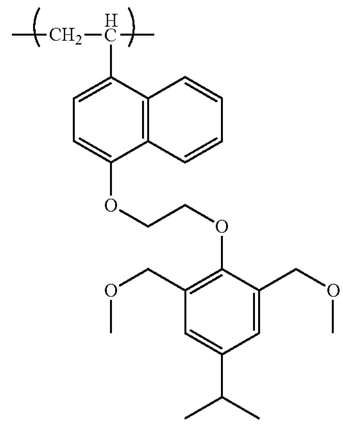
(Q-52)
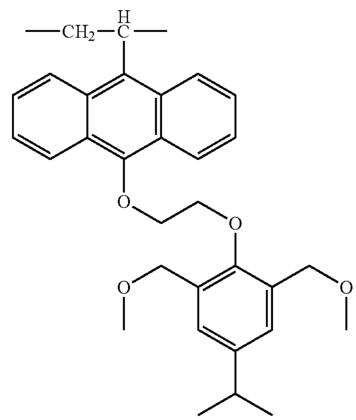
(Q-53)
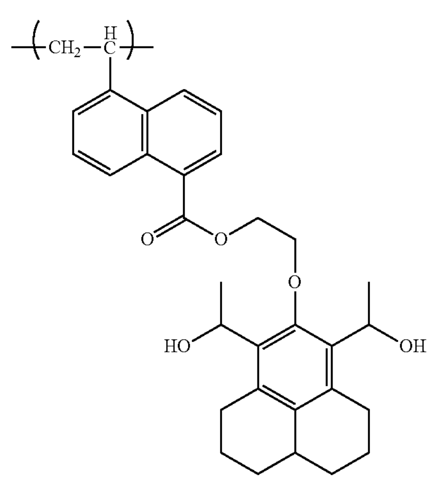

-continued
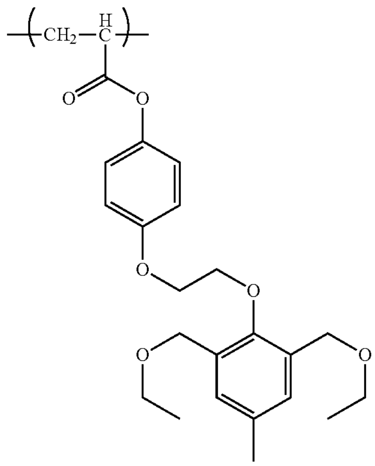
(Q-54)
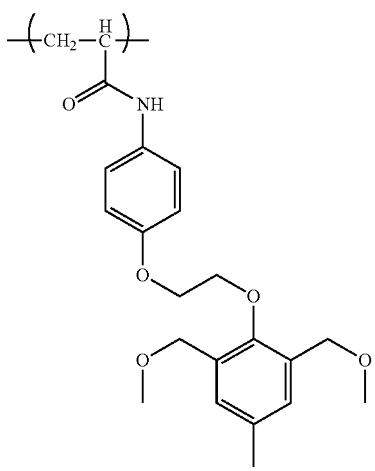
(Q-55)
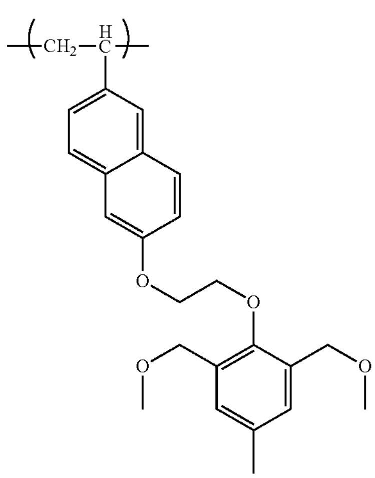
(Q-56)
-continued
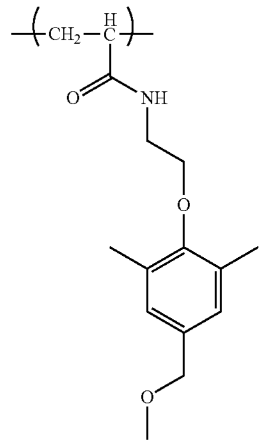
(Q-57)
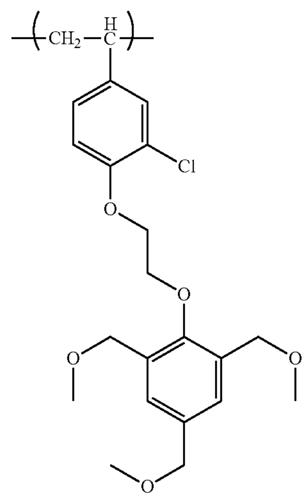
(Q-58)
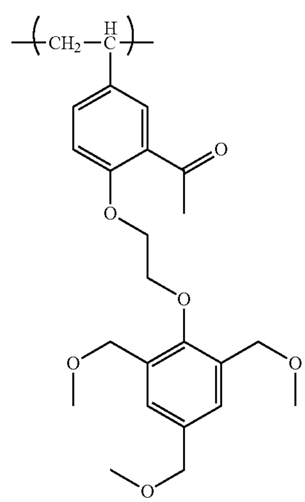
(Q-59)

-continued
(Q-60)
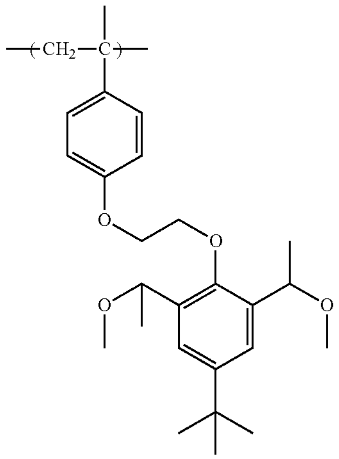
[Chem. 11-5]
(Q-61)
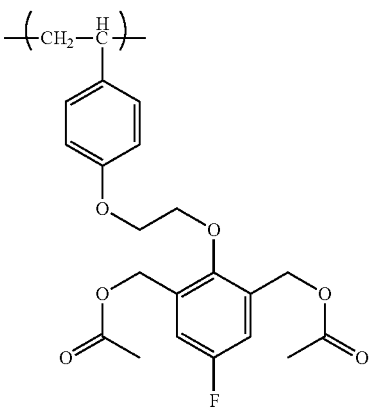
(Q-62)
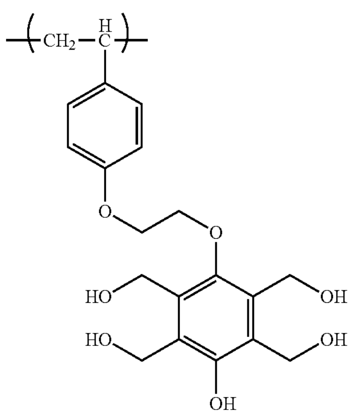
-continued
(Q-63)
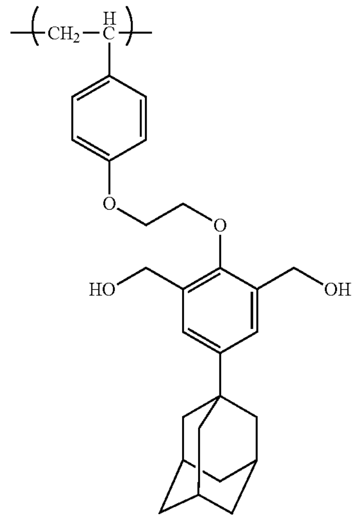
(Q-64)
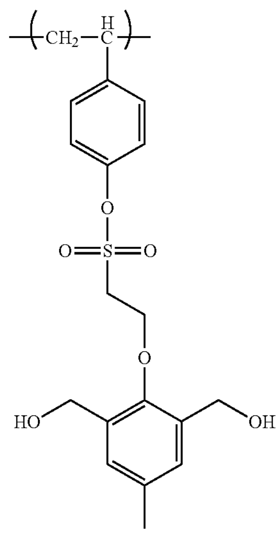
(Q-65)
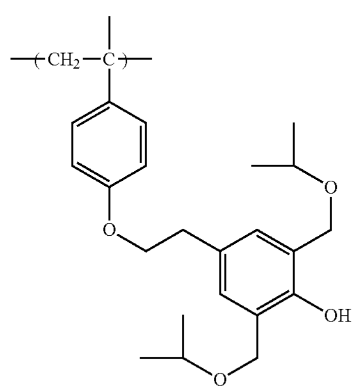

-continued
(Q-66)
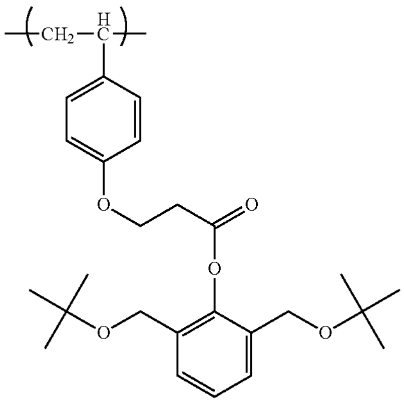
(Q-67)
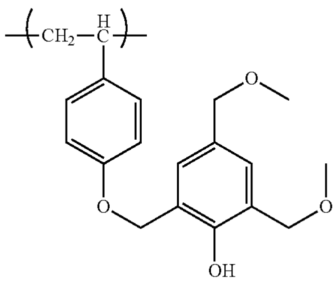
(Q-68)
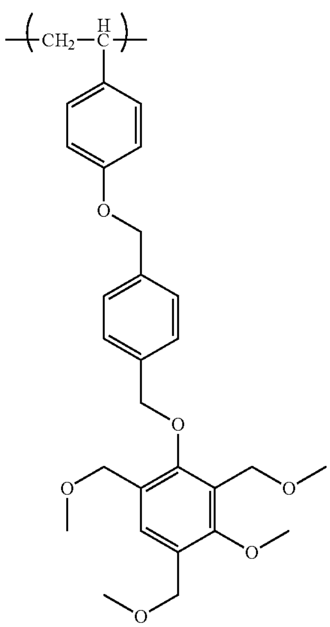
-continued
(Q-69)
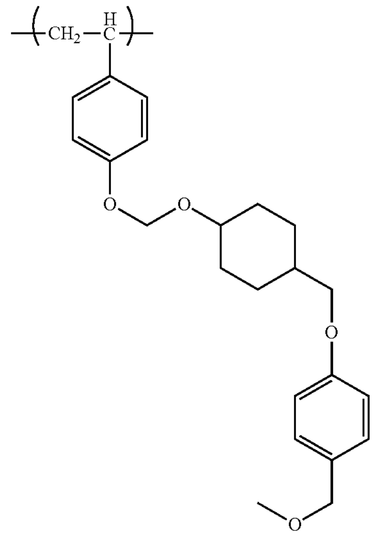
(Q-70)
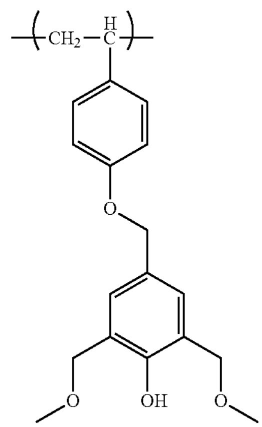
(Q-71)
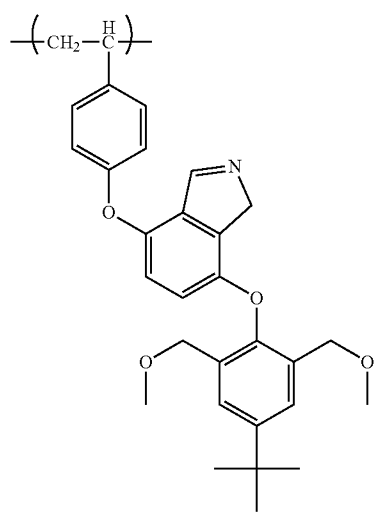

-continued
(Q-72)
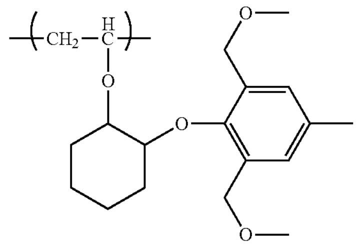
(Q-73)
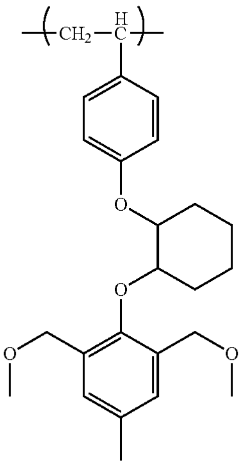
(Q-74)
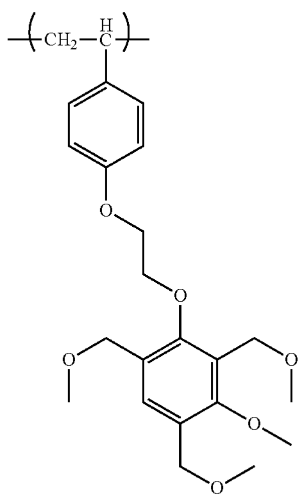
(Q-75)
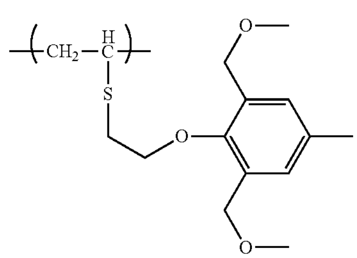
-continued
[Chem. 11-6]
(Q-76)
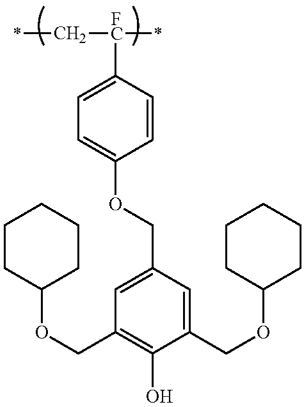
(Q-77)
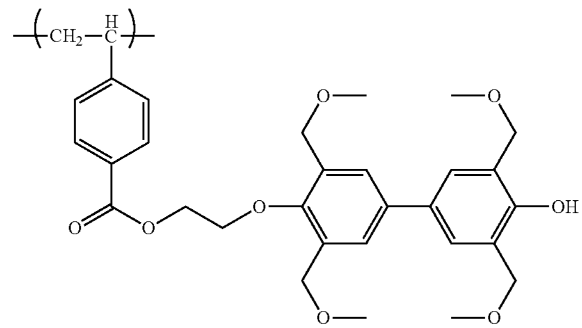
(Q-78)
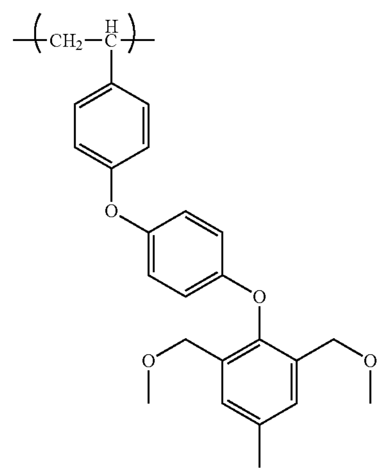
(Q-79)
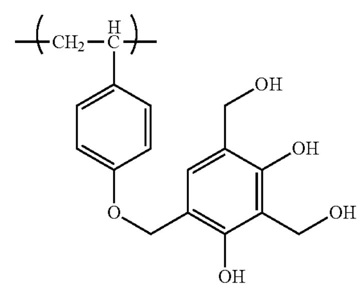

-continued
(Q-80)
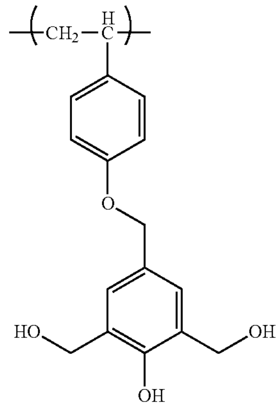
(Q-81)
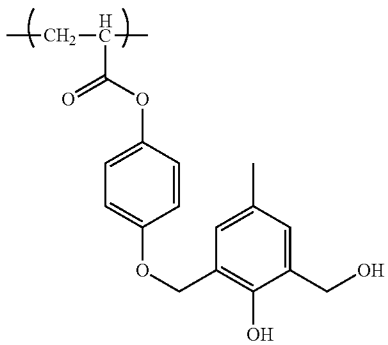
(Q-76)
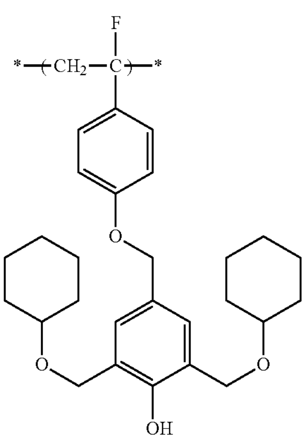
(Q-77)
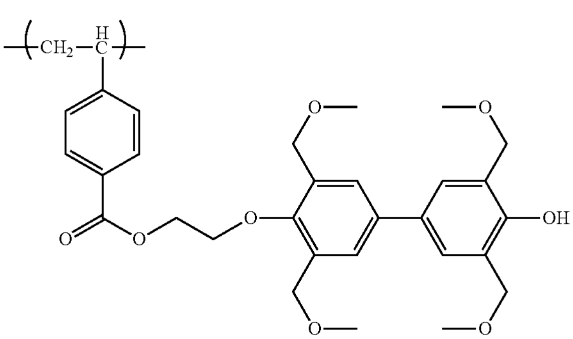
-continued
(Q-78)
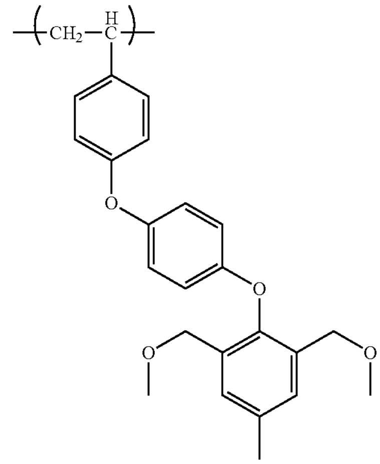
(Q-79)
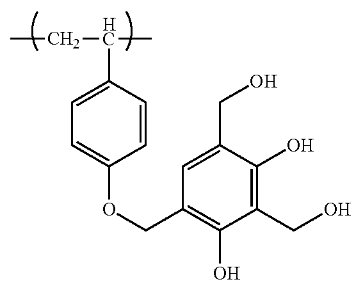
(Q-80)
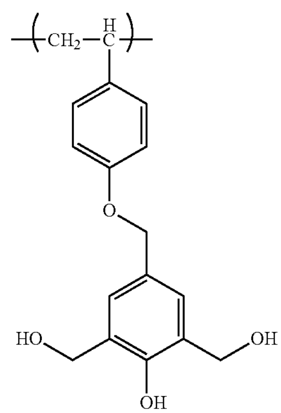
(Q-81)
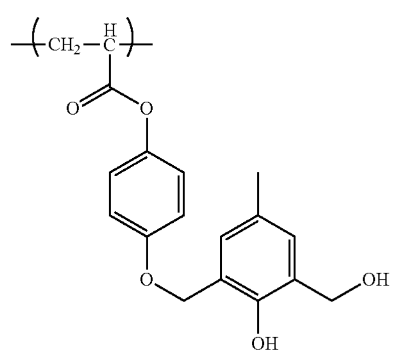

-continued
(Q-89)
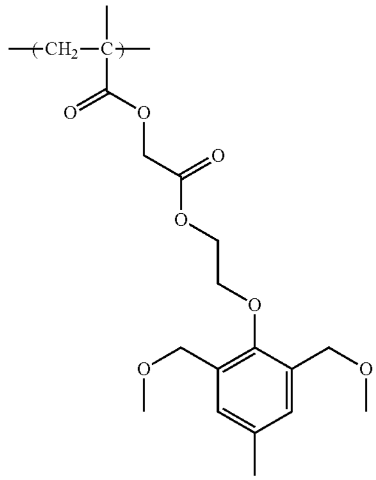
(Q-90)
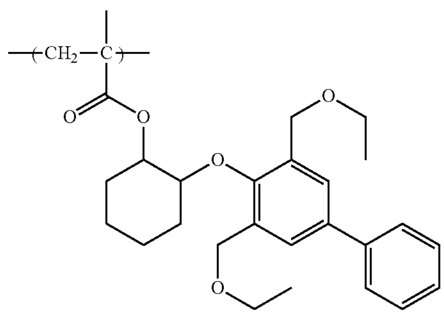
(Q-91)
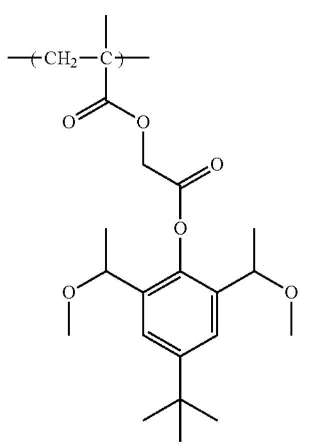
(Q-92)
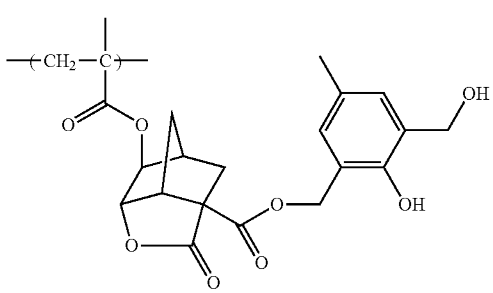
-continued
[Chem. 11-7]
(Q-93)
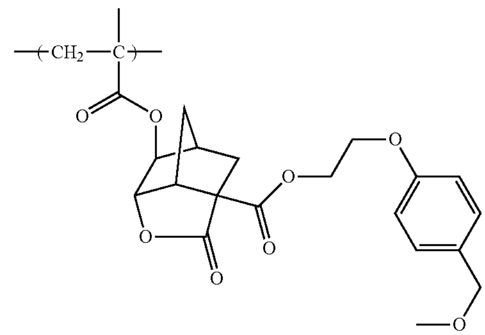
(Q-94)
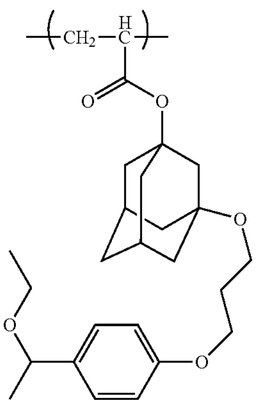
(Q-95)
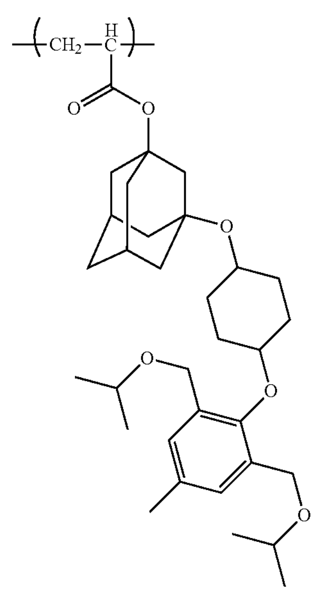

-continued
(Q-96)
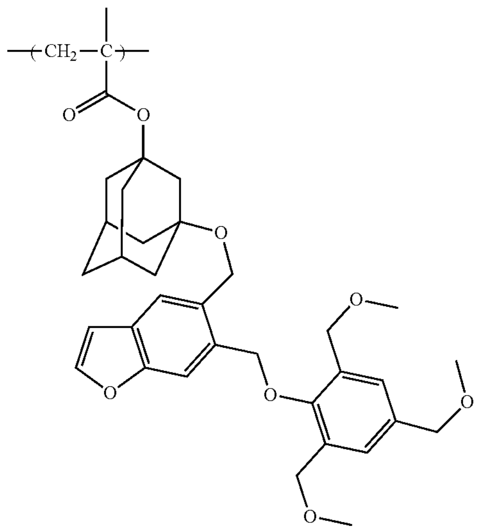
(Q-97)
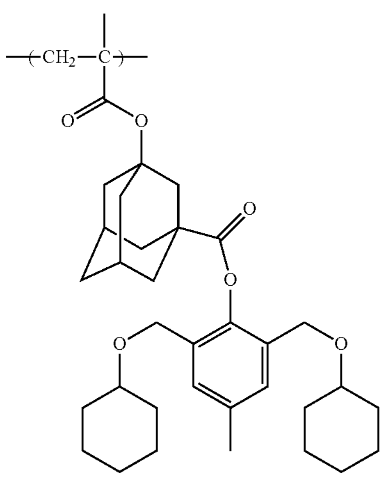
(Q-98)
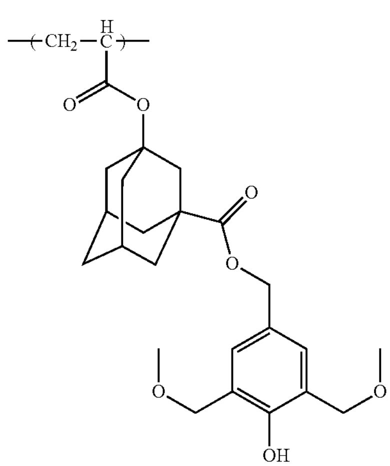
-continued
(Q-99)
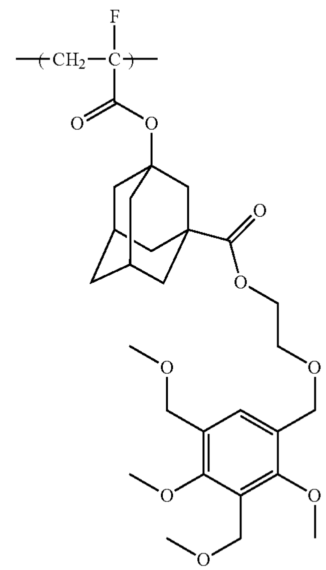
(Q-100)
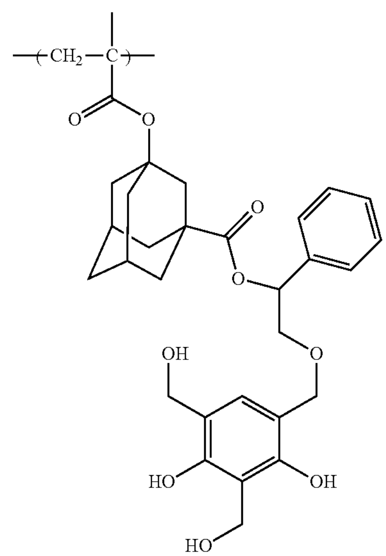
(Q-101)
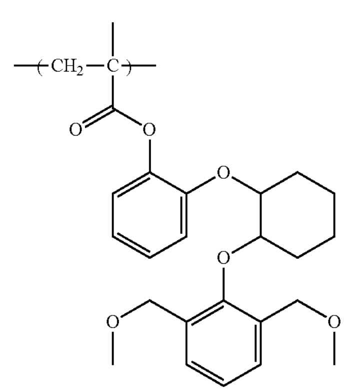

-continued
(Q-102)
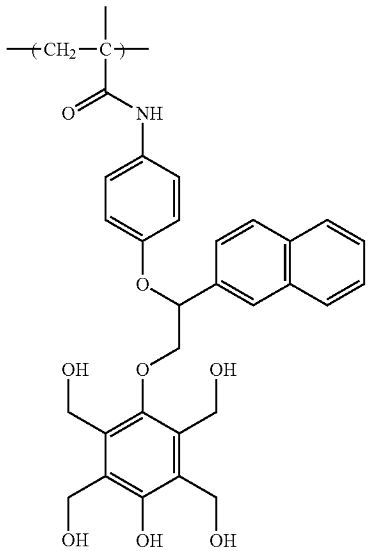
(Q-103)
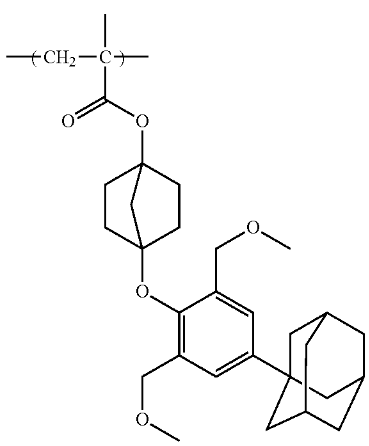
(Q-104)
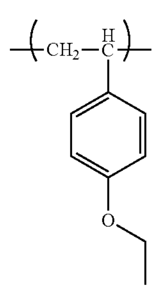
-continued
(Q-105)
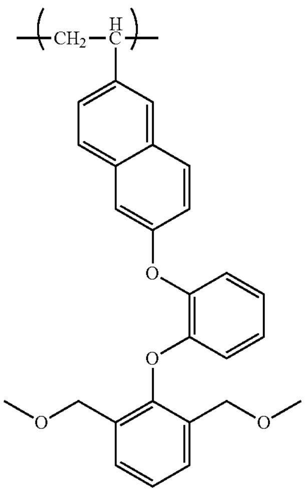
[Chem. 11-8]
(A-106)
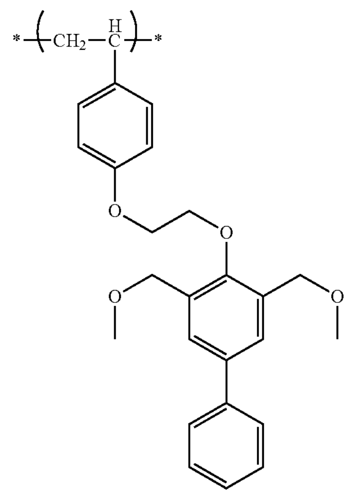
(A-107)
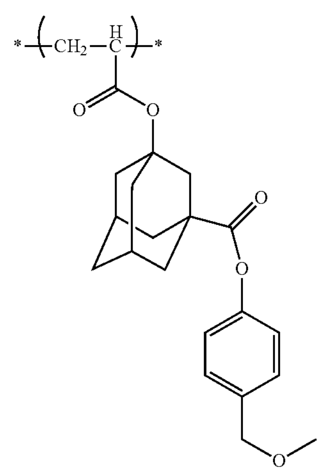

-continued (A-108)

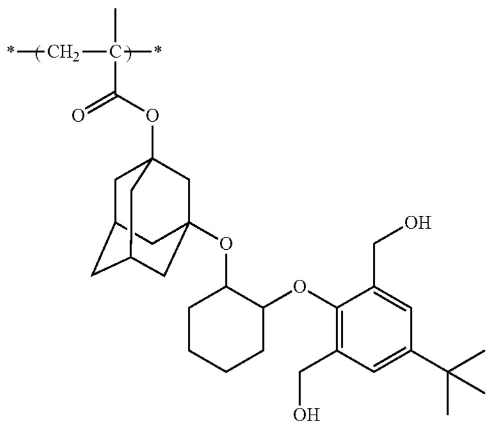

(A-109)

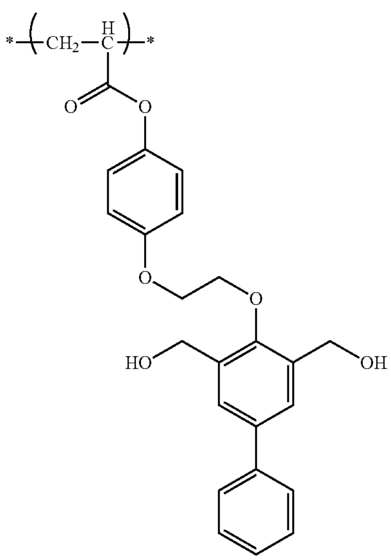

(A-110)

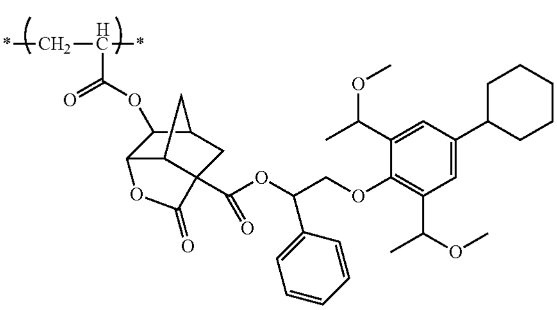

-continued (A-111)

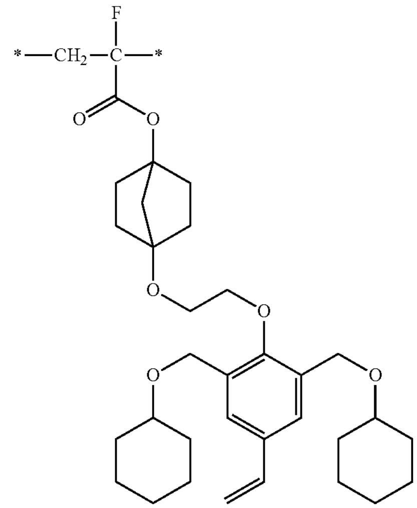

(b) Repeating Unit (P)

The polymer compound (A) may further contain a repeating unit (P) represented by the following general formula (4). However, the repeating unit (P) herein means a repeating unit not included in the repeating unit (Q) as described above.

[Chem. 12]

(4)

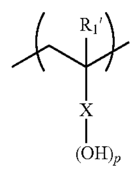

In the general formula (4), $R_1'$ represents a hydrogen atom, a methyl group, or a halogen atom.

X represents a (p+1)-valent linking group or a single bond.

p represents an integer of 1 or more.

Specific examples and the preferred ranges of the respective groups as $R_1'$ in the general formula (4) are the same as for $R_1$ in the general formula (1). In the case where $R_1'$ is a methyl group, it may have a substituent and specific examples of the substituent are the same as the substituent of $R_1$ above.

In the general formula (4), X represents a (p+1)-valent linking group or a single bond. Preferable examples of X include a carbonyl group, a sulfonyl group, —O—, —NH—, an aromatic ring, and a combination thereof. X is preferably an aromatic ring or a carbonyl group.

The aromatic ring in X may be either monocyclic or polycyclic, and examples thereof include aromatic hydrocarbon rings having 6 to 18 carbon atoms, which may be substituted, such as a benzene ring, a naphthalene ring, an anthracene ring, a fluorene ring, and a phenanthrene ring; and aromatic heterocyclic rings containing heterocyclic rings such as, for example, a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among them, a benzene ring and a naphthalene ring are preferred from the viewpoint of resolution, and a benzene ring is most preferred.

p is preferably an integer of 1 to 5, and more preferably an integer of 1 to 3.

The repeating unit (P) is preferably represented by the following general formula (5) or (6).

[Chem. 13]

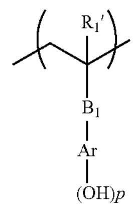

(5)

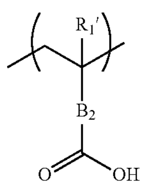

(6)

In the general formulae (5) and (6), $R_1$' and p are as defined in the general formula (4).

$B_1$ and $B_2$ represent a divalent linking group or a single bond.

Ar represents an aromatic ring group.

Specific examples and the preferred ranges of the respective groups as $R_1$' in the general formulae (5) and (6) are the same as for $R_1$' in the general formula (4). In the general formula (5), specific examples of the aromatic ring represented by Ar are the same as in the case where X in the general formula (4) is an aromatic ring, and the preferred ranges thereof are also the same. The preferred range of p in the general formula (5) is also the same as p in the general formula (4).

Examples of the divalent linking group represented by $B_1$ include a carbonyl group, —O—, —NH—, a sulfonyl group, an ester group, or a combination thereof. $B_1$ is preferably a single bond, a carbonyl group, an ester group, or an amide group, and more preferably a single bond.

Examples of the divalent linking group represented by $B_2$ include an aromatic ring group, —O—, —NH—, a sulfonyl group, and a carbonyl group. $B_2$ is preferably a single bond or an aromatic ring group. In the case where $B_2$ is an aromatic ring group, specific examples and the preferred range thereof are the same as in the case where X in the general formula (4) is an aromatic ring group.

When p is 1 and Ar is a benzene ring, the position of substitution of —OH may be the para-position, the meta-position, or the ortho-position with respect to the bonding position of the benzene ring to the polymer main chain. However, from the viewpoint of alkali developability, the para-position is more preferred.

The aromatic ring which may be the aromatic ring group of Ar may have a substituent other than the group represented by —OH, and examples of the substituent include an alkyl group, a halogen atom, a hydroxyl group, an alkoxy group, a carboxylic group, an alkoxycarbonyl group, an alkylcarbonyl group, an alkylcarbonyloxy group, an alkylsulfonyloxy group, an arylcarbonyl group, and a haloalkyl group.

The repeating unit (P) represented by the general formula (4) is more preferably the following general formula (5') or (6').

[Chem. 14]

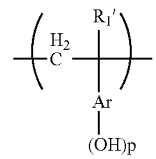

(5')

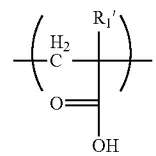

(6')

$R_1$', Ar, and p in the general formulae (5') and (6') have the same definitions as the respective groups in the general formulae (4) to (6), and specific examples and the preferred ranges thereof are also the same.

The repeating unit (P) is most preferably represented by the following general formula (6') or (5'').

[Chem. 15]

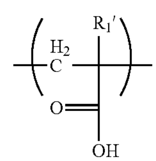

(6')

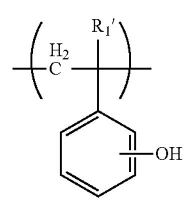

(5'')

$R_1$' in the general formulae (6') and (5') is the same as $R_1$' in the general formula (4), and specific examples and the preferred ranges thereof are also the same.

In the case where the polymer compound (A) contains a repeating unit (P), the content of the repeating unit (P) is preferably from 0% by mole to 96% by mole, more preferably from 20% by mole to 95% by mole, particularly preferably from 50% by mole to 95% by mole, and most preferably from 70% by mole to 95% by mole, based on the entire repeating units of the polymer compound (A). Thereby, particularly in the case where the resist film is a thin film (for example, when the thickness of the resist film is 10 nm to 150 nm), the dissolution rate of the exposed areas in the resist film of the present invention formed by using the polymer compound (A) in an alkali developer can be more securely decreased (that is, the dissolution rate of the resist film using the polymer compound (A) can be more reliably controlled to be optimal). As a result, the sensitivity can be more reliably increased.

Furthermore, in the case where the polymer compound (A) contains the repeating unit (P), the ratio of the repeating unit (Q) to the repeating unit (P) in the polymer compound (A) is preferably from 0:100 to 96:4, more preferably from 20:70 to 95:5, particularly preferably from 50:500 to 95:5, and most preferably from 70:30 to 95:5, in terms of a molar ratio.

Specific examples of the repeating unit represented by the general formula (4) are shown below, but the present invention is not limited hereto.

[Chem. 16-1]

(P-1)

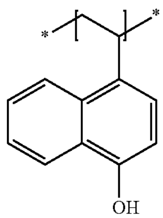

(P-2)

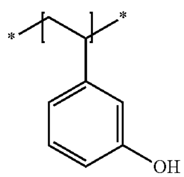

(P-3)

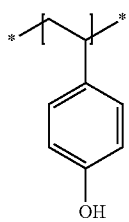

(P-4)

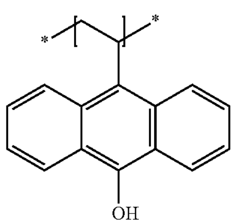

(P-5)

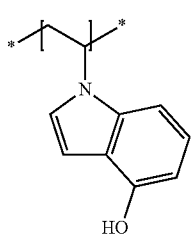

(P-6)

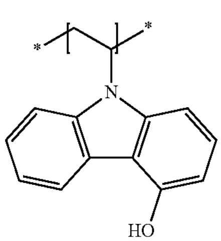

-continued (P-7)

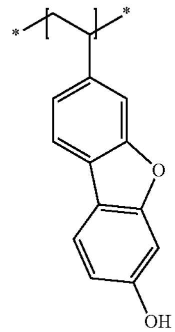

(P-8)

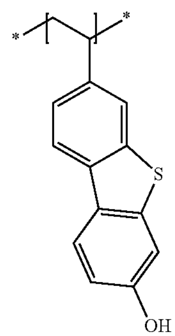

(P-9)

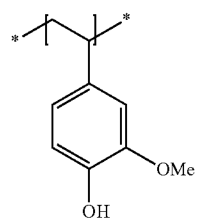

(P-10)

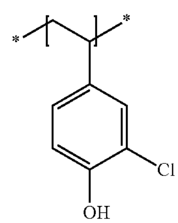

(P-11)

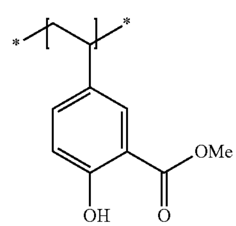

(P-12)

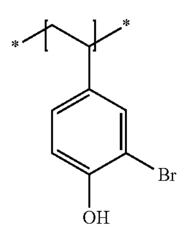

-continued
(P-13)
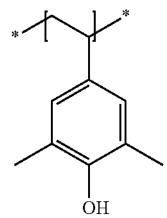
(P-14)
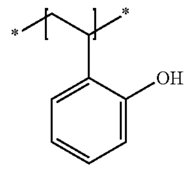
(P-15)
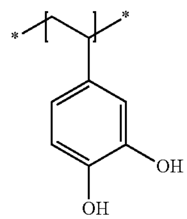
(P-16)
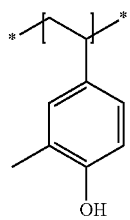
(P-17)
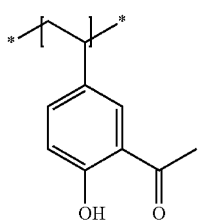
(P-18)
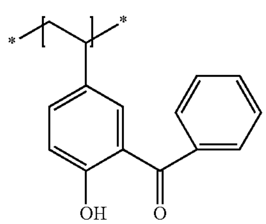
(P-19)
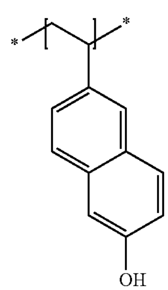
-continued
(P-20)
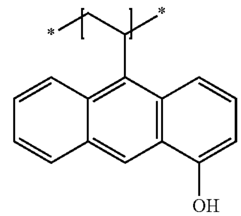
(P-21)
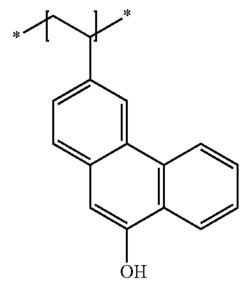
(P-22)
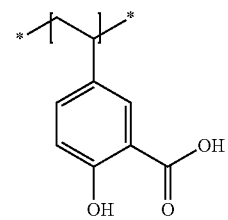
(P-23)
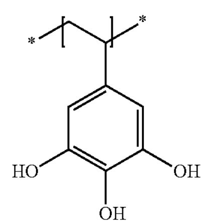
(P-24)
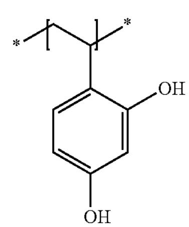
(P-25)
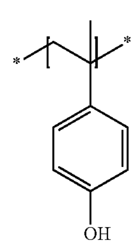

-continued
(P-26)
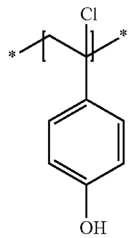
(P-27)
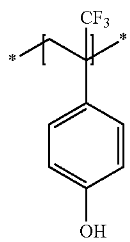
(P-28)
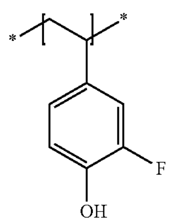
(P-29)
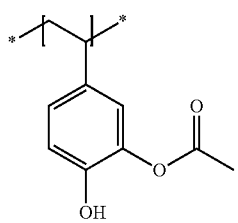
(P-30)
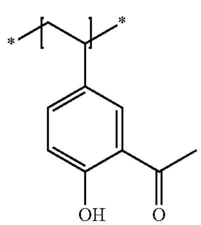
(P-31)
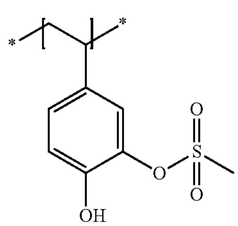
[Chem. 16-2]
(P-32)
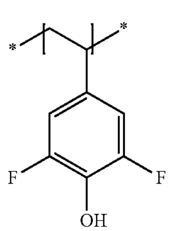
-continued
(P-33)
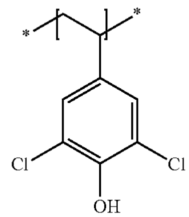
(P-34)
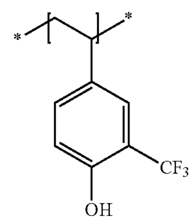
(P-35)
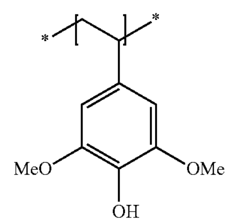
(P-36)
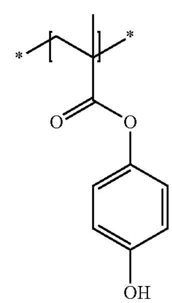
(P-37)
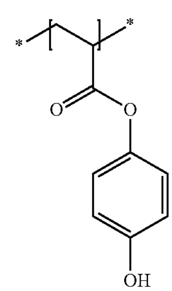
(P-38)
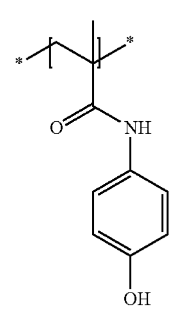

-continued
(P-39)
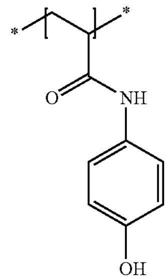
(P-40)
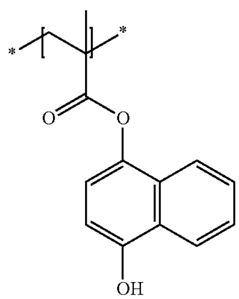
(P-41)
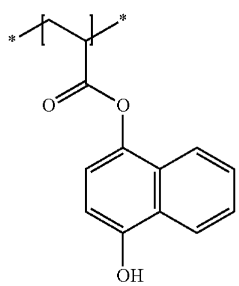
(P-42)
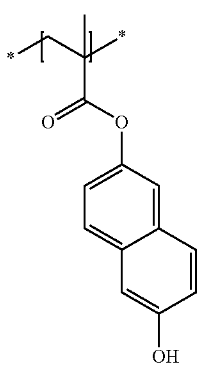
(P-43)
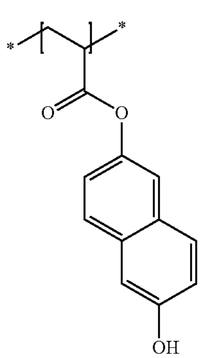
-continued
(P-44)
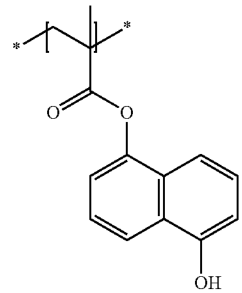
(P-45)
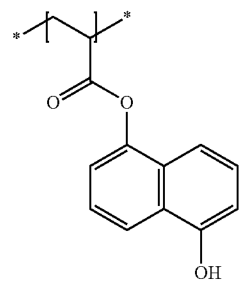
(P-46)
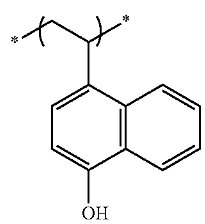
(P-47)
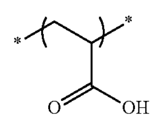
(P-48)
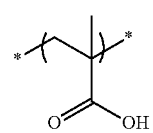
(P-49)
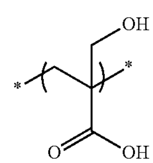
(P-50)
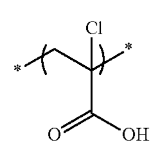
(P-51)
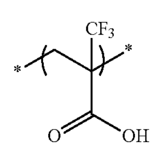

-continued
(P-52)
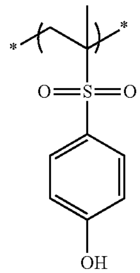
(P-53)
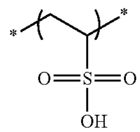
(P-54)
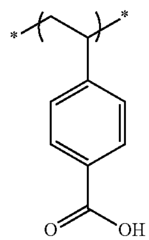
(P-55)
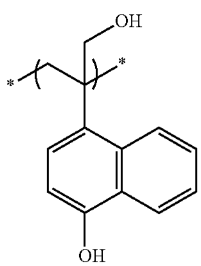
[Chem. 16-3]
(P-56)
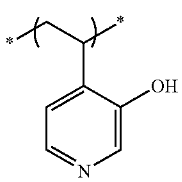
(P-57)
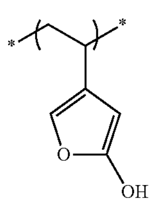
(P-58)
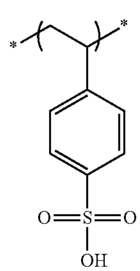
-continued
(P-59)
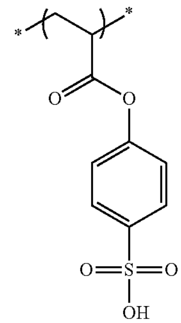
(P-60)
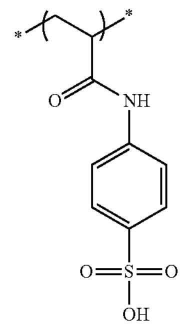
(P-61)
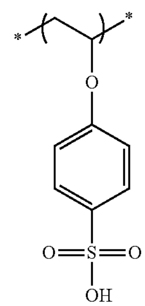
(P-62)
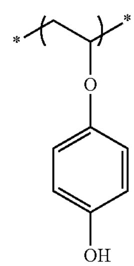
(P-63)
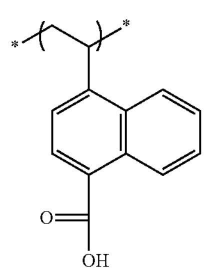
(P-64)
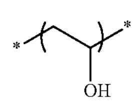

In one embodiment of the present invention, the polymer compound (A) preferably includes two kinds of repeating units represented by the following general formula (I).

[Chem. 17]

(I)

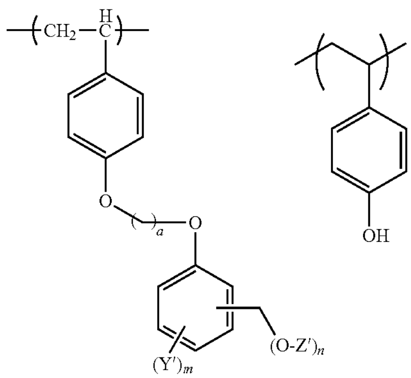

Furthermore, in another embodiment, the compound (A) preferably is a polymer compound containing two kinds of repeating units represented by the following general formula (II).

[Chem. 18]

(II)

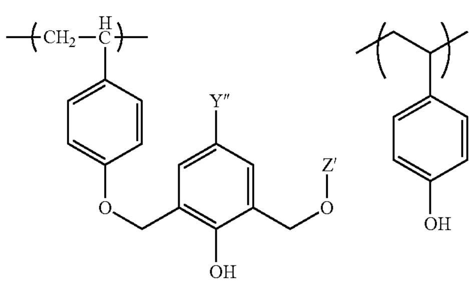

In the general formulae (I) and (II),

Y' represents an alkyl group, a cycloalkyl group, or an aryl group.

Y" represents a hydrogen atom, an alkyl group, a cycloalkyl group, or an aryl group.

Z' represents a hydrogen atom, or alkyl group, or a cycloalkyl group.

m is 0 or 1.

n is an integer of 1 to 3.

a is an integer of 2 to 6, and preferably 2 or 3.

In the case where Y', Y", and/or Z' is/are an alkyl group or a cycloalkyl group, specific examples and the preferred range thereof are the same as in the case where Y and Z in the general formula (1) are an alkyl group or a cycloalkyl group. In the case where Y' and/or Y" are aryl groups, the specific examples and the preferred range thereof are the same as in the case where Y in the general formula (1) is an aryl group.

Furthermore, in another embodiment, the polymer compound (A) preferably includes two kinds of repeating units represented by the following general formula (III).

[Chem. 19]

(III)

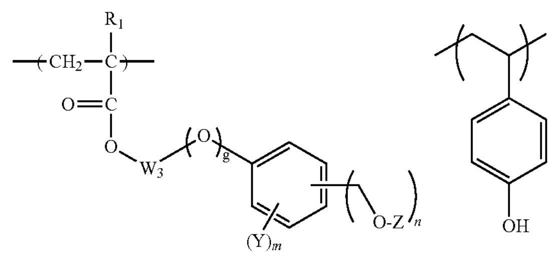

$R_1$, $W_3$, Y, Z, g, m, and n in the general formula (III) are as defined in the general formula (3') as described above, respectively, specific examples and the preferred ranges thereof being also the same.

Specific examples of the two kinds of repeating units represented by the general formula (I) will be shown below, but the present invention is not limited thereto.

[Chem. 20]

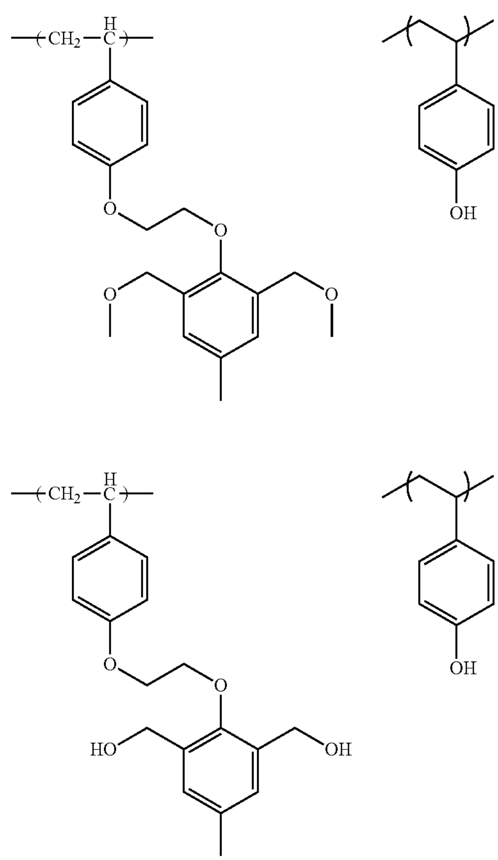

-continued
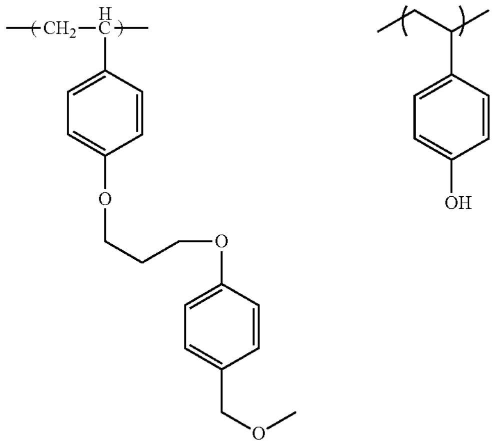
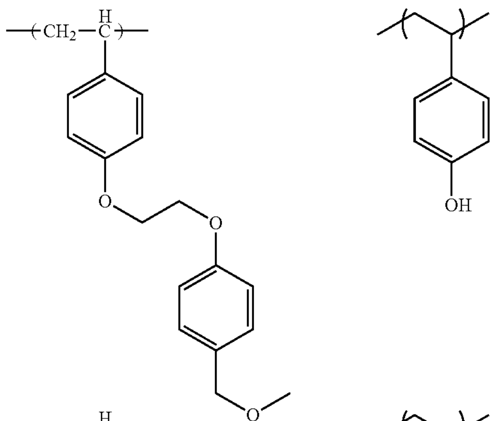
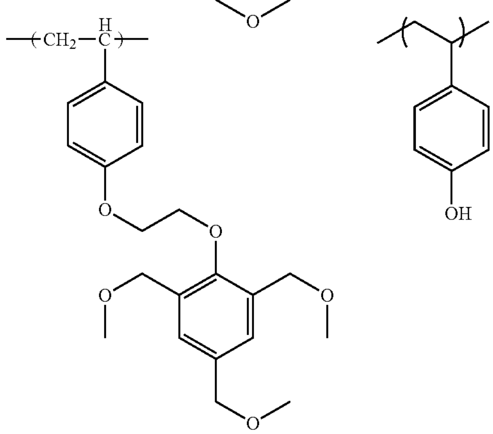
Specific examples of the two kinds of repeating units represented by the general formula (II) are shown below, but the present invention is not limited thereto.
[Chem. 21]
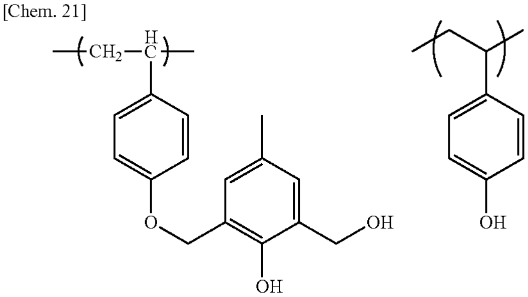
-continued
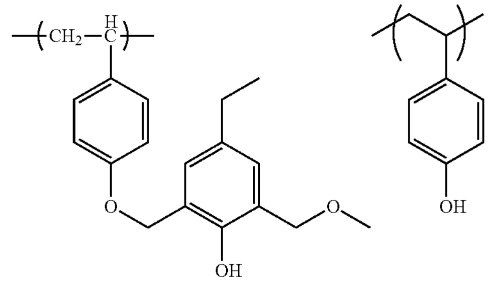
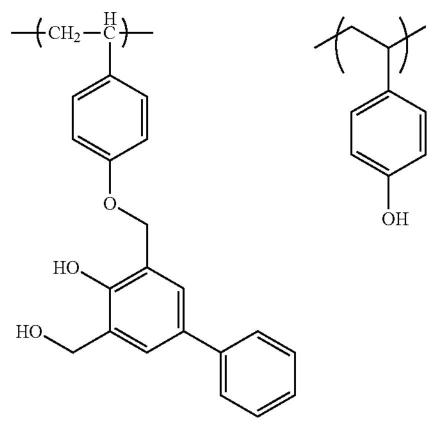
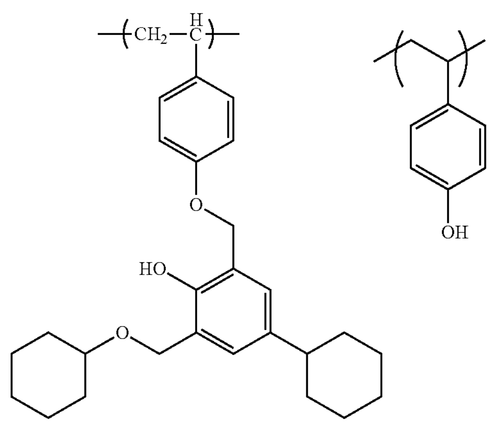
Specific examples of the two kinds of repeating units represented by the general formula (III) will be shown below, but the present invention is not limited thereto.

[Chem. 22]
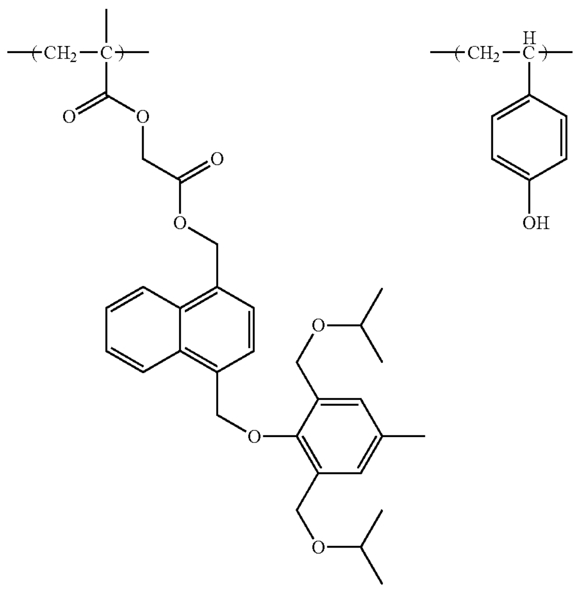
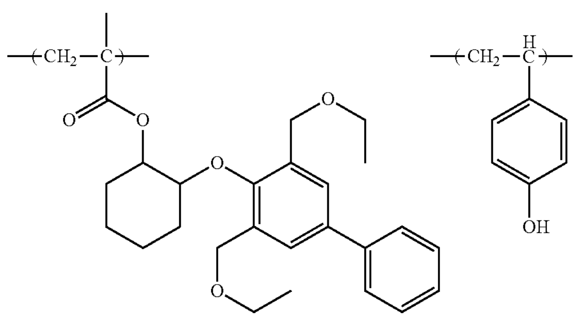
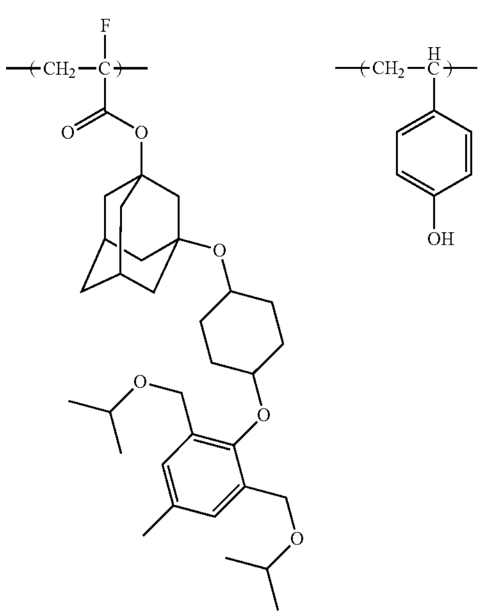
-continued
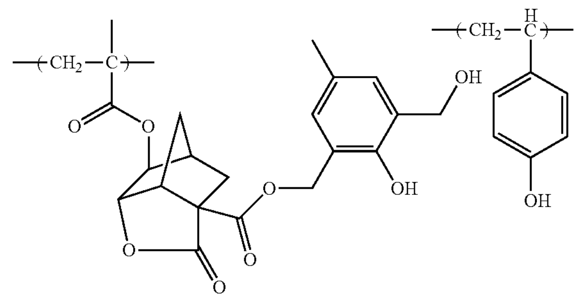
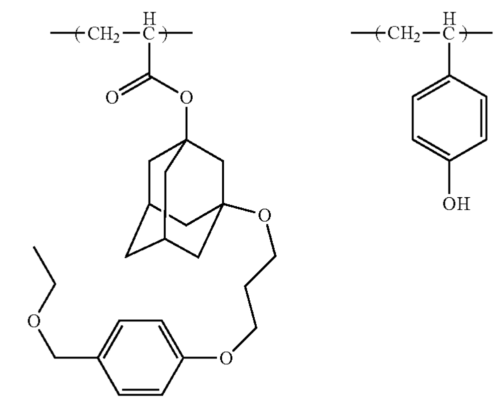
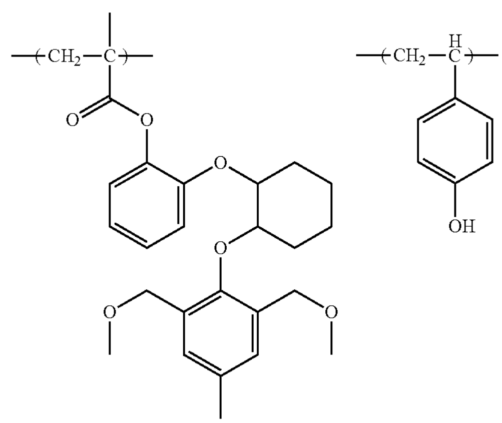
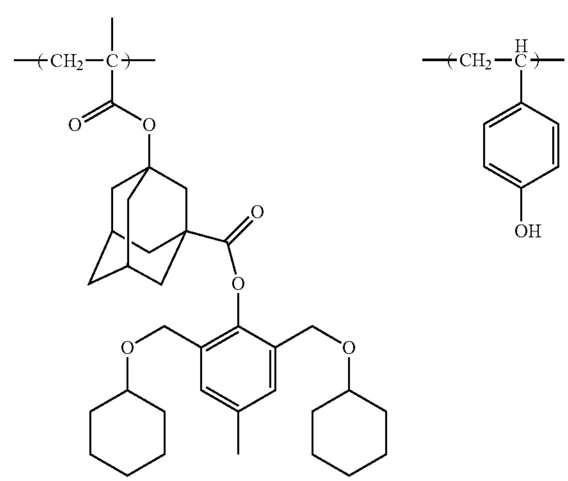

-continued

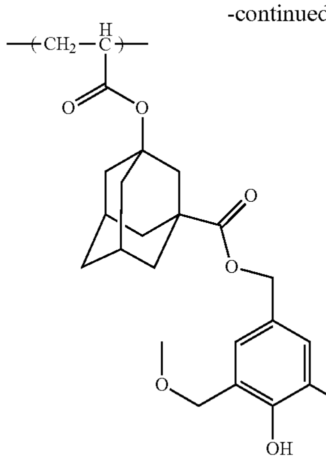

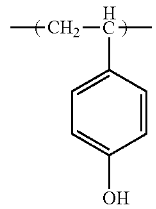

(c) Other Repeating Units

The polymer compound (A) may contain two or more kinds of the repeating units (P) and the repeating units (Q), respectively. Further, the polymer compound (A) may contain other repeating units, in addition to the repeating units (P) and the repeating units (Q).

For example, in the case where the composition of the present invention is used for the formation of a so-called positive tone pattern, the polymer compound (A) is required to further contain a repeating unit having a group that decomposes by the action of an acid to generate an alkali soluble group (which may be hereinafter referred to as "a repeating unit having an acid-decomposable group" in some cases).

Examples of the alkali soluble group include a phenolic hydroxyl group, a carboxylic group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferable examples of the alkali soluble group include a phenolic hydroxyl group, a carboxylic group, a fluorinated alcohol group (preferably a hexafluoroisopropanol group), and a sulfonic acid group.

The acid-decomposable group is preferably a group formed by substituting a group which eliminates a hydrogen atom of the alkali soluble group by an acid.

Examples of the group which is decomposed by the acid include —$C(R_{36})(R_{37})(R_{38})$, —$C(R_{36})(R_{37})(OR_{39})$, and —$C(R_{01})(R_{02})(OR_{39})$:

wherein $R_{36}$ to $R_{39}$ each independently represent an alkyl group, a cycloalkyl group, a monovalent aromatic ring group, a group formed by the combination of an alkylene group and a monovalent aromatic ring group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, a monovalent aromatic ring group, a group formed by the combination of an alkylene group and a monovalent aromatic ring group, or an alkenyl group.

Specific examples of the repeating unit having an acid-decomposable group will be shown below, but the present invention is not limited thereto.

[Chem. 23]

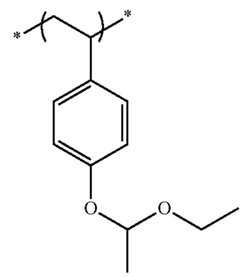

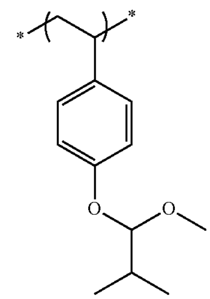

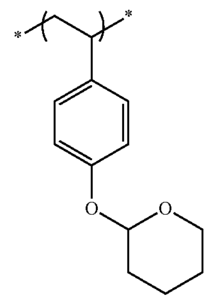

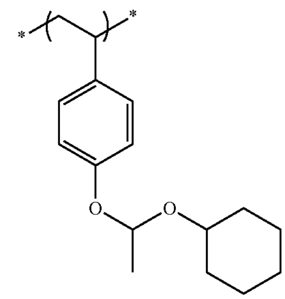

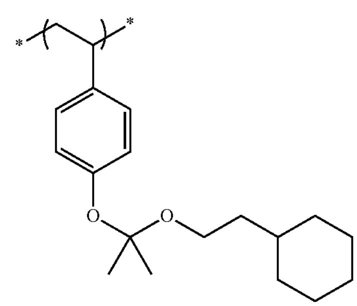

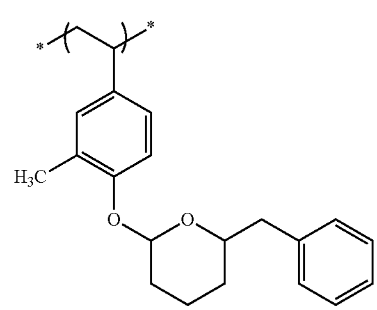

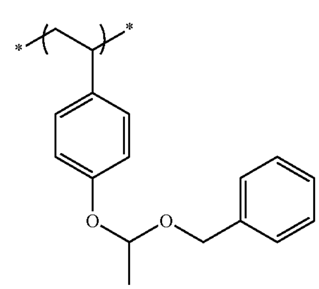

-continued
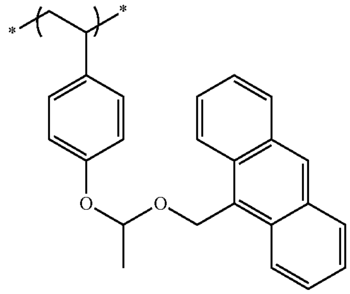
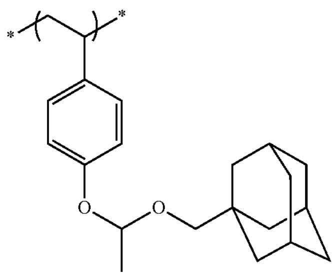
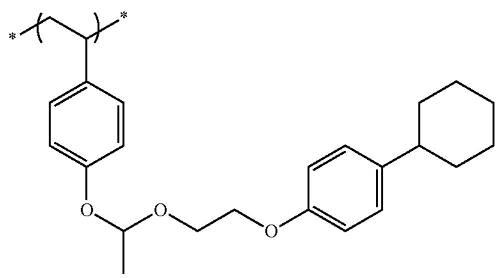
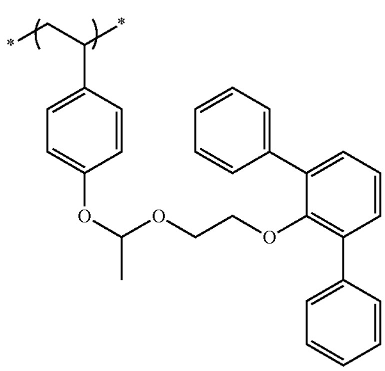
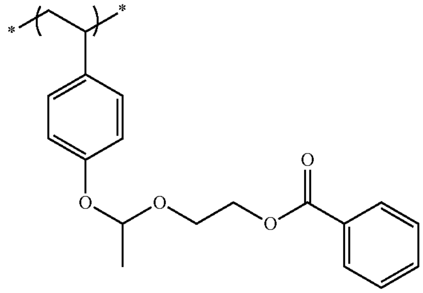
-continued
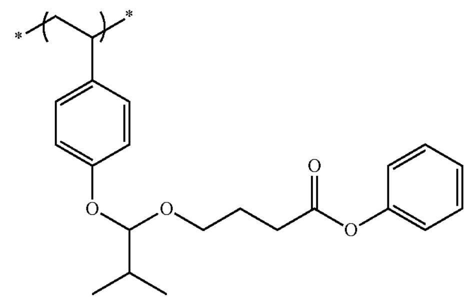
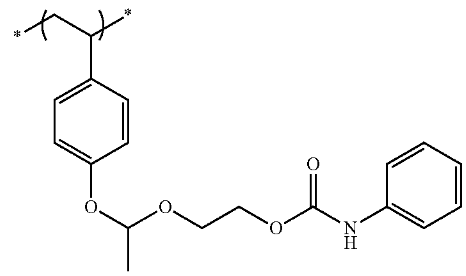
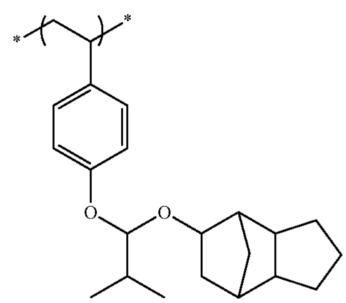
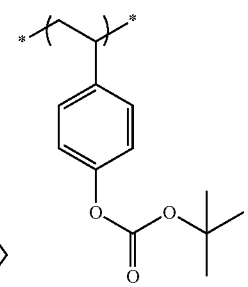
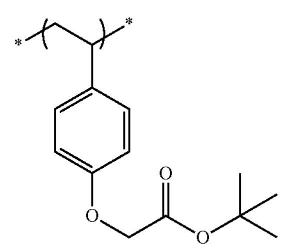
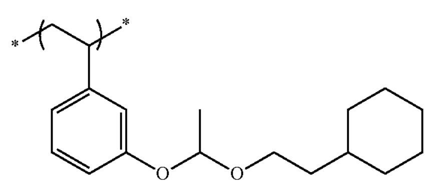
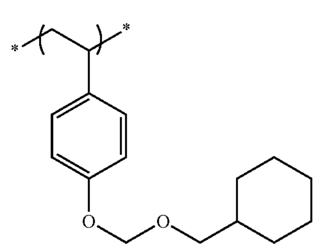
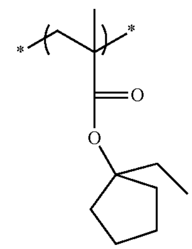

-continued

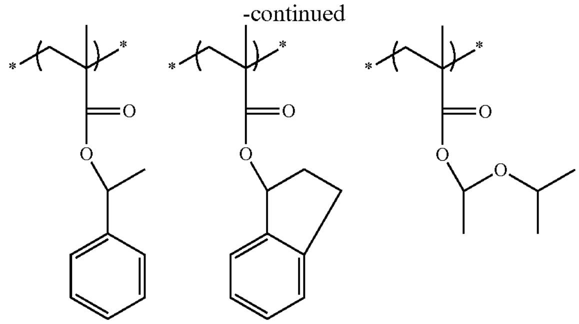

The content of the repeating unit having an acid-decomposable groups in the compound (A) when the composition of the present invention is used for forming a positive tone pattern is preferably in the range of 5% by mole to 70% by mole, more preferably in the range of 10% by mole to 60% by mole, and particularly preferably in the range of 15% by mole to 50% by mole, based on the entire repeating units of the compound (A).

Examples of the process in the case where the composition of the present invention is used for forming a positive tone pattern include a process in which development is carried out by controlling the conditions such as an exposure amount and a post-exposure baking temperature to bring about an acid decomposition reaction first earlier than an acid cross-linking reaction (that is, increase the solubility of the exposure portion in a developer), thereby obtaining a positive tone pattern, and then subjecting the pattern of the remaining unexposed areas to heating or exposure to make the cross-linking reaction proceed, thereby reinforcing the pattern.

In one embodiment, the compound (A) used in the present invention may further contain the following repeating units as a unit other than the repeating units described above (which are also hereinafter referred to as "other repeating units").

Examples of the polymerizable monomer for forming other repeating units include styrene, an alkyl-substituted styrene, an alkoxy-substituted styrene, an O-alkylated styrene, an O-acylated styrene, hydrogenated hydroxystyrene, maleic anhydride, an acrylic acid derivative (acrylic acid, an acrylic acid ester, or the like), a methacrylic acid derivative (methacrylic acid, a methacrylic acid ester, or the like), an N-substituted maleimide, acrylonitrile, methacrylonitrile, vinylnaphthalene, vinylanthracene, and indene which may have a substituent.

The polymer compound (A) may or may not contain these other repeating units; however, if the polymer compound contains the other repeating units, the content of these other repeating units in the polymer compound (A) is generally from 1% by mole to 20% by mole, and preferably from 2% by mole to 10% by mole, based on the entire repeating units that constitute the polymer compound (A).

Furthermore, in another embodiment, it is also preferable that the polymer compound (A) further have a repeating unit having a group which decomposes by the action of an alkali developer to have an increased solubility in an alkali developer as a repeating unit other than the repeating units above, or a repeating unit having a photoacid-generating group that generates an acid by the irradiation with actinic rays or radiation.

Examples of the repeating unit having a group which decomposes by the action of an alkali developer to have an increased solubility in the alkali developer include repeating units having a lactone structure and a phenyl ester structure. The repeating unit is preferably a repeating unit having a 5- to 7-membered ring lactone structure, and more preferably a repeating unit having a structure in which another ring structure is condensed with a 5- to 7-membered ring lactone structure to form a bicyclo-structure or a spiro-structure. Specific examples of the repeating unit having a group which decomposes by the action of an alkali developer to have an increased solubility in the alkali developer will be shown below. In the formulae, Rx represents H, $CH_3$, $CH_2OH$, or $CF_3$.

[Chem. 24]

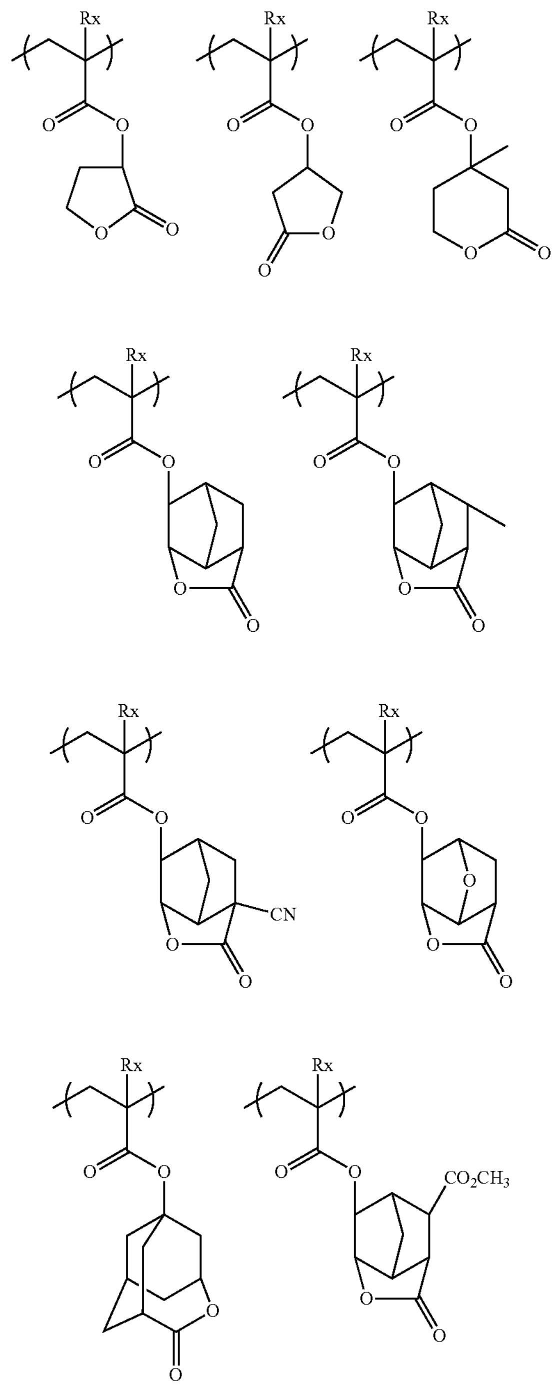

-continued
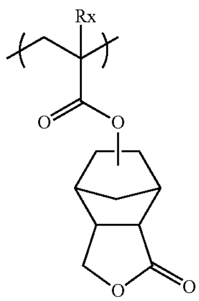
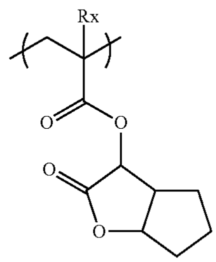
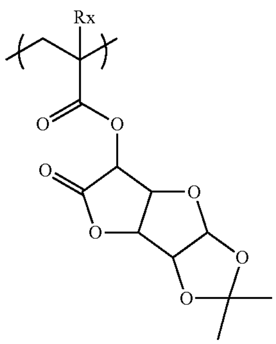
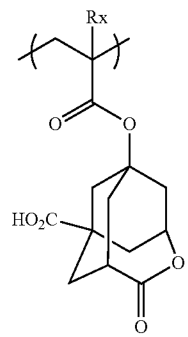
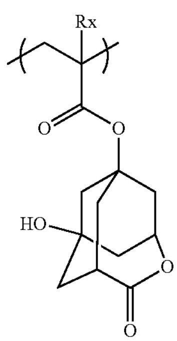
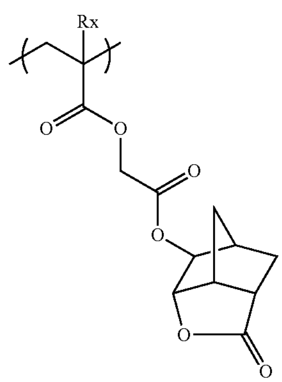
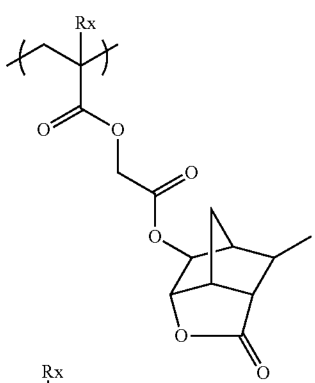
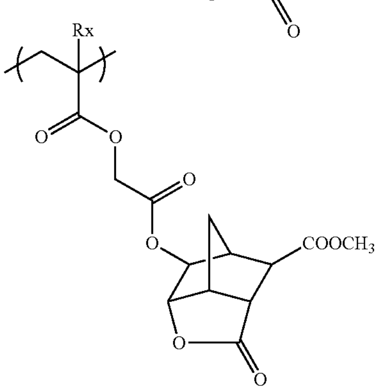
-continued
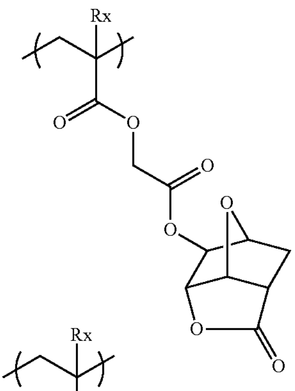
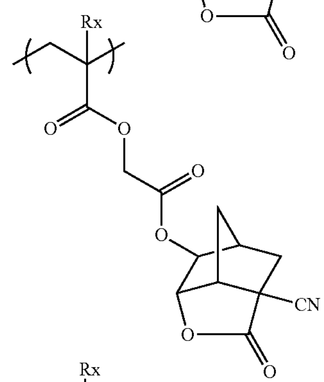
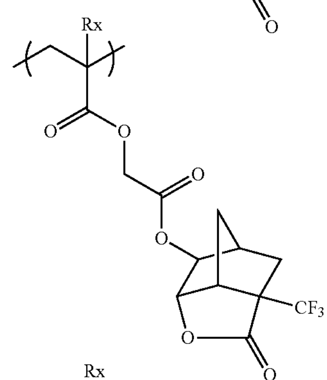
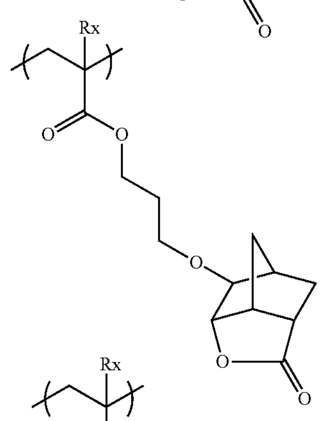
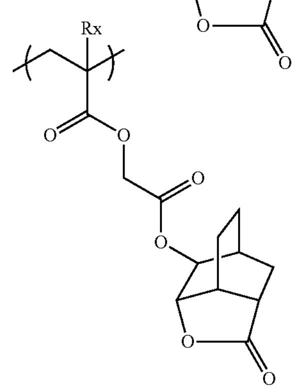

-continued

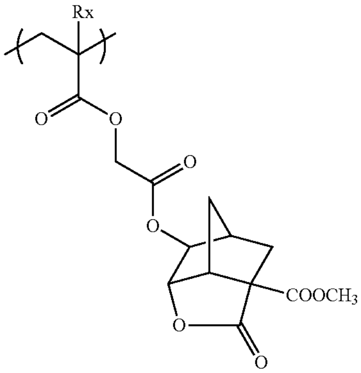

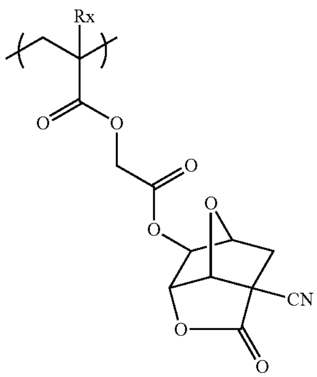

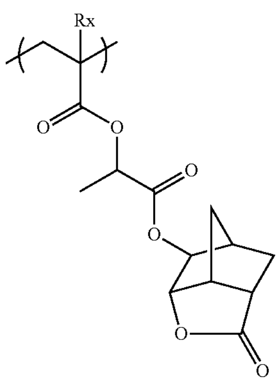

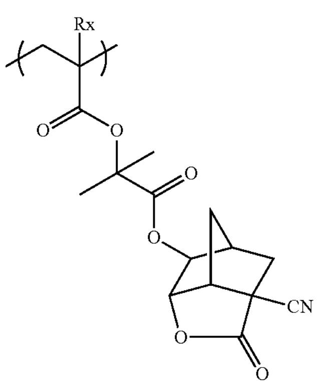

-continued

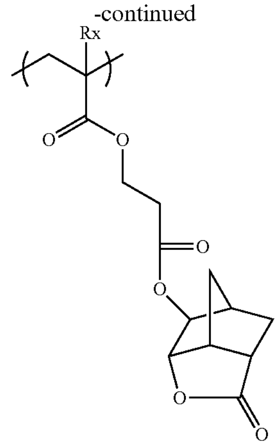

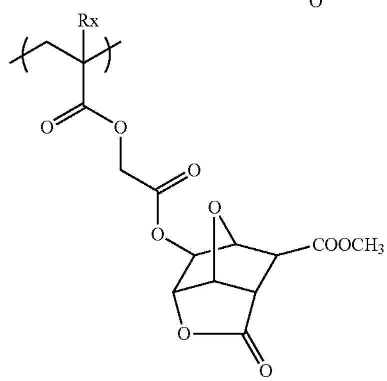

The polymer compound (A) may or may not contain a repeating unit having a group which decomposes by the action of an alkali developer to have an increased solubility in the alkali developer, but in the case where the polymer compound (A) may contain such a repeating unit, the content of the repeating units is preferably from 5% by mole to 50% by mole, more preferably from 10% by mole to 40% by mole, and even more preferably from 15% by mole to 30% by mole, based on the entire repeating units in the compound (A).

It is preferable that the polymer compound (A) contain a repeating unit having a structure in which a hydrogen atom of a phenolic hydroxyl group is substituted with a group having a non-acid-decomposable polycyclic alicyclic hydrocarbon structure, from the viewpoints of obtaining a high glass transition temperature (Tg) and good dry etching resistance.

When the polymer compound (A) has a repeating unit having the specific structure as described above, the glass transition temperature (Tg) of the polymer compound (A) becomes high, whereby a very hard resist film can be formed and the acid diffusion and dry etching resistance can be controlled. Accordingly, an acid is highly constrained from diffusion in the area exposed to actinic rays or radiation such as an electron beam and extreme ultraviolet rays, and this produces an excellent effect in terms of resolution, pattern shape and LER in a fine pattern. Also, the configuration in which the polymer compound (A) includes repeating units having a non-acid-decomposable polycyclic alicyclic hydrocarbon structure is considered to contribute to high dry etching resistance. Furthermore, although details are unknown, it is presumed that the polycyclic alicyclic hydrocarbon structure has a high hydrogen radical-donating property and the polymer compound works out to a hydrogen source when decomposing the later-described photoacid generator, that is, (B) a compound capable of generating an acid during irradiation with actinic rays or radiation, as a result, the decomposition efficiency of the photoacid generator and in turn, the acid generation efficiency being enhanced. This is considered to contribute to the excellent sensitivity.

In the specific structure as described above of the polymer compound (A) according to the present invention, an aromatic ring such as benzene ring and a group having a non-acid-decomposable polycyclic alicyclic hydrocarbon structure are connected through an oxygen atom derived from a phenolic hydroxyl group. This specific structure contributes to high dry etching resistance as described above and moreover, enables raising the glass transition temperature (Tg) of the polymer compound (A), and the combination of these effects is presumed to ensure high resolution.

In the present invention, "non-acid-decomposable" means a property of not causing a decomposition reaction by the effect of the acid generated from the later-described (B) compound that generates an acid by the irradiation with actinic rays or radiation.

More specifically, the group having a non-acid-decomposable polycyclic alicyclic hydrocarbon structure is preferably stable to an acid and an alkali. The "group stable to an acid and an alkali" means a group not exhibiting acid decomposability and alkali decomposability. The "acid decomposability" as used herein means a property of causing a decomposition reaction by the action of an acid generated from the later-described (B) compound capable of generating an acid upon irradiation with actinic rays or radiation, and the group exhibiting acid decomposability includes the acid decomposable groups described later in "Repeating Unit Having Acid-Decomposable Group".

Moreover, the "alkali decomposability" means a property of causing a decomposition reaction by the action of an alkali developer, and the group exhibiting alkali decomposability includes a conventionally known group capable of decomposing by the action of an alkali developer to increase the dissolution rate in an alkali developer (for example, a group having a lactone structure), which is contained in the resin suitably used for the positive chemical amplification resist composition.

The group having a polycyclic alicyclic hydrocarbon structure is not particularly limited as long as it is a monovalent group having a polycyclic alicyclic hydrocarbon structure, but the total number of carbon atoms thereof is preferably from 5 to 40, and more preferably from 7 to 30. The polycyclic alicyclic hydrocarbon structure may have an unsaturated bond in the ring.

The polycyclic alicyclic hydrocarbon structure in the group having a polycyclic alicyclic hydrocarbon structure means a structure having plural monocyclic alicyclic hydrocarbon groups, or an alicyclic hydrocarbon structure of a polycyclic type, and may be a cross-linked structure. The monocyclic alicyclic hydrocarbon group is preferably a cycloalkyl group having 3 to 8 carbon atoms, and examples thereof include a cyclopropyl group, a cyclopentyl group, a cyclohexyl group, a cyclobutyl group and a cyclooctyl group. The structure having plural monocyclic alicyclic hydrocarbon groups has plural such groups. The structure having plural monocyclic alicyclic hydrocarbon groups preferably has 2 to 4 monocyclic alicyclic hydrocarbon groups, and more preferably 2 monocyclic alicyclic hydrocarbon groups.

The alicyclic hydrocarbon structure of the polycyclic type includes, for example, a bicyclo-, tricyclo- or tetracyclo-structure having 5 or more carbon atoms and is preferably a polycyclic cyclo-structure having 6 to 30 carbon atoms, and examples thereof include an adamantane structure, a decalin structure, a norbornane structure, a norbornene structure, a cedrol structure, an isobornane structure, a bornane structure, a dicyclopentane structure, an $\alpha$-pinene structure, a tricyclodecane structure, a tetracyclodecane structure and an androstane structure. Incidentally, a part of carbon atoms in the monocyclic or polycyclic cycloalkyl group may be substituted with a heteroatom such as an oxygen atom.

The polycyclic alicyclic hydrocarbon structure is preferably an adamantane structure, a decalin structure, a norbornane structure, a norbornene structure, a cedrol structure, a structure having a plurality of cyclohexyl groups, a structure having a plurality of cycloheptyl groups, a structure having a plurality of cyclooctyl groups, a structure having a plurality of cyclodecanyl groups, a structure having a plurality of cyclododecanyl groups, or a tricyclodecane structure, and most preferably an adamantane structure from the viewpoint of dry etching resistance (that is, it is most preferred that the group having a non-acid-decomposable polycyclic alicyclic hydrocarbon structure is a group having a non-acid-decomposable adamantane structure).

The chemical formulae of these polycyclic alicyclic hydrocarbon structures (with respect to the structure having a plurality of monocyclic alicyclic hydrocarbon groups, the monocyclic alicyclic hydrocarbon structure corresponding to the monocyclic alicyclic hydrocarbon group (specifically, structures of the following formulae (47) to (50))) are illustrated below.

[Chem. 25]

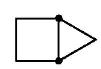
(1)

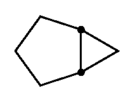
(2)

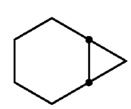
(3)

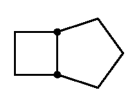
(4)

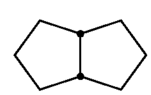
(5)

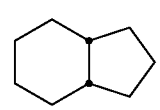
(6)

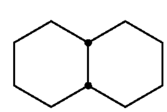
(7)

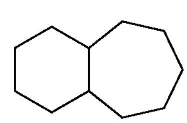
(8)

-continued
(9)
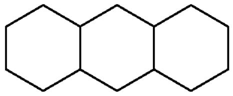
(10)
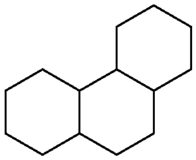
(11)
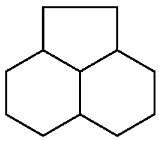
(12)
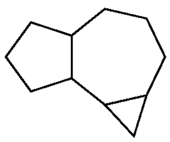
(13)
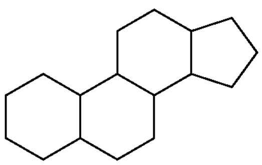
(14)
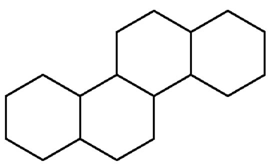
(15)
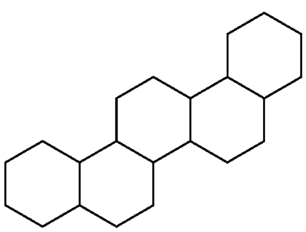
(16)
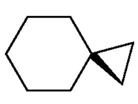
(17)
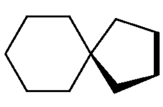
(18)
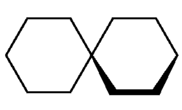
(19)
-continued
(20)
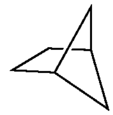
(21)
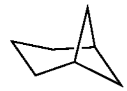
(22)
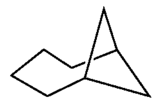
(23)
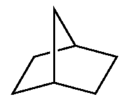
(24)
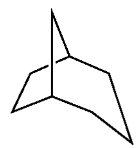
(25)
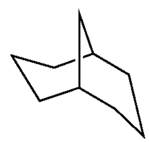
(26)
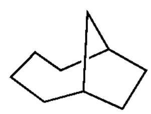
(27)
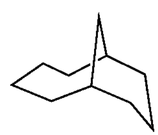
(28)
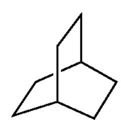
(29)
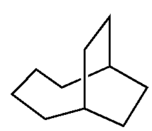
(30)
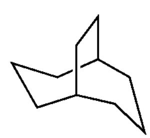
(31)
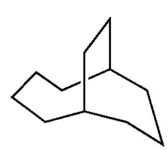

-continued (32)

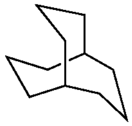

(33)

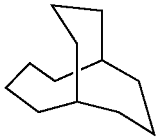

(34)

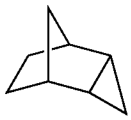

(35)

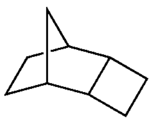

(36)

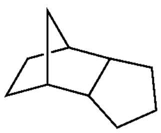

(37)

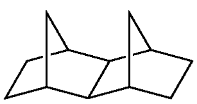

(38)

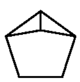

(39)

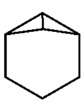

(40)

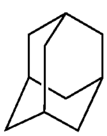

(41)

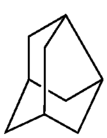

(42)

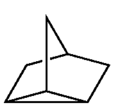

(43)

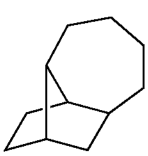

-continued (44)

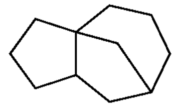

(45)

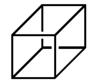

(46)

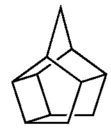

(47)

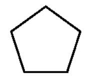

(48)

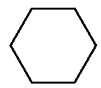

(49)

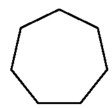

(50)

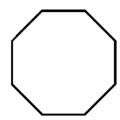

(51)

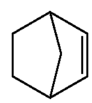

The polycyclic alicyclic hydrocarbon structure may further have a substituent, and examples of the substituent include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, a carbonyl group, a thiocarbonyl group, an alkoxycarbonyl group (preferably having 2 to 7 carbon atoms), and a combination of these groups (preferably having 1 to 30 carbon atoms in total, and more preferably having 1 to 15 carbon atoms in total).

The polycyclic alicyclic hydrocarbon structure is preferably a structure represented by any one of the formulae (7), (23), (40), (41), and (51), or a structure having two monovalent groups each formed by substituting a bond for one arbitrary hydrogen atom on the structure of the formulae (48), more preferably a structure represented by any one of formulae (23), (40), and (51), or a structure having two monovalent groups each formed by substituting a bond for one arbitrary hydrogen atom on the structure of the formula (48), and most preferably a structure represented by the formula (40).

The group having a polycyclic alicyclic hydrocarbon structure is preferably a monovalent group formed by substituting a bond for one arbitrary hydrogen atom on the polycyclic alicyclic hydrocarbon structure.

The structure in which a hydrogen atom of a phenolic hydroxyl group is substituted with a group having a nonacid-decomposable polycyclic alicyclic hydrocarbon structure is preferably contained in the polymer compound (A) as a repeating unit having a structure in which a hydrogen atom of a phenolic hydroxyl group is substituted with a group having a non-acid-decomposable polycyclic alicyclic hydrocarbon structure as a non-acid-decomposable polycyclic alicyclic hydrocarbon structure, and more preferably contained in the polymer compound (A) as a repeating unit represented by the following general formula (3).

[Chem. 26]

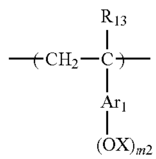

(3)

In the general formula (3), $R_{13}$ represents a hydrogen atom or a methyl group.

X represents a group having a non-acid-decomposable polycyclic alicyclic hydrocarbon structure.

$Ar_1$ represents an aromatic ring.

$m_2$ represents an integer of 1 or more.

In the general formula (3), $R_{13}$ represents a hydrogen atom or a methyl group, and particularly preferably a hydrogen atom.

The aromatic ring of $Ar_1$ in the general formula (3) is a monocyclic or polycyclic aromatic ring, and examples thereof include aromatic hydrocarbon rings having 6 to 18 carbon atoms, which may be substituted, such as a benzene ring, a naphthalene ring, an anthracene ring, a fluorene ring, and a phenanthrene ring; and aromatic heterocyclic rings containing heterocyclic rings such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among them, a benzene ring and a naphthalene ring are preferred from the viewpoint of resolution properties, and a benzene ring is most preferred.

The aromatic ring of $Ar_1$ may have a substituent other than the group represented by —OX, and examples thereof include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxylic group, and an alkoxycarbonyl group (preferably having 2 to 7 carbon atoms), more preferably an alkyl group, an alkoxy group, and an alkoxycarbonyl group, and even more preferably an alkoxy group.

X represents a group having a non-acid-decomposable polycyclic alicyclic hydrocarbon structure. Specific examples and preferred ranges of the group having a non-acid-decomposable polycyclic alicyclic hydrocarbon structure represented by X are the same as those described above. X is more preferably a group represented by —Y—$X_2$ in the general formula (4) as described later.

$m_2$ is preferably an integer of 1 to 5 and most preferably 1. When $m_2$ is 1 and $Ar_1$ is a benzene ring, the substitution position of —OX may be the para-position, the meta-position or the ortho-position with respect to the bonding position of the benzene ring to the polymer main chain but is preferably the para-position or the meta-position, and more preferably the para-position.

In the present invention, the repeating unit represented by the general formula (3) is preferably a repeating unit represented by the following general formula (4).

When a polymer compound (A) having a repeating unit represented by the general formula (4) is used, Tg of the polymer compound (A) becomes high and a very hard resist film is formed, and thus controlling the acid diffusion and dry etching resistance can be further ensured.

[Chem. 27]

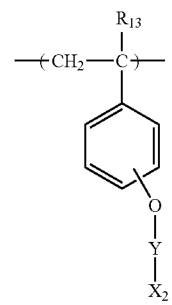

(4)

In the general formula (4), $R_{13}$ represents a hydrogen atom or a methyl group.

Y represents a single bond or a divalent linking group.

$X_2$ represents a non-acid-decomposable polycyclic alicyclic hydrocarbon group.

Preferable examples of the repeating unit represented by the general formula (4) used in the present invention are described below.

In the general formula (4), $R_{13}$ represents a hydrogen atom or a methyl group, and is particularly preferably a hydrogen atom.

In the general formula (4), Y is preferably a divalent linking group. The divalent linking group of Y is preferably a carbonyl group, a thiocarbonyl group, an alkylene group (preferably having 1 to 10 carbon atoms, and more preferably having 1 to 5 carbon atoms), a sulfonyl group, —$COCH_2$—, —NH—, or a divalent linking group composed of a combination thereof (having 1 to 20 carbon atoms in total, and more preferably having 1 to 10 carbon atoms in total), more preferably a carbonyl group, —$COCH_2$—, a sulfonyl group, —CONH—, or —CSNH—, still more preferably a carbonyl group or —$COCH_2$—, and still further more preferably a carbonyl group.

$X_2$ represents a polycyclic alicyclic hydrocarbon group and is non-acid-decomposable. The total number of carbon atoms of the polycyclic alicyclic hydrocarbon group is preferably from 5 to 40, and more preferably from 7 to 30. The polycyclic alicyclic hydrocarbon group may have an unsaturated bond in the ring.

This polycyclic alicyclic hydrocarbon group is a group having plural monocyclic alicyclic hydrocarbon groups, or an alicyclic hydrocarbon group of a polycyclic type, and may be a cross-linked group. The monocyclic alicyclic hydrocarbon group is preferably a cycloalkyl group having 3 to 8 carbon atoms, and examples thereof include a cyclopropyl group, a cyclopentyl group, a cyclohexyl group, a cyclobutyl group and a cyclooctyl group. The group has plural such groups. The group having plural monocyclic alicyclic hydrocarbon groups preferably has 2 to 4 monocyclic alicyclic hydrocarbon groups, more preferably two monocyclic alicyclic hydrocarbon groups.

The alicyclic hydrocarbon group of a polycyclic type includes a group containing, for example, a bicyclo-, tricyclo- or tetracyclo-structure having 5 or more carbon atoms and is preferably a group containing a polycyclic cyclo-structure having 6 to 30 carbon atoms, and examples thereof include an adamantyl group, a norbornyl group, a norbornenyl group, an isobornyl group, a camphanyl group, a dicyclopentyl group, an α-pinel group, a tricyclodecanyl group, a tetracyclodecanyl group and an androstanyl group. Further, a part of carbon atoms in the monocyclic or polycyclic cycloalkyl group may be substituted with a heteroatom such as oxygen atom.

The polycyclic alicyclic hydrocarbon group of $X_2$ above is preferably an adamantyl group, a decalin group, a norbornyl group, a norbornenyl group, a cedrol group, a group having a plurality of cyclohexyl groups, a group having a plurality of cycloheptyl groups, a group having a plurality of cyclooctyl groups, a group having a plurality of cyclodecanyl groups, a group having a plurality of cyclododecanyl groups, or a tricyclodecanyl group, and most preferably an adamantyl group from the viewpoint of dry etching resistance. Examples of the chemical formula of the polycyclic alicyclic hydrocarbon structure in the polycyclic alicyclic hydrocarbon group of $X_2$ are the same as those of the chemical formula of the polycyclic alicyclic hydrocarbon structure in the above-described group having a polycyclic alicyclic hydrocarbon structure, and the preferred range is also the same. The polycyclic alicyclic hydrocarbon group of $X_2$ includes a monovalent group formed by substituting a bond for one arbitrary hydrogen atom on the polycyclic alicyclic hydrocarbon structure as described above.

The alicyclic hydrocarbon group may further have a substituent, and examples of the substituent include the same as those described above that the polycyclic alicyclic hydrocarbon structure may have.

The position of substitution of —O—Y—$X_2$ in the general formula (4) may be the para-position, the meta-position, or the ortho-position with respect to the bonding position of the benzene ring to the polymer main chain, but the para-position is preferred.

In the present invention, the repeating unit represented by the general formula (3) is most preferably a repeating unit represented by the following general formula (4').

[Chem. 28]

(4')

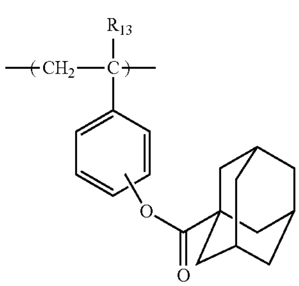

In the general formula (4'), $R_{13}$ represents a hydrogen atom or a methyl group.

In the general formula (4'), $R_{13}$ represents a hydrogen atom or a methyl group, but a hydrogen atom is particularly preferred.

The position of substitution of the adamantyl ester group in the general formula (4') may be the para-position, the meta-position, or the ortho-position with respect to the bonding position of the benzene ring to the polymer main chain, but the para-position is preferred.

Specific examples of the repeating unit represented by the general formula (3) include the following:

[Chem. 29-1]

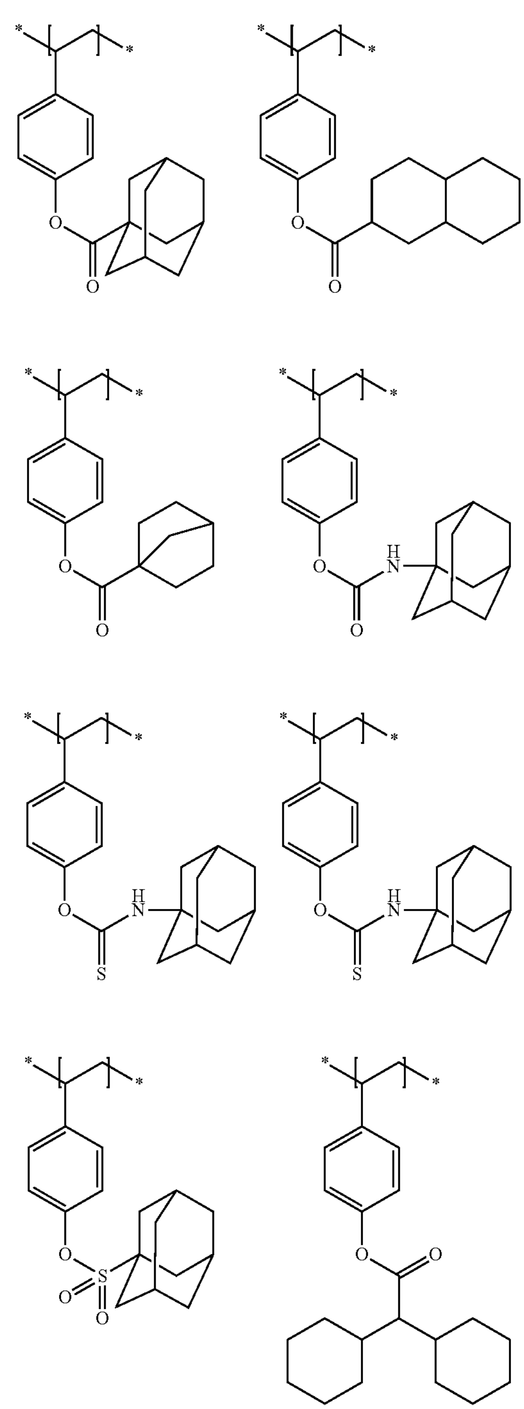

-continued
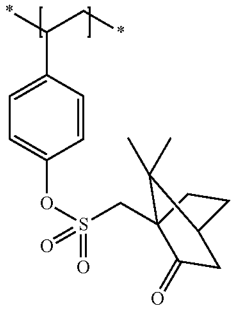
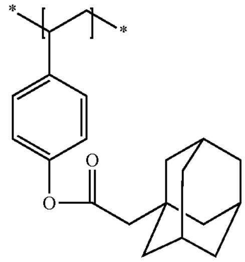
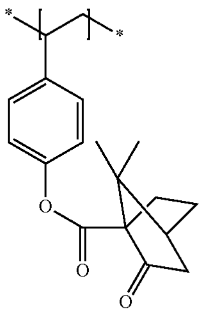
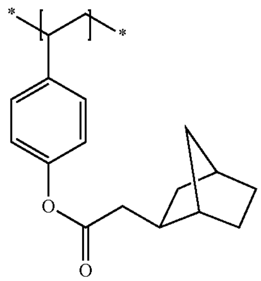
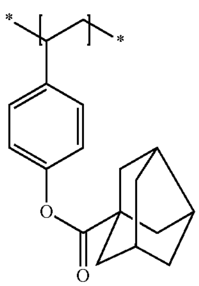
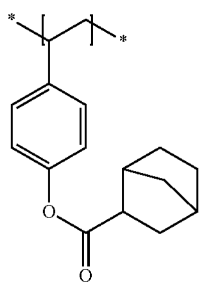
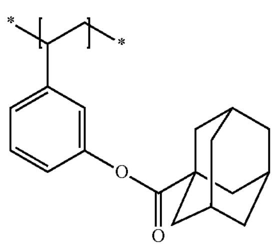
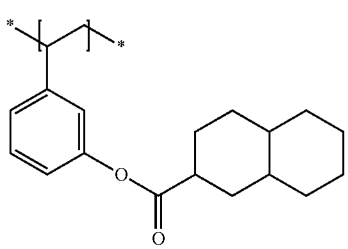
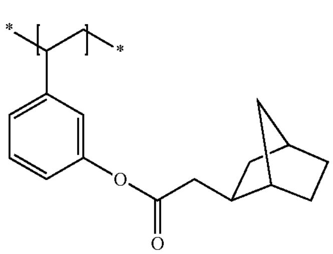
-continued
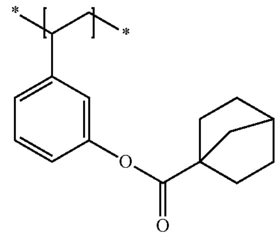
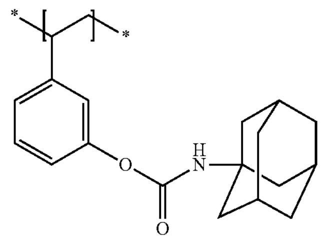
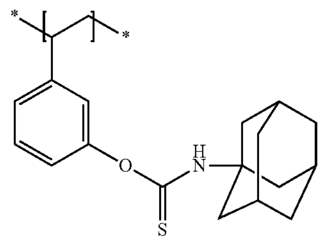
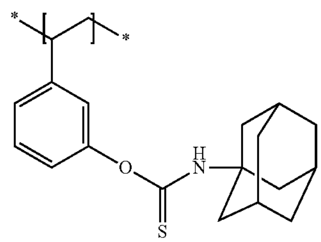
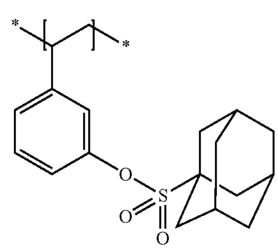
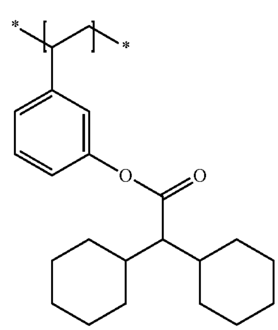

-continued
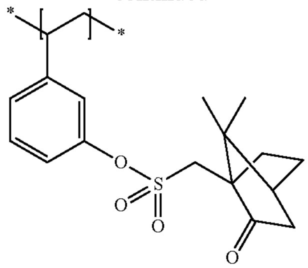
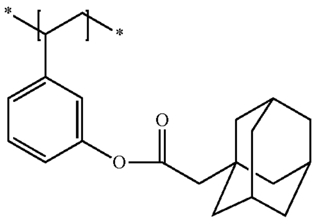
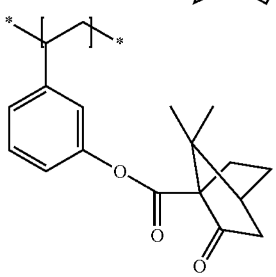
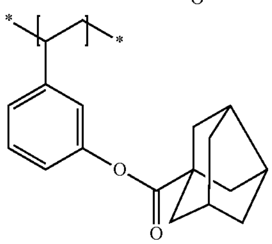
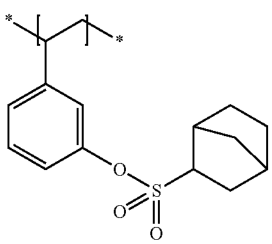
[Chem. 29-2]
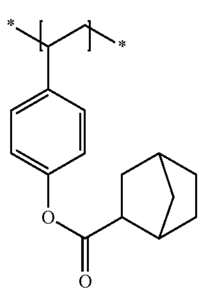
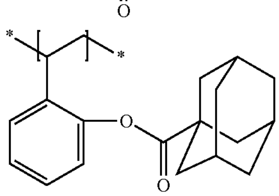
-continued
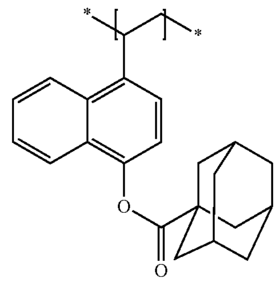
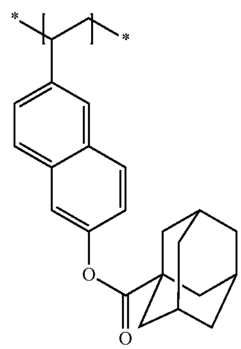
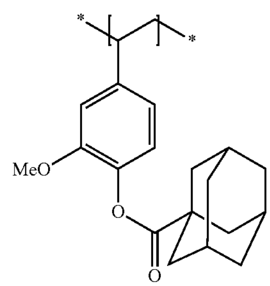
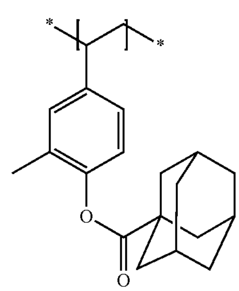
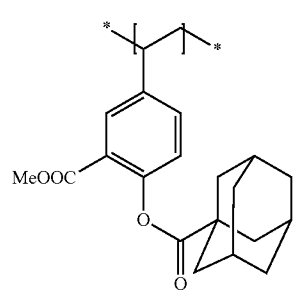

-continued

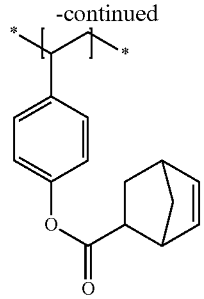

In the case where the polymer compound (A) contains a repeating unit having a structure in which a hydrogen atom of a phenolic hydroxyl group is substituted with a group having a non-acid-decomposable polycyclic alicyclic hydrocarbon structure, the content of the repeating units is preferably from 1% by mole to 40% by mole, and more preferably from 2% by mole to 30% by mole, based on the entire repeating units of the polymer compound (A).

Furthermore, the polymer compound (A) is preferably synthesized by modifying a polymer synthesized by subjecting a unit having an acid-cross-linkable group to a radical polymerization method, a living radical polymerization, or a living anion polymerization method with a polymer reaction.

Particularly, the polymer compound (A) having an oxirane ring or an oxetane ring as a cross-linkable group is preferably synthesized by modifying a polymer synthesized by subjecting a unit having a polycyclic structure including an alkene to a radical polymerization method, a living radical polymerization, or a living anion polymerization method with a polymer reaction, and oxidation using an oxidant (for example, hydrogen peroxide and mCPBA).

The weight average molecular weight of the polymer compound (A) is preferably 1000 to 200000, and more preferably having 2000 to 50000, and even more preferably 2000 to 10000.

The dispersity (molecular weight distribution) (Mw/Mn) of the polymer compound (A) is preferably 1.7 or less, and from the viewpoint of enhancing sensitivity and resolution, the dispersity is more preferably 1.0 to 1.35, and most preferably 1.0 to 1.20. When living polymerization such as living anion polymerization is used, the dispersity (molecular weight distribution) of the polymer compound (A) thus obtained becomes uniform, which is preferable. The weight average molecular weight and dispersity of the polymer compound (A) are defined by the values obtained by gas permeation chromatography (GPC) measurement and calculated relative to polystyrene standards. Specifically, the weight average molecular weight (Mw) and number average molecular weight (Mn) of the polymer compound (A) can be determined by using, for example, HLC-8120 (manufactured by Tosoh Corp.) and using a TSK gel Multipore HXL-M (manufactured by Tosoh Corp., 7.8 mm ID×30.0 cm) as a column and tetrahydrofuran (THF) as an eluent.

The content of the polymer compound (A) in the composition of the present invention is preferably from 20% by mass to 95% by mass, more preferably from 50% by mass to 95% by mass, and particularly preferably from 80% by mass to 95% by mass, based on the total solid content of the composition.

Specific examples of the polymer compound (A) will be shown below, but the present invention is not limited thereto.

[Chem. 30-1]

(A-1)

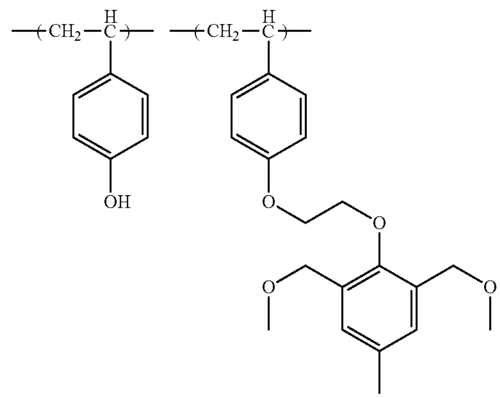

(A-2)

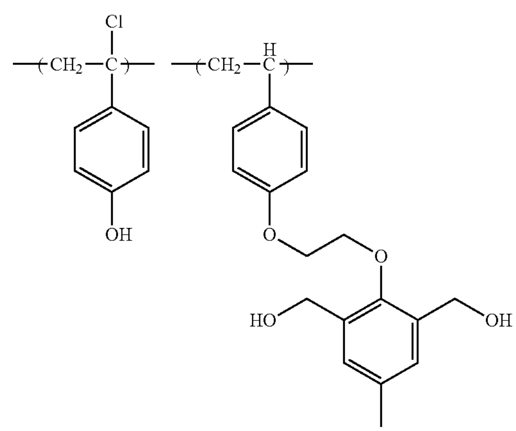

(A-3)

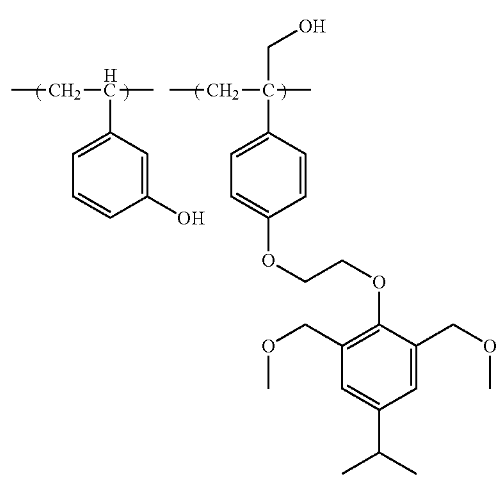

-continued
(A-4)
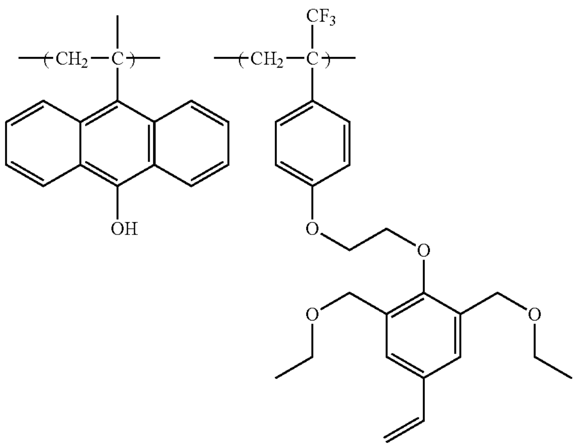
(A-5)
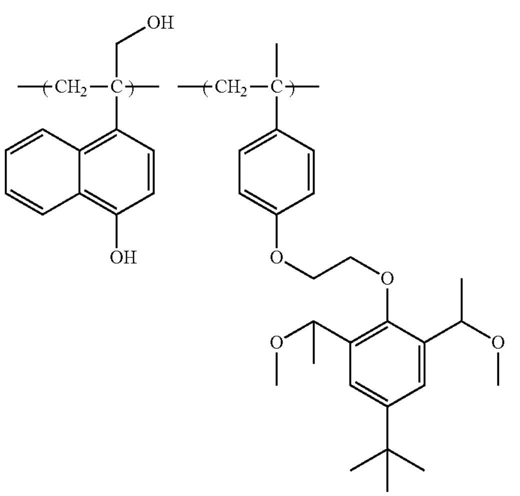
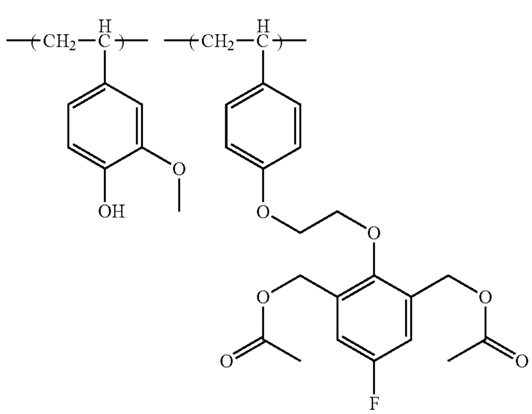
-continued
(A-7)
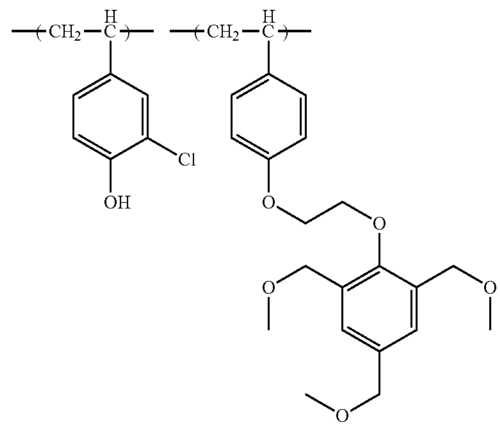
(A-8)
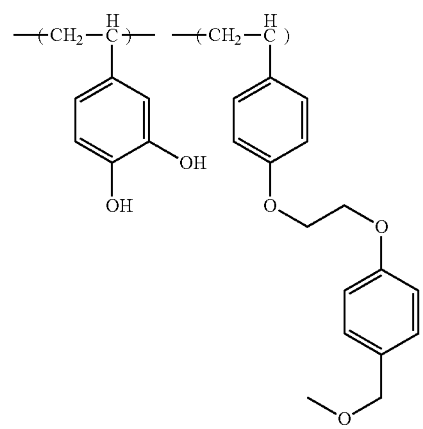
(A-9)
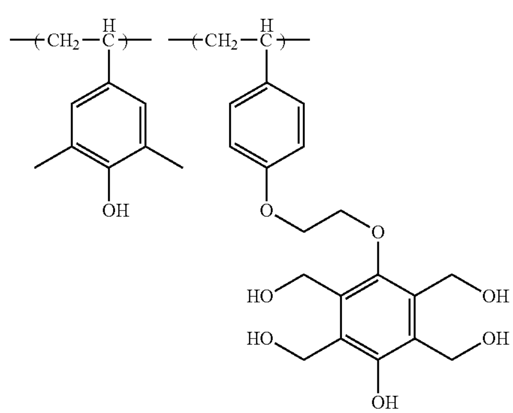

-continued
(A-10)
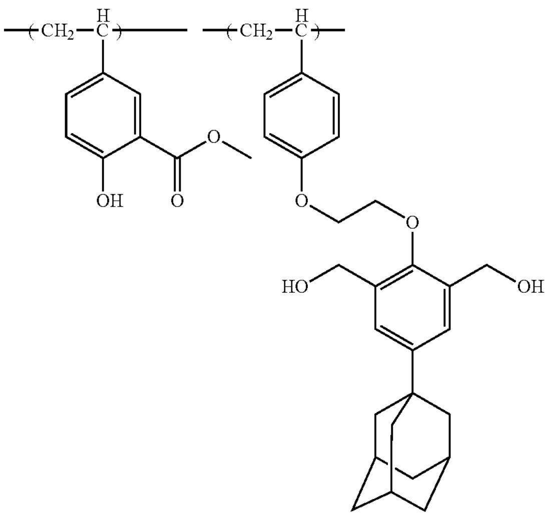
(A-11)
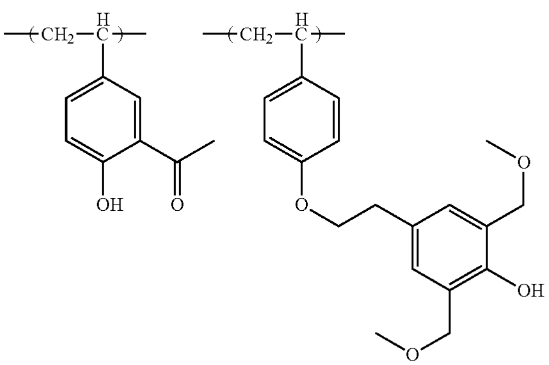
(A-12)
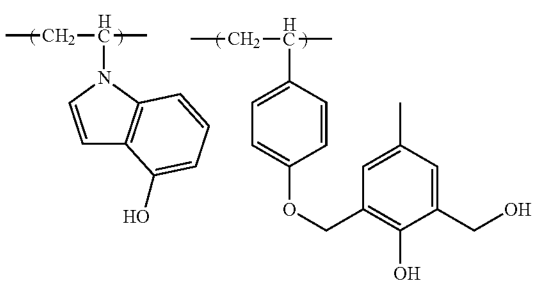
(A-13)
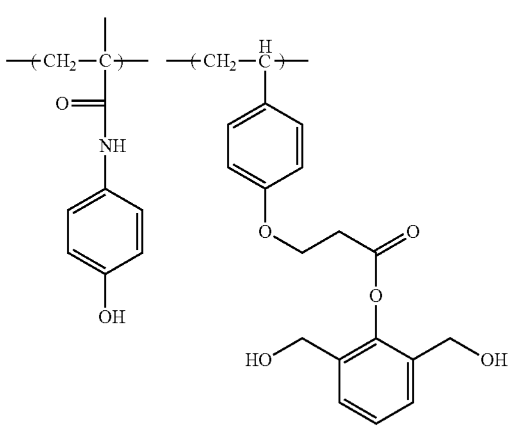
-continued
(A-14)
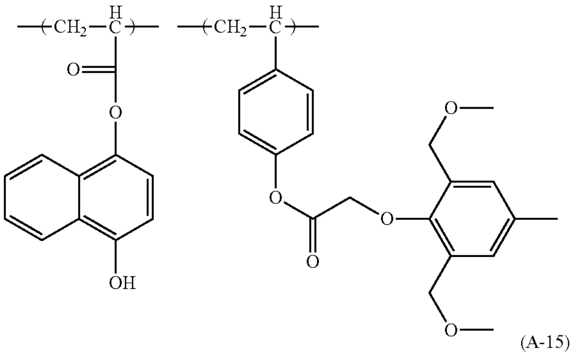
(A-15)
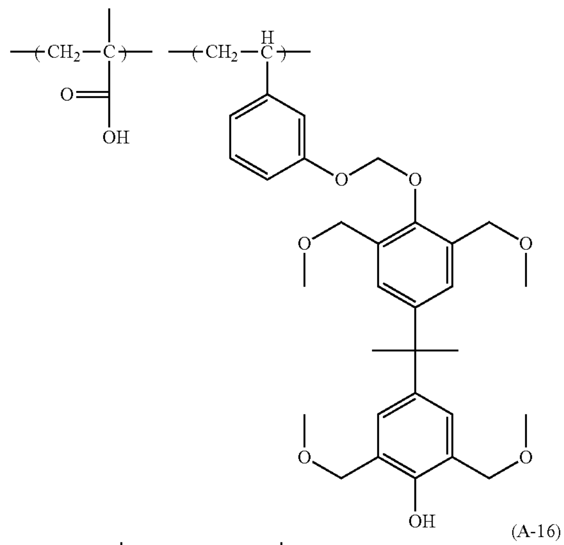
(A-16)
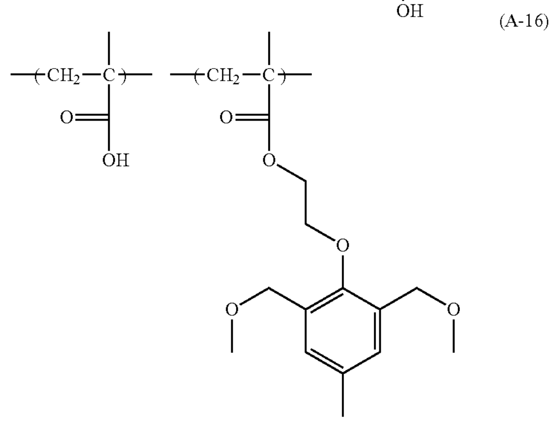
[Chem. 30-2]
(A-17)
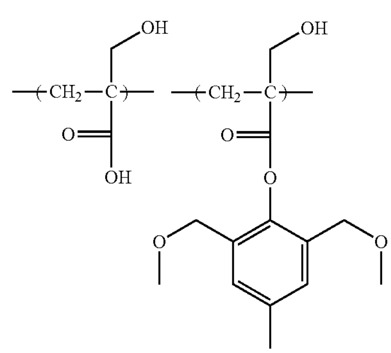

-continued
(A-18)
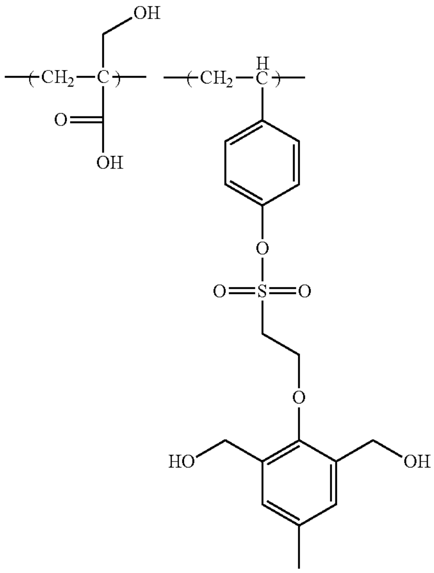
(A-19)
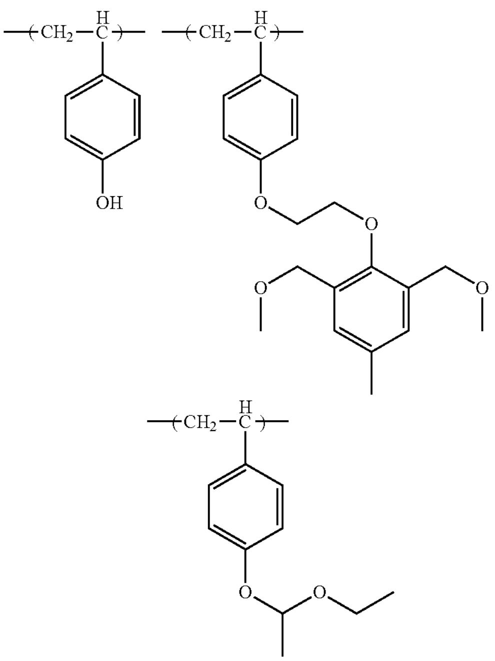
(A-20)
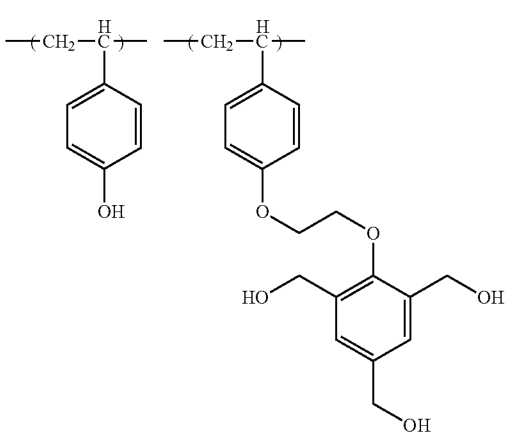
-continued
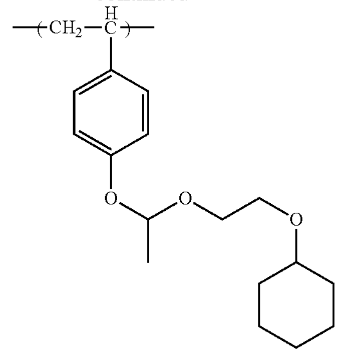
(A-21)
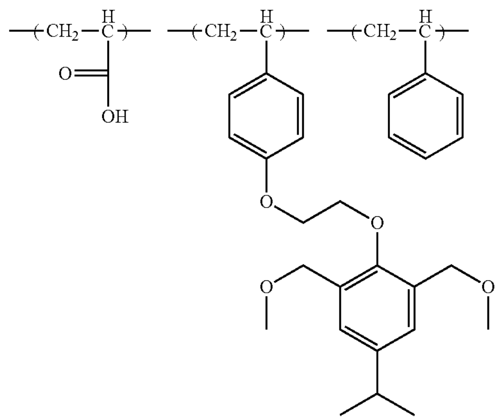
(A-22)
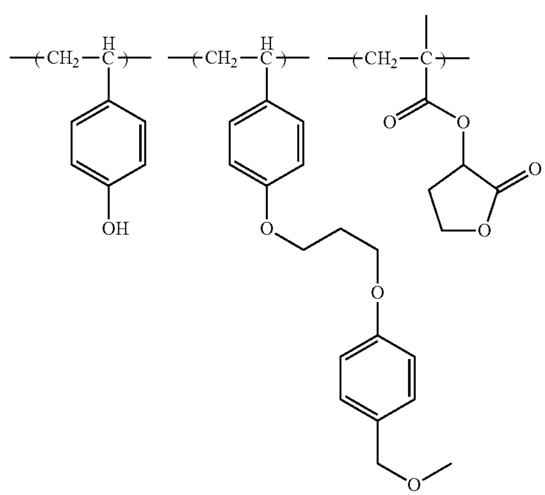
(A-23)
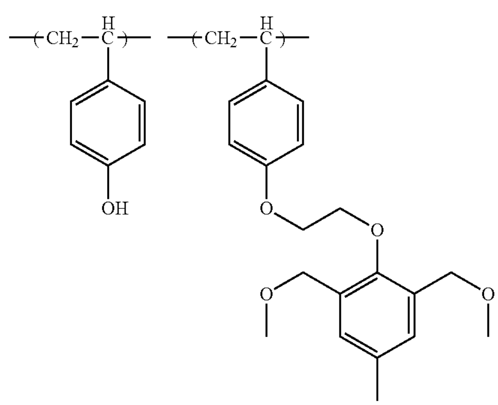

-continued
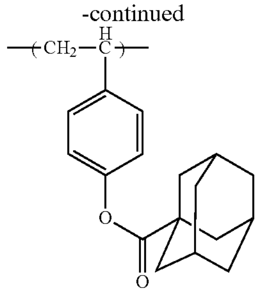
(A-24)
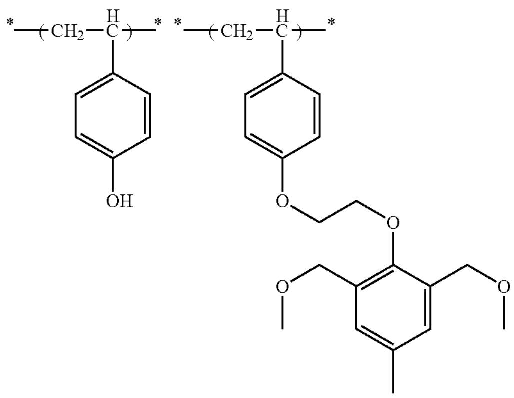
(A-25)
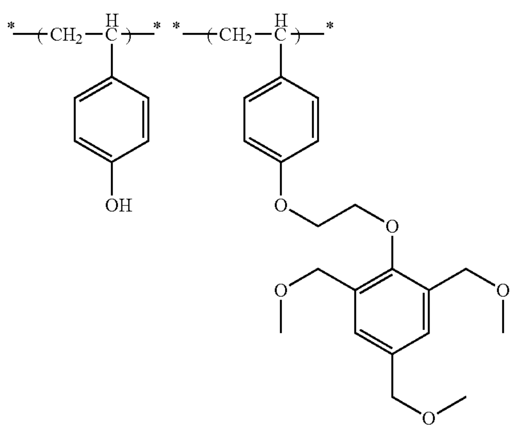
(A-26)
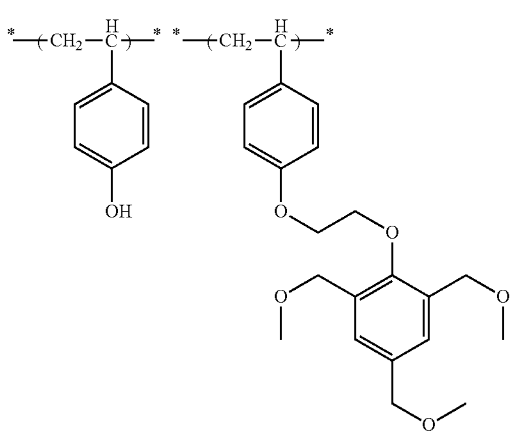
-continued
(A-27)
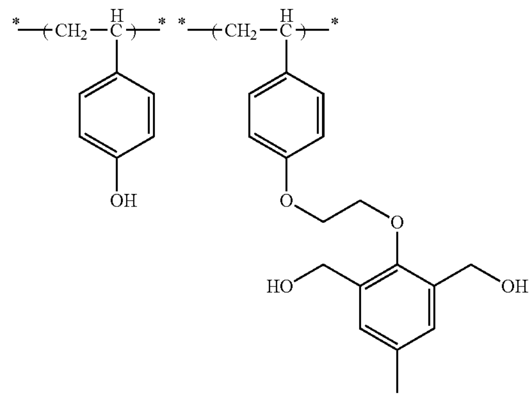
[Chem. 30-3]
(A-28)
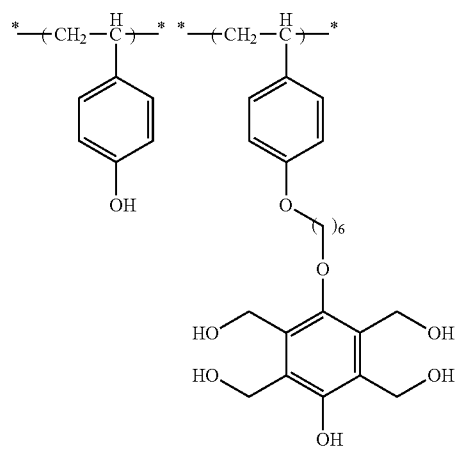
(A-29)
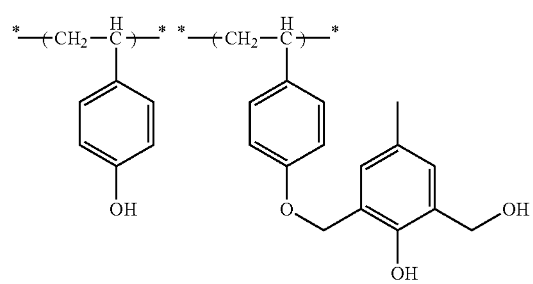
(A-30)
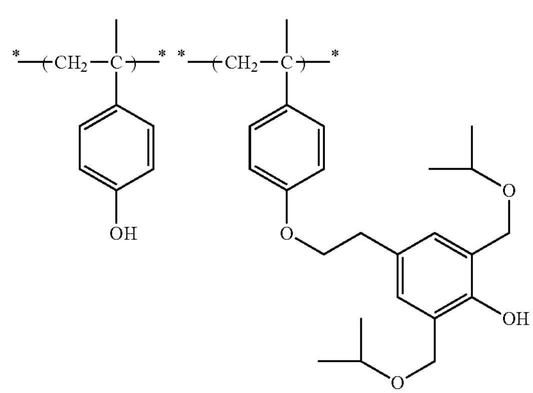

-continued
(A-31)
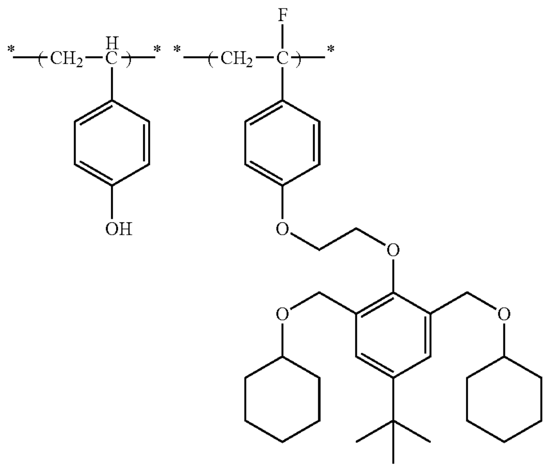
(A-32)
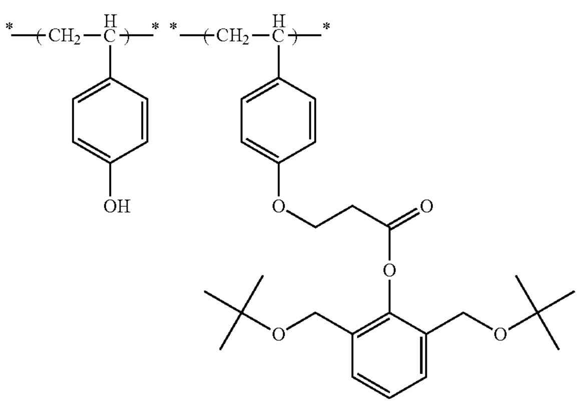
(A-33)
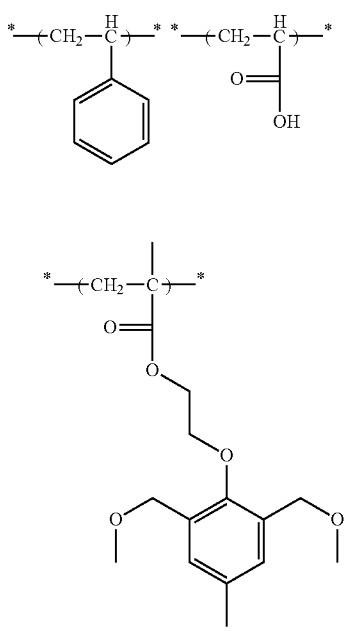
-continued
(A-34)
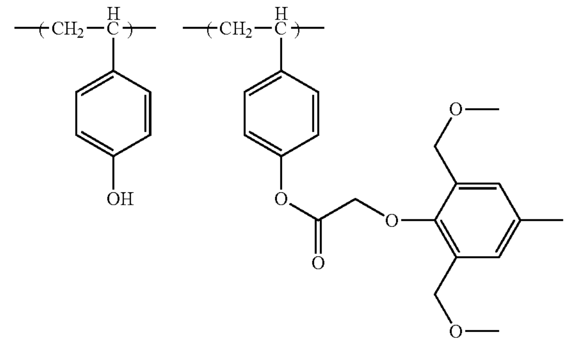
(A-35)
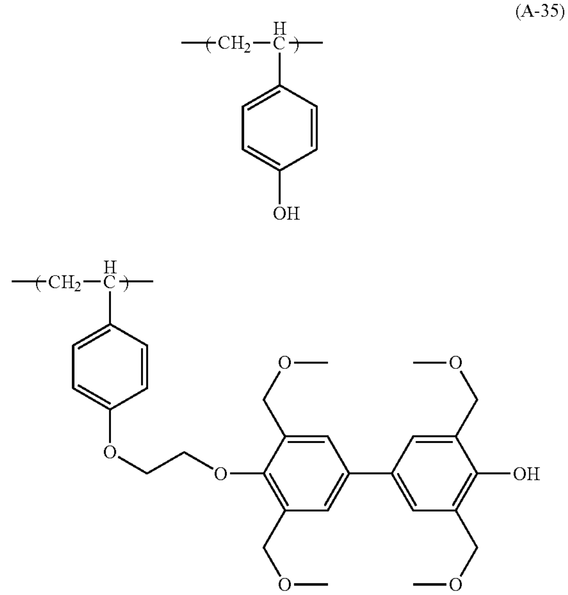
(A-36)
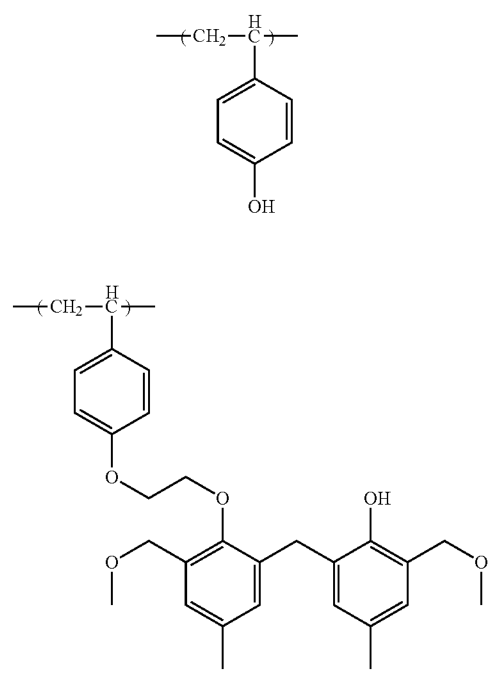

(A-37)
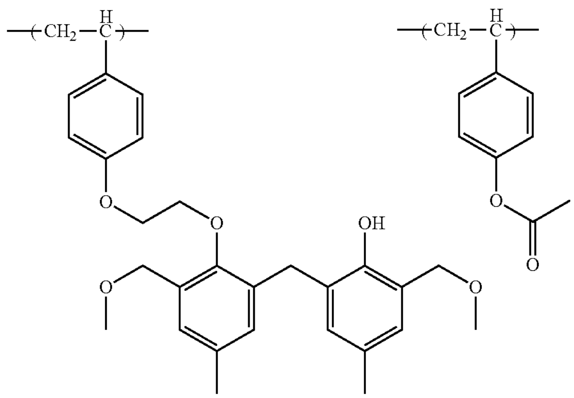
[Chem. 30-4]
(A-38)
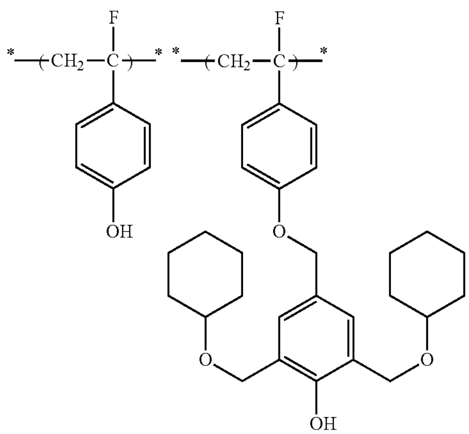
(A-39)
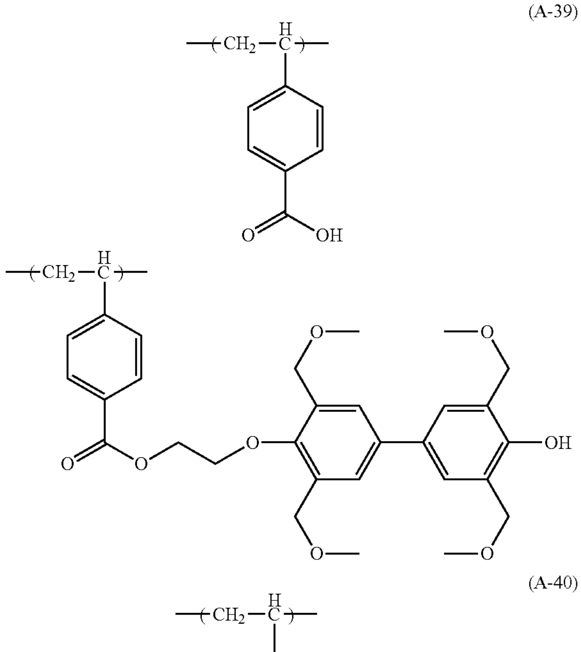
(A-40)
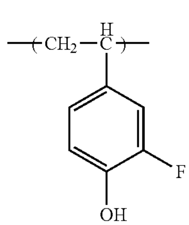
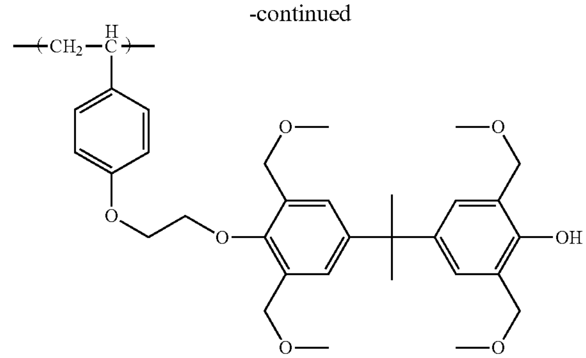
(A-41)
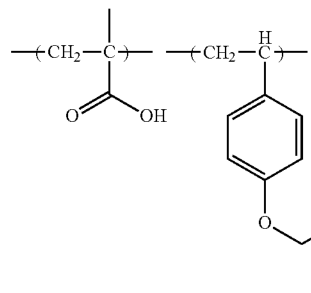
(A-42)
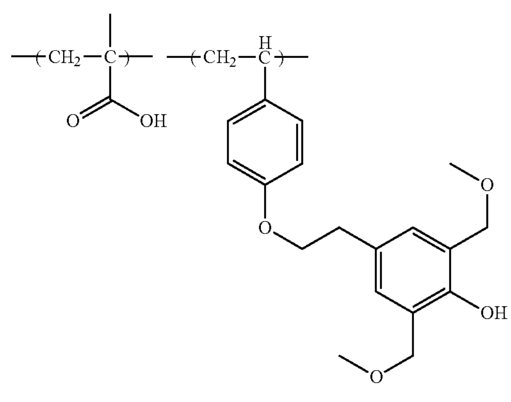
(A-43)
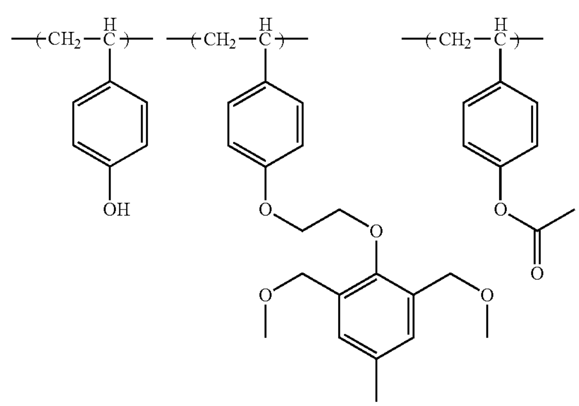

-continued
(A-44)
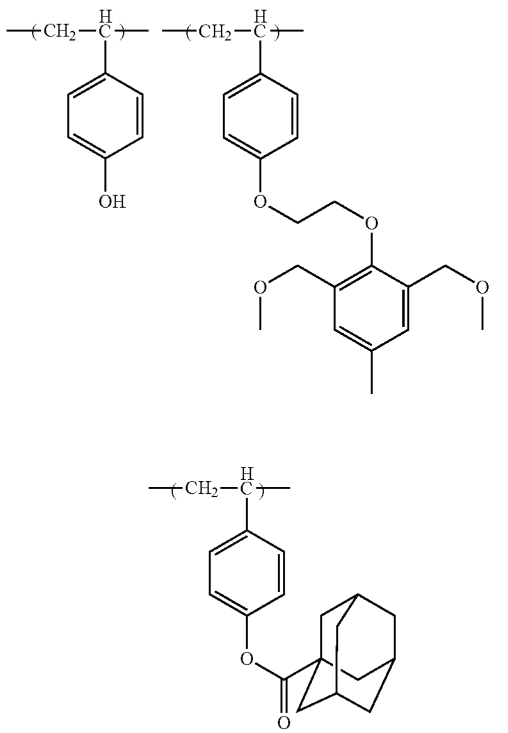
(A-45)
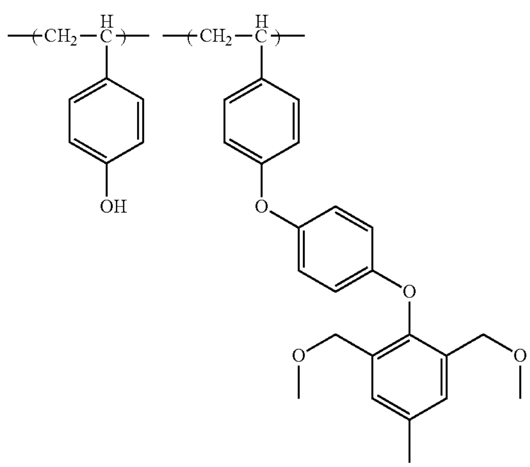
(A-46)
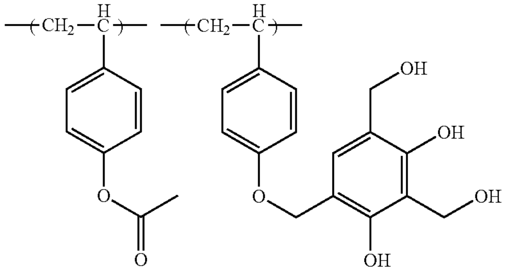
-continued
(A-47)
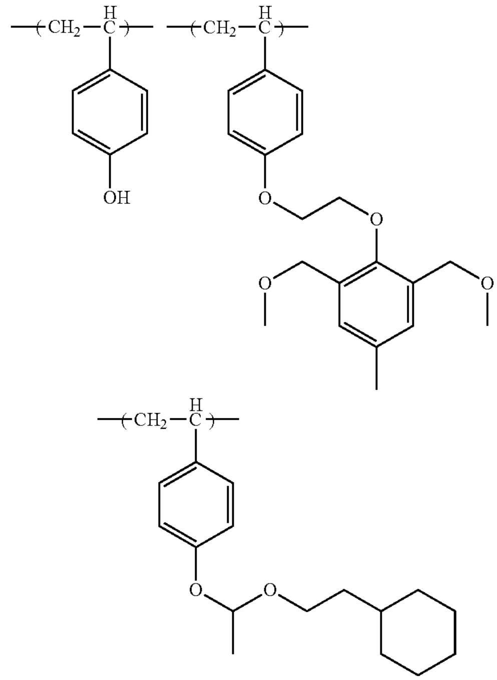
(A-48)
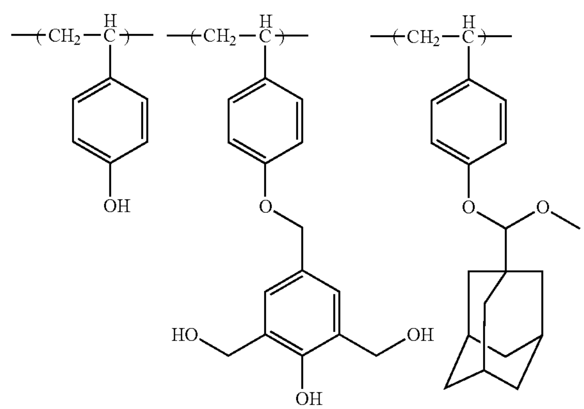
(A-49)
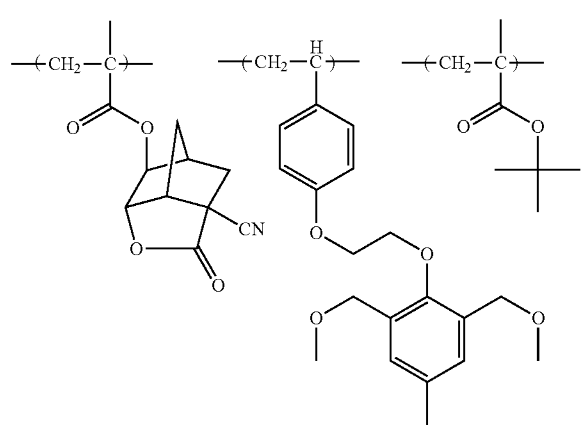

-continued
(A-50)
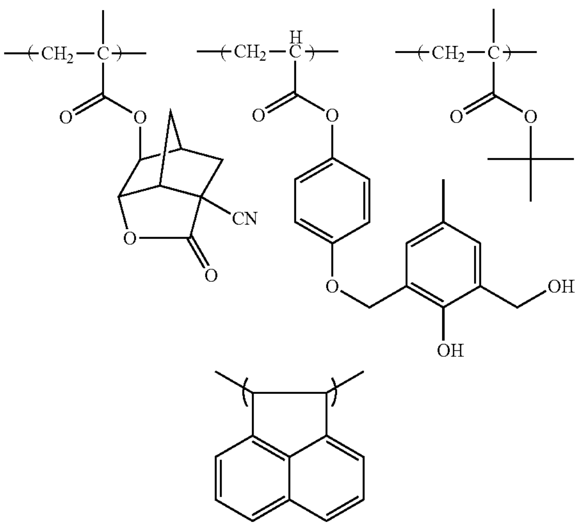
[Chem. 30-5]
(A-51)
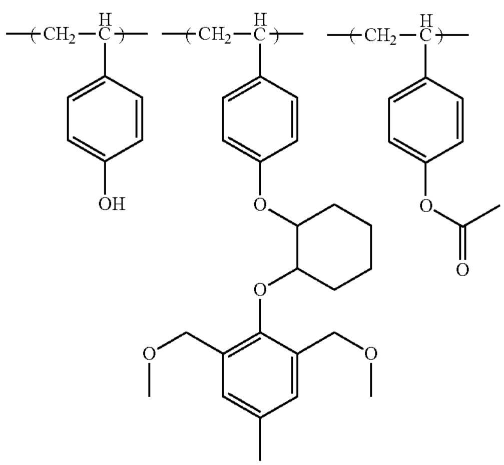
(A-52)
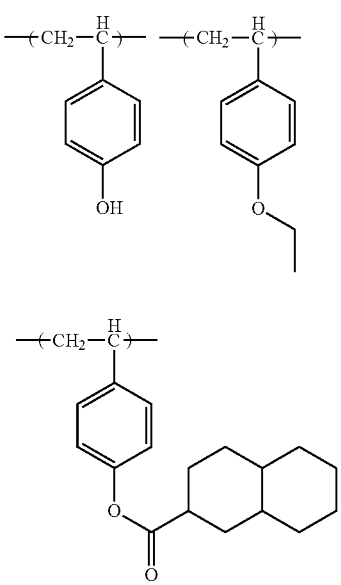
-continued
(A-53)
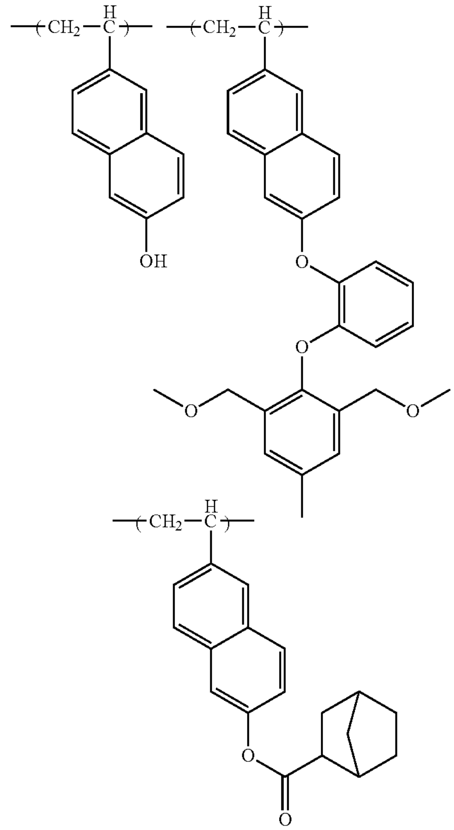
(A-54)
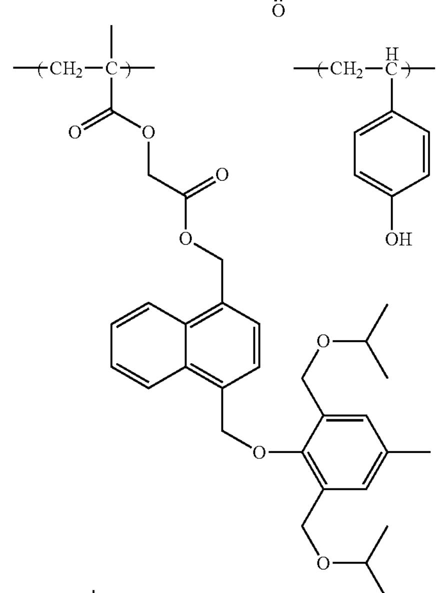
(A-55)
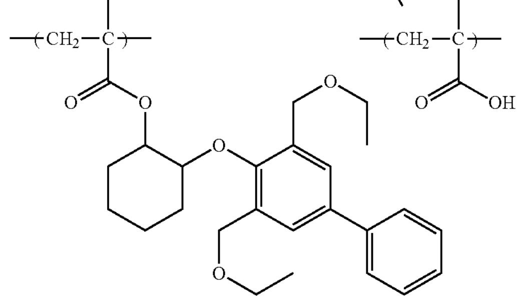

-continued
(A-56)
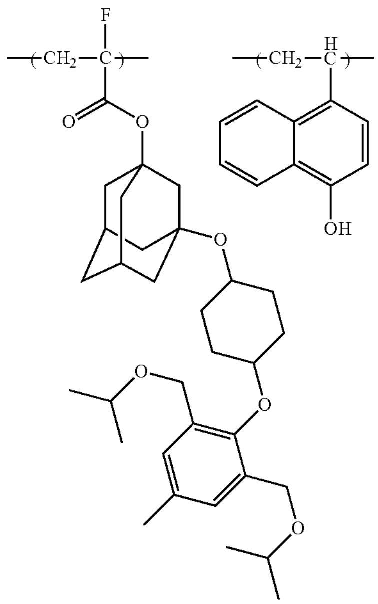
(A-57)
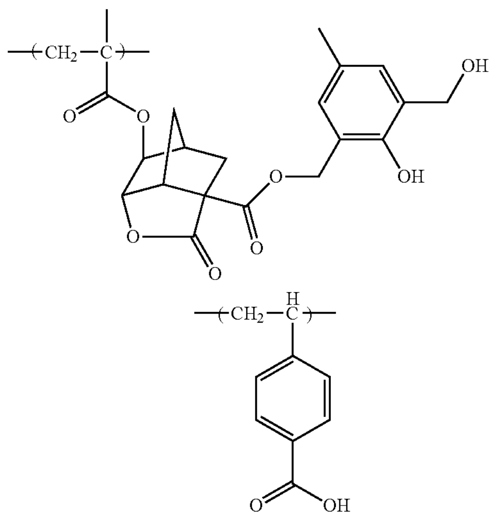
(A-58)
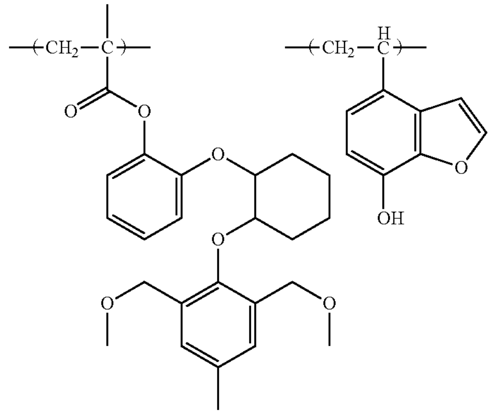
-continued
(A-59)
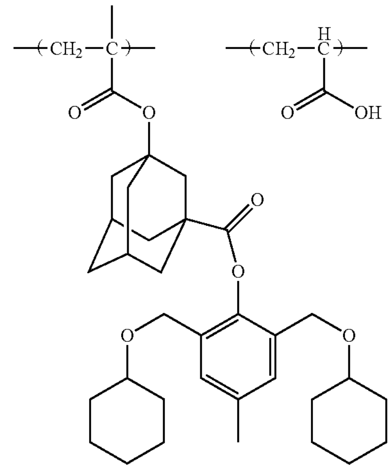
(A-60)
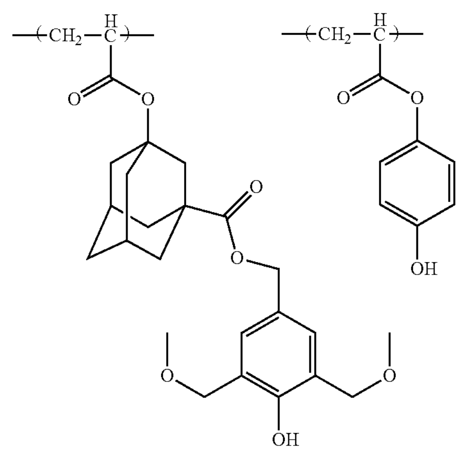
[Chem. 30-6]
(A-61)
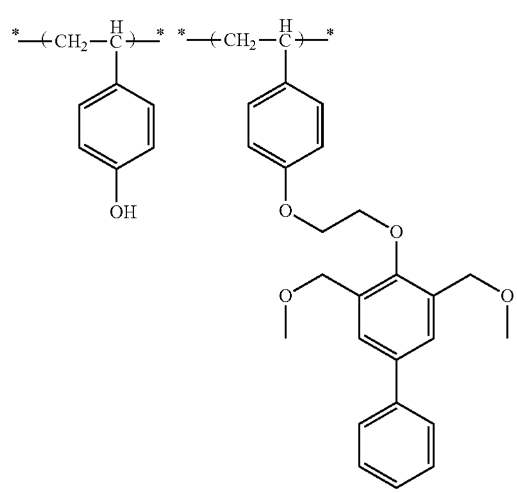

-continued
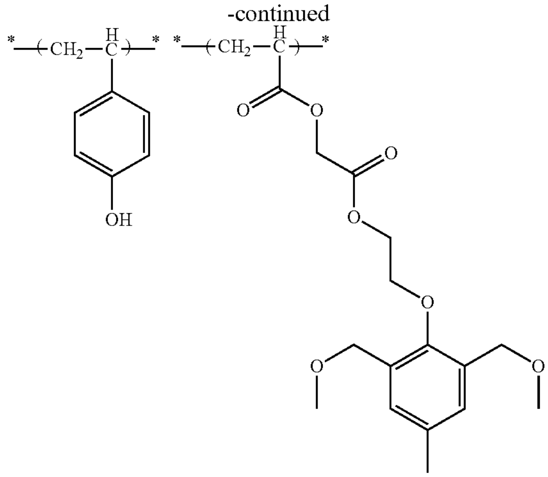
(A-63)
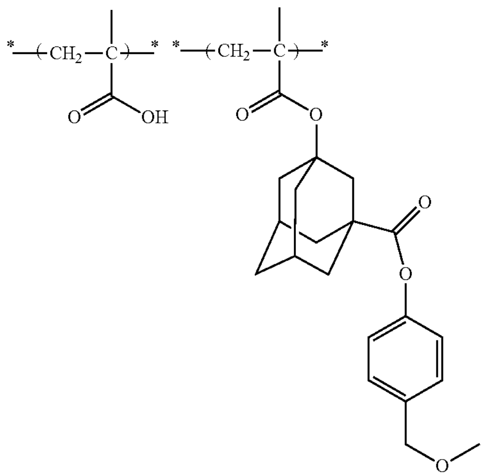
(A-64)
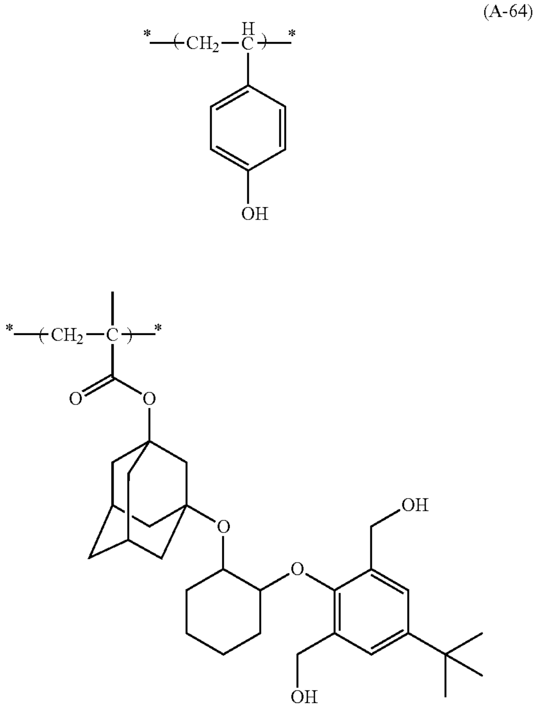
-continued
(A-65)
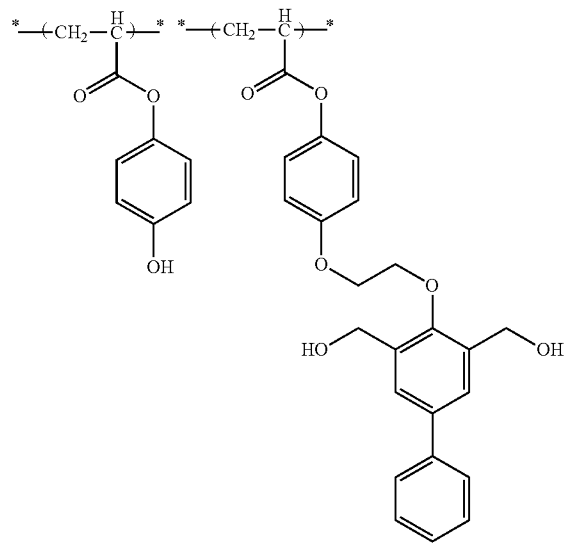
(A-66)
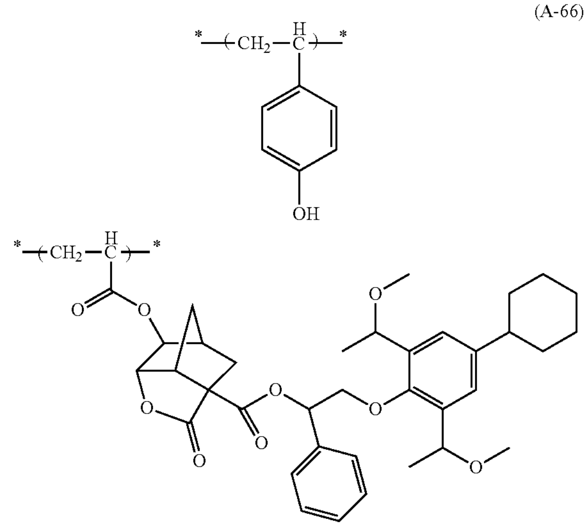
(A-67)
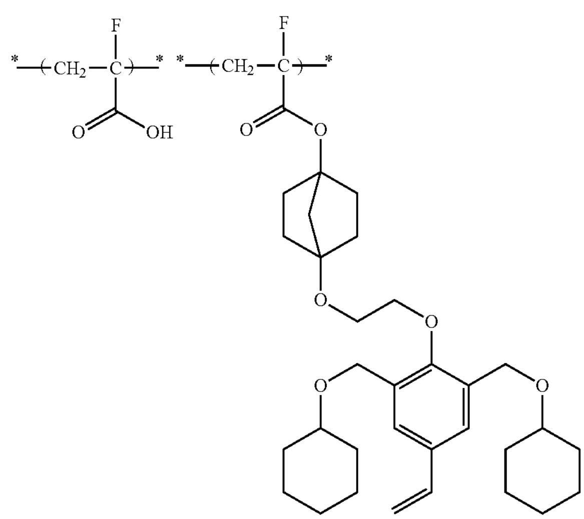

[2] Compound (X) Having Phenolic Hydroxyl Group

In one embodiment, the composition of the present invention may contain a phenolic compound (X) having a phenolic hydroxyl group, in addition to the polymer compound (A) of the present invention. The phenolic hydroxyl group is a group obtained by substituting a hydrogen atom of an aromatic group with a hydroxyl group. The aromatic ring of the aromatic group is a monocyclic or polycyclic aromatic ring, and examples thereof include a benzene ring and a naphthalene ring.

The phenolic compound (X) having a phenolic hydroxyl group is not particularly limited as long as it has a phenolic hydroxyl group, and may be a compound having a relatively low molecular weight, such as a molecule resist, or may be a polymer compound. Herein, as the molecule resist, a low-molecular-weight cyclic polyphenol compound or the like may be used, which is described in, for example, JP2009-173623A and JP2009-173625A.

The compound having a phenolic hydroxyl group is preferably a polymer compound from the viewpoints of reactivity and sensitivity. In the case where the compound having a phenolic hydroxyl group is a polymer compound, the weight average molecular weight is preferably from 1000 to 200000, more preferably from 2000 to 50000, and even more preferably from 2000 to 15000. Further, the dispersity (molecular weight distribution) (Mw/Mn) is preferably 2.0 or less, and from the viewpoint of enhancing sensitivity and resolution, the dispersity is more preferably from 1.0 to 1.80, more preferably from 1.0 to 1.60, and most preferably from 1.0 to 1.20. When living polymerization such as living anion polymerization is used, the dispersity (molecular weight distribution) of the polymer compound thus obtained becomes uniform, which is preferable. The weight average molecular weight and dispersity are defined by the values obtained by GPC measurement and calculated relative to polystyrene standards.

Specific examples of the compound having a phenolic hydroxyl group will be shown below, but the present invention is not limited thereto.

[Chem. 31-1]

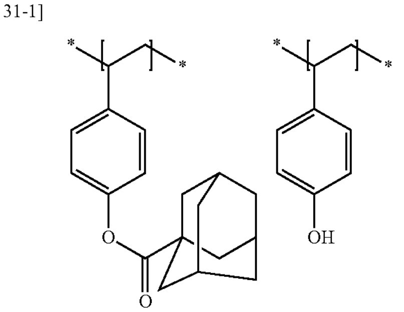

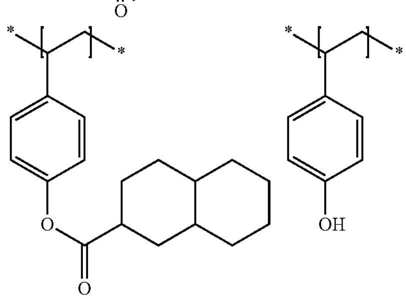

-continued

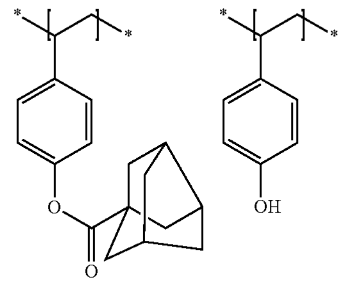

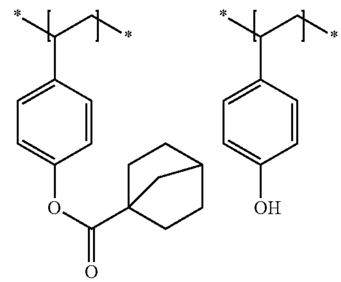

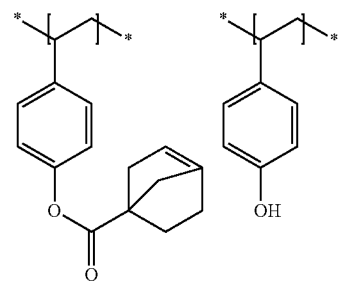

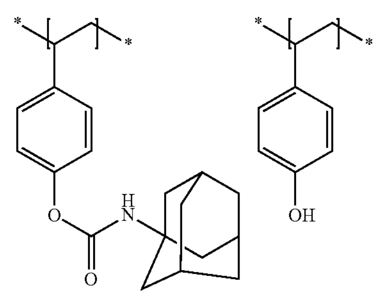

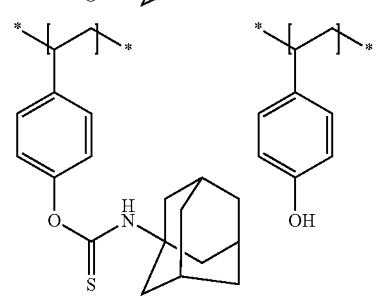

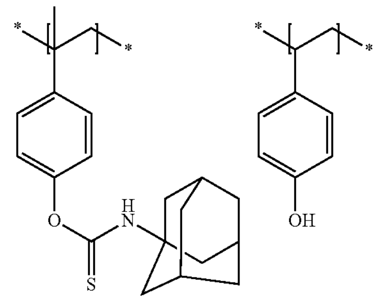

-continued
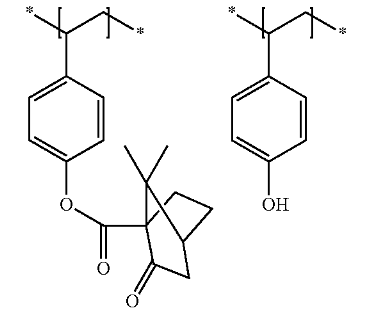
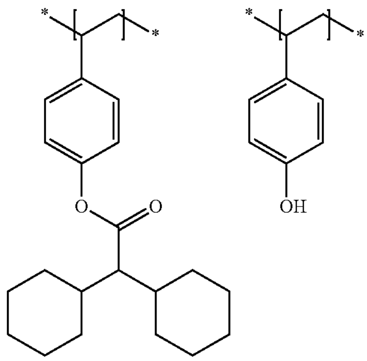
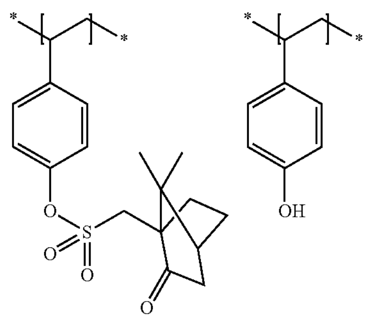
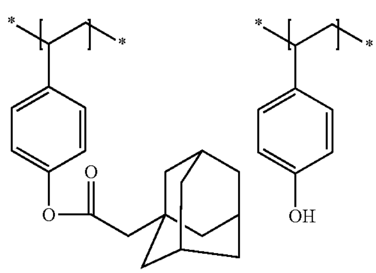
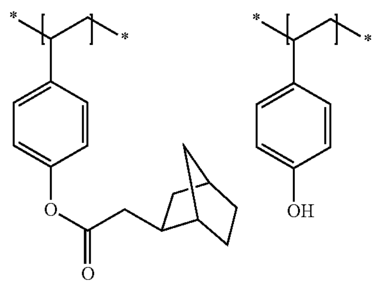
-continued
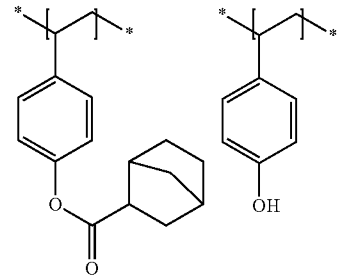
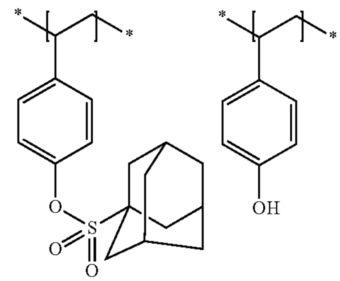
[Chem. 31-2]
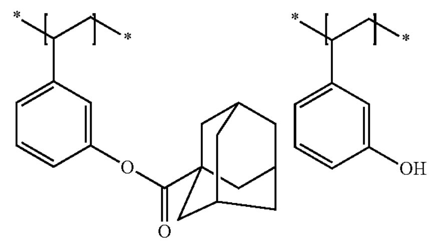
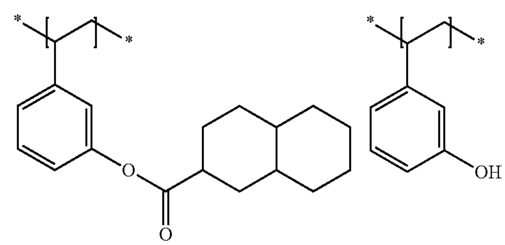
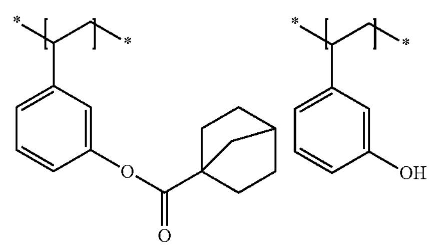
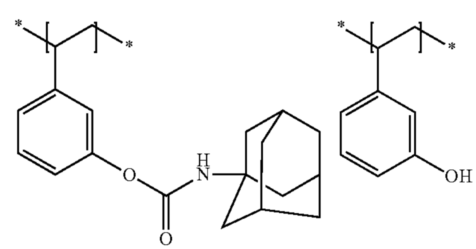

-continued
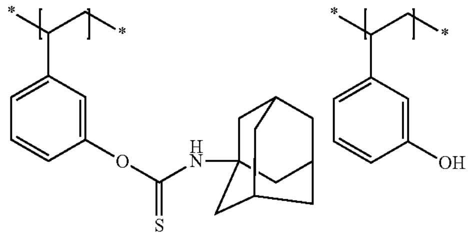
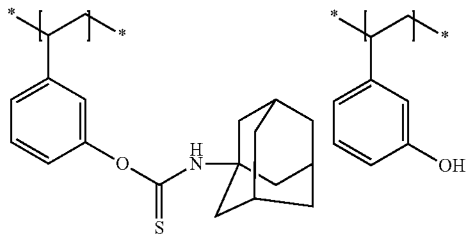
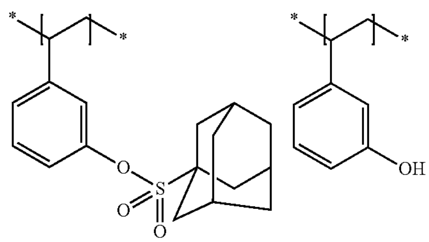
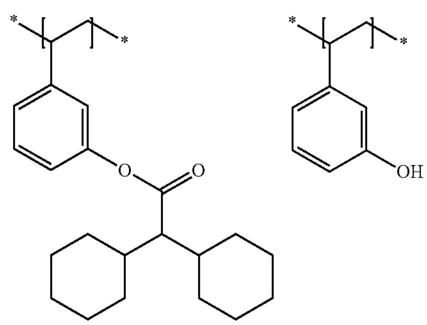
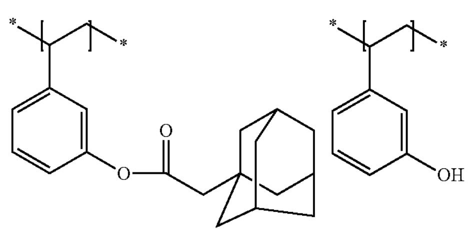
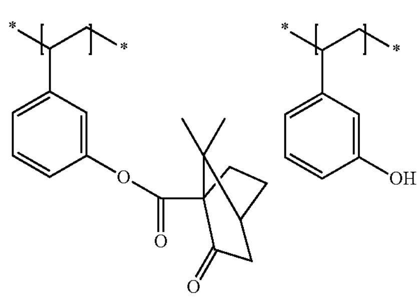
-continued
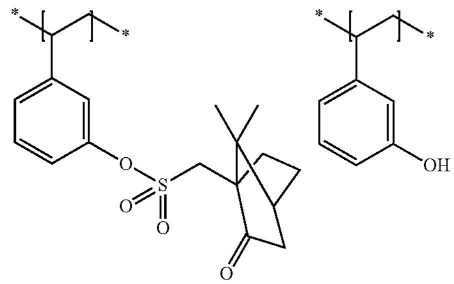
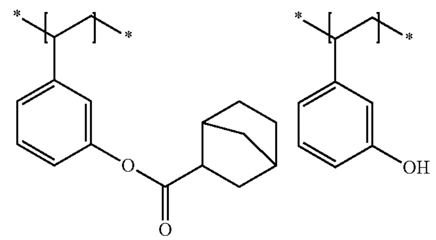
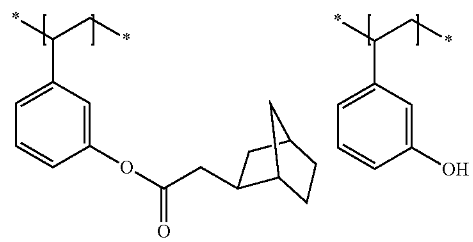
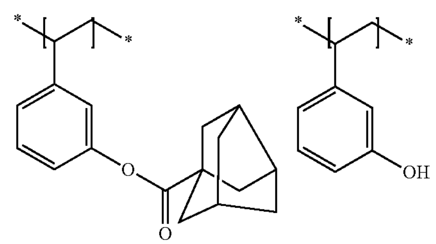
[Chem. 31-3]
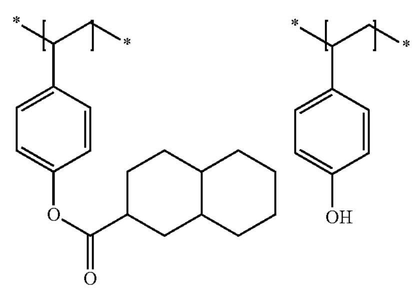
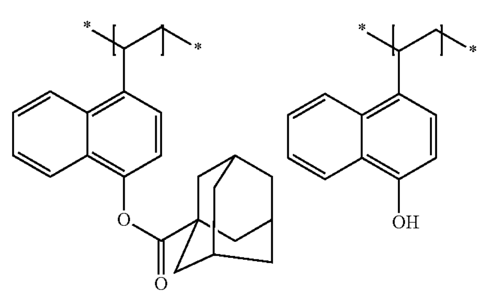

-continued
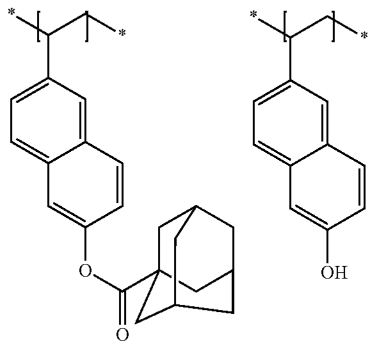
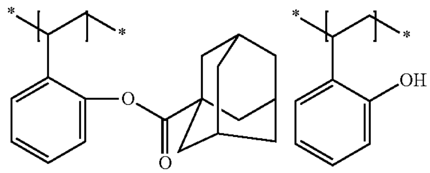
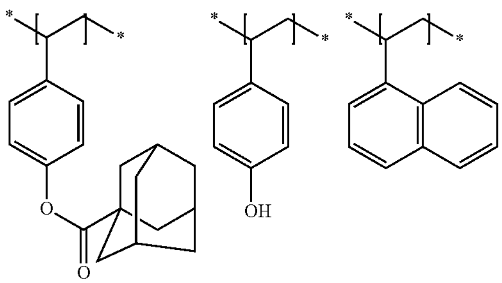
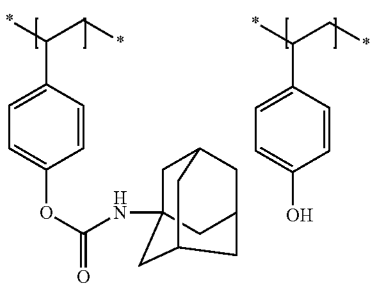
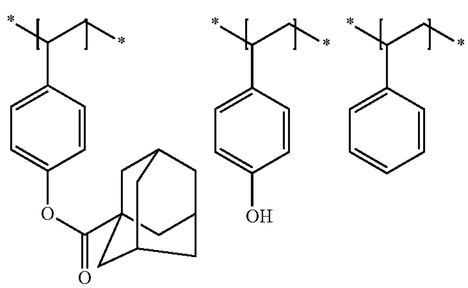
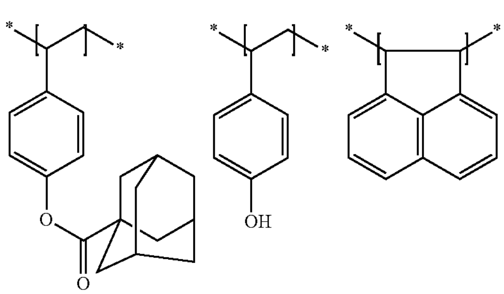
-continued
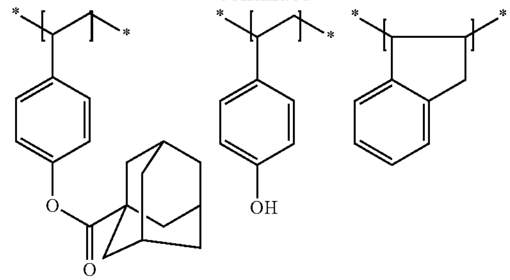
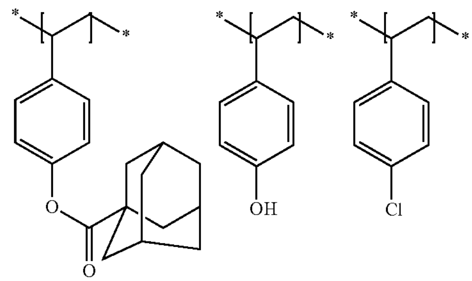
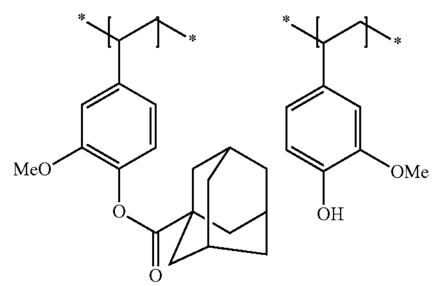
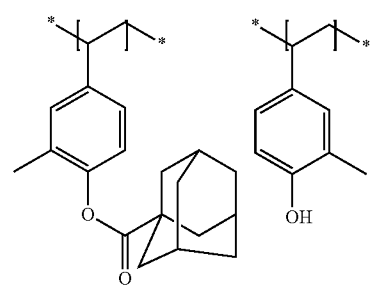
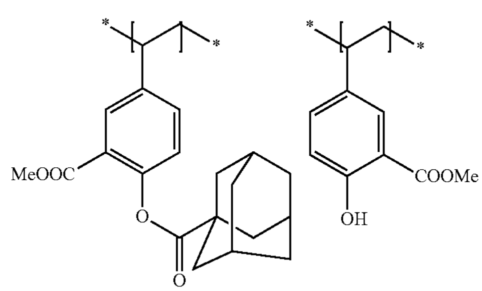
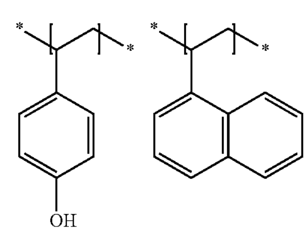

-continued

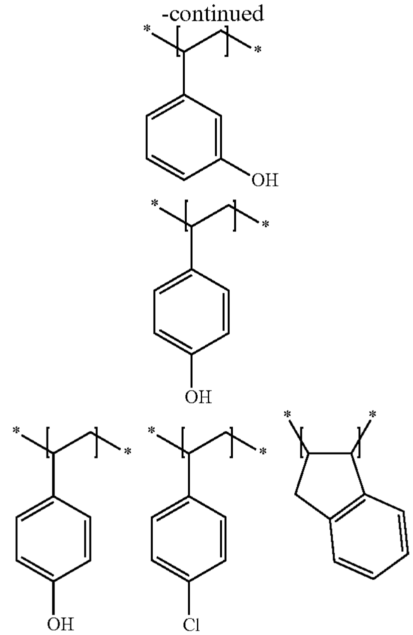

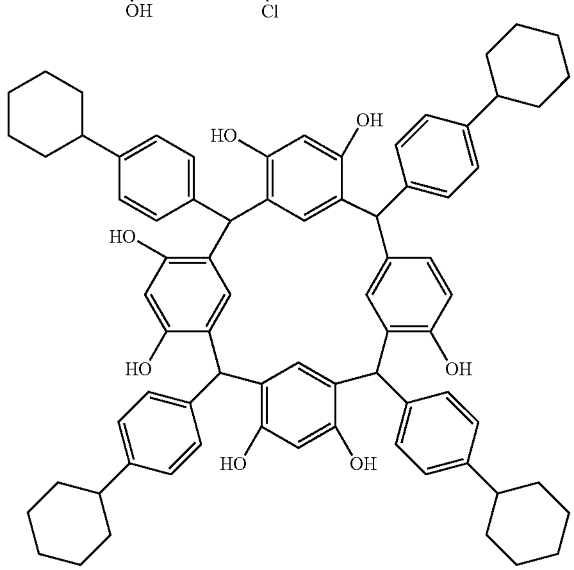

[3] Compound (B) Capable of Generating Acid when Irradiated with Actinic Rays or Radiation In one embodiment, the composition of the present invention contains a compound (B) capable of generating an acid when irradiated with actinic rays or radiation (which will be hereinafter also referred to as a "compound (B)" or an "acid generator").

A preferred form of the acid generator may be an onium salt compound. Examples of such an onium salt compound include a sulfonium salt, an iodonium salt, and a phosphonium salt.

Furthermore, another preferred form of the acid generator may be a compound that generates a sulfonic acid, an imide acid or a methide acid when irradiated with actinic rays or radiation. Examples of the acid generator in that form include a sulfonium salt, an iodonium salt, a phosphonium salt, an oxime sulfonate, and an imide sulfonate.

The acid generator used in the present invention is not limited to low molecular weight compounds, and a compound in which a group which generates an acid when irradiated with actinic rays or radiation is introduced into the main chain or a side chain of a polymer compound, can also be used. Furthermore, as discussed above, when a group which generates an acid when irradiated with actinic rays or radiation is present in a repeating unit which serves as a copolymerization component of the polymer compound (A) used in the present invention, an acid generator (B) of a different molecule from the polymer compound (A) of the present invention may be absent.

The acid generator is preferably a compound that generates an acid when irradiated with an electron beam or extreme ultraviolet rays.

In the present invention, preferable examples of the onium salt compound include a sulfonium compound represented by the following general formula (7) and an iodonium compound represented by the following general formula (8).

[Chem. 32]

(7)

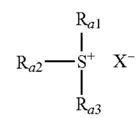

(8)

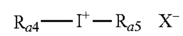

In the general formulae (7) and (8), $R_{a1}$, $R_{a2}$, $R_{a3}$, $R_{a4}$ and $R_{a5}$ each independently represent an organic group.

$X^-$ represents an organic anion.

Hereinafter, the sulfonium compound represented by the general formula (7) and the iodonium compound represented by the general formula (8) will be described in more detail.

$R_{a1}$, $R_{a2}$ and $R_{a3}$ of the general formula (7) and $R_{a4}$ and $R_{a5}$ of the general formula (8) each independently represent an organic group, but preferably, at least one of $R_{a1}$ to $R_{a3}$ and at least one of $R_{a4}$ and $R_{a5}$ are respectively an aryl group. The aryl group is preferably a phenyl group or a naphthyl group, and more preferably a phenyl group.

Examples of the organic anion of $X^-$ in the general formulae (7) and (8) include a sulfonate anion, a carboxylate anion, a bis(alkylsulfonyl)amide anion, and a tris(alkylsulfonyl)methide anion. The organic anion is preferably represented by the following general formula (9), (10), or (11), and more preferably represented by the following general formula (9).

[Chem. 33]

(9)

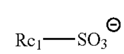

(10)

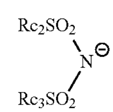

(11)

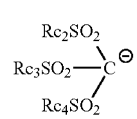

In the general formulae (9), (10), and (11), $R_{c1}$, $R_{c2}$, $R_{c3}$ and $R_{c4}$ each independently represent an organic group.

The organic anion of $X^-$ corresponds to the sulfonic acid, imide acid or methide acid, which are acids generated by irradiation of actinic rays or radiation such as an electron beam or extreme ultraviolet rays.

Examples of the organic group of $R_{c1}$, $R_{c2}$, $R_{c3}$ and $R_{c4}$ include an alkyl group, an aryl group, and groups having a plural number of these groups linked together. Among these organic groups, more preferable examples include an alkyl group in which the 1-position is substituted with a fluorine atom or a fluoroalkyl group and a phenyl group substituted with a fluorine atom or a fluoroalkyl group. When the organic group has a fluorine atom or a fluoroalkyl group, the acidity of the acid generated by light irradiation increases, and sensitivity is enhanced. However, it is preferable that terminal groups do not contain fluorine atoms as the substituent.

From the viewpoint of suppressing the diffusion of the acid generated by light exposure to unexposed areas and thereby making the resolution or pattern shape satisfactory in the present invention, the compound (B) capable of generating an acid is preferably a compound which generates an acid (more preferably, sulfonic acid) having a volume size of 130 $Å^3$ or more; more preferably a compound which generates an acid (more preferably, sulfonic acid) having a volume size of 190 $Å^3$ or more; even more preferably a compound which generates an acid (more preferably, sulfonic acid) having a volume size of 270 $Å^3$ or more; particularly preferably a compound which generates an acid (more preferably, sulfonic acid) having a volume size of 400 $Å^3$ or more. However, from the viewpoints of sensitivity and coating solvent solubility, the volume is preferably 2000 $Å^3$ or less, and more preferably 1500 $Å^3$ or less. The value of the volume is determined by using "WinMOPAC" manufactured by Fujitsu, Ltd. That is, first, the chemical structure of the acid related to each compound is input, subsequently the most stable configuration of each acid is determined by calculation of the molecular force field using an MM3 method by using the chemical structure as the initial structure, and then molecular orbital calculation is carried out by using a PM3 method with respect to this most stable configuration. Thereby, the "accessible volume" of each acid can be calculated.

Particularly preferable examples of the acid generator in the present invention will be shown below. Meanwhile, for some of the examples, the calculated values of volume are indicated therewith (unit: $Å^3$). Meanwhile, the calculated value determined herein is the volume value of an acid with a proton bonded to the anion moiety.

[Chem. 34-1]

(z1)

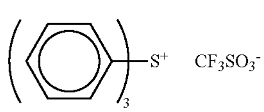

(z2)

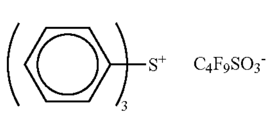

113 $Å^3$

-continued (z3)

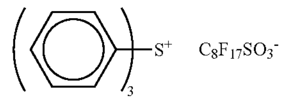

220 $Å^3$ (z4)

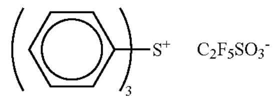

(z5)

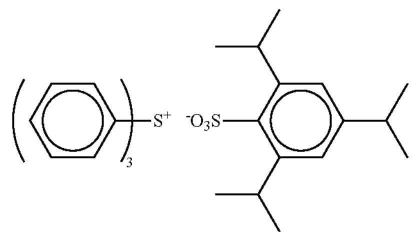

303 $Å^3$ (z6)

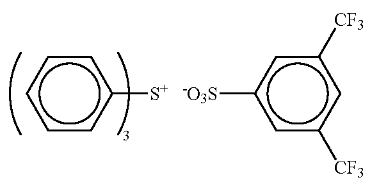

(z7)

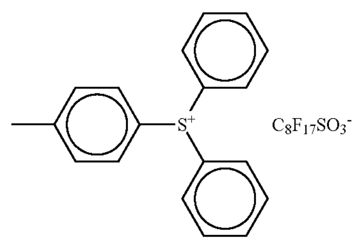

(z8)

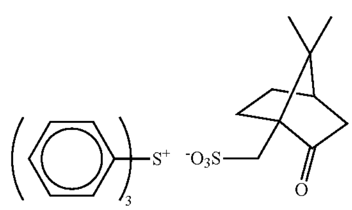

216 $Å^3$ (z9)

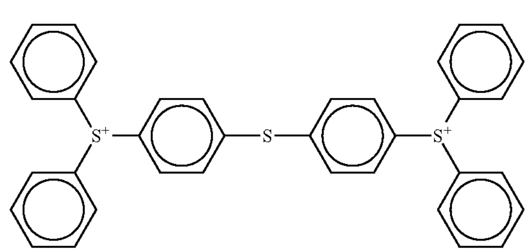

127 $Å^3$

-continued
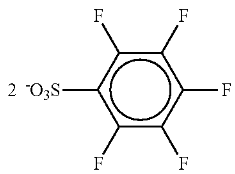
(z10)
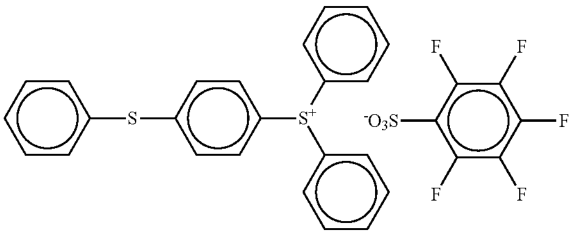
127 Å$^3$
(z11)
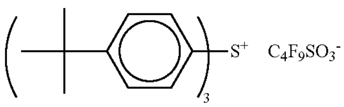
113 Å$^3$
(z12)
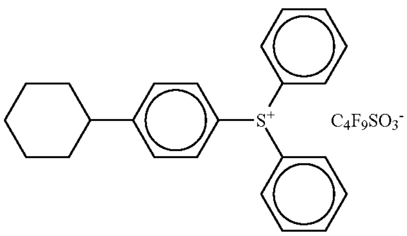
113 Å$^3$
(z13)
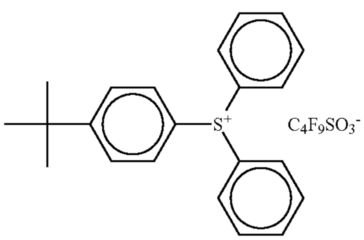
113 Å$^3$
(z14)
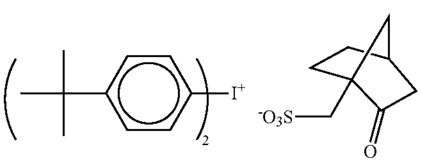
216 Å$^3$
(z15)
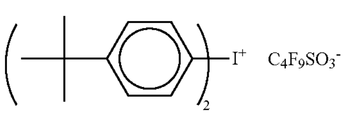
113 Å$^3$
-continued
(z16)
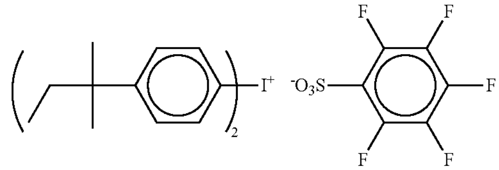
127 Å$^3$
(z17)
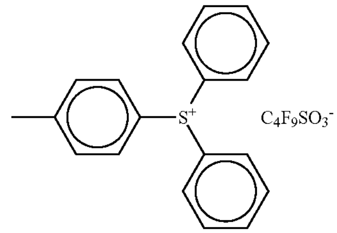
113 Å$^3$
[Chem. 34-2]
(z18)
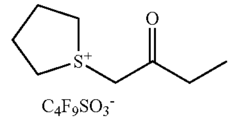
113 Å$^3$
(z19)
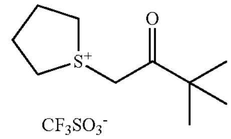
113 Å$^3$
(z20)
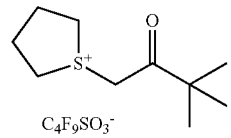
113 Å$^3$
(z21)
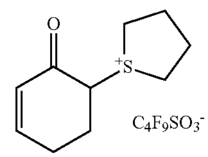
113 Å$^3$
(z22)
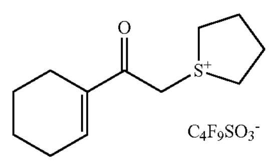
113 Å$^3$ -continued
(z23)
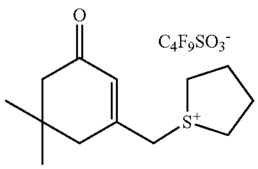
113 Å$^3$
(z24)
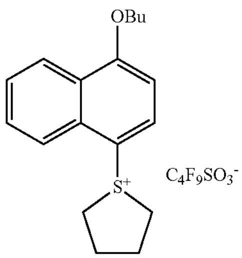
113 Å$^3$
(z25)
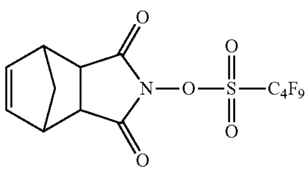
113 Å$^3$
(z26)
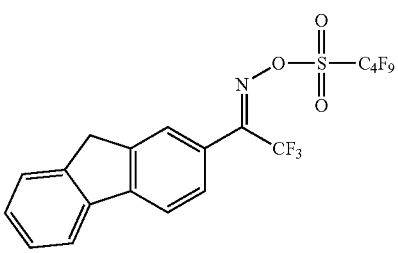
113 Å$^3$
(z27)
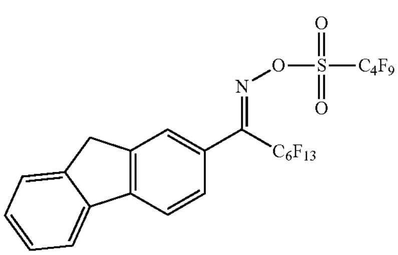
113 Å$^3$
(z28)
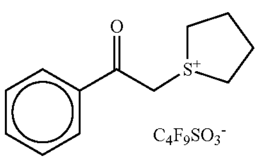
113 Å$^3$
-continued
(z29)
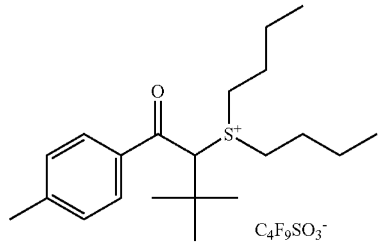
113 Å$^3$
(z30)
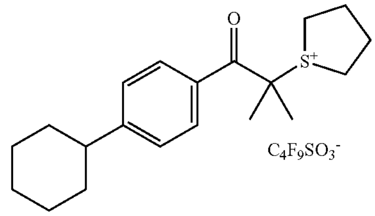
113 Å$^3$
(z31)
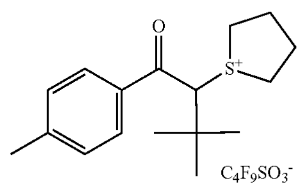
113 Å$^3$
(z32)
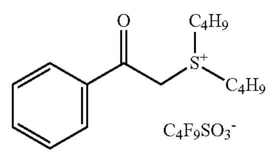
113 Å$^3$
(z33)
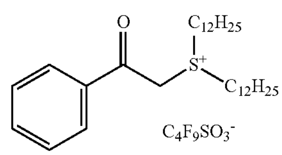
113 Å$^3$
(z34)
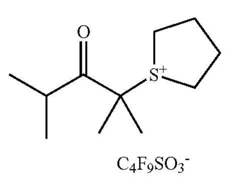
113 Å$^3$ -continued
(z35)
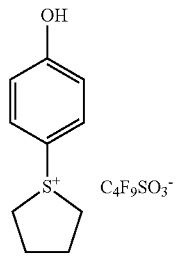
113 Å$^3$
(z36)
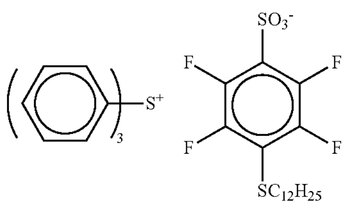
393 Å$^3$
(z37)
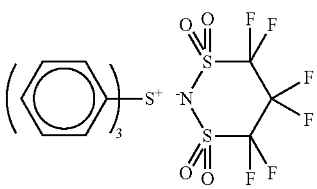
136 Å$^3$
(z38)
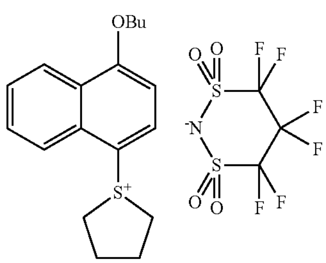
136 Å$^3$
(z39)
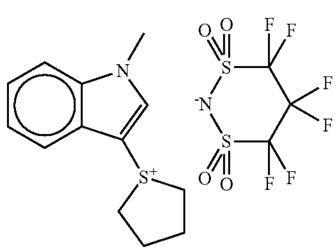
136 Å$^3$
(z40)
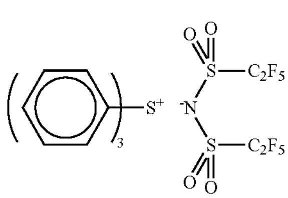
173 Å$^3$
-continued
(z41)
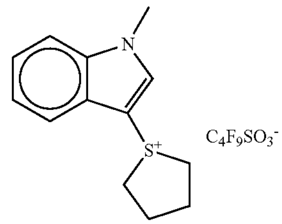
113 Å$^3$
[Chem. 34-3]
(z42)
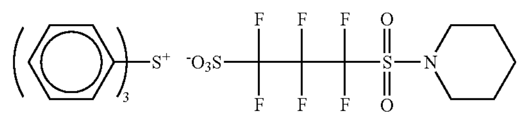
244 Å$^3$
(z43)
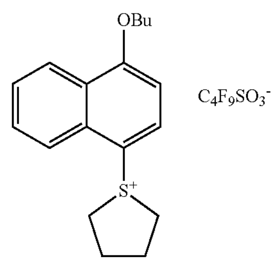
113 Å$^3$
(z44)
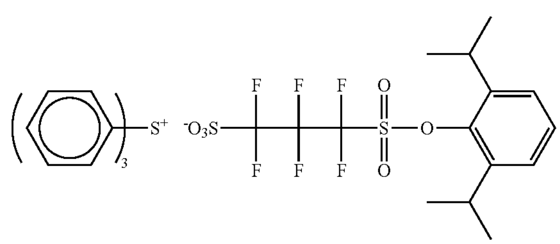
347 Å$^3$
(z45)
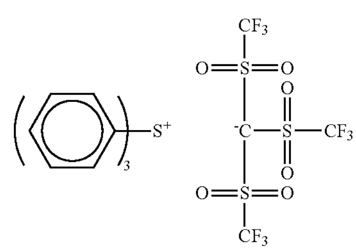
189 Å$^3$ -continued
(z46)
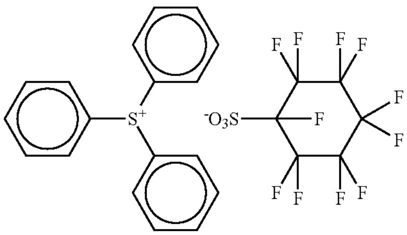
136 Å$^3$
(z47)
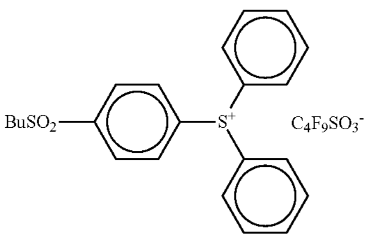
113 Å$^3$
(z48)
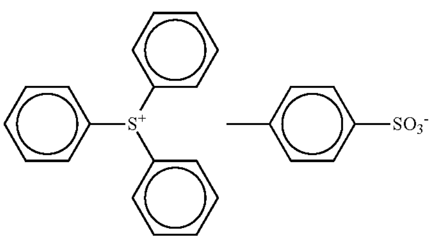
186 Å$^3$
(z49)
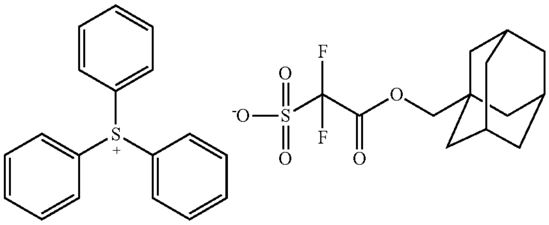
271 Å$^3$
(z50)
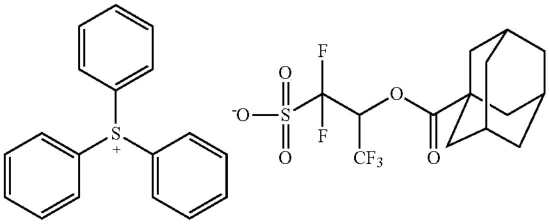
291 Å$^3$
-continued
(z51)
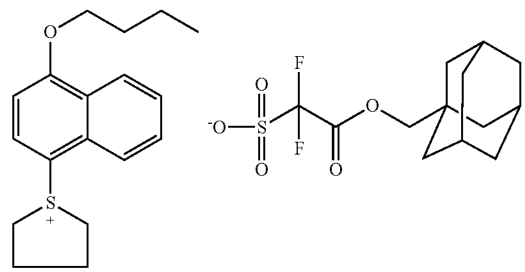
271 Å$^3$
(z52)
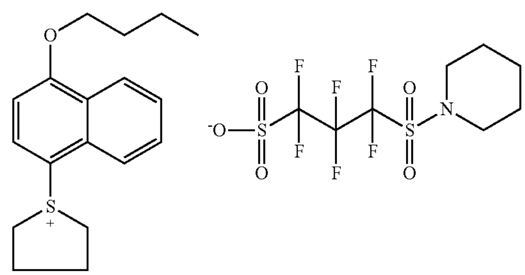
244 Å$^3$
(z53)
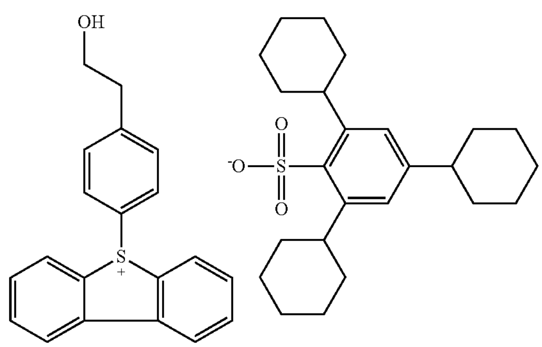
437 Å$^3$
(z54)
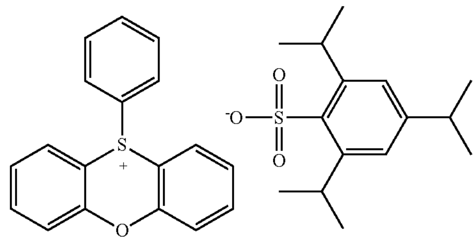
303 Å$^3$ (z55)
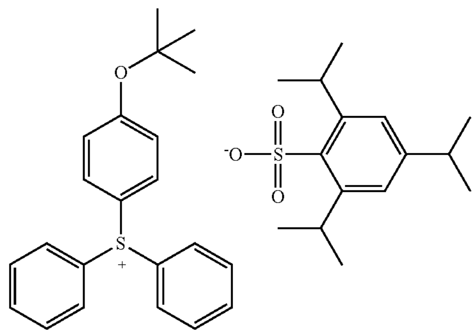
303 Å$^3$
[Chem. 34-4]
(z56)
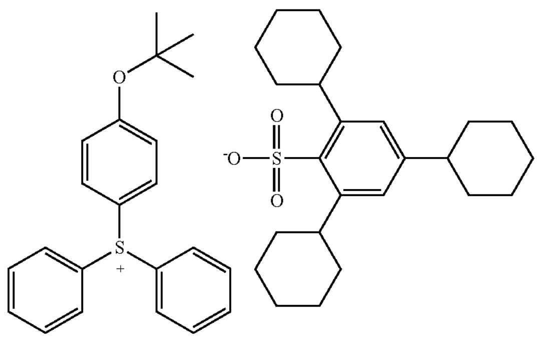
437 Å$^3$
(z57)
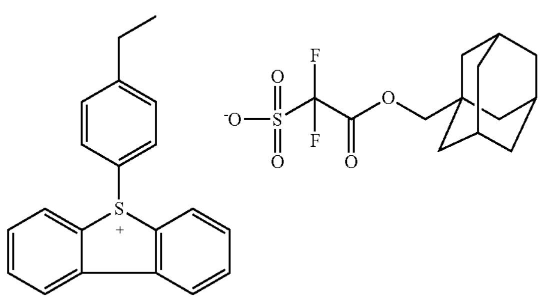
271 Å$^3$
(z58)
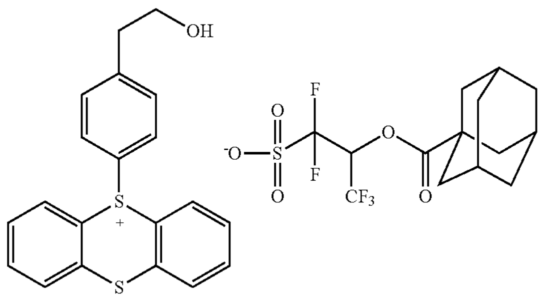
291 Å$^3$
(z59)
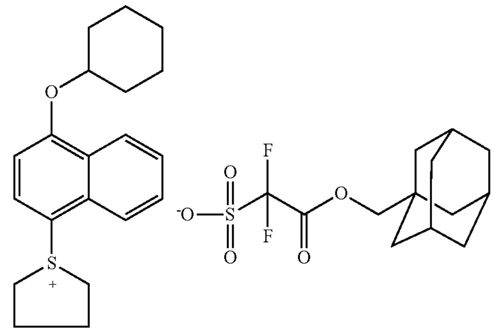
271 Å$^3$
(z60)
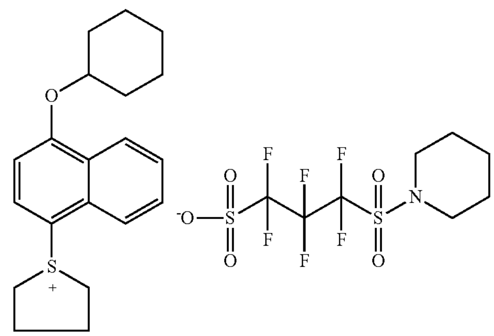
244 Å$^3$
(z61)
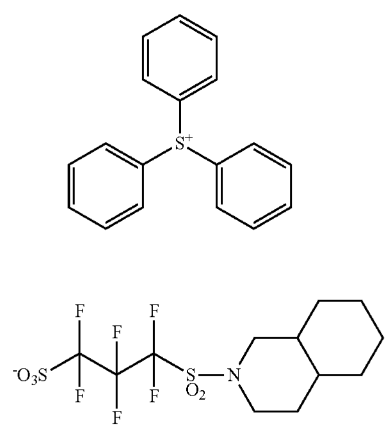
311 Å$^3$
(z62)
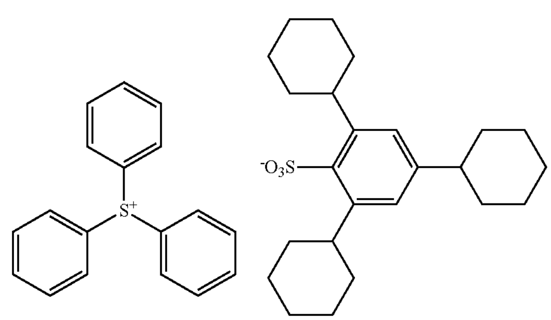
437 Å$^3$ -continued (z63)

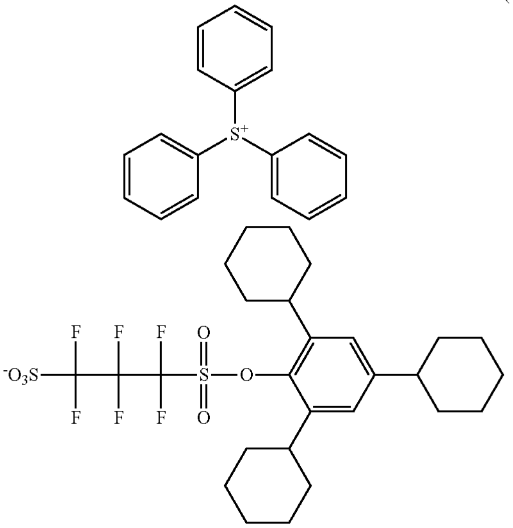

535 Å$^3$ (z64)

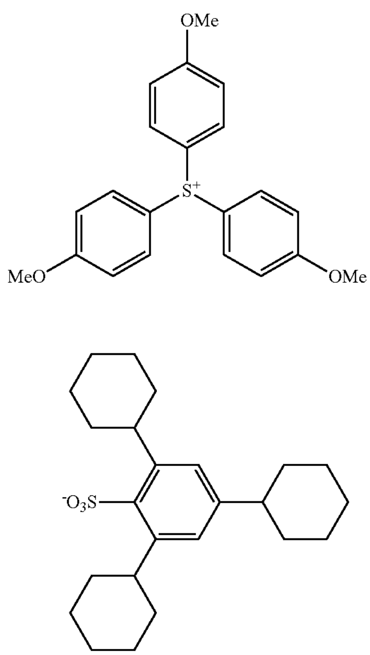

437 Å$^3$ (z65)

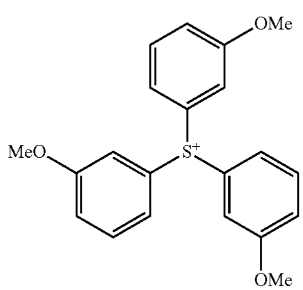

-continued

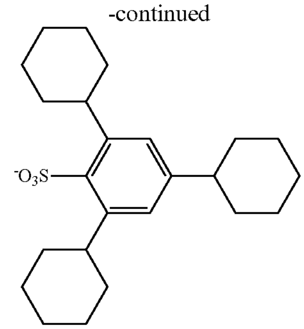

437 Å$^3$ (z66)

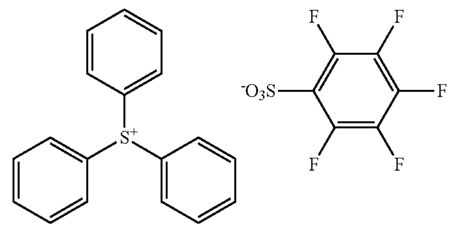

127 Å$^3$

Furthermore, as the acid generator (preferably, an onium compound) used in the present invention, a polymer type acid generator in which a group which generates an acid when irradiated with actinic rays or radiation (photoacid generating group) is introduced into the main chain or a side chain of a polymer compound, can also be used. Such an acid generator is indicated as a repeating unit having a photoacid generating group in the descriptions for the polymer compound (A).

The content of the acid generator in the composition is preferably 0.1% by mass to 25% by mass, more preferably 0.5% by mass to 20% by mass, and even more preferably 1% by mass to 18% by mass, based on the total solid content of the composition.

The acid generators may be used singly or in combination of two or more kinds thereof.

[4] Compound (C) as Crosslinking Agent

In the case where the composition of the present invention is used for forming a negative tone pattern, the composition of the present invention may contain a cross-linking agent (C) (which will be hereinafter also referred to as a "compound (C)", a "cross-linking agent", or the like). Examples of the cross-linking agent include epoxy cross-linking agents, styrene-based cross-linking agents, and oxetane-based cross-linking agents, but are not limited thereto.

The compound (C) is preferably a compound having a methylol group in the molecule, and more preferably a compound having 2 or more methylol groups in the molecule.

The methylol group is preferably defined as a hydroxymethyl group or an alkoxymethyl group as described in the polymer compound (A).

Preferable examples of the compound having methylol group(s) in the molecule include hydroxymethylated or alkoxymethylated phenol compounds, alkoxymethylated melamine-based compounds, alkoxymethyl glycoluril-based compounds, and alkoxymethylated urea-based compounds. Particularly preferable examples thereof include a phenol derivative which contains 3 to 5 benzene rings in the molecule, has two or more hydroxymethyl groups or alkoxymethyl groups in total, and has a molecular weight of 1200 or less; and a phenol derivative or an alkoxymethyl glycoluril derivative.

The alkoxymethyl group is preferably a methoxymethyl group or an ethoxymethyl group.

Among the cross-linking agents, the phenol derivative having a hydroxymethyl group can be obtained by allowing a corresponding phenol compound which does not have a hydroxymethyl group and formaldehyde to react in the presence of a base catalyst. Furthermore, the phenol derivative having an alkoxymethyl group can be obtained by allowing a corresponding phenol derivative having a hydroxymethyl group and an alcohol to react in the presence of an acid catalyst.

Other preferable examples of the cross-linking agent include compounds having N-hydroxymethyl groups or N-alkoxymethyl groups, such as alkoxymethylated melamine-based compounds, alkoxymethyl glycoluril-based compounds, and alkoxymethylated urea-based compounds.

Examples of these compounds include hexamethoxymethyl melamine, hexaethoxymethyl melamine, tetramethoxymethyl glycoluril, 1,3-bismethoxymethyl-4,5-bismethoxyethylene urea, and bismethoxymethyl urea, and these are disclosed in EP0,133,216A, German Patent 3,634,671, German Patent 3,711,264, and EP0,212,482A.

Particularly preferable examples among these cross-linking agents will be shown below:

[Chem. 35]

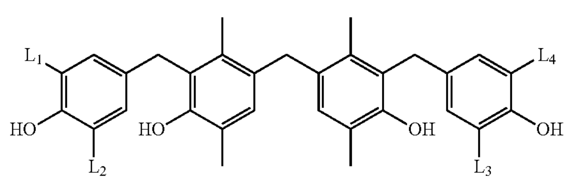

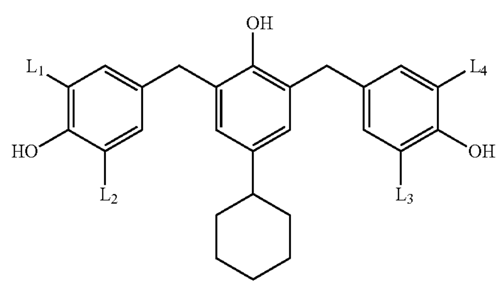

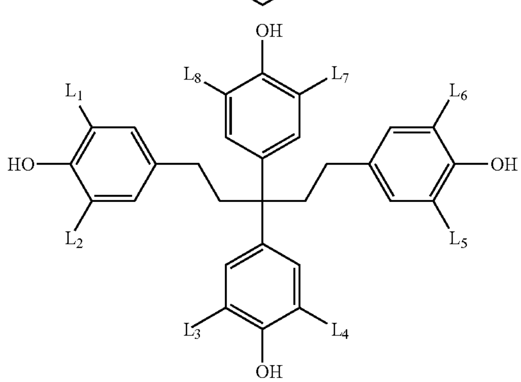

-continued

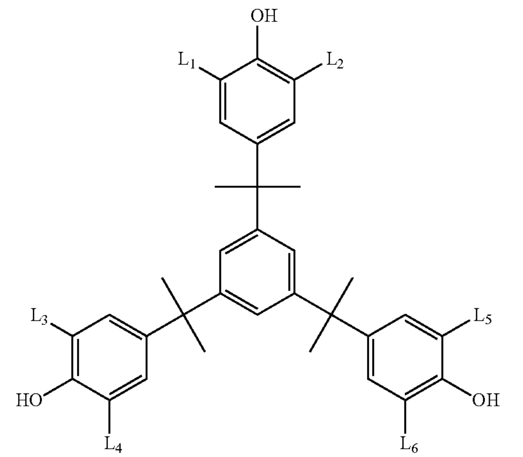

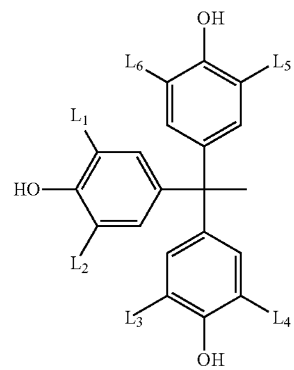

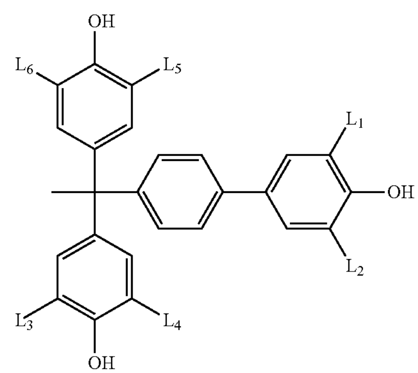

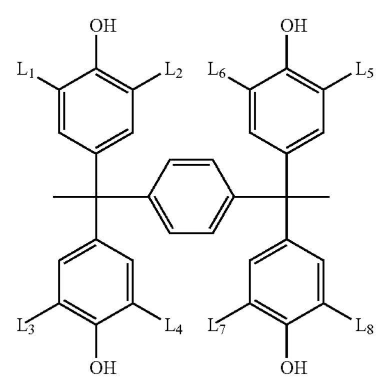

-continued

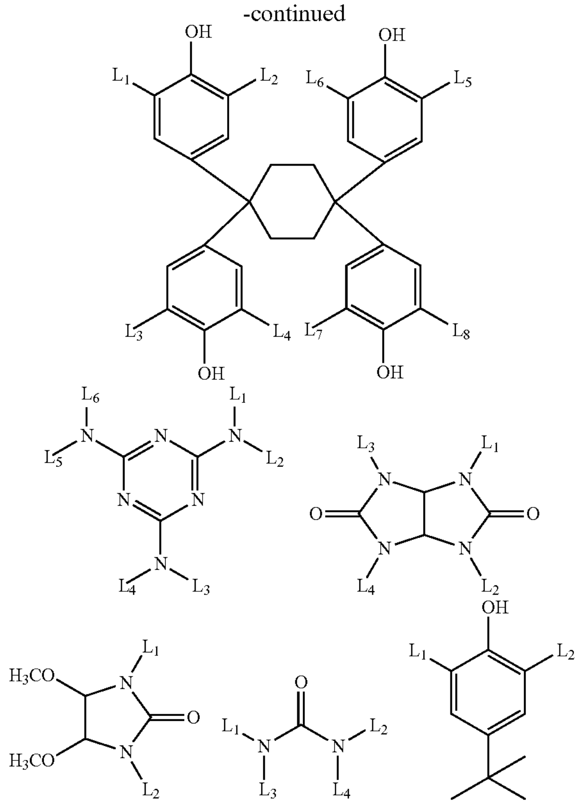

wherein $L_1$ to $L_8$ each independently represent a hydrogen atom, a hydroxymethyl group, a methoxymethyl group, an ethoxymethyl group, or an alkyl group having 1 to 6 carbon atoms.

The cross-linking agent in the present invention is preferably used in an addition amount of 0% by mass to 50% by mass, and more preferably 0% by mass to 30% by mass, based on the total solid content of the composition forming a negative tone pattern. When the content of the cross-linking agent is set to the above ranges, decreases in the residual film ratio are prevented, and the stability upon storage of the composition of the present invention can be satisfactorily maintained.

In the present invention, the cross-linking agent may be used singly or in combination of two or more kinds thereof. From the viewpoint of the pattern shape, it is preferable to use the cross-linking agents in combination of two or more kinds thereof.

For example, when in addition to the phenol derivative described above, another cross-linking agent, for example, the aforementioned compound having an N-alkoxymethyl group, is used, the proportions of the phenol derivative and the other cross-linking agent are, as a molar ratio, from 90/10 to 20/80, preferably from 85/15 to 40/60, and more preferably from 80/20 to 50/50.

[5] Basic Compound

The composition of the present invention preferably contains a basic compound as an acid complement agent, in addition to the components described above. When a basic compound is used, the performance change due to the passage of time from the exposure to the post-heating can be reduced. Such a basic compound is preferably an organic basic compound, and more specific examples thereof include aliphatic amines, aromatic amines, heterocyclic amines, nitrogen-containing compounds having carboxyl groups, nitrogen-containing compounds having sulfonyl groups, nitrogen-containing compounds having hydroxyl groups, nitrogen-containing compounds having hydroxyphenyl groups, alcoholic nitrogen-containing compounds, amide derivatives, and imide derivatives. An amine oxide compound (described in JP2008-102383A), and an ammonium salt (which is preferably a hydroxide or a carboxylate; and more specifically, a tetraalkylammonium hydroxide represented by tetrabutylammonium hydroxide is preferred from the viewpoint of LER) are also appropriately used.

Furthermore, a compound which has increasing basicity under the action of an acid can also be used as one kind of the basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethylaniline, tris(methoxyethoxyethyl)amine; the compounds exemplified in column 3, line 60 in the specification of U.S. Pat. No. 6,040,112B; 2-[2-{2-(2,2-dimethoxyphenoxyethoxy)ethyl}-bis-(2-methoxyethyl)]-amine; and compounds (C1-1) to (C3-3) exemplified in paragraph <0066> in the specification of US2007/0224539A1. Examples of the compounds having nitrogen-containing heterocyclic structures include 2-phenylbenzoimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]-none-5-ene, 1,8-diazabicyclo[5.4.0]-undeca-7-ene, and tetrabutylammonium hydroxide.

Furthermore, a photodegradable basic compound (a compound in which a basic nitrogen atom initially acts as a base and thereby the compound exhibits basicity, but as the compound is degraded by irradiation of actinic rays or radiation and generates a zwitterionic compound having a basic nitrogen atom and an organic acid moiety, these moieties are neutralized in the molecule, and basicity is decreased or lost, for example, the onium salts described in JP3577743B, JP2001-215689A, JP2001-166476A, and JP2008-102383A), and a photobase generator (for example, the compounds described in JP2010-243773A) are also appropriately used.

Among these basic compounds, an ammonium salt is preferred from the viewpoint of improving the resolution.

The content of the basic compound used in the present invention is preferably 0.01% by mass to 10% by mass, more preferably 0.03% by mass to 5% by mass, and particularly preferably 0.05% by mass to 3% by mass, based on the total solids content of the composition.

[6] Surfactant

The composition of the present invention may further contain a surfactant in order to enhance coatability. Examples of the surfactant include, but are not particularly limited to, nonionic surfactants such as polyoxyethylene alkyl ethers, polyoxyethylene alkyl allyl ethers, polyoxyethylene polyoxypropylene block copolymers, sorbitan fatty acid esters, and polyoxyethylene sorbitan fatty acid esters; fluorine-based surfactants such as MEGAFACE F171 (manufactured by Dainippon Ink and Chemicals, Inc.), Fluorad FC430 (manufactured by Sumitomo 3M, Ltd.), Surfinol E1004 (manufactured by Asahi Glass Co., Ltd.), PF656 and PF6320 manufactured by Omnova Solutions, Inc.; and organosiloxane polymers.

When the composition of the present invention contains a surfactant, the content of the surfactant used is preferably from 0.0001% by mass to 2% by mass, and more preferably 0.0005% by mass to 1% by mass, based on the total amount (excluding the solvent) of the composition.

[7] Organic Carboxylic Acid

The composition of the present invention preferably contains an organic carboxylic acid in addition to the components described above. Examples of such an organic carboxylic acid compound include aliphatic carboxylic acids, alicyclic carboxylic acids, unsaturated aliphatic carboxylic acids, oxycarboxylic acids, alkoxycarboxylic acids, ketocarboxylic acids, benzoic acid derivatives, phthalic acid, terephthalic acid, isophthalic acid, 2-naphthoic acid, 1-hydroxy-2-naphthoic acid, and 2-hydroxy-3-naphthoic acid. However, since there is a risk that when exposure to an electron beam is carried out in a vacuum, the organic carboxylic acid compound may evaporate from the resist film surface and contaminate the drawing chamber, preferred compounds include aromatic organic carboxylic acids, and among them, for example, benzoic acid, 1-hydroxy-2-naphthoic acid, and 2-hydroxy-3-naphthoic acid are suitable.

The mixing ratio of the organic carboxylic acid is preferably in the range of 0.01 parts by mass to 10 parts by mass, more preferably 0.01 parts by mass to 5 parts by mass, and even more preferably 0.01 parts by mass to 3 parts by mass, based on 100 parts by mass of the polymer compound (A).

The composition of the present invention may further contain a dye, a plasticizer, an acid proliferating agent (described in WO95/29968, WO98/24000, JP1996-305262A (JP-H08-305262A), JP1997-034106A (JP-H09-034106A), JP1996-248561A (JP-H08-248561A), JP1996-503082A (JP-H08-503082A), U.S. Pat. No. 5,445,917B, JP 1996-503081 A (JP-H08-503081 A), U.S. Pat. No. 5,534,393B, U.S. Pat. No. 5,395,736B, U.S. Pat. No. 5,741,630B, U.S. Pat. No. 5,334,489B, U.S. Pat. No. 5,582,956B, U.S. Pat. No. 5,578,424B, U.S. Pat. No. 5,453,345B, U.S. Pat. No. 5,445,917B, EP665,960B, EP757,628B, EP665,961B, U.S. Pat. No. 5,667,943B, JP1998-001508A (JP-H10-001508A), JP1998-282642A (JP-H10-282642A), JP1997-512498A (JP-H09-512498), JP2000-062337A, JP-2005-017730A, JP2008-209889A, and the like), and the like, if necessary. Examples of these compounds include the respective compounds described in JP2008-268935A.

[8] Carboxylic Acid Onium Salt

The composition of the present invention may also contain a carboxylic acid onium salt. Examples of the carboxylic acid onium salt include a carboxylic acid sulfonium salt, a carboxylic acid iodonium salt, and a carboxylic acid ammonium salt. Particularly, the carboxylic acid onium salt is preferably a carboxylic acid sulfonium salt or a carboxylic acid iodonium salt. Furthermore, according to the present invention, it is preferable that the carboxylate residue of the carboxylic acid onium salt not contain an aromatic group or a carbon-carbon double bond. As a particularly preferred anionic moiety, a linear or branched, monocyclic or polycyclic cyclic alkylcarboxylic acid anion having 1 to 30 carbon atoms is preferred. More preferably, an anion of a carboxylic acid in which a part or all of these alkyl groups are fluorine-substituted, is preferred. The carboxylic acid onium salt may contain an oxygen atom in the alkyl chain. Thereby, transparency to light having a wavelength of 220 nm or less is secured, and sensitivity and resolution are enhanced, while the coarseness or compactness dependency and exposure margin are improved.

[9] Solvent

The composition of the present invention may contain a solvent, and the solvent is preferably, for example, ethylene glycol monoethyl ether acetate, cyclohexanone, 2-heptanone, propylene glycol monomethyl ether (PGME, also known as 1-methoxy-2-propanol), propylene glycol monomethyl ether acetate (PGMEA, also known as 1-methoxy-2-acetoxypropane), propylene glycol monomethyl ether propionate, propylene glycol monoethyl ether acetate, methyl 3-methoxypropionate, ethyl 3-ethoxypropionate, methyl methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, or ethylene carbonate.

It is preferable that the solid content of the composition of the present invention be dissolved at a solids concentration of 1% by mass to 40% by mass, more preferably 1% by mass to 30% by mass, and even more preferably 3% by mass to 20% by mass.

<Actinic Ray-Sensitive or Radiation-Sensitive Film and Mask Blanks>

The present invention also relates to an actinic ray-sensitive or radiation-sensitive film including the composition of the present invention, and such a film is formed when, for example, the composition of the present invention is applied on a support such as a substrate. The thickness of this film is preferably from 0.02 μm to 0.1 μm. Regarding the method of applying the resist composition on a substrate, the resist composition is applied on a substrate by an appropriate coating method such as spin coating, roll coating, flow coating, dip coating, spray coating, or doctor coating, but spin coating is preferred, and the speed of rotation is preferably from 1000 rpm to 3000 rpm. The coating film is prebaked for 1 minute to 20 minutes at 60° C. to 150° C., and preferably for 1 minute to 10 minutes at 80° C. to 120° C., to form a thin film.

As the material that constitutes the substrate to be processed and its outermost layer, for example, in the case of a semiconductor wafer, a silicon wafer can be used. Examples of the material that forms the outermost layer include Si, $SiO_2$, SiN, SiON, TiN, WSi, BPSG; and SOG organic antireflection films.

Furthermore, the present invention also relates to mask blanks, which form the actinic ray-sensitive or radiation-sensitive film obtainable as described above. In the case of forming a pattern on photomask blanks for photomask production in order to obtain such mask blanks including the actinic ray-sensitive or radiation-sensitive film, examples of a transparent substrate to be used include transparent substrates of quartz and calcium fluoride. Generally, a light-shielding film, an antireflection film, and a phase shift film, with any necessary one of additional functional films such as an etching stopper film and an etching mask film are laminated on the substrate. As the material of the functional films, films containing silicon or a transition metal such as chromium, molybdenum, zirconium, tantalum, tungsten, titanium, or niobium are laminated. Furthermore, examples of the material to be used in the outermost layer include a material which has, as a main constituent material, a material containing silicon or silicon with oxygen and/or nitrogen; and a silicon compound material which has, as a main constituent material, a material containing transition metals in addition thereto; and a transition metal compound material which has, as a main constituent material, transition metals, in particular, at least one selected from chromium, molybdenum, zirconium, tantalum, tungsten, titanium and niobium, or a material further containing at least one element selected from oxygen, nitrogen and carbon in addition thereto.

The light-shielding film may be a single layer, but a multilayer structure including the laminated plural materials is more preferable. In a case of the multilayer structure, the film thickness per layer is not particularly limited, but the thickness is preferably 5 nm to 100 nm, and more preferably 10 nm to 80 nm. The thickness of the entire light-shielding film is not particularly limited, but the thickness is preferably 5 nm to 200 nm, and more preferably 10 nm to 150 nm.

Among these materials, generally, when pattern formation is carried out on photomask blanks which have a material containing oxygen or nitrogen together with chromium in the outermost layer, by using the composition of the present invention, a so-called undercut shape by which a constricted shape is formed near the substrate is likely to be prepared. However, in the case of using the present invention, the problem of undercut can be improved as compared with those of the related art.

Subsequently, the actinic rays or radiation (an electron beam, or the like) are irradiated to this resist film, preferably baking (usually 80° C. to 150° C., and more preferably 90° C. to 130° C., usually 1 minute to 20 minutes, and preferably 1 minute to 10 minutes) is carried out, and thereafter the resist film is developed. Thereby, a satisfactory pattern can be obtained. Thus, a semiconductor fine circuit and a mold structure for imprint, a photomask or the like are prepared by using this pattern as a mask, and conducting an appropriate etching treatment, ion implantation and the like.

Meanwhile, the process in the case of producing the mold for imprint by using the composition of the present invention is disclosed in, for example, JP4109085B, W2008-162101A, and "Fundamentals and Technological Development and Application Deployment of Nanoimprint-Nanoimprint Substrate Technology and Recent Technology Deployment, edited by Hirai, Yoshihiko (published by Frontier Publishing Co., Ltd.)".

<Pattern Forming Method>

Next, the pattern forming method according to the present invention will be described.

In one embodiment, the pattern forming method of the present invention includes developing a film irradiated with actinic rays or radiation by irradiating an actinic ray-sensitive or radiation-sensitive film with actinic rays or radiation.

In another embodiment, the pattern forming method of the present invention includes developing mask blanks irradiated with actinic rays or radiation by irradiating the mask blanks having an actinic ray-sensitive or radiation-sensitive film formed therein with actinic rays or radiation.

In the present invention, irradiation of actinic rays or radiation is preferably carried out using an electron beam or extreme ultraviolet rays.

In the production of precision integrated circuit elements and the like, first, it is preferable to conduct the exposure onto the actinic ray-sensitive or radiation-sensitive film (a pattern forming step) by irradiating patternwise the resist film with an electron beam or extreme ultraviolet rays (EUV). The exposure amount is, in the case of an electron beam, about 0.1 μC/cm$^2$ to 20 μC/cm$^2$, and preferably about 3 μC/cm$^2$ to 10 μC/cm$^2$, and in the case of extreme ultraviolet rays, about 0.1 mJ/cm$^2$ to 20 mJ/cm$^2$, preferably about 3 mJ/cm$^2$ to 15 mJ/cm$^2$. Subsequently, a pattern is formed by performing heating after exposure (post-exposure baking) on a hot plate at 60° C. to 150° C. for 1 minute to 20 minutes, and preferably at 80° C. to 120° C. for 1 minute to 10 minutes, and developing, rinsing, and drying the pattern.

The development in the present invention may be either alkali development or organic solvent development. In the case of obtaining a negative tone pattern in the organic solvent development, it is particularly preferable to use a rein having both a methylol cross-linking group and an acid-decomposable group. By the synergic effect of the cross-linking and decomposition, the sensitivity and the resolution can be further improved.

In the case of using the alkali development, the developer is a 0.1% by mass to 5% by mass, and more preferably 2% by mass to 3% by mass alkaline aqueous solution of tetramethylammonium hydroxide (TMAH), tetrabutylammonium hydroxide (TBAH) or the like, and development is carried out by a routine method such as a dipping method, a puddle method or a spray method, for preferably 0.1 minutes to 3 minutes, and more preferably 0.5 minutes to 2 minutes. The alkali developer may also contain an appropriate amount of an alcohol and/or a surfactant.

Thus, in the case where the composition of the present invention is a negative tone composition used for forming a negative tone pattern, the film of the unexposed areas is dissolved and the exposed areas have the compound (A) cross-linked, and thus are difficult to be dissolved in the developer. Further, in the case where the composition of the present invention is a positive tone composition used for forming a positive tone pattern, the exposed areas are dissolved in the developer and the unexposed areas are difficult to be dissolved in the developer, thereby forming a desired pattern on the substrate.

The resin composition of the present invention may also be preferably used in the process, in which after coating the composition, forming a film, and exposing the film, development using a developer having an organic solvent as a main component is performed to obtain a negative tone pattern. For such a process, for example, a process described in JP2008-292975A, JP2010-217884A, and the like may be used.

As the organic developer, polar solvents such as an ester-based solvent (butyl acetate, ethyl acetate, and the like), a ketone-based solvent (2-heptanone, cyclohexanone, and the like), an alcohol-based solvent, an amide-based solvent, and an ether-based solvent, or hydrocarbon-based solvents may be used. The moisture content in the entire volume of the organic developer is preferably less than 10% by mass, and more preferably substantially 0%.

The present invention also relates to a method for manufacturing an electronic device, including the pattern forming method of the present invention, and an electronic device manufactured by this preparation method.

The electronic device of the present invention is suitably mounted in electric and electronic instruments (electrical appliances, OA and media-related equipment, optical instruments, communication devices, and the like).

EXAMPLES

Hereinafter, the present invention will be described in detail with reference to Examples, but the content of the present invention is not limited thereto.

Synthesis Example 1: Synthesis of Polymer Compound (A1)

The polymer compound (A1) shown in Table 1 below was synthesized as follows.

[Chem. 36]

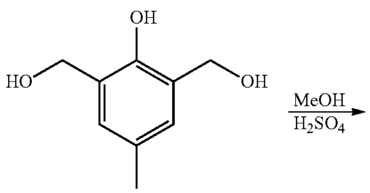

(1a-1)

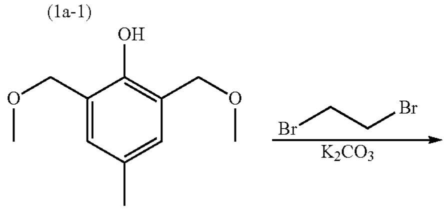

(1a-2)

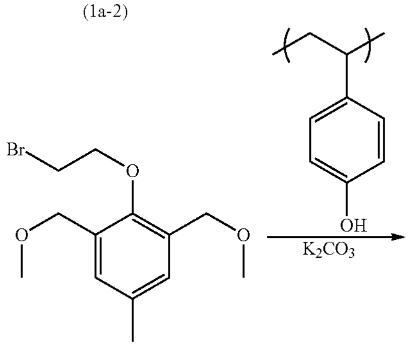

(1a-3)

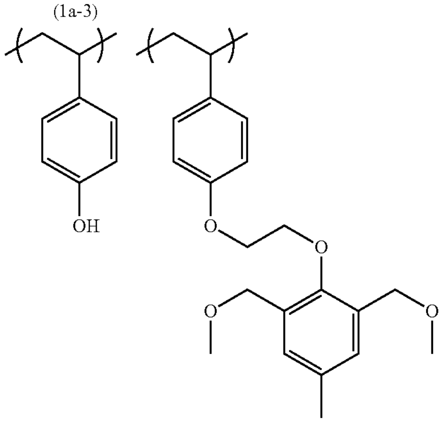

(A1)

(Synthesis of Compound (1a-2))

35 g of 2,6-bis(hydroxymethyl)-p-cresol (1a-1) manufactured by Tokyo Chemical Industry Co., Ltd. was dissolved in 400 mL of methanol. 3.6 g of a 45% aqueous sulfuric acid solution was added dropwise thereto, followed by stirring at 50° C. for 5 hours. After the completion of the reaction, the reaction liquid was returned to room temperature, and then in an ice bath, sodium carbonate was added to the reaction liquid while stirring, followed by filtration through Celite. The filtrate was concentrated and then transferred to a separating funnel. 200 mL of each of distilled water and ethyl acetate was added thereto to carry out extraction, and the aqueous layer was removed. Thereafter, the organic layer was washed with 200 mL of distilled water five times, and the organic layer was concentrated to obtain 37 g of the compound of (1a-2).

$^1$H-NMR ($CDCl_3$: ppm) δ: 2.25 (3H, s), 3.43 (6H, s), 4.56 (4H, s), 6.92 (2H, s).

(Synthesis of Compound (1a-3))

20 g of the compound (1a-2) synthesized above was dissolved in 200 mL of dimethyl sulfoxide. 38.3 g of dibromoethane and 16.9 g of potassium carbonate were added thereto, followed by stirring at 40° C. for 4 hours. After the completion of the reaction, the reaction liquid was returned to room temperature, and 100 mL of each of ethyl acetate and distilled water was added thereto. The reaction liquid was transferred to a separating funnel and the aqueous layer was removed. Thereafter, the organic layer was washed with 200 mL of distilled water five times, and the organic layer was concentrated. The concentrate was purified by silica gel column chromatography (developing solvent: hexane/ethyl acetate=20/1), the solvent was evaporated under reduced pressure, and then the residue was dried in vacuo to obtain 24.7 g of a compound (1a-3).

$^1$H-NMR ($CDCl_3$: ppm) δ: 2.33 (3H, s), 3.70 (2H, t), 4.27 (2H, t), 4.50 (4H, s), 7.19 (2H, s).

(Synthesis of Polymer Compound (A1))

5 g of poly(p-hydroxystyrene) (VP2500) manufactured by Nippon Soda Co., Ltd. was dissolved in 30 g of dimethyl sulfoxide. 1.7 g of potassium carbonate and 2 g of the compound (1a-3) synthesized above were sequentially added thereto, followed by stirring at 60° C. for 2 hours. After the completion of the reaction, the reaction liquid was returned to room temperature, and 50 mL of each of ethyl acetate and distilled water was added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 5.4 g of a polymer compound (A1) including the repeating units above. The $^1$H-NMR measurement chart of the obtained polymer compound (A1) in a $d_6$-DMSO solvent is shown in FIG. 1.

Synthesis Example 2: Synthesis of Polymer Compound (A2)

The polymer compound (A2) shown in Table 1 below was synthesized as follows.

[Chem. 37]

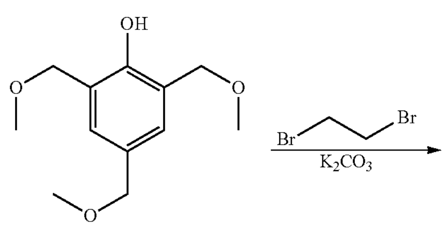

(2a-1)

-continued

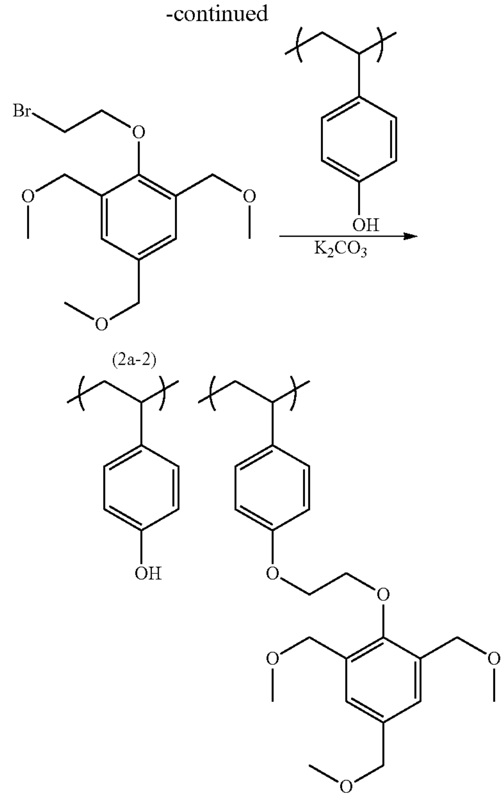

(2a-2)

(A2)

(Synthesis of Compound (2a-2))

16 g of 2,4,6-tris(methoxymethyl)phenol (2a-1) was dissolved in 200 mL of dimethyl sulfoxide. 39.09 g of potassium carbonate and 53.13 g of dibromoethane were added thereto, followed by stirring at 40° C. for 4 hours. To the reaction liquid were added 100 mL of ethyl acetate and 100 mL of distilled water, followed by transferring to a separating funnel, and the aqueous layer was removed. Thereafter, the organic layer was washed with 200 mL of distilled water three times, and the solvent in the organic layer was evaporated under reduced pressure. The obtained material was purified by silica gel column chromatography to obtain 17.7 g of a compound (2a-2).

$^{1}$H-NMR ($d_6$-DMSO: ppm) δ: 3.28 (3H, s), 3.33 (6H, s), 3.83 to 3.80 (2H, m), 4.15 to 4.12 (2H, m), 4.59 (2H, s), 4.68 (4H, s), 7.27 (2H, s).

(Synthesis of Polymer Compound (A2))

Figure 2:
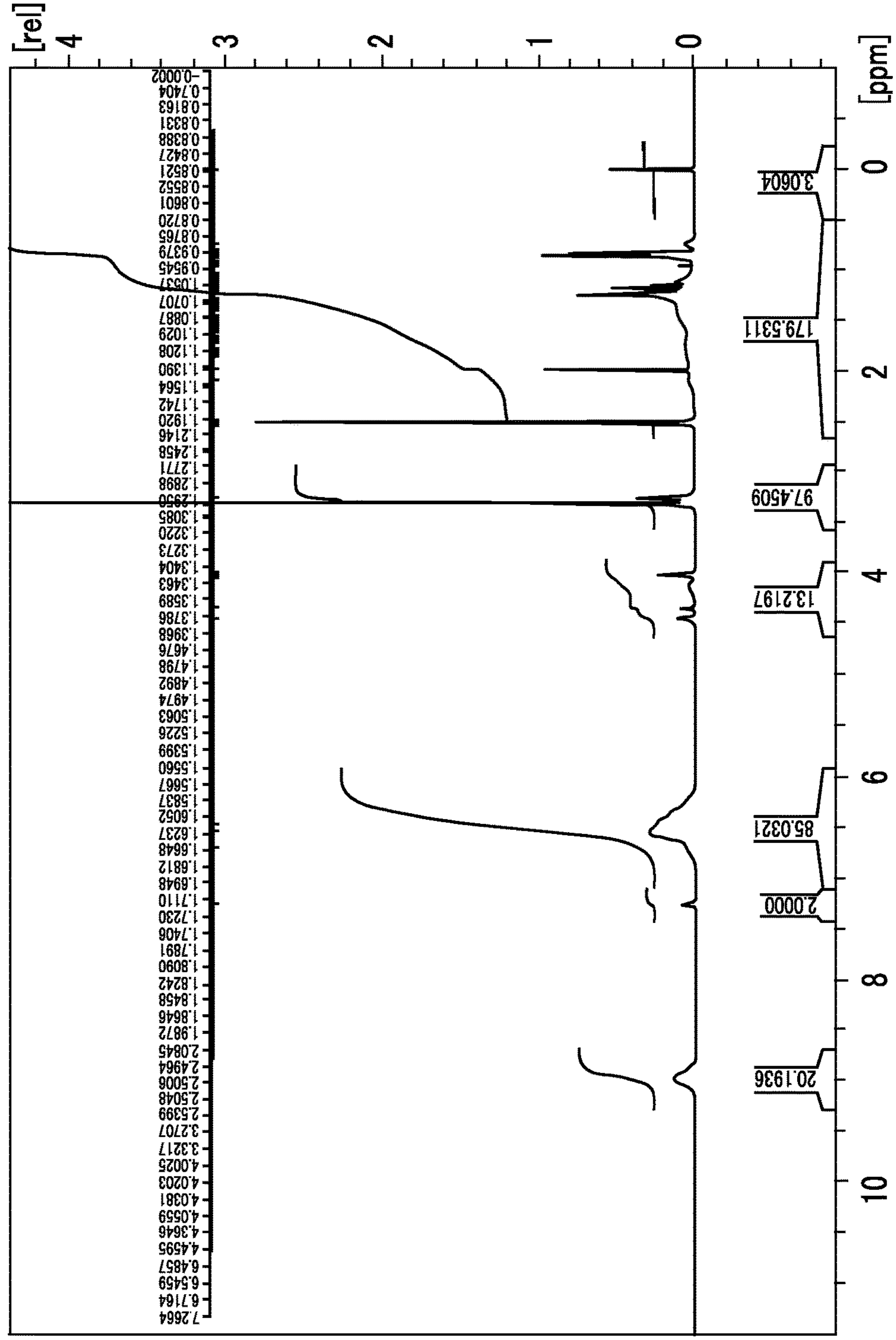
FIG. 2 is a view showing a $^{1}$H-NMR spectrum of the polymer compound (A2) obtained in Synthesis Example 2.

5 g of poly(p-hydroxystyrene) (VP2500) manufactured by Nippon Soda Co., Ltd. was dissolved in 30 g of dimethyl sulfoxide. 1.7 g of potassium carbonate and 1.4 g of the compound (2a-2) synthesized above were sequentially added thereto, followed by stirring at 60° C. for 2 hours. After the completion of the reaction, the reaction liquid was returned to room temperature, and 50 mL of each of ethyl acetate and distilled water was added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 5.1 g of a polymer compound (A2) including the repeating units above. The $^{1}$H-NMR measurement chart of the obtained polymer compound (A2) in a $d_6$-DMSO solvent is shown in FIG. 2.

Synthesis Example 3: Synthesis of Polymer Compound (A3)

The polymer compound (A3) shown in Table 1 below was synthesized as follows.

[Chem. 38]

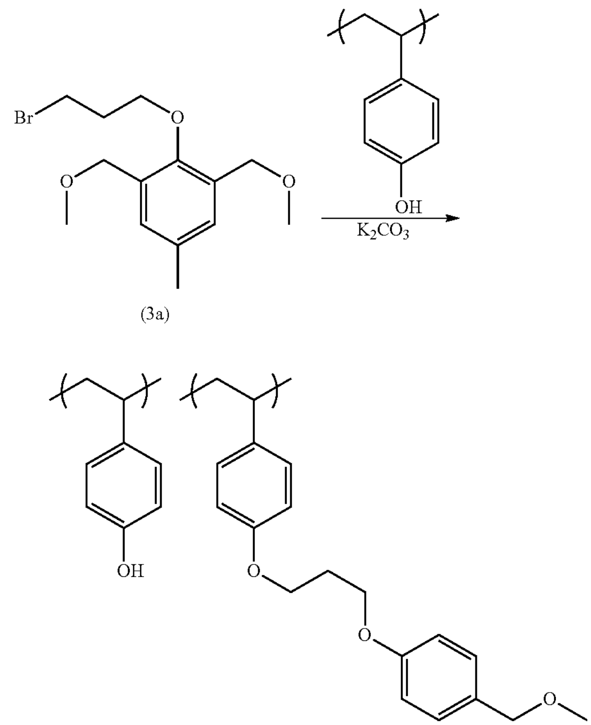

(3a)

(A3)

(Synthesis of Polymer Compound (A3))

Figure 3:
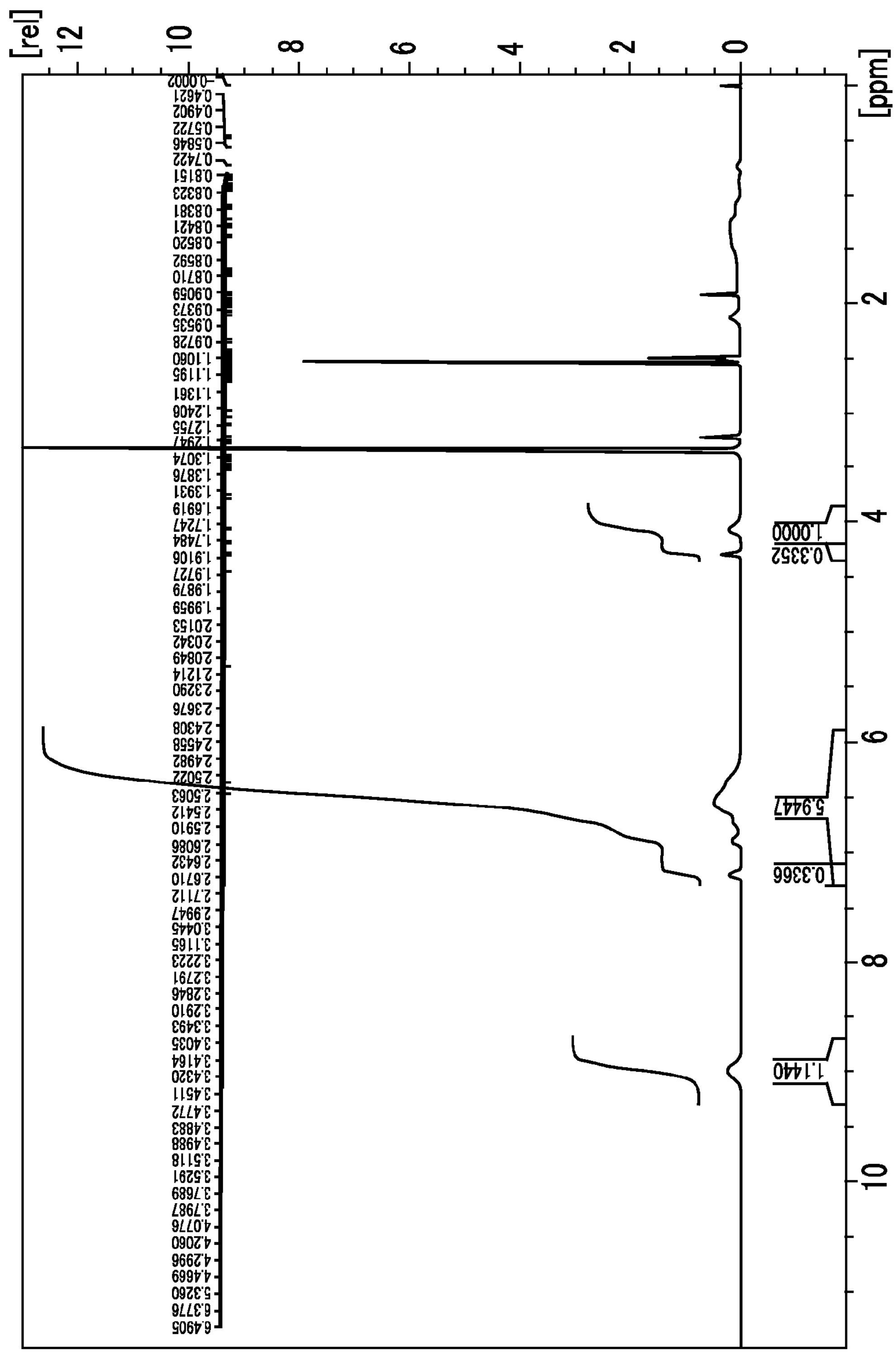
FIG. 3 is a view showing a $^{1}$H-NMR spectrum of the polymer compound (A3) obtained in Synthesis Example 3.

5 g of poly(p-hydroxystyrene) (VP2500) manufactured by Nippon Soda Co., Ltd. was dissolved in 30 g of dimethyl sulfoxide. 1.7 g of potassium carbonate and 2 g of the compound (3a) were sequentially added thereto, followed by stirring at 60° C. for 2 hours. After the completion of the reaction, the reaction liquid was returned to room temperature, and 50 mL of each of ethyl acetate and distilled water was added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 5.2 g of a polymer compound (A3) including the repeating units above. The $^{1}$H-NMR measurement chart of the obtained polymer compound (A3) in a $d_6$-DMSO solvent is shown in FIG. 3.

Synthesis Example 4: Synthesis of Polymer Compound (A4)

The polymer compound (A4) shown in Table 1 below was synthesized as follows.

[Chem. 39]

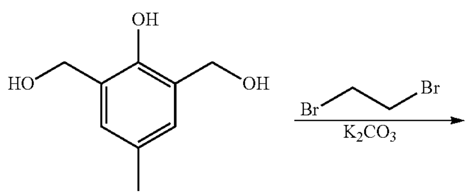

(4a-1)

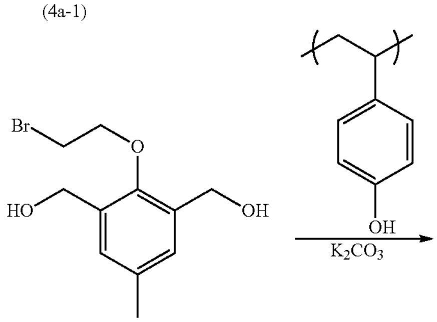

(4a-2)

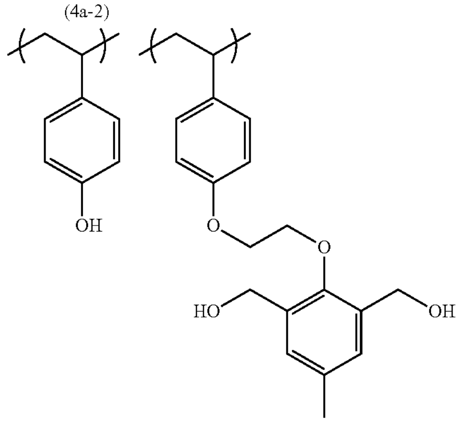

(A4)

(Synthesis of Compound (4a-2))

40 g of 2,6-bis(hydroxymethyl)-p-cresol (4a-1) manufactured by Tokyo Chemical Industry Co., Ltd. was dissolved in 400 mL of dimethyl sulfoxide. 125 g of dibromoethane and 120 g of potassium carbonate were added thereto, followed by stirring at 40° C. for 4 hours. After the completion of the reaction, the reaction liquid was returned to room temperature, and 100 mL of each of ethyl acetate and distilled water was added thereto. The reaction liquid was transferred to a separating funnel and the aqueous layer was removed. Thereafter, the organic layer was washed with 200 mL of distilled water five times and the organic layer was concentrated. The concentrate was purified by silica gel column chromatography (developing solvent: hexane/ethyl acetate=20/1), the solvent was evaporated under reduced pressure and the residue was dried in vacuo to obtain 45 g of a compound (4a-2).

$^1$H-NMR ($CDCl_3$: ppm) δ: 2.33 (3H, s), 3.70 (2H, t), 4.27 (2H, t), 4.72 (4H, d), 7.15 (2H, s).

(Synthesis of Polymer Compound (A4))

Figure 4:
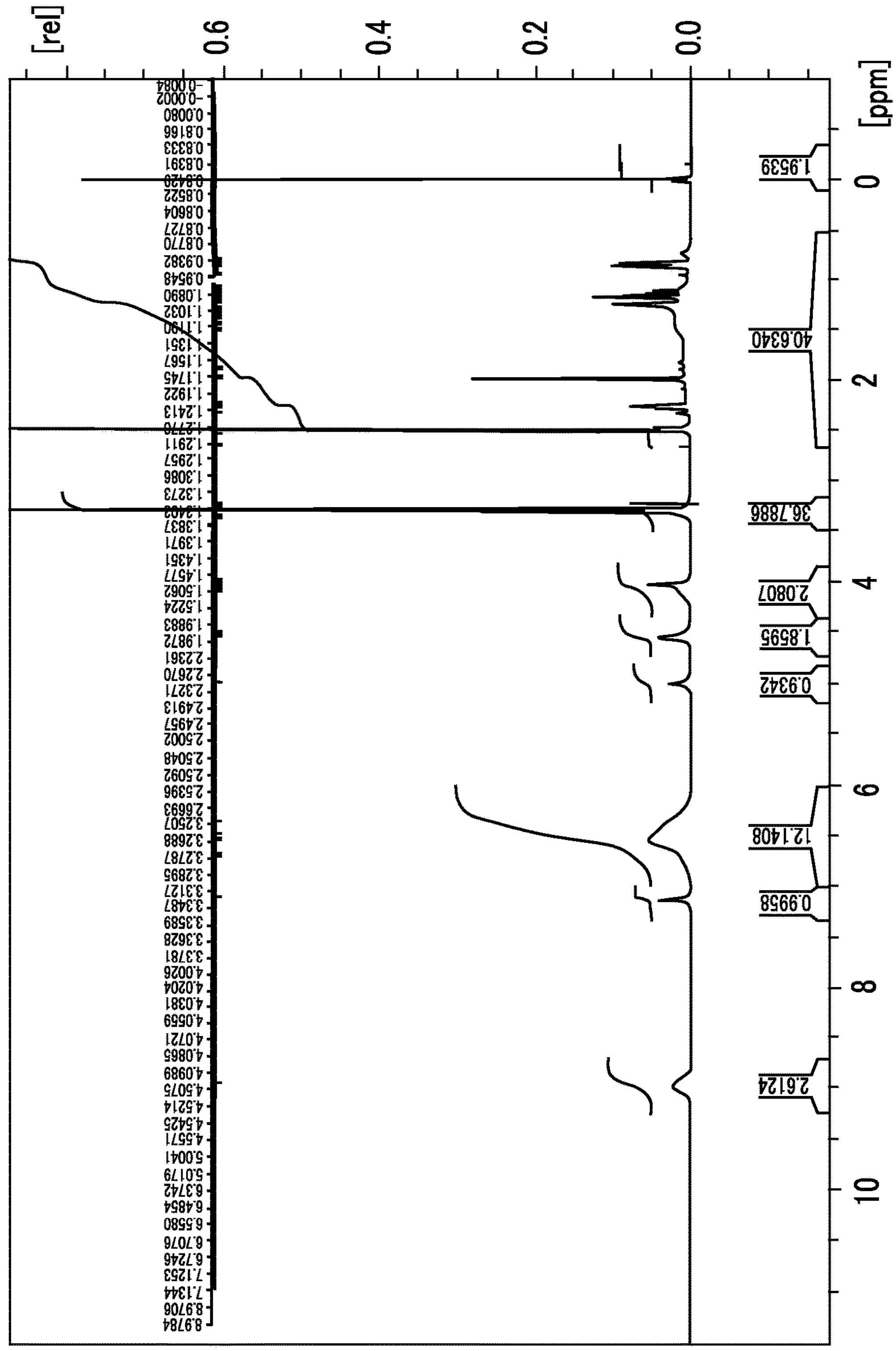
FIG. 4 is a view showing a $^{1}$H-NMR spectrum of the polymer compound (A4) obtained in Synthesis Example 4

5 g of poly(p-hydroxystyrene) (VP2500) manufactured by Nippon Soda Co., Ltd. was dissolved in 30 g of dimethyl sulfoxide. 1.7 g of potassium carbonate and 2 g of the compound (4a-2) synthesized above were sequentially added thereto, followed by stirring at 60° C. for 2 hours. After the completion of the reaction, the reaction liquid was returned to room temperature, and 50 mL of each of ethyl acetate and distilled water was added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 5.4 g of a polymer compound (A4) including the repeating units above. The $^1$H-NMR measurement chart of the obtained polymer compound (A4) in a $d_6$-DMSO solvent is shown in FIG. 4.

Synthesis Example 5: Synthesis of Polymer Compound (A6)

The polymer compound (A6) shown in Table 1 below was synthesized as follows.

[Chem. 40]

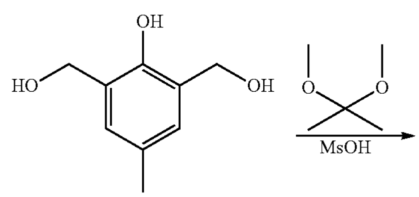

(6a-1)

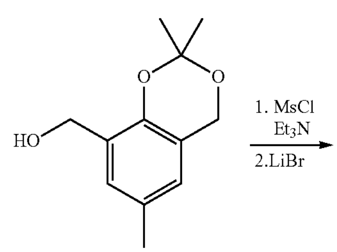

(6a-2)

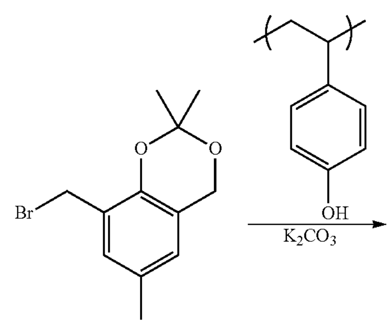

(6a-3)

-continued

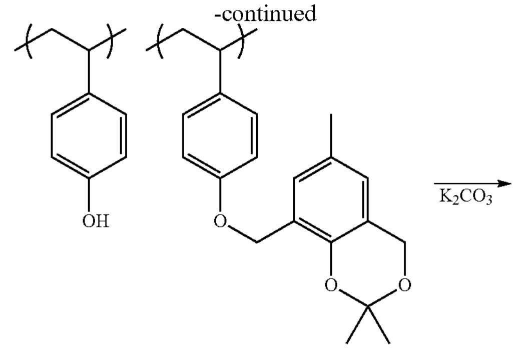

(6a-4)

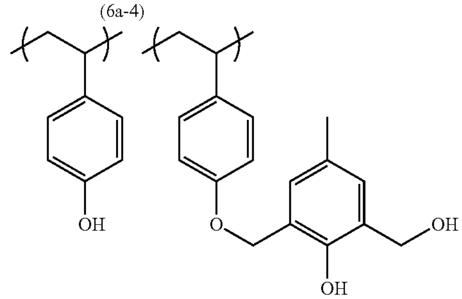

(A6)

(Synthesis of Compound (6a-2))

50 g of 2,6-bis(hydroxymethyl)-p-cresol (4a-1) manufactured by Tokyo Chemical Industry Co., Ltd., and 43.4 g of 2,2-dimethoxypropane were dissolved in 300 mL of acetone. The mixture was stirred at room temperature, and then several droplets of methanesulfonic acid were added thereto, followed by stirring at room temperature for 4 hours. After the completion of the reaction, sodium carbonate was added thereto, and 200 mL of each of distilled water and ethyl acetate were further added thereto. The reaction liquid was transferred to a separating funnel and extracted, and the aqueous layer was removed. Thereafter, the organic layer was washed with 100 mL of distilled water five times and the organic layer was concentrated to obtain 56 g of a compound (6a-2).

$^1$H-NMR ($CDCl_3$: ppm) δ: 1.55 (6H, s), 2.26 (3H, s), 4.62 (2H, s), 4.81 (2H, s), 6.72 (1H, s), 6.97 (1H, s).

(Synthesis of Compound (6a-3))

20 g of the compound (6a-2) synthesized above and 38.9 g of triethylamine were dissolved in 300 mL of ethyl acetate, followed by cooling to 0° C. 22 g of methanesulfonyl chloride was added dropwise to the reaction solution, followed by stirring at 0° C. for 3 hours. After the completion of the reaction, the precipitate was separated by filtration. To the filtrate were added 82 g of LiBr monohydrate and 100 mL of N,N-dimethylformamide, followed by stirring at room temperature for 1 hour. After the completion of the reaction, 100 mL of each of ethyl acetate and distilled water was added thereto. The reaction liquid was transferred to a separating funnel and the aqueous layer was removed. Thereafter, the organic layer was washed with 200 mL of distilled water five times and the organic layer was concentrated to obtain 13 g of a compound (6a-3).

$^1$H-NMR (DMSO-$d_6$: ppm) δ: 1.47 (6H, s), 2.21 (3H, s), 4.54 (2H, s), 4.77 (2H, s), 6.85 (1H, s), 7.09 (1H, s).

(Synthesis of Polymer Compound (6a-4))

Figure 5:
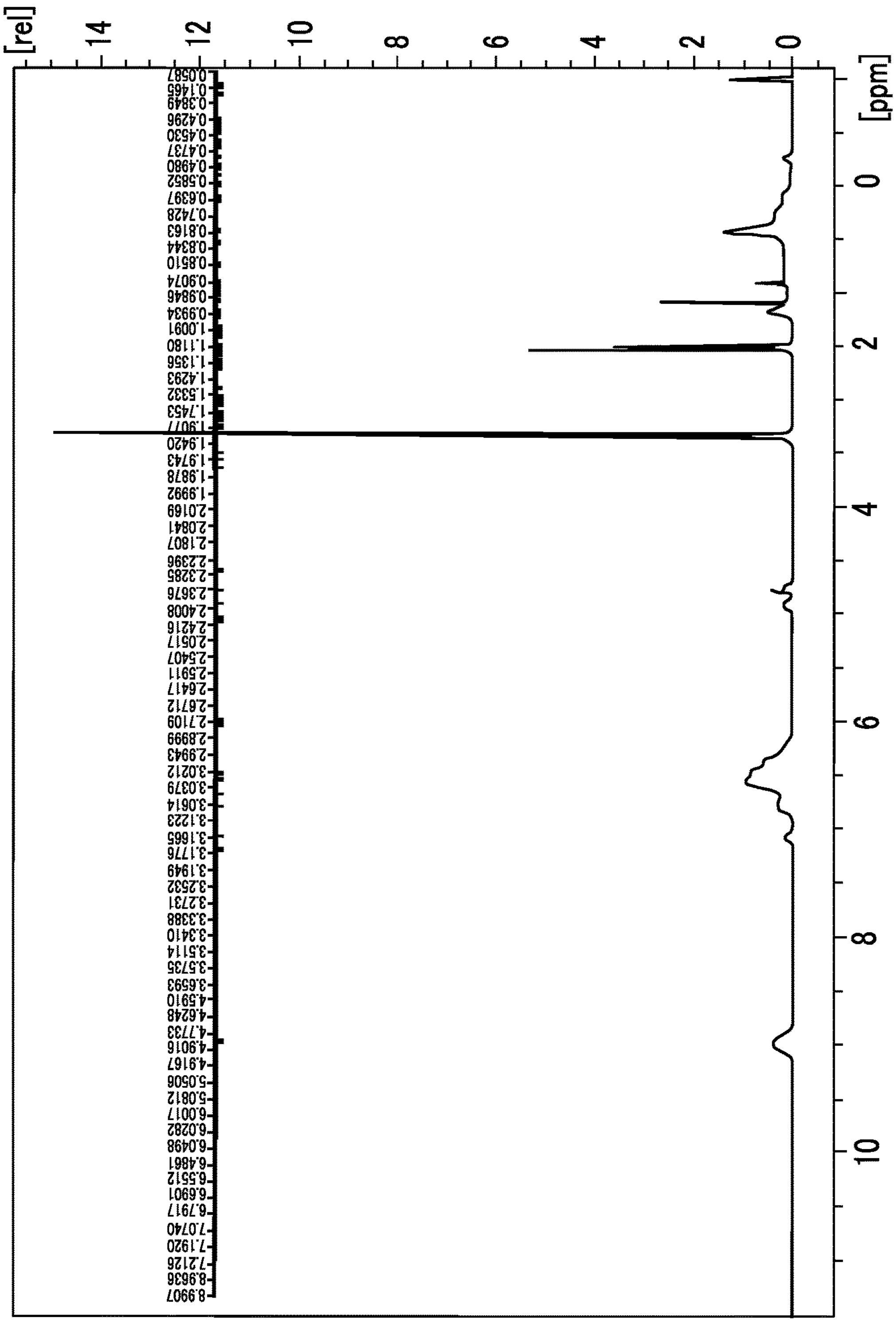
FIG. 5 is a view showing a $^{1}$H-NMR spectrum of the polymer compound (6a-4) obtained in Synthesis Example 5.

3 g of poly(p-hydroxystyrene) (VP2500) manufactured by Nippon Soda Co., Ltd. was dissolved in 30 g of dimethyl sulfoxide. 2.8 g of potassium carbonate and 2 g of the compound (6a-3) synthesized above were sequentially added thereto, followed by stirring at 60° C. for 2 hours. After the completion of the reaction, the reaction liquid was returned to room temperature, and 50 mL of each of ethyl acetate and distilled water was added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 3.9 g of a polymer compound (6a-4) including the repeating units above. The $^1$H-NMR measurement chart of the obtained polymer compound (6a-4) in a $d_6$-DMSO solvent is shown in FIG. 5.

(Synthesis of Compound (A6))

Figure 6:
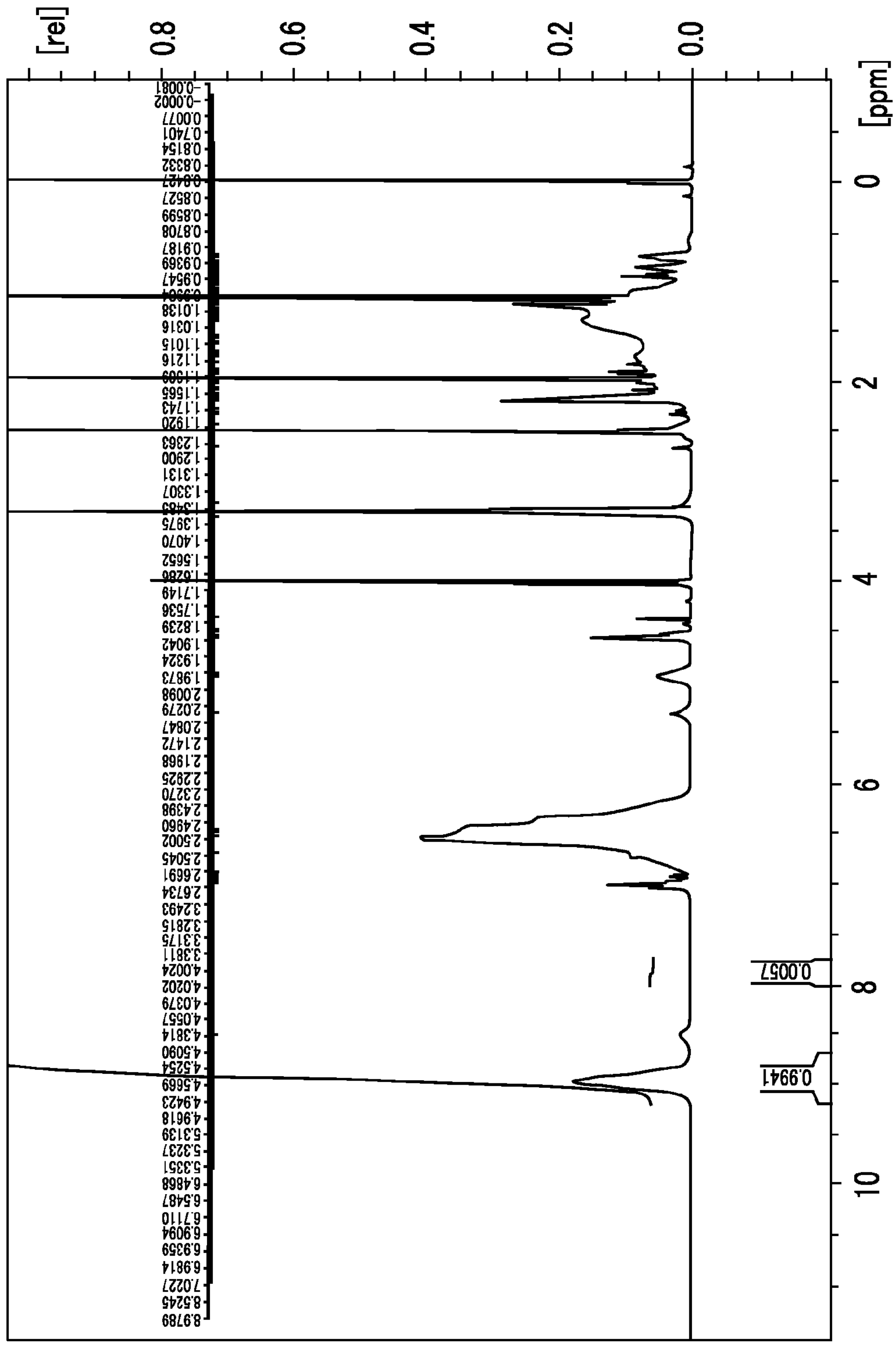
FIG. 6 is a view showing a $^{1}$H-NMR spectrum of the polymer compound (A6) obtained in Synthesis Example 5.

4.5 g of the compound (6a-4) synthesized above was dissolved in 400 mL of methanol. 14 g of a 35% aqueous hydrochloric acid solution and 126 g of distilled water were added dropwise thereto, followed by stirring at room temperature for 24 hours. After the completion of the reaction, the obtained reaction solution was concentrated, and 100 mL of each of ethyl acetate and distilled water was added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 3.5 g of a polymer compound (A6) including the repeating units above. The $^1$H-NMR measurement chart of the obtained polymer compound (A6) in a $d_6$-DMSO solvent is shown in FIG. 6.

Synthesis Example 6: Synthesis of Polymer Compound (A19)

The polymer compound (A19) shown in Table 1 below was synthesized as follows.

[Chem. 41]

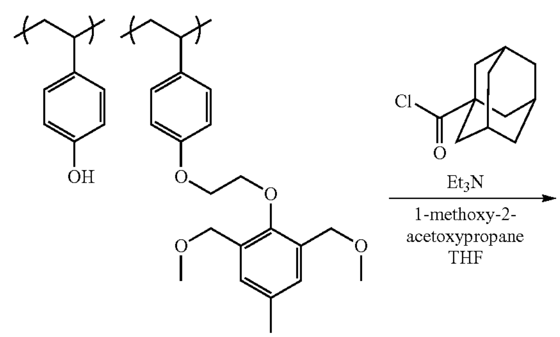

(19a-1)

-continued

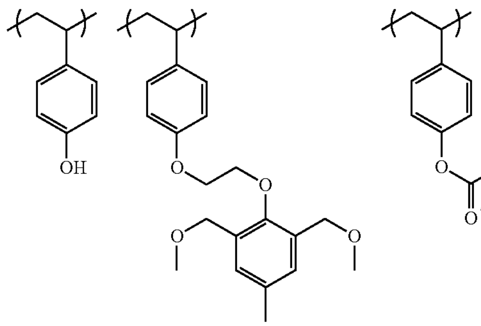

(A19)

-continued

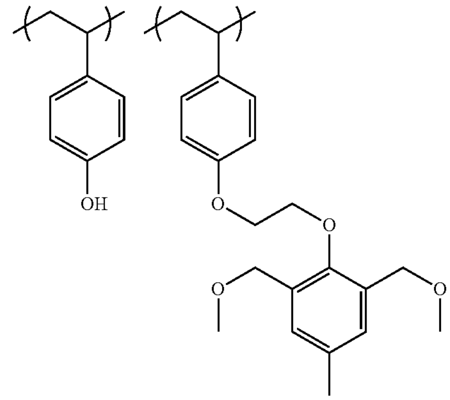

(A26)

(Synthesis of Polymer Compound (A19))

Figure 7:
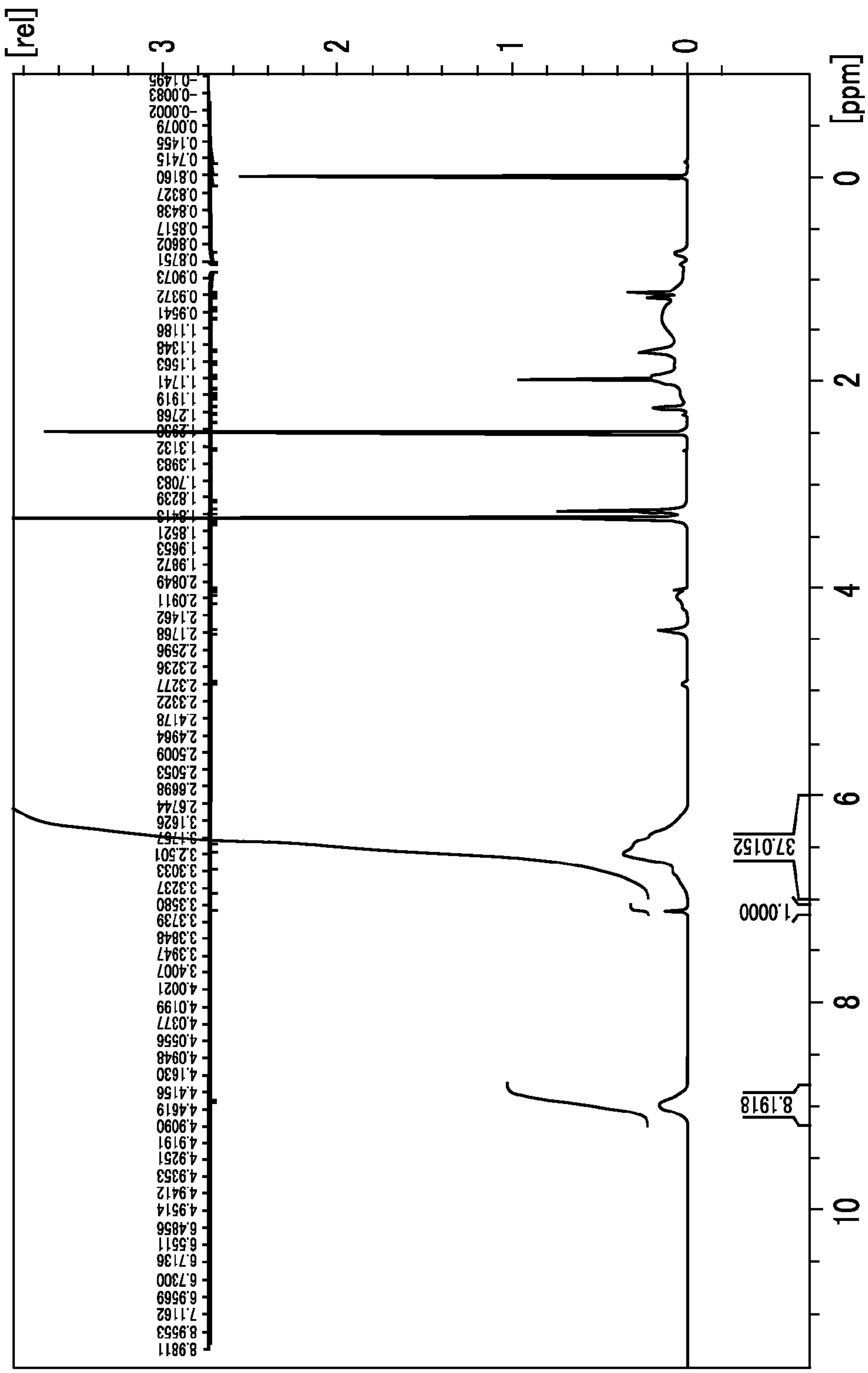
FIG. 7 is a view showing a $^{1}$H-NMR spectrum of the polymer compound (A19) obtained in Synthesis Example 6.

4 g of a compound (19a-1) was dissolved in 20 g of 1-methoxy-2-acetoxypropane and 20 g of tetrahydrofuran. 0.3 g of triethylamine and 0.3 g of 1-adamantane carbonyl chloride were sequentially added thereto, followed by stirring at 50° C. for 2 hours. After the completion of the reaction, the reaction liquid was returned to room temperature, and 50 mL of each of ethyl acetate and distilled water were added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 4.2 g of a polymer compound (A19) including the repeating units above. The $^{1}$H-NMR measurement chart of the obtained polymer compound (A19) in a $d_6$-DMSO solvent is shown in FIG. 7.

Synthesis Example 7: Synthesis of Polymer Compound (A26)

The polymer compound (A26) shown in Table 1 below was synthesized as follows.

[Chem. 42]

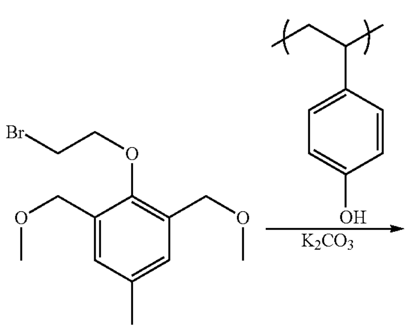

(26a)

(Synthesis of Polymer Compound (A26))

Figure 8:
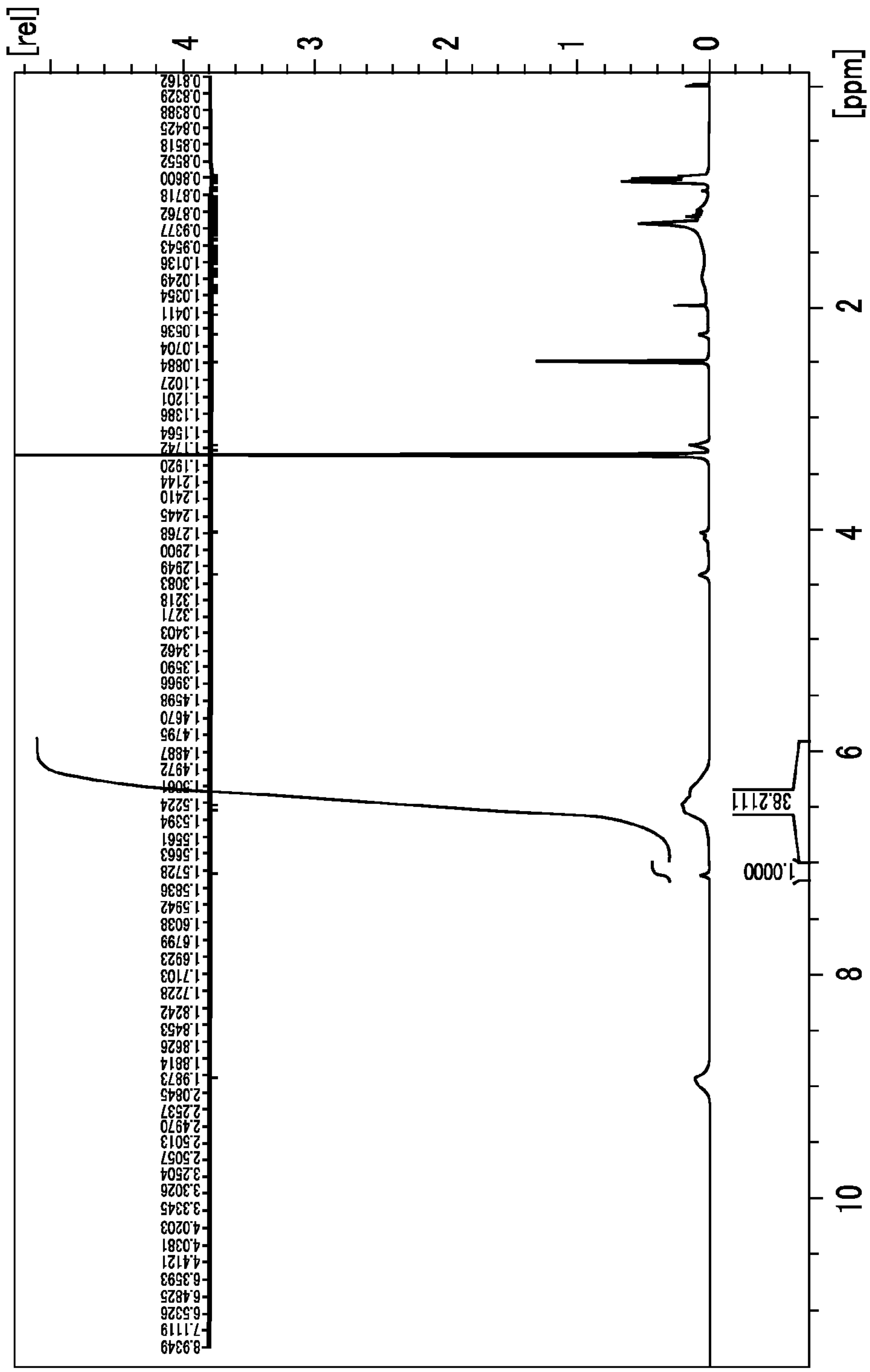
FIG. 8 is a view showing a $^{1}$H-NMR spectrum of the polymer compound (A26) obtained in Synthesis Example 7.

5 g of poly(p-hydroxystyrene) (VP8000) manufactured by Nippon Soda Co., Ltd. was dissolved in 30 g of dimethyl sulfoxide. 1.7 g of potassium carbonate and 2 g of the compound (26a) were sequentially added thereto, followed by stirring at 60° C. for 2 hours. After the completion of the reaction, the reaction liquid was returned to room temperature, and 50 mL of each of ethyl acetate and distilled water was added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 5.4 g of a polymer compound (A26) including the repeating units above. The $^{1}$H-NMR measurement chart of the obtained polymer compound (26A) in a $d_6$-DMSO solvent is shown in FIG. 8.

Synthesis Example 8: Synthesis of Polymer Compound (A27)

The polymer compound (A27) shown in Table 1 below was synthesized as follows.

[Chem. 43]

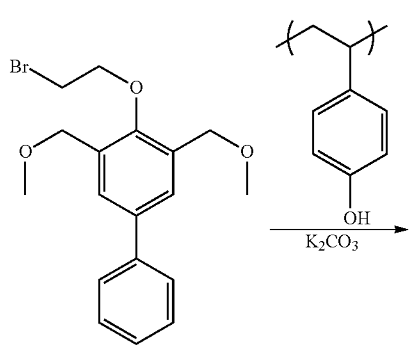

(27a)

-continued

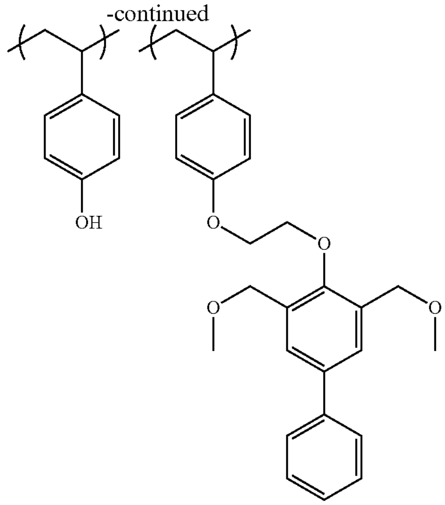

(A27)

(Synthesis of Polymer Compound (A27))

Figure 9:
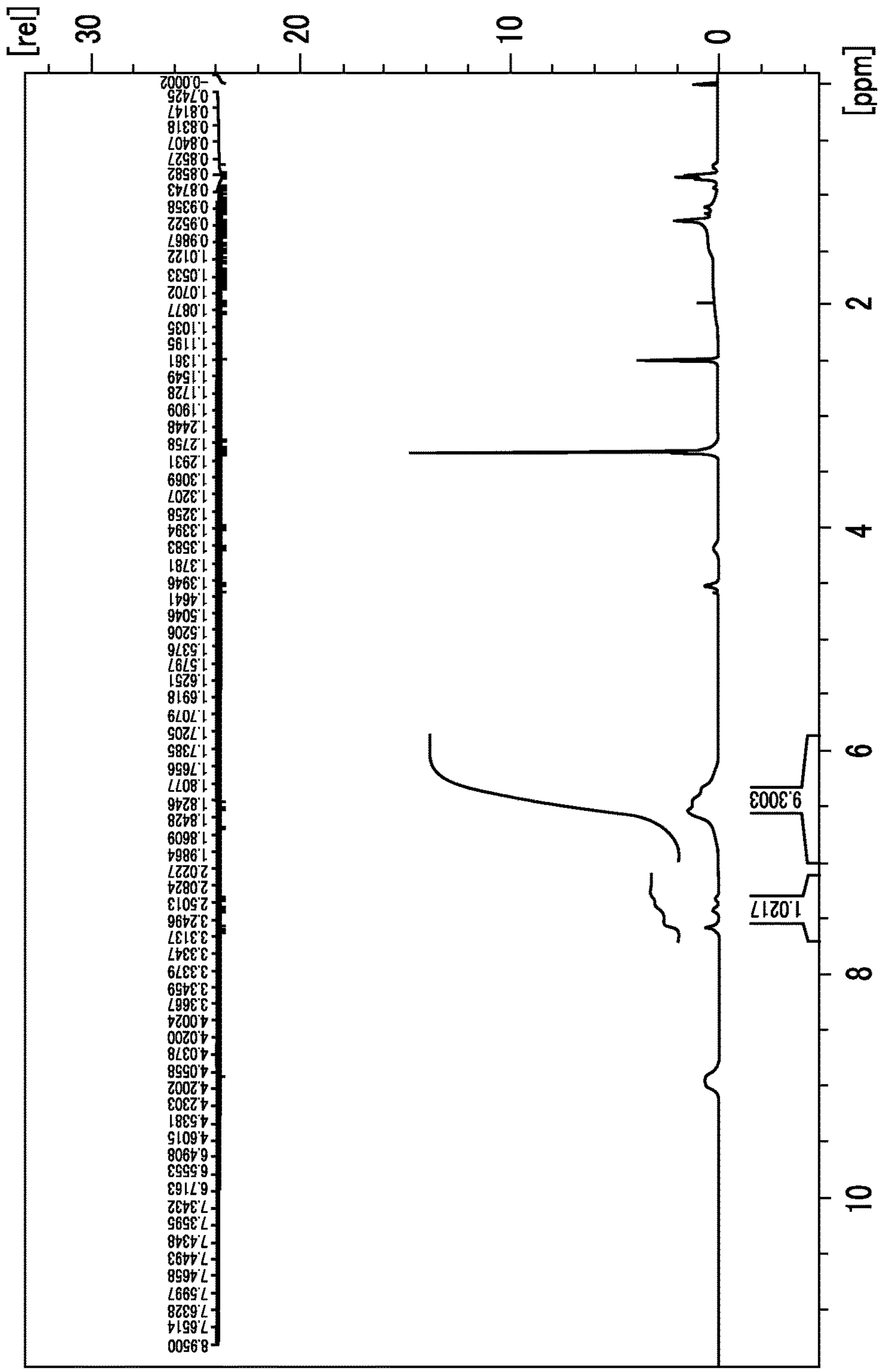
FIG. 9 is a view showing a $^{1}$H-NMR spectrum of the polymer compound (A27) obtained in Synthesis Example 8.

5 g of poly(p-hydroxystyrene) (VP2500) manufactured by Nippon Soda Co., Ltd. was dissolved in 30 g of dimethyl sulfoxide. 1.7 g of potassium carbonate and 1 g of the compound (27a) were sequentially added thereto, followed by stirring at 60° C. for 2 hours. After the completion of the reaction, the reaction liquid was returned to room temperature, and 50 mL of each of ethyl acetate and distilled water was added thereto. The reaction liquid was transferred to a separating funnel and the aqueous layer was removed. Thereafter, the organic layer was washed with 50 mL of distilled water five times, the organic layer was concentrated, and the concentrate was added dropwise to 500 mL of hexane. The powder was filtered, then separated, and dried in vacuo to obtain 5.4 g of a polymer compound (A27) including the repeating units above. The $^{1}$H-NMR measurement chart of the obtained polymer compound (A27) in a $d_6$-DMSO solvent is shown in FIG. 9.

<Synthesis of Polymer Compounds (A5), (A7) to (A18), (A20) to (A25) and (A28) to (A33)>

By the method as described above, polymer compounds (A5), (A7) to (A18), (A20) to (A25) and (A28) to (A33) were synthesized. Further, for comparison, polymer compounds (R1) to (R4) were synthesized. The chemical formulae, compositional ratios, weight average molecular weights, and dispersity of these compounds are shown in Table 1 below. In Table 1, the positional relationship of the respective repeating units with the respective polymer compounds corresponds to the positional relationship of the numeral values of the compositional ratios of the respective repeating units.

TABLE 1

| Polymer compound (A) | Chemical formula | Compositional ratio (molar ratio) | Weight average molecular weight | Dispersity |
|---|---|---|---|---|
| Polymer compound (A1) | 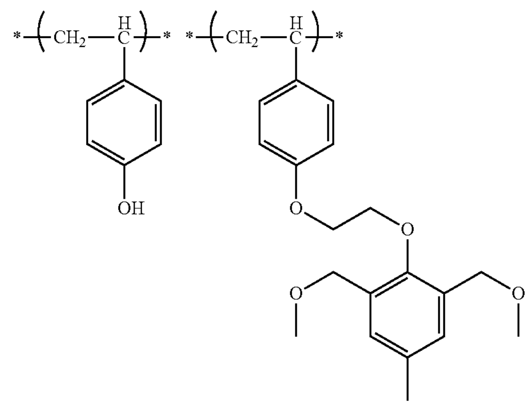 | 91/9 | 3800 | 1.12 |
| Polymer compound (A2) | 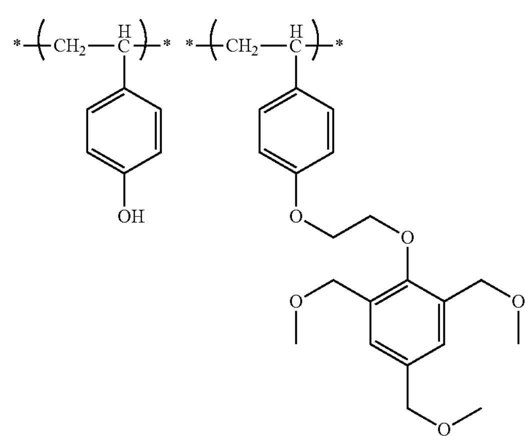 | 95/5 | 3800 | 1.13 |

TABLE 1-continued
| Polymer compound (A) | Chemical formula | Compositional ratio (molar ratio) | Weight average molecular weight | Dispersity |
|---|---|---|---|---|
| Polymer compound (A3) | 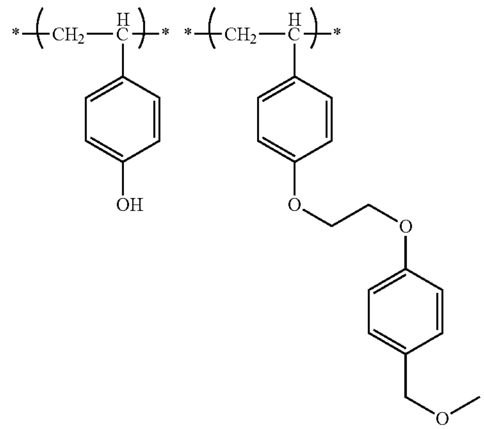 | 88/12 | 3700 | 1.13 |
| Polymer compound (A4) | 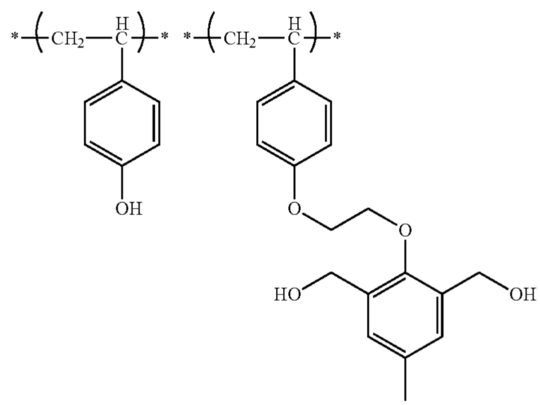 | 85/15 | 3700 | 1.12 |
| Polymer compound (A5) | 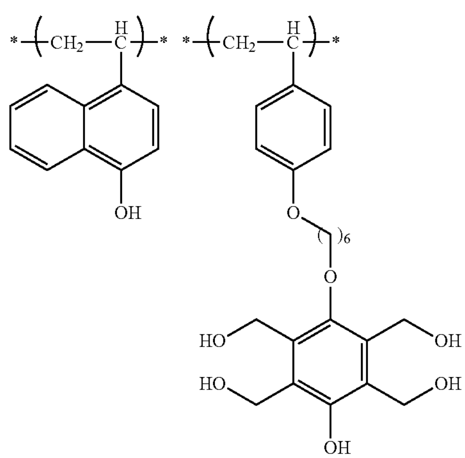 | 75/25 | 3800 | 1.12 |

TABLE 1-continued
| Polymer compound (A) | Chemical formula | Compositional ratio (molar ratio) | Weight average molecular weight | Dispersity |
|---|---|---|---|---|
| Polymer compound (A6) | 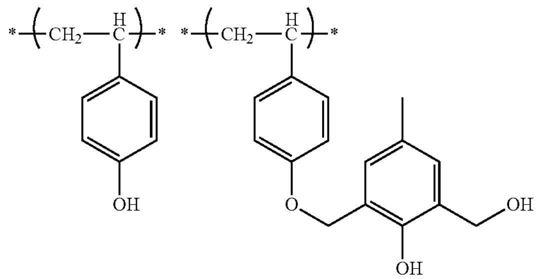 | 70/30 | 3700 | 1.11 |
| Polymer compound (A7) | 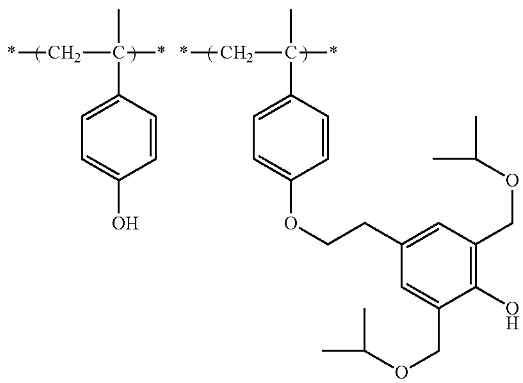 | 75/25 | 4000 | 1.12 |
| Polymer compound (A8) | 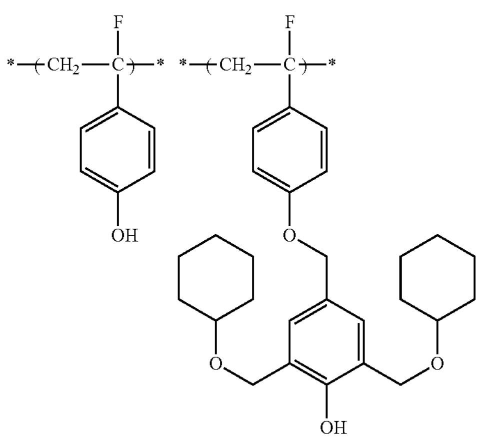 | 90/10 | 4500 | 1.12 |
| Polymer compound (A9) | 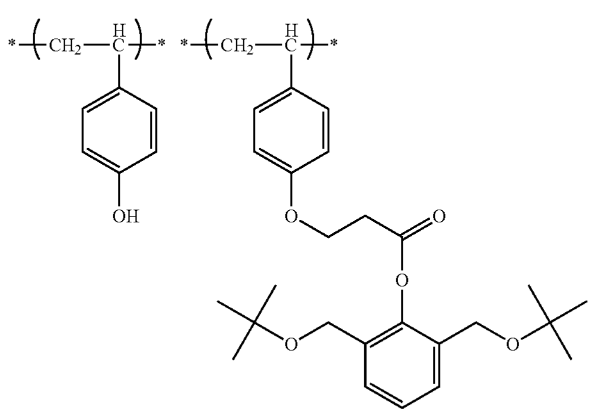 | 80/20 | 4500 | 1.14 |

TABLE 1-continued
| Polymer compound (A) | Chemical formula | Compositional ratio (molar ratio) | Weight average molecular weight | Dispersity |
|---|---|---|---|---|
| Polymer compound (A10) | 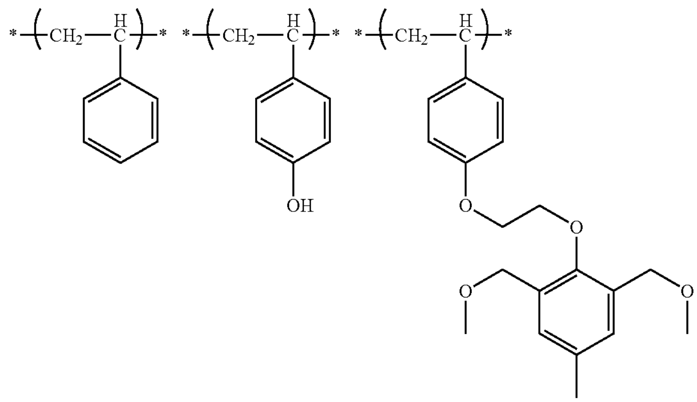 | 5/80/15 | 6500 | 1.45 |
| Polymer compound (A11) | 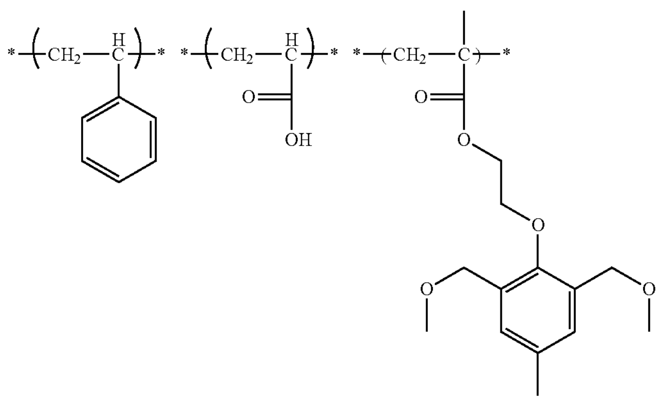 | 5/85/10 | 6500 | 1.50 |
| Polymer compound (A12) | 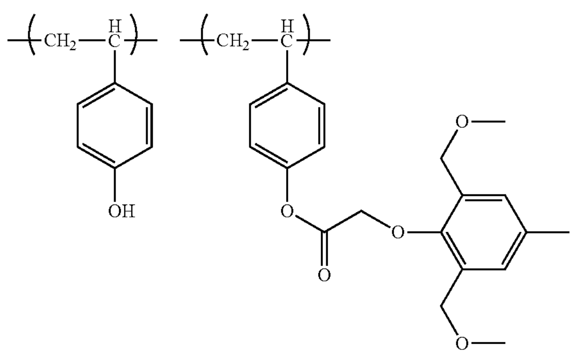 | 85/15 | 4100 | 1.11 |
| Polymer compound (A13) | 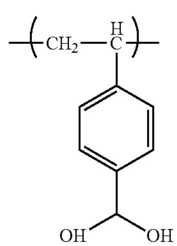 | 80/20 | 4300 | 1.12 |

TABLE 1-continued
| Polymer compound (A) | Chemical formula | Compositional ratio (molar ratio) | Weight average molecular weight | Dispersity |
|---|---|---|---|---|
| | 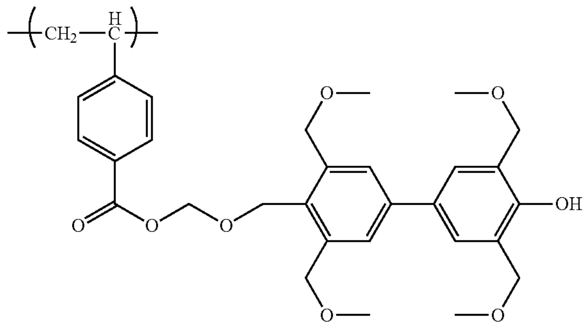 | | | |
| Polymer compound (A14) | 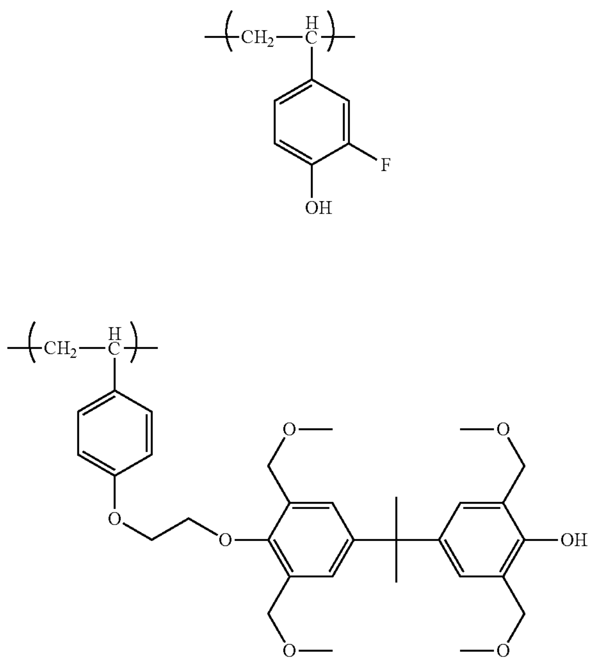 | 85/15 | 4300 | 1.20 |
| Polymer compound (A15) | 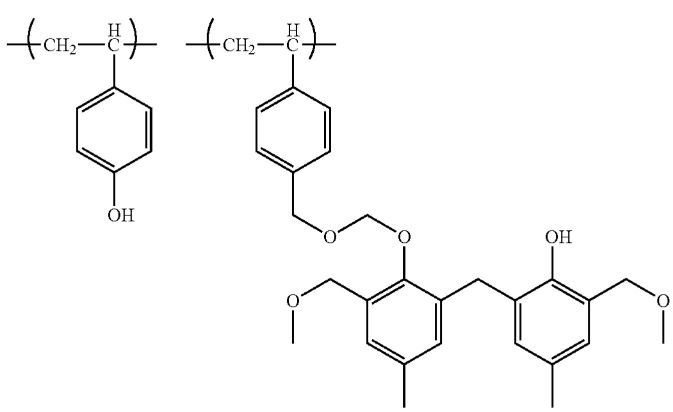 | 80/20 | 4500 | 1.14 |

TABLE 1-continued
| Polymer compound (A) | Chemical formula | Compositional ratio (molar ratio) | Weight average molecular weight | Dispersity |
|---|---|---|---|---|
| Polymer compound (A16) | 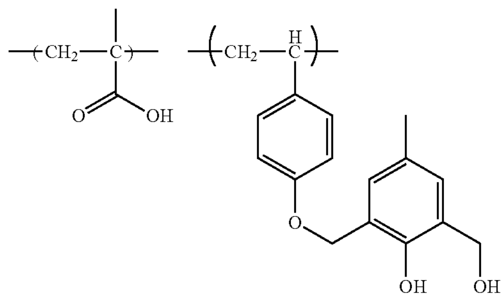 | 70/30 | 6500 | 1.52 |
| Polymer compound (A17) | 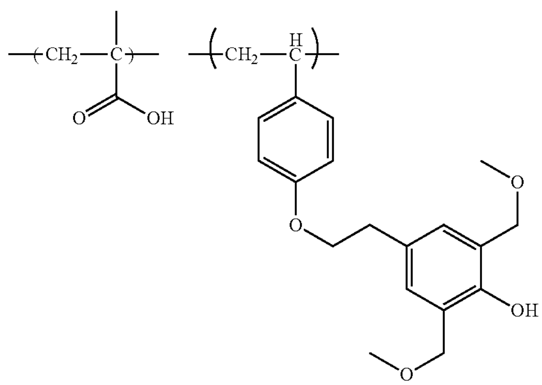 | 80/20 | 6500 | 1.50 |
| Polymer compound (A18) | 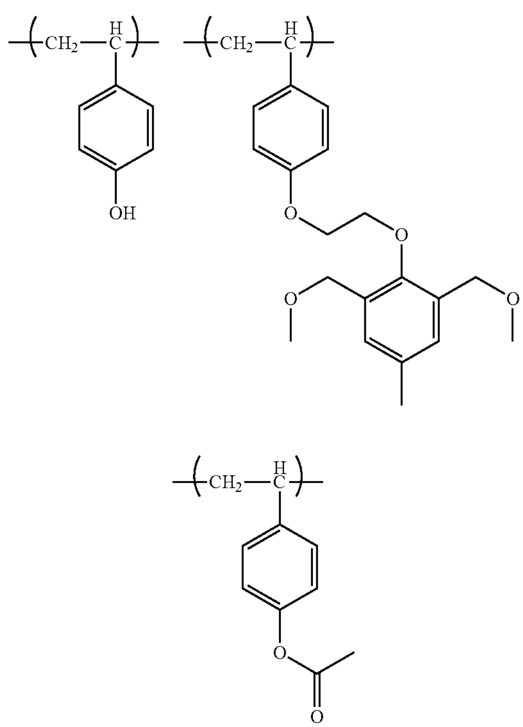 | 90/5/5 | 4000 | 1.12 |

TABLE 1-continued
| Polymer compound (A) | Chemical formula | Compositional ratio (molar ratio) | Weight average molecular weight | Dispersity |
|---|---|---|---|---|
| Polymer compound (A19) | 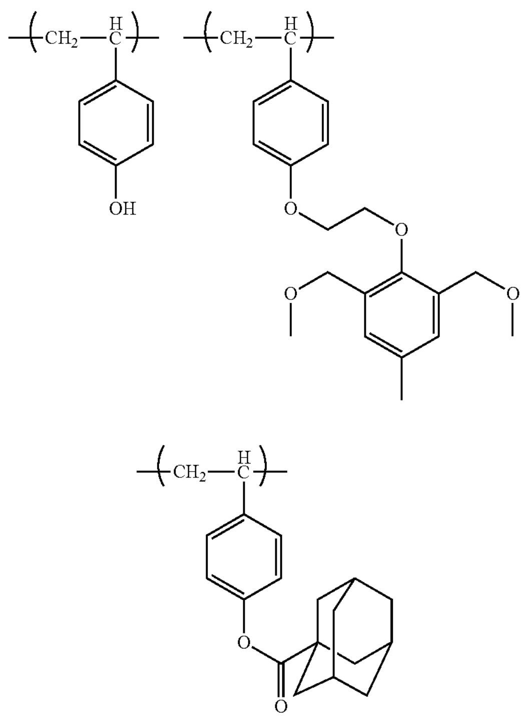 | 90/5/5 | 4500 | 1.12 |
| Polymer compound (A20) | 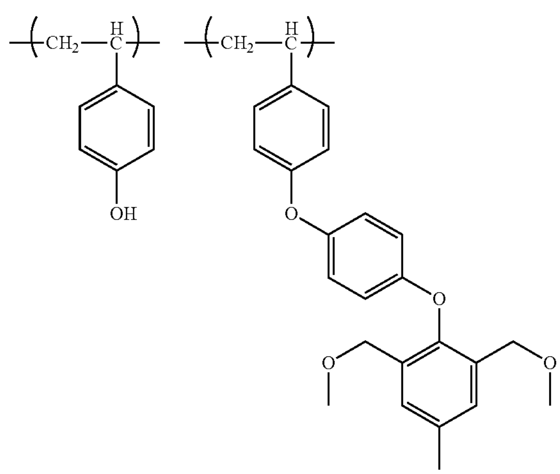 | 90/10 | 4000 | 1.13 |
| Polymer compound (A21) | 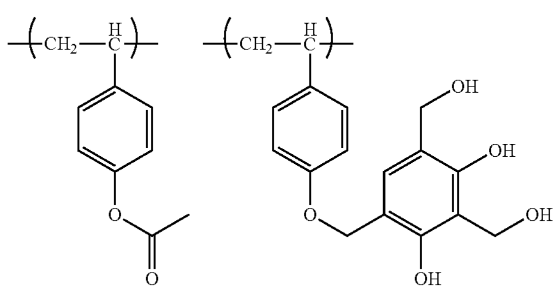 | 50/50 | 4000 | 1.13 |

TABLE 1-continued
| Polymer compound (A) | Chemical formula | Compositional ratio (molar ratio) | Weight average molecular weight | Dispersity |
|---|---|---|---|---|
| Polymer compound (A22) | 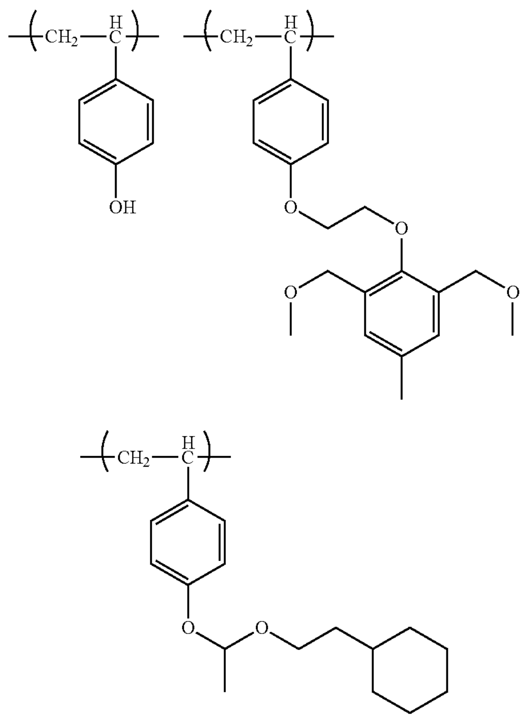 | 70/5/25 | 4000 | 1.12 |
| Polymer compound (A23) | 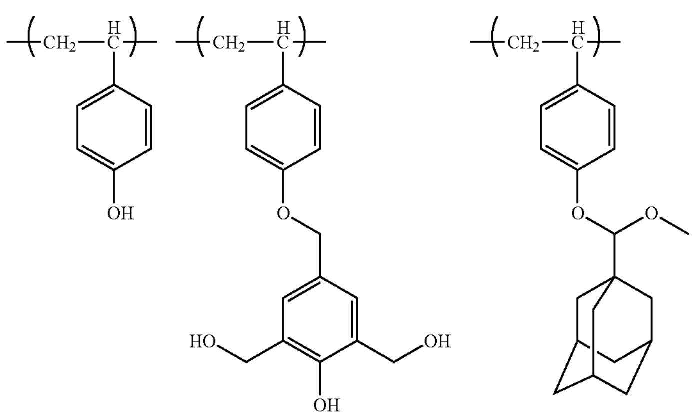 | 65/10/25 | 4000 | 1.12 |
| Polymer compound (A24) | 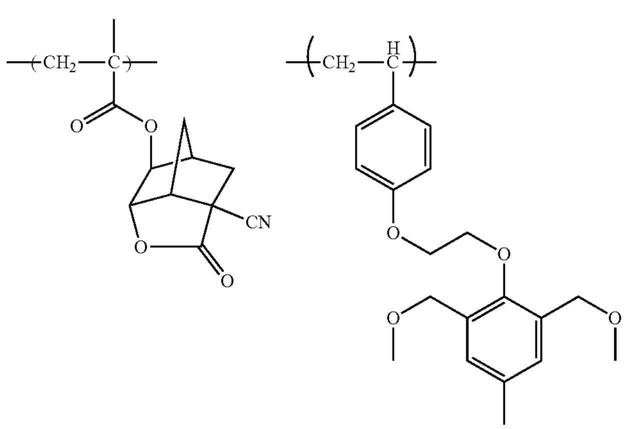 | 40/15/45 | 4000 | 1.50 |

TABLE 1-continued
| Polymer compound (A) | Chemical formula | Compositional ratio (molar ratio) | Weight average molecular weight | Dispersity |
|---|---|---|---|---|
| | 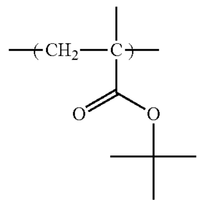 | | | |
| Polymer compound (A25) | 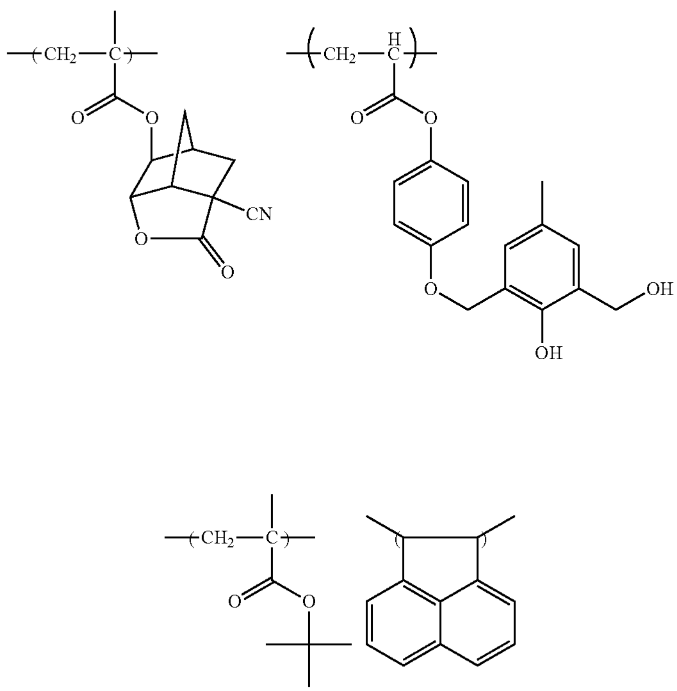 | 40/10/ 35/15 | 4000 | 1.50 |
| Polymer compound (A26) | 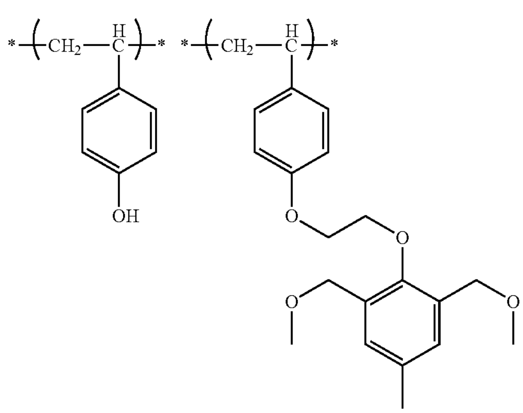 | 95/5 | 9000 | 1.12 |

TABLE 1-continued
| Polymer compound (A) | Chemical formula | Compositional ratio (molar ratio) | Weight average molecular weight | Dispersity |
|---|---|---|---|---|
| Polymer compound (A27) | 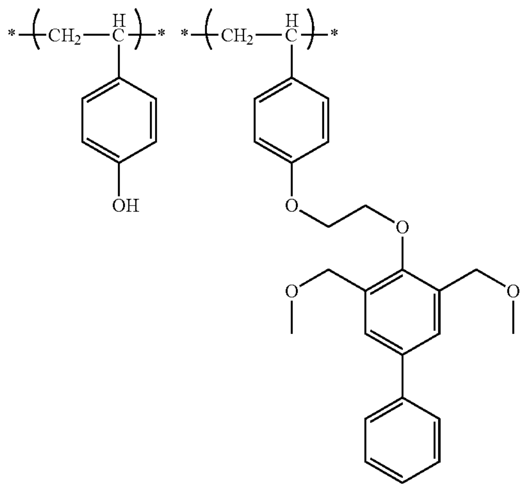 | 95/5 | 4500 | 1.12 |
| Polymer compound (A28) | 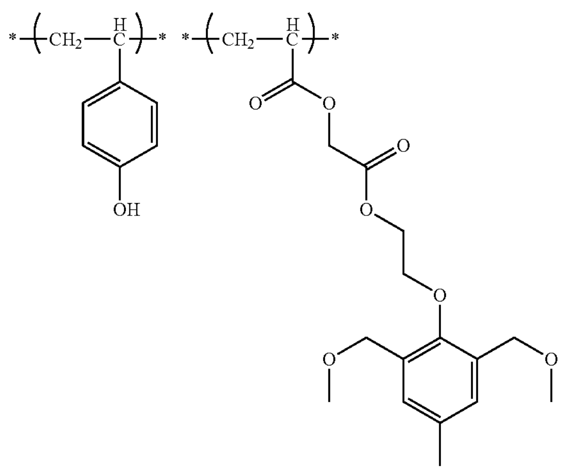 | 90/10 | 4700 | 1.50 |
| Polymer compound (A29) | 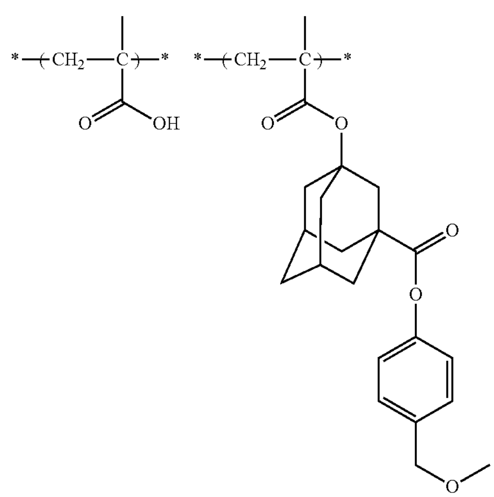 | 80/20 | 4000 | 1.12 |

TABLE 1-continued
| Polymer compound (A) | Chemical formula | Compositional ratio (molar ratio) | Weight average molecular weight | Dispersity |
|---|---|---|---|---|
| Polymer compound (A30) | 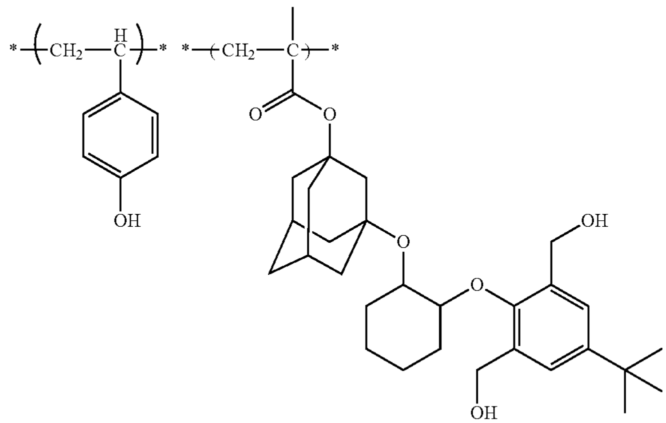 | 90/10 | 4500 | 1.45 |
| Polymer compound (A31) | 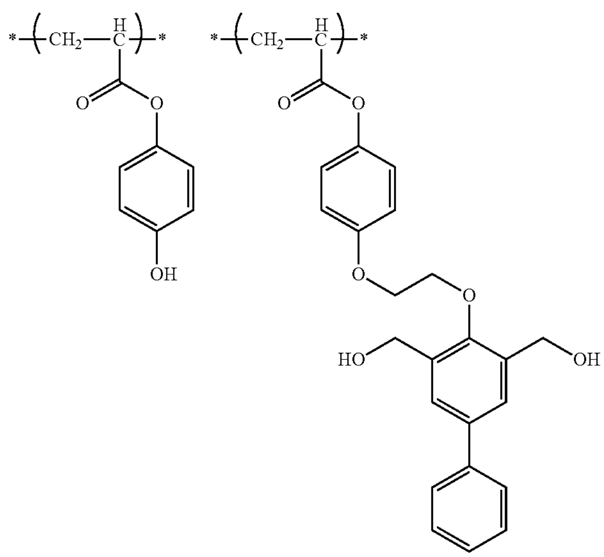 | 85/15 | 5100 | 1.12 |
| Polymer compound (A32) | 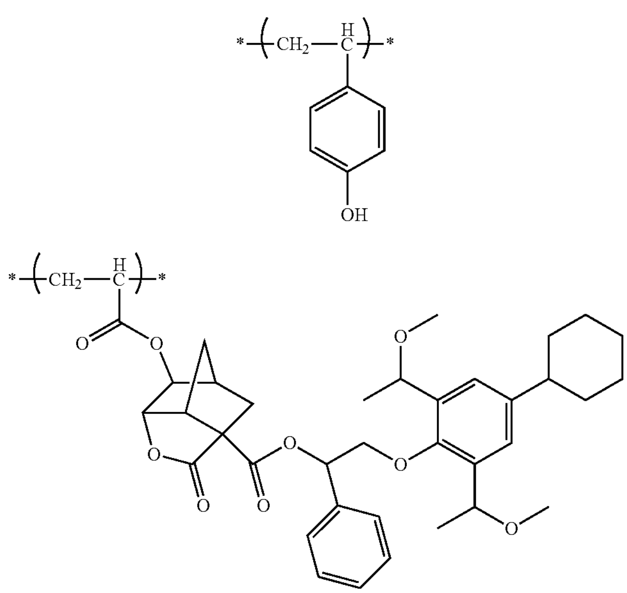 | 95/5 | 5000 | 1.50 |

TABLE 1-continued
| Polymer compound (A) | Chemical formula | Compositional ratio (molar ratio) | Weight average molecular weight | Dispersity |
|---|---|---|---|---|
| Polymer compound (A33) | 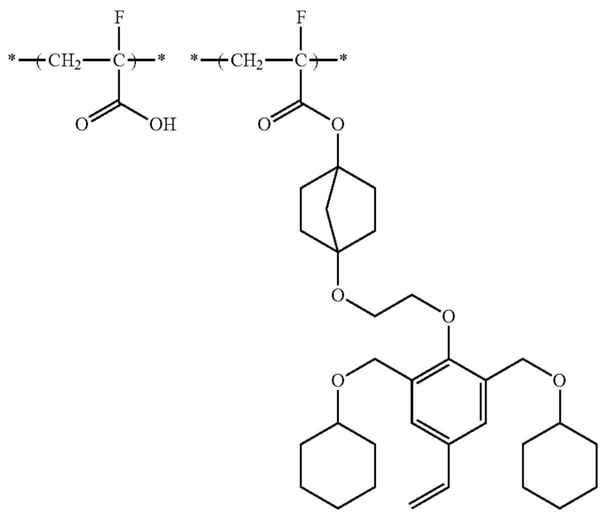 | 95/5 | 4500 | 1.16 |
| Comparative polymer compound (R1) | 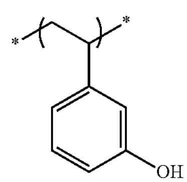 | 100 | 4500 | 1.13 |
| Comparative polymer compound (R2) | 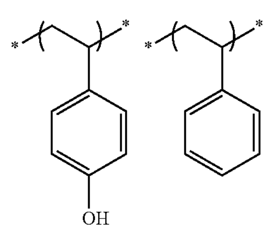 | 90/10 | 8000 | 1.51 |
| Comparative polymer compound (R3) | 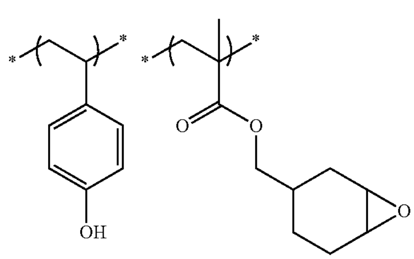 | 85/15 | 7000 | 1.45 |
| Comparative polymer compound (R4) | 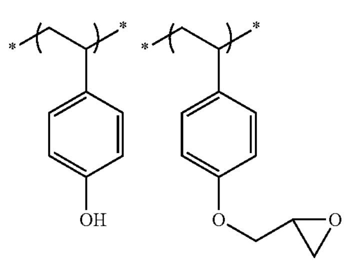 | 80/20 | 4500 | 1.12 |

TABLE 1-continued

| Polymer compound (A) | Chemical formula | Compositional ratio (molar ratio) | Weight average molecular weight | Dispersity |
|---|---|---|---|---|
| Comparative polymer compound (R5) | 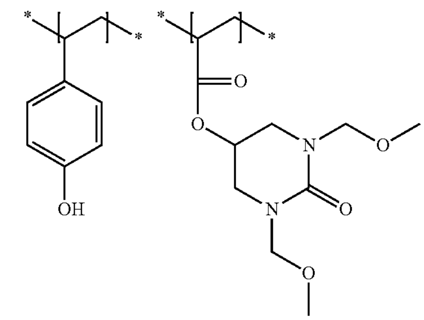 | 80/20 | 4500 | 1.51 |
| Comparative polymer compound (R6) | 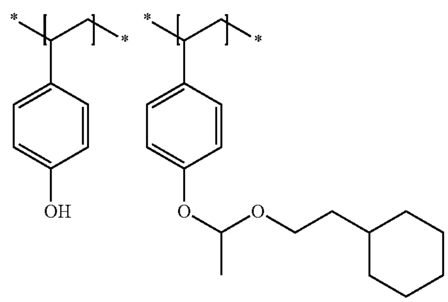 | 70/30 | 5100 | 1.40 |
| Comparative polymer compound (R7) | 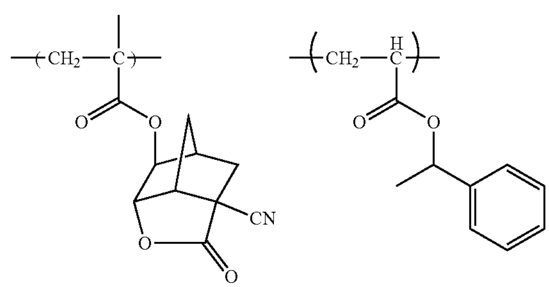 | 60/40 | 5500 | 1.50 |

The structures (excluding the compound (A)) corresponding to the abbreviations described in Tables 2 and 5 below are described below:

[Acid Generator (B)]

[Chem. 44]

(z2)

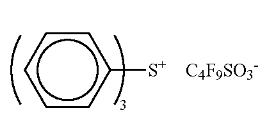

113 Å$^3$ (z5)

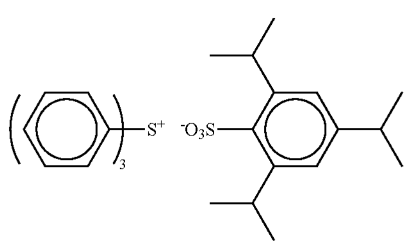

303 Å$^3$

-continued (z8)

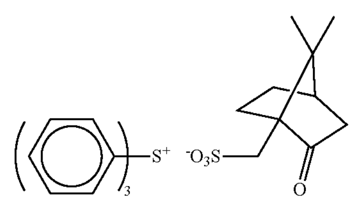

216 Å$^3$ (z37)

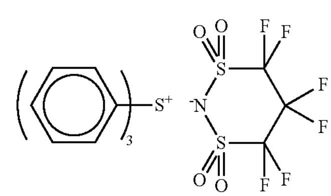

136 Å$^3$

-continued
(z42)
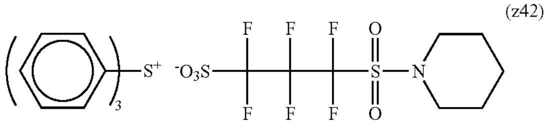
244 Å$^3$
(z48)
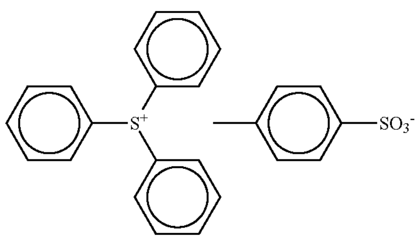
186 Å$^3$
(z49)
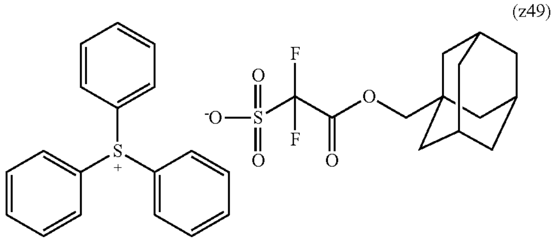
271 Å$^3$
(z61)
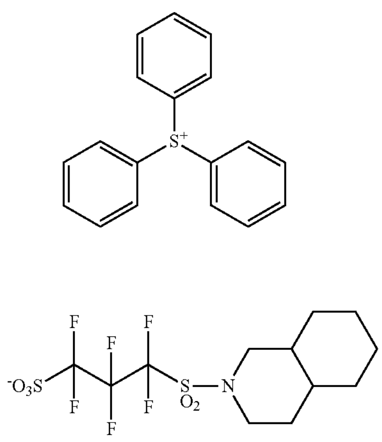
311 Å$^3$
(z63)
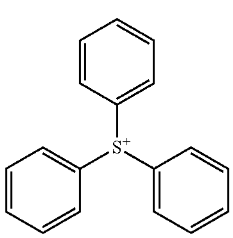
-continued
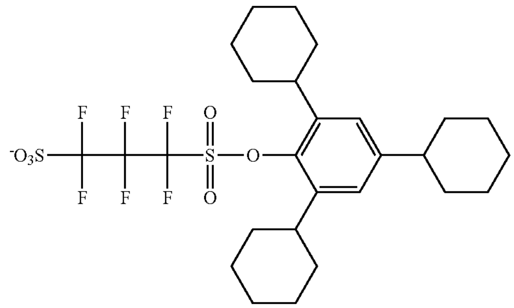
535 Å$^3$
(z65)
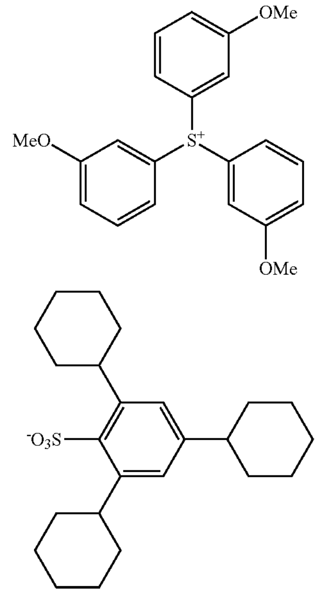
437 Å$^3$
(z66)
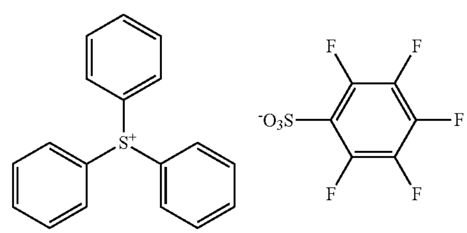
127 Å$^3$
(z67)
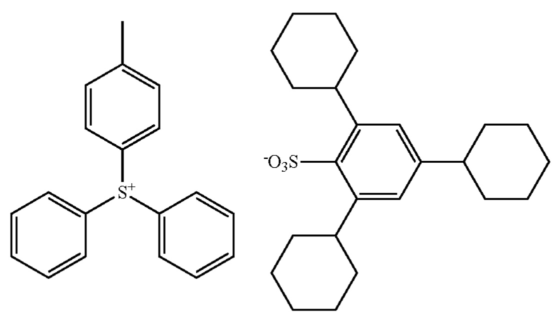
437 Å$^3$ -continued
(z68)
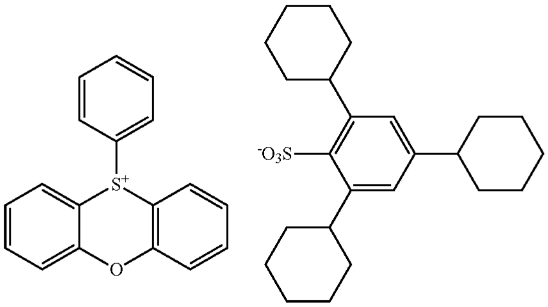
437 Å$^3$
[Cross-Linking Agent (Compound (C))]
[Chem. 45]
CL-1
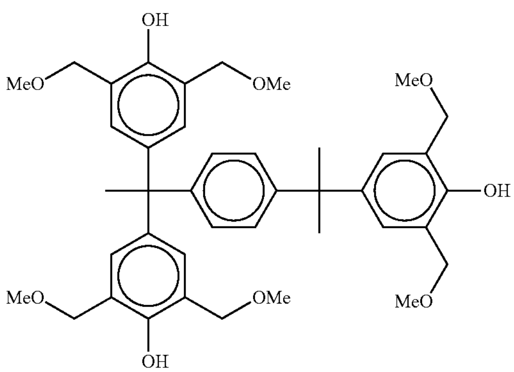
CL-2
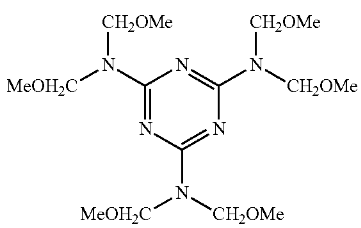
CL-3
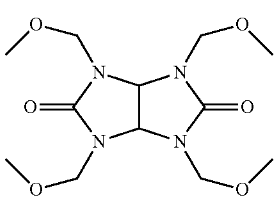
CL-4
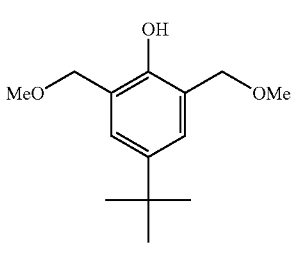
[Compound Having Phenolic Hydroxyl Group (Compound (X))]
[Chem. 46]
X1
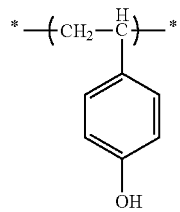
X2
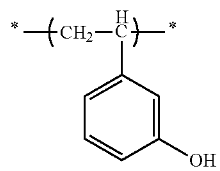
X3
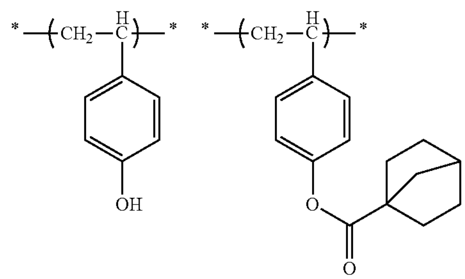
X4
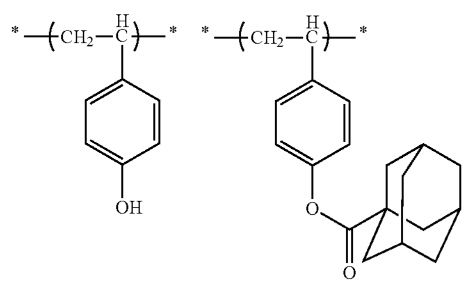
[Basic Compound]
BASE-1: Tetrabutylammonium hydroxide
BASE-2: 2,4,5-Triphenylimidazole
BASE-3: Tri(n-octyl)amine
[Chem. 47]
BASE-4
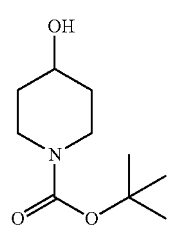

-continued

BASE-5

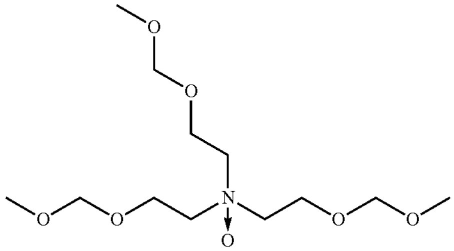

BASE-6

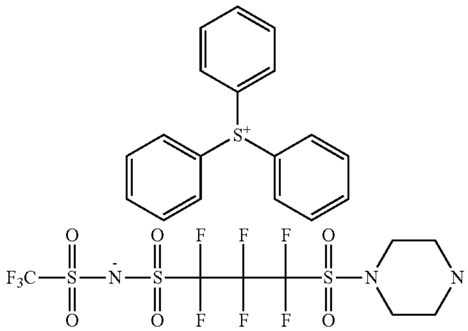

[Organic Carboxylic Acid]

D1: 2-Hydroxy-3-naphthoic acid

D2: 2-Naphthoic acid

D3: Benzoic acid

[Surfactant]

W-1: PF6320 (manufactured by OMNOVA Solutions, Inc.)

W-2: MEGAFACE F176 (manufactured by DIC Corporation; fluorine-based)

W-3: Polysiloxane polymer KP-341 (manufactured by Shin-Etsu Chemical Co., Ltd.; silicone-based)

[Solvent]

<Coating Solvent>

S1: Propylene glycol monomethyl ether acetate (1-methoxy-2-acetoxypropane)

S2: Propylene glycol monomethyl ether (1-methoxy-2-propanol)

S3: 2-Heptanone

S4: Ethyl lactate

S5: Cyclohexanone

S6: γ-Butyrolactone

S7: Propylene carbonate

<Developer/Rinsing Solution>

S8: Butyl acetate

S9: Pentyl acetate

S10: Anisole

S11: 1-Hexanol

S12: Decane

Examples 1A to 35A and Comparative Examples 1A to 5A (Electron Beam Exposure; Negative Tone; Alkali Development)

Example 1A (1) Preparation of Support

A support, in which chromium (Cr) oxide had been deposited on a 6-inch wafer (a wafer subjected to a shielding film treatment used for common photomask blanks) was prepared.

(2) Preparation of Resist Coating Solution

| (Coating Solution Composition of Negative tone Resist Composition 1N) | |
|---|---|
| Compound (A1) | 92.38% by weight |
| Acid generator (z61) (structural formula is described below) | 5.73% by weight |
| Tetrabutylammonium hydroxide (basic compound) | 0.49% by weight |
| 2-Hydroxy-3-naphthoic acid (organic carboxylic acid) | 1.34% by weight |
| Surfactant PF6320 (manufactured by OMNOVA) | 0.06% by weight |
| Propylene glycol monomethyl ether acetate (solvent) | |
| Propylene glycol monomethyl ether (solvent) | |

[Chem. 48]

(z61)

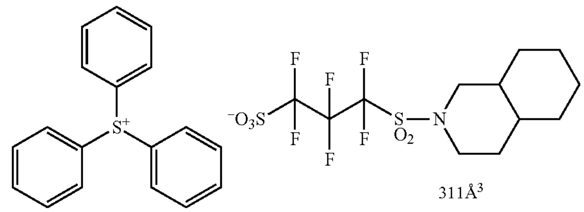

311Å$^3$

A solution of the composition described above was microfiltered through a membrane filter having a pore size of 0.04 μm to obtain a resist coating solution (composition 1N).

(3) Preparation of Resist Film

The resist coating solution was coated on the 6-inch wafer by using a spin coater Mark 8 manufactured by Tokyo Electron, Ltd., and the wafer was dried on a hot plate at 110° C. for 90 seconds to obtain a resist film having a film thickness of 100 nm. That is, mask blanks including the resist film were obtained.

(4) Preparation of Negative Tone Resist Pattern

This resist film was subjected to patternwise irradiation by using an electron beam lithographic apparatus (manufactured by Elionix, Inc.; ELS-7500, acceleration voltage: 50 keV). After the irradiation, the film was heated on a hot plate at 120° C. for 90 seconds and immersed in a 2.38%-by-mass aqueous solution of tetramethylammonium hydroxide (TMAH) for 60 seconds. Subsequently, the film was rinsed with water for 30 seconds and then dried.

(5) Evaluation of Resist Pattern

The pattern thus obtained was evaluated for sensitivity, resolution, pattern shape, line edge roughness (LER), scum, and dry etching resistance, by the methods described below.

[Sensitivity]

The cross-sectional shape of the pattern thus obtained was observed by using a scanning electron microscope (S-4300 manufactured by Hitachi, Ltd.). The amount of exposure (amount of electron beam irradiation) used to resolve a resist pattern having a line width of 100 nm (line:space=1:1) was designated as sensitivity. A smaller value of this amount of exposure indicates higher sensitivity.

[LS Resolution]

The resolution limit (the minimum line width at which lines and spaces (line:space=1:1) are separated and resolved) at the amount of exposure (amount of electron beam irradiation) exhibiting the sensitivity described above was designated as an LS resolution (nm).

[IS Resolution]

The resolution limit (the minimum line width when the lines and the spaces were separated and resolved) at the minimum irradiation dose when resolving an isolated space pattern with a space line of 100 nm (space:line=1:>100) was taken as the IS resolution (nm).

[Pattern Shape]

The cross-sectional shape of a line pattern (L/S=1/1) having a line width of 100 nm at the amount (amount of electron beam irradiation) of exposure exhibiting the sensitivity described above, was observed by using a scanning electron microscope (S-4300 manufactured by Hitachi, Ltd.). In regard to the cross-sectional shape of the line pattern, a sample in which the ratio represented by [line width at the top (surface area) of the line pattern/line width in the middle of the line pattern (height position at a half of the line pattern height)] is 1.5 or more was designated as “inverse taper”; a sample in which the ratio is 1.2 or more and less than 1.5 was designated as “slightly inverse taper”; and a sample in which the ratio is less than 1.2 was designated as “rectangular”. Thus, an evaluation was performed.

[Scum Evaluation]

A line pattern was formed by the same method as described in the section of [Pattern Shape]. Thereafter, a cross-section SEM was obtained by using a scanning electron microscope S4800 (manufactured by Hitachi High Technologies Corp.), and the presence of scum in the space area was observed and evaluated as follows.

A: No scum is observed.

B: Scum is observed, but patterns are not connected to each other.

C: Scum is observed, and patterns are partially connected to each other.

[Dry Etching Resistance]

A resist film on which a resist pattern having a line width of 100 nm (line:space=1:1) was formed at the amount of irradiation (amount of electron beam irradiation) exhibiting the sensitivity described above, was subjected to dry etching for 30 seconds by using HITACHI U-621 and $Ar/C_4F_6/O_2$ gas (gas mixture at a volume ratio of 100/4/2). Thereafter, the resist residual film ratio was measured and was used as an indicator for dry etching resistance.

Very satisfactory: a residual film ratio of 95% or more

Satisfactory: a residual film ratio of 90% or more and less than 95%

Poor: a residual film ratio of less than 90%

[Line Edge Roughness (LER)]

A line pattern (L/S=1/1) having a line width of 100 nm was formed with the amount of irradiation (amount of electron beam irradiation) exhibiting the sensitivity described above. At any arbitrary 30 points included in 50 μm along the length direction, the distance from a reference line at which an edge should exist was measured by using a scanning electron microscope (S-9220 manufactured by Hitachi, Ltd.). The standard deviation of this distance was determined, and 3σ was calculated. A smaller value indicates satisfactory performance.

Examples 2A to 35A and Comparative Examples 1A to 5A

The negative tone resist compositions 2N to 49N and comparative compositions 1N to 5N described in Table 2 below were prepared in the same manner as for the composition 1N, and the negative tone patterns were formed and evaluation were carried out by the same methods. The results are shown in Table 3 below.

TABLE 2

| Composition | Polymer compound (A) (% by mass) | Acid generator (% by mass) | Basic compound (% by mass) | Cross-linking agent (% by mass) | Compound (X) (% by mass) | Organic carboxylic acid (% by mass) | Surfactant (% by mass) | Solvent (weight ratio) |
|---|---|---|---|---|---|---|---|---|
| 1N | A1 (92.38) | z61 (5.73) | BASE-1 (0.49) | None | None | D1 (1.34) | W-3 (0.06) | S1/S2 (80/20) |
| 2N | A2 (92.38) | z61 (5.73) | BASE-1 (0.49) | None | None | D1 (1.34) | W-3 (0.06) | S1/S2 (80/20) |
| 3N | A3 (92.38) | z61 (5.73) | BASE-1 (0.49) | None | None | D1 (1.34) | W-3 (0.06) | S1/S2 (80/20) |
| 4N | A4 (92.38) | z61 (5.73) | BASE-1 (0.49) | None | None | D1 (1.34) | W-3 (0.06) | S1/S2 (80/20) |
| 5N | A5 (92.38) | z61 (5.73) | BASE-1 (0.49) | None | None | D1 (1.34) | W-3 (0.06) | S1/S2 (80/20) |
| 6N | A6 (92.38) | z61 (5.73) | BASE-1 (0.49) | None | None | D1 (1.34) | W-3 (0.06) | S1/S2 (80/20) |
| 7N | A7 (92.38) | z61 (5.73) | BASE-1 (0.49) | None | None | D1 (1.34) | W-3 (0.06) | S1/S2 (80/20) |
| 8N | A8 (92.38) | z61 (5.73) | BASE-1 (0.49) | None | None | D1 (1.34) | W-3 (0.06) | S1/S5 (80/20) |
| 9N | A9 (92.38) | z61 (5.73) | BASE-1 (0.49) | None | None | D1 (1.34) | W-3 (0.06) | S1/S5 (80/20) |
| 10N | A10 (92.38) | z61 (5.73) | BASE-1 (0.49) | None | None | D1 (1.34) | W-3 (0.06) | S1/S2 (80/20) |
| 11N | A11 (92.38) | z61 (5.73) | BASE-1 (0.49) | None | None | D1 (1.34) | W-3 (0.06) | S1/S2 (80/20) |
| 12N | A12 (92.38) | z61 (5.73) | BASE-1 (0.49) | None | None | D1 (1.34) | W-3 (0.06) | S1/S2 (80/20) |
| 13N | A13 (92.38) | z61 (5.73) | BASE-1 (0.49) | None | None | D1 (1.34) | W-3 (0.06) | S1/S7 (80/20) |
| 14N | A14 (92.38) | z61 (5.73) | BASE-1 (0.49) | None | None | D1 (1.34) | W-3 (0.06) | S1/S2 (80/20) |
| 15N | A15 (92.38) | z61 (5.73) | BASE-1 (0.49) | None | None | D1 (1.34) | W-3 (0.06) | S1/S2 (80/20) |
| 16N | A1 (63.04) | z2 (4.22) | BASE-1 (0.49) | CL-1/CL-4 (7.19/3.66) | X1 (20.00) | D1 (1.34) | W-1 (0.06) | S1/S2 (80/20) |
| 17N | A1 (72.76) | z5 (4.50) | BASE-1 (0.49) | CL-1/CL-4 (7.19/3.66) | X3 (10.00) | D1 (1.34) | W-3 (0.06) | S1/S2 (80/20) |

TABLE 2-continued

| Composition | Polymer compound (A) (% by mass) | Acid generator (% by mass) | Basic compound (% by mass) | Cross-linking agent (% by mass) | Compound (X) (% by mass) | Organic carboxylic acid (% by mass) | Surfactant (% by mass) | Solvent (weight ratio) |
|---|---|---|---|---|---|---|---|---|
| 18N | A6 (44.04) | z8 (4.07) | BASE-1 (0.49) | None | X2 (50.00) | D1 (1.34) | W-2 (0.06) | S1/S2 (80/20) |
| 19N | A1 (83.51) | z37/z63 (2.63/1.12) | BASE-1 (0.49) | CL-1/CL-4 (7.19/3.66) | None | D1 (1.34) | W-3 (0.06) | S1/S2 (80/20) |
| 20N | A1 (81.98) | z42 (5.28) | BASE-1 (0.49) | CL-1/CL-4 (7.19/3.66) | None | D1 (1.34) | W-3 (0.06) | S1/S2 (80/20) |
| 21N | A1 (41.90) | z48 (3.58) | BASE-1 (0.49) | CL-1/CL-4 (7.19/3.66) | X4 (41.90) | D2 (1.22) | W-1 (0.06) | S1/S2 (80/20) |
| 22N | A1 (82.43) | z49 (4.83) | BASE-1 (0.49) | CL-1/CL-4 (7.19/3.66) | None | D1 (1.34) | W-3 (0.06) | S1/S2 (80/20) |
| 23N | A2 (85.85) | z63 (7.26) | BASE-1 (0.49) | None | X4 (5.00) | D1 (1.34) | W-1 (0.06) | S1/S2 (80/20) |
| 24N | A1 (81.06) | z65 (6.20) | BASE-1 (0.49) | CL-1/CL-4 (7.19/3.66) | None | D1 (1.34) | W-3 (0.06) | S1/S2 (80/20) |
| 25N | A1 (83.06) | z66 (4.20) | BASE-1 (0.49) | CL-1/CL-4 (7.19/3.66) | None | D1 (1.34) | W-3 (0.06) | S1/S2/S3 (5S/25/20) |
| 26N | A1 (81.65) | z67 (5.61) | BASE-1 (0.49) | CL-1/CL-4 (7.19/3.66) | None | D1 (1.34) | W-2 (0.06) | S1/S2/S6 (5S/25/20) |
| 27N | A1 (82.12) | z68 (5.61) | BASE-1 (0.49) | CL-1/CL-4 (7.19/3.66) | None | D3 (0.87) | W-2 (0.06) | S1/S2/S4 (55/2S/20) |
| 28N | A1 (56.58) | z61 (5.73) | BASE-2 (0.67) | CL-1/CL-4 (7.19/3.66) | X1 (25.00) | D2 (1.22) | W-2 (0.06) | S1/S2 (80/20) |
| 29N | A2 (81.58) | z61 (5.73) | BASE-3 (0.56) | CL-3 (10.85) | None | D3 (0.87) | None | S1/S2 (80/20) |
| 30N | A1 (81.50) | z61 (5.73) | BASE-1/ BASE-6 (0.29/0.29) | CL-1/CL-4 (7.19/3.66) | None | D1 (1.34) | None | S1/S2 (80/20) |
| 31N | A1 (20.00) | z61 (5.73) | BASE-4 (0.38) | CL-3 (10.85) | X3 (61.70) | D1 (1.34) | None | S1/S2 (80/20) |
| 32N | A1 (30.00) | z61 (5.73) | BASE-5 (0.49) | CL-1/CL-4 (7.19/3.66) | X2 (51.65) | D2 (1.22) | W-2 (0.06) | S1/S2 (80/20) |
| 33N | A5 (80.00) | z61 (5.73) | BASE-6 (1.46) | CL-2 (10.43) | X1 (1.51) | D3 (0.87) | None | S1/S2 (80/20) |
| 34N | A1 (81.59) | z61 (5.73) | BASE-1 (0.49) | CL-1/CL-4 (7.19/3.66) | None | D1 (1.34) | None | S1/S2 (80/20) |
| 35N | A1 (70.00) | z65 (6.20) | BASE-1 (0.49) | CL-1/CL-4 (7.19/3.66) | X1 (11.12) | D1 (1.34) | None | S1/S2 (80/20) |
| 36N | A16 (92.38) | z61 (5.73) | BASE-1 (0.49) | None | None | D1 (1.34) | W-3 (0.06) | S1/S2 (80/20) |
| 37N | A17 (92.38) | z61 (5.73) | BASE-1 (0.49) | None | None | D1 (1.34) | W-3 (0.06) | S1/S2 (80/20) |
| 38N | A18 (92.38) | z61 (5.73) | BASE-1 (0.49) | None | None | D1 (1.34) | W-3 (0.06) | S1/S2 (80/20) |
| 39N | A19 (92.38) | z61 (5.73) | BASE-1 (0.49) | None | None | D1 (1.34) | W-3 (0.06) | S1/S2 (80/20) |
| 40N | A20 (92.38) | z61 (5.73) | BASE-1 (0.49) | None | None | D1 (1.34) | W-3 (0.06) | S1/S2 (80/20) |
| 41N | A21 (92.38) | z61 (5.73) | BASE-1 (0.49) | None | None | D1 (1.34) | W-3 (0.06) | S1/S2 (80/20) |
| 42N | A26 (92.38) | z61 (5.73) | BASE-1 (0.49) | None | None | D1 (1.34) | W-3 (0.06) | S1/S2 (80/20) |
| 43N | A27 (92.38) | z61 (5.73) | BASE-1 (0.49) | None | None | D1 (1.34) | W-3 (0.06) | S1/S2 (80/20) |
| 44N | A28 (92.38) | z61 (5.73) | BASE-1 (0.49) | None | None | D1 (1.34) | W-3 (0.06) | S1/S2 (80/20) |
| 45N | A29 (92.38) | z61 (5.73) | BASE-1 (0.49) | None | None | D1 (1.34) | W-3 (0.06) | S1/S2 (80/20) |
| 46N | A30 (92.38) | z61 (5.73) | BASE-1 (0.49) | None | None | D1 (1.34) | W-3 (0.06) | S1/S2 (80/20) |
| 47N | A31 (92.38) | z61 (5.73) | BASE-1 (0.49) | None | None | D1 (1.34) | W-3 (0.06) | S1/S2 (80/20) |
| 48N | A32 (92.38) | z61 (5.73) | BASF.-l (0.49) | None | None | D1 (1.34) | W-3 (0.06) | S1/S2 (80/20) |
| 49N | A33 (92.38) | z61 (5.73) | BASE-1 (0.49) | None | None | D1 (1.34) | W-3 (0.06) | S1/S2 (80/20) |
| Comparative Example 1N | R-1 (83.68) | z48 (3.58) | BASE-1 (0.49) | CL-3 (10.85) | None | D1 (1.34) | W-3 (0.06) | S1/S2 (80/20) |
| Comparative Example 2N | R-2 (63.68) | z48 (3.58) | BASE-1 (0.49) | CL-3 (10.85) | X1 (20.00) | D1 (1.34) | W-3 (0.06) | S1/S2 (80/20) |
| Comparative Example 3N | R-3 (83.68) | z48 (3.58) | BASE-1 (0.49) | CL-3 (10.85) | None | D1 (1.34) | W-3 (0.06) | S1/S2 (80/20) |

TABLE 2-continued

| Composition | Polymer compound (A) (% by mass) | Acid generator (% by mass) | Basic compound (% by mass) | Cross-linking agent (% by mass) | Compound (X) (% by mass) | Organic carboxylic acid (% by mass) | Surfactant (% by mass) | Solvent (weight ratio) |
|---|---|---|---|---|---|---|---|---|
| Comparative Example 4N | R-4 (33.68) | z48 (3.58) | BASE-1 (0.49) | CL-3 (10.85) | X3 (50.00) | D1 (1.34) | W-3 (0.06) | S1/S2 (80/20) |
| Comparative Example 5N | R-5 (83.68) | z48 (3.58) | BASE-1 (0.49) | CL-3 (10.85) | None | D1 (1.34) | W-3 (0.06) | S1/S2 (80/20) |

TABLE 3

(electron beam exposure; negative tone; alkali development)

| Example | Composition | Sensitivity ($\mu C/cm^2$) | LS resolution (nm) | IS resolution (nm) | Pattern shape | Scum | LER (nm) | Dry etching resistance |
|---|---|---|---|---|---|---|---|---|
| 1A | 1N | 8.6 | 37.5 | 37.5 | Rectangular | A | 4.5 | Very good |
| 2A | 2N | 8.4 | 37.5 | 37.5 | Rectangular | A | 4.2 | Very good |
| 3A | 3N | 9.0 | 50.0 | 50.0 | Rectangular | A | 4.8 | Very good |
| 4A | 4N | 8.6 | 37.5 | 37.5 | Rectangular | A | 4.5 | Very good |
| 5A | 5N | 8.4 | 37.5 | 37.5 | Rectangular | A | 4.5 | Very good |
| 6A | 6N | 8.6 | 37.5 | 37.5 | Rectangular | A | 4.5 | Very good |
| 7A | 7N | 8.5 | 37.5 | 37.5 | Rectangular | A | 4.4 | Very good |
| 8A | 8N | 8.6 | 37.5 | 37.5 | Rectangular | A | 4.5 | Very good |
| 9A | 9N | 9.0 | 50.0 | 50.0 | Rectangular | A | 4.8 | Very good |
| 10A | 10N | 8.5 | 37.5 | 37.5 | Rectangular | A | 4.5 | Very good |
| 11A | 11N | 8.5 | 37.5 | 37.5 | Rectangular | A | 4.5 | Very good |
| 12A | 12N | 8.8 | 37.5 | 37.5 | Rectangular | A | 4.6 | Very good |
| 13A | 13N | 8.6 | 37.5 | 37.5 | Rectangular | A | 4.5 | Very good |
| 14A | 14N | 8.2 | 37.5 | 37.5 | Rectangular | A | 4.1 | Very good |
| 15A | 15N | 8.7 | 37.5 | 37.5 | Rectangular | A | 4.7 | Very good |
| 16A | 16N | 9.5 | 50.0 | 50.0 | Rectangular | A | 4.9 | Very good |
| 17A | 17N | 8.4 | 37.5 | 37.5 | Rectangular | A | 4.7 | Very good |
| 18A | 18N | 8.5 | 50.0 | 50.0 | Rectangular | A | 4.5 | Very good |
| 19A | 19N | 9.4 | 50.0 | 50.0 | Rectangular | A | 4.9 | Very good |
| 20A | 20N | 8.9 | 37.5 | 37.5 | Rectangular | A | 4.7 | Very good |
| 21A | 21N | 9.5 | 37.5 | 37.5 | Rectangular | A | 4.5 | Very good |
| 22A | 22N | 8.9 | 50.0 | 50.0 | Rectangular | A | 4.9 | Very good |
| 23A | 23N | 8.5 | 37.5 | 37.5 | Rectangular | A | 4.5 | Very good |
| 24A | 24N | 9.0 | 37.5 | 37.5 | Rectangular | A | 4.9 | Very good |
| 25A | 25N | 9.4 | 50.0 | 50.0 | Rectangular | A | 50 | Very good |
| 26A | 26N | 9.0 | 50.0 | 50.0 | Rectangular | A | 4.7 | Very good |
| 27A | 27N | 9.0 | 50.0 | 50.0 | Rectangular | A | 4.7 | Very good |
| 28A | 28N | 8.8 | 37.5 | 37.5 | Rectangular | A | 4.8 | Very good |
| 29A | 29N | 8.7 | 37.5 | 37.5 | Rectangular | A | 4.6 | Very good |
| 30A | 30N | 8.7 | 37.5 | 37.5 | Rectangular | A | 4.7 | Very good |
| 31A | 31N | 9.0 | 50.0 | 50.0 | Rectangular | A | 4.7 | Very good |
| 32A | 32N | 8.9 | 37.5 | 37.5 | Rectangular | A | 4.7 | Very good |
| 33A | 33N | 8.7 | 37.5 | 37.5 | Rectangular | A | 4.6 | Very good |
| 34A | 34N | 8.7 | 37.5 | 37.5 | Rectangular | A | 4.7 | Very good |
| 35A | 35N | 8.9 | 37.5 | 37.5 | Rectangular | A | 4.8 | Very good |
| 36A | 36N | 8.5 | 37.5 | 37.5 | Rectangular | A | 4.5 | Very good |
| 37A | 37N | 8.5 | 37.5 | 37.5 | Rectangular | A | 4.5 | Very good |
| 38A | 38N | 8.4 | 37.5 | 37.5 | Rectangular | A | 4.4 | Very good |
| 39A | 39N | 8.4 | 37.5 | 37.5 | Rectangular | A | 4.3 | Very good |
| 40A | 40N | 8.4 | 37.5 | 37.5 | Rectangular | A | 4.3 | Very good |
| 41A | 41N | 8.5 | 37.5 | 37.5 | Rectangular | A | 4.4 | Very good |
| 42A | 42N | 8.5 | 37.5 | 37.5 | Rectangular | A | 4.4 | Very good |
| 43A | 43N | 8.4 | 37.5 | 37.5 | Rectangular | A | 4.4 | Very good |
| 44A | 44N | 8.6 | 37.5 | 37.5 | Rectangular | A | 4.5 | Very good |
| 45A | 45N | 8.8 | 37.5 | 37.5 | Rectangular | A | 4.3 | Very good |
| 46A | 46N | 8.2 | 37.5 | 37.5 | Rectangular | A | 4.3 | Very good |
| 47A | 47N | 8.5 | 37.5 | 37.5 | Rectangular | A | 4.5 | Very good |
| 48A | 48N | 8.7 | 37.5 | 37.5 | Rectangular | A | 4.5 | Very good |
| 49A | 49N | 8.7 | 37.5 | 37.5 | Rectangular | A | 4.6 | Very good |
| Comparative Example 1A | Comparative composition 1N | 13.7 | 62.5 | 62.5 | Slightly inverse taper | C | 6.0 | Poor |
| Comparative Example 2A | Comparative composition 2N | 13.6 | 62.5 | 62.5 | Slightly inverse taper | C | 5.5 | Good |
| Comparative Example 3A | Comparative composition 3N | 13.6 | 62.5 | 62.5 | Slightly inverse taper | B | 5.5 | Poor |

TABLE 3-continued

| (electron beam exposure; negative tone; alkali development) | | | | | | | | |
|---|---|---|---|---|---|---|---|---|
| Example | Composition | Sensitivity ($\mu C/cm^2$) | LS resolution (nm) | IS resolution (nm) | Pattern shape | Scum | LER (nm) | Dry etching resistance |
| Comparative Example 4A | Comparative composition 4N | 13.6 | 62.5 | 62.5 | Slightly inverse taper | B | 5.5 | Poor |
| Comparative Example 5A | Comparative composition 5N | 12.6 | 62.5 | 62.5 | Slightly inverse taper | B | 5.5 | Good |

Examples 1B to 12B, and Comparative Examples 1B and 2B (EUV Exposure; Negative Tone; Alkali Development)

(Preparation of Resist Solution)

The negative tone resist compositions having the composition shown in Table 2 above were filtered through a polytetrafluoroethylene filter having a pore size of 0.04 μm, and thus negative tone resist solutions were prepared.

(Resist Evaluation)

Each of the negative tone resist solutions thus prepared was uniformly applied on a silicon substrate that had been subjected to a hexamethyldisilazane treatment, by using a spin coater. The treated substrate was heated and dried on a hot plate at 100° C. for 60 seconds, and thus a resist film having a thickness of 0.05 μm was formed.

The resist film thus obtained was evaluated for sensitivity, resolution, pattern shape, line edge roughness (LER), scum, and dry etching resistance by the methods described below. The results are shown in Table 4.

[Sensitivity]

The resist film thus obtained was exposed through a reflection type mask having a 1:1 line-and-space pattern having a line width of 100 nm, by using EUV light (wavelength: 13 nm) while changing the amount of exposure by 0.1 $mJ/cm^2$ over the range of 0 $mJ/cm^2$ to 20.0 $mJ/cm^2$, and then the resist film was baked for 90 seconds at 110° C. Thereafter, the resist pattern was developed by using a 2.38%-by-mass aqueous solution of tetramethylammonium hydroxide (TMAH).

The amount of exposure which reproduced the line-and-space (L/S=1/1) mask pattern with a line width of 100 nm was designated as sensitivity. A smaller value of this amount of exposure indicates higher sensitivity.

[Resolution (LS)]

The resolution limit (minimum line width at which lines and spaces (line:space=1:1) are separated and resolved) at the amount of exposure exhibiting the sensitivity described above was designated as the resolution (nm).

[Pattern Shape]

The cross-sectional shape of a line pattern (L/S=1/1) having a line width of 100 nm at the amount of exposure exhibiting the sensitivity described above, was observed by using a scanning electron microscope (S-4300 manufactured by Hitachi, Ltd.). In regard to the cross-sectional shape of the line pattern, a sample in which the ratio represented by [line width at the top (surface area) of the line pattern/line width in the middle of the line pattern (height position at a half of the line pattern height)] was more than 1.5 was designated as "inverse taper"; a sample in which the ratio is 1.2 or more and less than 1.5 was designated as "slightly inverse taper"; and a sample in which the ratio is less than 1.2 was designated as "rectangular". Thus, an evaluation was performed.

[Scum Evaluation]

A line pattern was formed by the same method as described in the section of [Pattern Shape]. Thereafter, a cross-section SEM was obtained by using a scanning electron microscope S4800 (manufactured by Hitachi High Technologies Corp.), and the presence of scum in the space area was observed and evaluated as follows.

A: No scum is observed.

B: Scum is observed, but patterns are not connected to each other.

C: Scum is observed, and patterns are partially connected to each other.

[Dry Etching Resistance]

The resist film formed by irradiation onto the entire surface at the amount of exposure exhibiting the sensitivity described above, was subjected to dry etching for 15 seconds by using HITACHI U-621 and $Ar/C_4F_6/O_2$ gas (gas mixture at a volume ratio of 100/4/2). Thereafter, the resist residual film ratio was measured and was used as an indicator for dry etching resistance.

Very satisfactory: a residual film ratio of 95% or more

Satisfactory: a residual film ratio of 90% or more and less than 95%

Poor: a residual film ratio of less than 90%

[Line Edge Roughness (LER)]

A line pattern (L/S=1/1) having a line width of 100 nm was formed with the amount of exposure exhibiting the sensitivity described above. At any arbitrary 30 points included in 50 μm along the length direction, the distance from a reference line at which an edge should exist was measured by using a scanning electron microscope (S-9220 manufactured by Hitachi, Ltd.). The standard deviation of this distance was determined, and 3σ was calculated. A smaller value indicates satisfactory performance.

TABLE 4

| (EUV exposure; negative tone; alkali development) | | | | | | | |
|---|---|---|---|---|---|---|---|
| Example | Composition | Sensitivity ($mJ/cm^2$) | LS resolution (nm) | Scum | Pattern shape | LER (nm) | Dry etching resistance |
| 1B | 1N | 11.5 | 37.5 | A | Rectangular shape | 4.5 | Very good |
| 2B | 2N | 10.9 | 37.5 | A | Rectangular shape | 4.0 | Very good |

TABLE 4-continued (EUV exposure; negative tone; alkali development)

| Example | Composition | Sensitivity (mJ/cm$^2$) | LS resolution (nm) | Scum | Pattern shape | LER (nm) | Dry etching resistance |
|---|---|---|---|---|---|---|---|
| 3B | 3N | 11.7 | 37.5 | A | Rectangular shape | 4.7 | Very good |
| 4B | 4N | 11.7 | 37.5 | A | Rectangular shape | 4.5 | Very good |
| 5B | 5N | 11.9 | 37.5 | A | Rectangular shape | 4.5 | Very good |
| 6B | 6N | 11.7 | 37.5 | A | Rectangular shape | 4.5 | Very good |
| 7B | 10N | 11.8 | 37.5 | A | Rectangular shape | 4.6 | Very good |
| 8B | 14N | 11.8 | 37.5 | A | Rectangular shape | 4.6 | Very good |
| 9B | 16N | 12.0 | 37.5 | A | Rectangular shape | 4.9 | Very good |
| 10B | 25N | 12.1 | 50.0 | A | Rectangular shape | 4.8 | Very good |
| 11B | 29N | 11.9 | 37.5 | A | Rectangular shape | 4.7 | Very good |
| 12B | 30N | 11.9 | 37.5 | A | Rectangular shape | 4.7 | Very good |
| Comparative Example 1B | Comparative composition 1N | 15.8 | 55 | C | Slightly inverse taper | 6.0 | Poor |
| Comparative Example 2B | Comparative composition 2N | 15.8 | 55 | C | Slightly inverse taper | 6.0 | Good |

Examples 1F to 6F and Comparative Examples 1F and 2F (EB Exposure; Negative Tone; Organic Solvent Development)

(Formation of Negative Tone Resist Pattern)

The compositions having the formulations shown in Table 5 below were micro-filtered through a membrane filter having a pore size of 0.1 μm to obtain a resist solution.

The resist solution was coated on a 6-inch silicon wafer treated with hexamethyldisilazane (HMDS) in advance by using a spin coater Mark 8 manufactured by Tokyo Electron, Ltd., and the wafer was dried on a hot plate at 100° C. for 60 seconds. Thus, a resist film having a film thickness of 50 nm was obtained.

The wafer coated with the resist film prepared above was subjected to pattern irradiation, using an electron beam lithographic apparatus (HL750, manufactured by Hitachi, Ltd., accelerating voltage of 50 keV). Printing was carried out to form a line-and-space pattern of 1:1. After the printing with an electron beam, the film was heated on a hot plate at 110° C. for 60 seconds, and then the organic developer described in Table 5 was paddled, developed for 30 seconds, and rinsed using the rinsing liquid described in Table 5. Then, the wafer was rotated at a rotation speed of 4000 rpm for 30 seconds and then heated at 90° C. for 60 seconds to obtain a resist pattern with a 1:1 line-and-space pattern having a line width of 50 nm.

(Evaluation of Resist Pattern)

[Sensitivity]

The cross-sectional shape of the pattern thus obtained was observed by using a scanning electron microscope (S-4300 manufactured by Hitachi, Ltd.). The amount of exposure (amount of electron beam irradiation) used to resolve a resist pattern having a line width of 100 nm (line:space=1:1) was designated as sensitivity. A smaller value indicates higher sensitivity.

[Resolution]

The resolution limit (minimum line width at which lines and spaces are separated and resolved) at the amount of exposure (amount of electron beam irradiation) exhibiting the sensitivity described above was designated as the resolution (nm).

[Pattern Shape]

The cross-sectional shape of a resist pattern having a line width of 100 nm (line:space=1:1) at the amount (amount of electron beam irradiation) of exposure exhibiting the sensitivity described above, was observed by using a scanning electron microscope (S-4300 manufactured by Hitachi, Ltd.). In regard to the cross-sectional shape of the line pattern, a sample in which the ratio represented by [line width at the top (surface area) of the line pattern/line width in the middle of the line pattern (height position at a half of the line pattern height)] is 1.5 or more was designated as "inverse taper"; a sample in which the ratio is 1.2 or more and less than 1.5 was designated as "slightly inverse taper"; and a sample in which the ratio is less than 1.2 was designated as "rectangular". Thus, an evaluation was performed.

[Line Edge Roughness (LER)]

A resist pattern having a line width of 100 nm (line:space=1:1) was formed with the amount of irradiation (amount of electron beam irradiation) exhibiting the sensitivity described above. At any arbitrary 30 points included in 50 μm along the length direction, the distance from a reference line at which an edge should exist was measured by using a scanning electron microscope (S-9220 manufactured by Hitachi, Ltd.). The standard deviation of this distance was determined, and 3σ was calculated. A smaller value indicates satisfactory performance.

The evaluation results are shown in Table 6.

TABLE 5

| Composition | Polymer compound (A) (% by mass) | Acid generator (% by mass) | Basic compound (% by mass) | Compound (X) (% by mass) | Surfactant (% by mass) | Developer | Rinsing liquid | Solvent (mass ratio) |
|---|---|---|---|---|---|---|---|---|
| 1T | A-22 (93.72) | Z61 (5.73) | BASE-1 (0.49) | None | W-1 (0.06) | S8 | S11 | S1/S2 (80/20) |
| 2T | A-23 (93.72) | Z61 (5.73) | BASE-1 (0.49) | None | W-3 (0.06) | S8 | S11 | S1/S2 (80/20) |

TABLE 5-continued

| Composition | Polymer compound (A) (% by mass) | Acid generator (% by mass) | Basic compound (% by mass) | Compound (X) (% by mass) | Surfactant (% by mass) | Developer | Rinsing liquid | Solvent (mass ratio) |
|---|---|---|---|---|---|---|---|---|
| 3T | A-24 (63.54) | Z61 (5.73) | BASE-2 (0.67) | X2 (30.00) | W-2 (0.06) | S9 | S12 | S1/S2 (80/20) |
| 4T | A-25 (93.72) | Z61 (5.73) | BASE-2 (0.67) | None | W-2 (0.06) | S10 | S11 | S1/S2 (80/20) |
| 5T | A-22 (54.03) | Z63 (5.42) | BASE-1 (0.49) | X3 (40.00) | W-3 (0.06) | S8 | S11 | S1/S2 (80/20) |
| 6T | A-22 (90.00) | Z49 (4.83) | BASE-2 (0.67) | X4 (4.44) | W-1 (0.06) | S9 | S10 | S1/S2 (80/20) |
| Comparative Example 1T | R-6 (93.72) | Z61 (5.73) | BASE-1 (0.49) | None | W-1 (0.06) | S8 | S11 | S1/S2 (80/20) |
| Comparative Example 2T | R-7 (94.44) | Z49 (4.83) | BASE-2 (0.67) | None | W-1 (0.06) | S8 | S11 | S1/S2 (80/20) |

TABLE 6

(EB exposure; negative tone; Organic solvent development)

| Example | Composition | Sensitivity ($\mu C/cm^2$) | Resolution (nm) | Pattern shape | LER (nm) |
|---|---|---|---|---|---|
| 1F | 1T | 12.0 | 37.5 | Rectangular | 3.7 |
| 2F | 2T | 12.0 | 37.5 | Rectangular | 4.3 |
| 3F | 3T | 12.6 | 37.5 | Rectangular | 4.3 |
| 4F | 4T | 13.0 | 50 | Rectangular | 4.5 |
| 5F | 5T | 12.0 | 37.5 | Rectangular | 3.8 |
| 6F | 6T | 12.8 | 50 | Rectangular | 4.5 |
| Comparative Example IF | Comparative Example IT | 20.2 | 62.5 | Inverse taper | 6.0 |
| Comparative Example 2F | Comparative Example 2T | 17.4 | 62.5 | Inverse taper | 5.5 |

Examples 1G to 6G and Comparative Examples 1G and 2G (EUV Exposure; Negative Tone; Organic Solvent Development)

(Formation of Negative Tone Resist Pattern)

The composition having the formulation shown in Table 5 above was micro-filtered through a membrane filter having a 0.05 μm pore diameter to obtain a resist solution.

This resist solution was coated on the 6-inch Si wafer which had been subjected to a hexamethyldisilazane (HMDS) treatment in advance, by using a spin coater Mark 8 manufactured by Tokyo Electron, Ltd., and the wafer was dried on a hot plate at 100° C. for 60 seconds to obtain a resist film having a film thickness of 50 nm.

The obtained wafer having the resist film coated thereon was subjected to pattern exposure using an EUV exposure apparatus (Micro Exposure Tool, NA 0.3, Quadrupole, manufactured by Exitech, Outer Sigma 0.68, Inner Sigma 0.36) with an exposure mask (line:space=1:1). After the irradiation, the film was heated on a hot plate at 110° C. for 60 seconds, and then the organic developer described in Table 5 above was paddled, developed for 30 seconds, and rinsed using the rinsing liquid described in Table 5. Then, the wafer was rotated at a rotation speed of 4000 rpm for 30 seconds and then baked at 90° C. for 60 seconds to obtain a resist pattern with a 1:1 line-and-space pattern having a line width of 50 nm.

(Evaluation of Resist Pattern)

Using a scanning electron microscope (SEM, S-9380II manufactured by Hitachi Ltd.), the obtained resist pattern was evaluated for the sensitivity, the resolution, and the LER, using the following methods.

[Sensitivity]

The amount of exposure for resolving a pattern having a line width of 100 nm was designated as sensitivity. A smaller value of this amount of exposure indicates higher sensitivity.

[Resolution]

The resolution limit (minimum line width at which lines and spaces are separated and resolved) at the amount of exposure exhibiting the sensitivity described above was designated as the resolution (nm).

[Pattern Shape]

The cross-sectional shape of a 1:1 line-and-space resist pattern having a line width of 100 nm at the amount of exposure exhibiting the sensitivity described above was observed by using a scanning electron microscope (S-4300 manufactured by Hitachi, Ltd.). In regard to the cross-sectional shape of the line pattern, a sample in which the ratio represented by [line width at the bottom of the line pattern/line width in the middle of the line pattern (height position at a half of the line pattern height)] is 1.5 or more was designated as "inverse taper"; a sample in which the ratio is 1.2 or more and less than 1.5 was designated as "slightly inverse taper"; and a sample in which the ratio is less than 1.2 was designated as "rectangular". Thus, an evaluation was performed.

[LER Performance]

A 1:1 line-and-space resist pattern having a line width of 100 nm was formed with the amount of exposure exhibiting the sensitivity described above. At any arbitrary 30 points included in 50 μm along the length direction, the distance from a reference line at which an edge should exist was measured by using a scanning electron microscope (S-9220 manufactured by Hitachi, Ltd.). The standard deviation of this distance was determined, and 3σ was calculated. A smaller value indicates satisfactory performance.

The evaluation results are shown in Table 7 below.

TABLE 7

(EUV exposure; negative tone; organic solvent development)

| Example | Composition | Sensitivity ($mJ/cm^2$) | resolution (nm) | Pattern shape | LER (nm) |
|---|---|---|---|---|---|
| 1G | 1T | 3.9 | 24.0 | Rectangular | 5.4 |
| 2G | 2T | 3.9 | 24.5 | Rectangular | 5.4 |
| 3G | 3T | 4.0 | 25.0 | Rectangular | 5.5 |
| 4G | 4T | 4.5 | 27.5 | Rectangular | 5.6 |
| 5G | 5T | 4.1 | 25.5 | Rectangular | 5.6 |
| 6G | 6T | 4.5 | 28.0 | Rectangular | 5.9 |

TABLE 7-continued (EUV exposure; negative tone; organic solvent development)

| Example | Composition | Sensitivity (mJ/cm$^2$) | resolution (nm) | Pattern shape | LER (nm) |
|---|---|---|---|---|---|
| Comparative Example 1G | Comparative Example IT | 6.5 | 35.0 | Inverse taper | 6.4 |
| Comparative Example 2G | Comparative Example 2T | 6.0 | 32.0 | Inverse taper | 6.1 |

From the results in Tables 3, 4, 6, and 7, it was found that the composition of the present invention is capable of forming a pattern satisfying high sensitivity, high resolution properties (for example, a high resolution, an excellent pattern shape, and a small line edge roughness (LER)) and good dry etching resistance.

What is claimed is:

1. A resin composition comprising a polymer compound (A) containing a first repeating unit (Q) represented by the following general formula (2'):

(2')

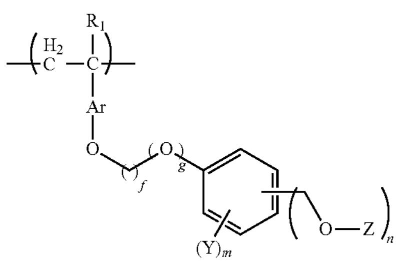

wherein $R_1$ represents a hydrogen atom, a methyl group, or a halogen atom;

Y represents a substituent excluding a methylol group;

Z represents a hydrogen atom, an alkyl group, an alkenyl group, an alkynyl group, a cycloalkyl group, an aryl group, a haloalkyl group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthio group, an arylthio group, an alkoxyalkyl group, or a heterocyclic group;

f represents an integer of 0 to 6;

g represents 0 or 1;

m represents an integer of 0 to 4;

n represents an integer of 1 to 5;

m+n is 5 or less;

in the case where m is 2 or more, plural Y's may be the same as or different from each other;

in the case where n is 2 or more, plural Z's may be the same as or different from each other;

any two or more of Y and Z may be bonded to each other to form a ring structure; and Ar represents an aromatic ring.

2. The resin composition according to claim 1, wherein n in general formula (2') is an integer of 2 to 4.

3. The resin composition according to claim 1, wherein the polymer compound (A) further contains a second repeating unit (P) represented by the following general formula (4), and the second repeating unit (P) does not correspond to the first repeating unit (Q):

(4)

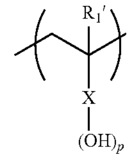

wherein $R_1'$ represents a hydrogen atom, a methyl group, or a halogen atom;

X represents a (p+1)-valent linking group or a single bond; and p represents an integer of 1 or more.

4. The resin composition according to claim 3, wherein the second repeating unit (P) represented by the general formula (4) is represented by the following general formula (5) or (6):

(5)

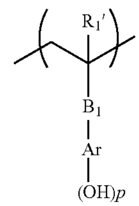

(6)

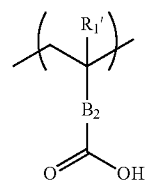

wherein $R_1'$ and p are as defined in the general formula (4);

$B_1$ and $B_2$ represent a divalent linking group or a single bond; and

Ar represents an aromatic ring.

5. The resin composition according to claim 1, further comprising a compound (B) capable of generating an acid by irradiation with actinic rays or radiation.

6. The resin composition according to claim 5, the compound (B) including an organic anion represented by the following general formula (9), (10), or (11):

[Chem. 33]

(9)

$$Rc_1—SO_3^{\ominus}$$

(10)

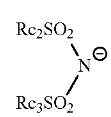

(11)

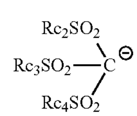

wherein $R_{c1}$, $R_{c2}$, $R_{c3}$ and $R_{c4}$ each independently represents an alkyl group in which the 1-position is substituted with a fluorine atom or a fluoroalkyl group, or a phenyl group substituted with a fluorine atom or a fluoroalkyl group.

7. The resin composition according to claim 5, wherein the compound (B) is an onium compound, and the acid that the compound (B) generates by the irradiation with actinic rays or radiation has a volume of 130 $Å^3$ or more.

8. The resin composition according to claim 1, wherein the dispersity of the polymer compound (A) is from 1.0 to 1.20.

9. The resin composition according to claim 1, further comprising a compound (C) as a cross-linking agent.

10. The resin composition according to claim 1, which is a chemical amplification type resist composition.

11. The resin composition according to claim 1, further comprising a photodegradable basic compound.

12. The resin composition according to claim 1, further comprising a compound which has increasing basicity under action of an acid.

13. The resin composition according to claim 1, wherein in the general formula (2'), Z represents a methyl group.

14. An actinic ray-sensitive or radiation-sensitive film comprising the resin composition according to claim 1.

15. Mask blanks having the actinic ray-sensitive or radiation-sensitive film according to claim 14 on a surface thereof.

16. A pattern forming method comprising: irradiating the mask blanks according to claim 15 with actinic rays or radiation; and developing the mask blanks irradiated with actinic rays or radiation.

17. A pattern forming method comprising:

irradiating an actinic ray-sensitive or radiation-sensitive film comprising the resin composition according to claim 1 with actinic rays or radiation; and developing the film irradiated with the actinic rays or radiation with organic developer, the moisture content in the entire volume of the organic developer being less than 10% by mass.

18. The pattern forming method according to claim 17, wherein the irradiation with the actinic rays or radiation is carried out using an electron beam or extreme ultraviolet rays.

19. A method for manufacturing an electronic device, comprising the pattern forming method according to claim 17.

20. The pattern forming method according to claim 17 utilized for forming a negative tone pattern.

21. A polymer compound containing two kinds of repeating units represented by the following general formula (I) or two kinds of repeating units represented by the following general formula (II):

(I)

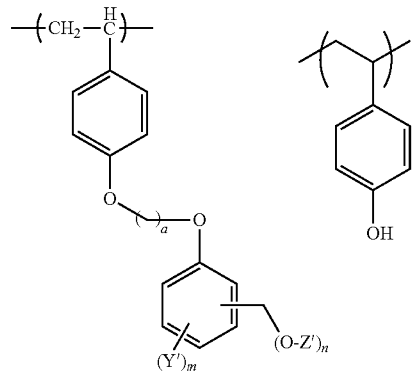

(II)

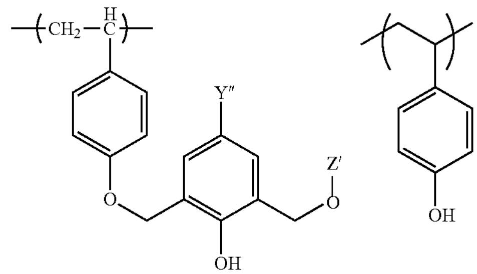

wherein

Y' represents an alkyl group, a cycloalkyl group, or an aryl group;

Y" represents a hydrogen atom, an alkyl group, a cycloalkyl group, or an aryl group;

Z' represents a hydrogen atom, an alkyl group, or a cycloalkyl group;

m is 0 or 1;

n represents an integer of 1 to 3; and a represents an integer of 2 to 6.

22. A resin composition comprising a polymer compound (A) containing a first repeating unit (Q) represented by the following general formula (3'):

(3')

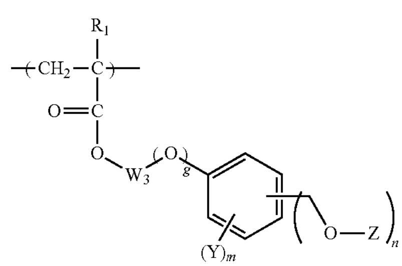

wherein $R_1$ represents a hydrogen atom, a methyl group, or a halogen atom;

Y represents a substituent excluding a methylol group;

Z represents a hydrogen atom, an alkyl group, an alkenyl group, an alkynyl group, a cycloalkyl group, an aryl group, a haloalkyl group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthio group, an arylthio group, an alkoxyalkyl group and a heterocyclic group;

g represents 1;

m represents an integer of 0 to 4;

n represents an integer of 1 to 5;

m+n is 5 or less;

in the case where m is 2 or more, plural Y's may be the same as or different from each other;

in the case where n is 2 or more, plural Z's may be the same as or different from each other;

$W_3$ represents a monocyclic or polycyclic aromatic hydrocarbon ring which may have a substituent having 6 to 18 carbon atoms, —C(═O)—, a cycloalkylene group, or a cyclic lactone structure; and any two or more of Y and Z may be bonded to each other to form a ring structure, wherein the weight average molecular weight of the polymer compound (A) is 1000 to 9000, and the content of the first repeating units (Q) is from 5% by mole to 40% by mole based on the entire repeating units included in the polymer compound (A).

23. The resin composition according to claim 22, wherein n in general formula (3') is an integer of 2 to 4.

24. The resin composition according to claim 22, further comprising a photodegradable basic compound.

25. The resin composition according to claim 22, further comprising a compound which has increasing basicity under action of an acid.

26. The resin composition according to claim 22, further comprising a compound (B) capable of generating an acid by irradiation with actinic rays or radiation.

27. The resin composition according to claim 26, the compound (B) including an organic anion represented by the following general formula (9), (10), or (11):

[Chem. 33]

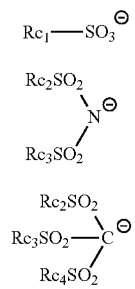

(9)

(10)

(11)

wherein $R_{c1}$, $R_{c2}$, $R_{c3}$ and $R_{c4}$ each independently represent an alkyl group in which the 1-position is substituted with a fluorine atom or a fluoroalkyl group, or a phenyl group substituted with a fluorine atom or a fluoroalkyl group.

28. The resin composition according to claim 22, wherein in the general formula (3'), Z represents a methyl group.

* * * * *